United States Patent
Sorrells et al.

(10) Patent No.: US 6,694,128 B1
(45) Date of Patent: Feb. 17, 2004

(54) FREQUENCY SYNTHESIZER USING UNIVERSAL FREQUENCY TRANSLATION TECHNOLOGY

(75) Inventors: David F. Sorrells, Middleburg; Michael J. Bultman, Jacksonville; Robert W. Cook, Switzerland; Richard C. Looke; Charley D. Moses, Jr., both of Jacksonville; Gregory S. Rawlins; Michael W. Rawlins, both of Lake Mary, all of FL (US); Francis J. Smith, Livermore, CA (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

(21) Appl. No.: 09/567,963

(22) Filed: May 10, 2000

Related U.S. Application Data

(63) Continuation-in-part of application No. 09/550,644, filed on Apr. 14, 2000, and a continuation-in-part of application No. 09/521,879, filed on Mar. 9, 2000, and a continuation-in-part of application No. 09/176,154, filed on Oct. 21, 1998, and a continuation-in-part of application No. 09/376,359, filed on Aug. 18, 1998, which is a continuation of application No. 09/176,022, filed on Oct. 21, 1998, now Pat. No. 6,061,551, said application No. 09/521,879, is a continuation-in-part of application No. 09/293,342, filed on Apr. 16, 1999, which is a continuation-in-part of application No. 09/176,022, said application No. 09/550,644, is a continuation-in-part of application No. 09/521,879, which is a continuation-in-part of application No. 09/293,342, filed on Apr. 16, 1999, which is a continuation-in-part of application No. 09/176,022.

(51) Int. Cl.[7] .................................................. H04B 1/40
(52) U.S. Cl. ........................ 455/76; 455/260; 327/105; 331/34; 331/143; 376/376
(58) Field of Search .................. 455/76, 260, 264; 327/101, 105; 331/34, 111, 143, 144, 145; 375/376

(56) References Cited

U.S. PATENT DOCUMENTS

| | | | |
|---|---|---|---|
| 2,057,613 A | 10/1936 | Gardner | 250/8 |
| 2,241,078 A | 5/1941 | Vreeland | 179/15 |
| 2,270,385 A | 1/1942 | Skillman | 179/15 |
| 2,283,575 A | 5/1942 | Roberts | 250/6 |
| 2,358,152 A | 9/1944 | Earp | 179/171.5 |
| 2,410,350 A | 10/1946 | Labin et al. | 179/15 |
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredenall | 178/44 |

(List continued on next page.)

FOREIGN PATENT DOCUMENTS

| | | | | |
|---|---|---|---|---|
| DE | 35 41 031 A1 | 5/1986 | | H03D/3/00 |
| DE | 42 37 692 C1 | 3/1994 | | H04B/1/26 |

(List continued on next page.)

OTHER PUBLICATIONS

English–language Abstract of Japanese Patent Publication No. 61–030821, from http://www1.ipdl.jpo.go.jp, 1 page (Feb. 13, 1986 –Date of publication of application).

(List continued on next page.)

*Primary Examiner*—Lee Nguyen
(74) *Attorney, Agent, or Firm*—Sterne, Kessler, Goldstein & Fox, P.L.L.C.

(57) ABSTRACT

Frequency translation and applications of same are described herein, including frequency synthesizers that employ universal frequency translation technology. The universal frequency translation technology includes a device for switching, a device for storing, and an energy transfer signal for controlling the switching device. The energy transfer signal may include pulses having apertures sufficiently wide to effect substantial energy transfer.

32 Claims, 76 Drawing Sheets

U.S. PATENT DOCUMENTS

| | | |
|---|---|---|
| 2,497,859 A | 2/1950 | Boughtwood et al. ......... 250/8 |
| 2,499,279 A | 2/1950 | Peterson ...................... 332/41 |
| 2,802,208 A | 8/1957 | Hobbs ......................... 343/176 |
| 2,985,875 A | 5/1961 | Grisdale et al. ............ 343/100 |
| 3,023,309 A | 2/1962 | Foulkes ....................... 250/17 |
| 3,069,679 A | 12/1962 | Sweeney et al. ............. 343/200 |
| 3,104,393 A | 9/1963 | Vogelman ..................... 343/200 |
| 3,114,106 A | 12/1963 | McManus ..................... 325/56 |
| 3,118,117 A | 1/1964 | King et al. ................... 332/22 |
| 3,226,643 A | 12/1965 | McNair ........................ 325/40 |
| 3,246,084 A | 4/1966 | Kryter |
| 3,258,694 A | 6/1966 | Shepherd ..................... 325/145 |
| 3,383,598 A | 5/1968 | Sanders ....................... 325/163 |
| 3,384,822 A | 5/1968 | Miyagi ......................... 325/30 |
| 3,454,718 A | 7/1969 | Perreault ..................... 178/66 |
| 3,523,291 A | 8/1970 | Pierret ........................ 340/347 |
| 3,548,342 A | 12/1970 | Maxey .......................... 332/9 |
| 3,555,428 A | 1/1971 | Perreault ..................... 325/320 |
| 3,617,892 A | 11/1971 | Hawley et al. ............... 325/145 |
| 3,621,402 A | 11/1971 | Gardner ....................... 328/37 |
| 3,622,885 A * | 11/1971 | Kruszynski et al. ........... 325/40 |
| 3,623,160 A | 11/1971 | Giles et al. ............ 340/347 DA |
| 3,626,417 A | 12/1971 | Gilbert ........................ 343/203 |
| 3,629,696 A | 12/1971 | Bartelink ................... 324/57 R |
| 3,662,268 A | 5/1972 | Gans et al. .................... 325/56 |
| 3,689,841 A | 9/1972 | Bello et al. ................... 325/39 |
| 3,702,440 A | 11/1972 | Moore |
| 3,714,577 A | 1/1973 | Hayes ......................... 325/145 |
| 3,716,730 A | 2/1973 | Cerny, Jr. .................... 307/295 |
| 3,717,844 A | 2/1973 | Barret et al. ................ 340/5 R |
| 3,735,048 A | 5/1973 | Tomsa et al. .......... 179/15 BM |
| 3,767,984 A | 10/1973 | Shinoda et al. |
| 3,806,811 A | 4/1974 | Thompson ................... 325/146 |
| 3,852,530 A | 12/1974 | Shen |
| 3,868,601 A | 2/1975 | MacAfee ..................... 332/45 |
| 3,949,300 A | 4/1976 | Sadler .......................... 325/31 |
| 3,967,202 A | 6/1976 | Batz ............................. 325/31 |
| 3,980,945 A | 9/1976 | Bickford ...................... 325/30 |
| 3,987,280 A | 10/1976 | Bauer ..................... 235/150.53 |
| 3,991,277 A | 11/1976 | Hirata .................... 179/15 FD |
| 4,003,002 A | 1/1977 | Snijders et al. ............... 332/10 |
| 4,013,966 A | 3/1977 | Campbell ..................... 325/363 |
| 4,017,798 A | 4/1977 | Gordy et al. .................. 325/42 |
| 4,019,140 A | 4/1977 | Swerdlow .................... 322/65 |
| 4,032,847 A | 6/1977 | Unkauf ........................ 325/323 |
| 4,035,732 A | 7/1977 | Lohrmann ................... 325/446 |
| 4,047,121 A | 9/1977 | Campbell ..................... 331/76 |
| 4,051,475 A | 9/1977 | Campbell ..................... 343/180 |
| 4,066,841 A | 1/1978 | Young ...................... 178/66 R |
| 4,066,919 A | 1/1978 | Huntington ................. 307/353 |
| 4,080,573 A | 3/1978 | Howell ........................ 325/439 |
| 4,081,748 A | 3/1978 | Batz ............................. 325/56 |
| 4,130,765 A | 12/1978 | Arakelian et al. ....... 307/220 R |
| 4,130,806 A | 12/1978 | Van Gerwen et al. ...... 325/487 |
| 4,142,155 A | 2/1979 | Adachi ......................... 325/47 |
| 4,170,764 A | 10/1979 | Salz et al. ..................... 332/17 |
| 4,204,171 A | 5/1980 | Sutphin, Jr. ................. 328/167 |
| 4,210,872 A | 7/1980 | Gregorian ..................... 330/9 |
| 4,220,977 A * | 9/1980 | Yamanaka .................. 358/213 |
| 4,245,355 A | 1/1981 | Pascoe et al. ............... 455/326 |
| 4,253,066 A | 2/1981 | Fisher et al. .................. 329/50 |
| 4,253,067 A | 2/1981 | Caples et al. ............... 329/110 |
| 4,253,069 A | 2/1981 | Nossek ........................ 330/107 |
| 4,308,614 A | 12/1981 | Fisher et al. ................ 370/119 |
| 4,320,361 A | 3/1982 | Kikkert .................... 332/16 R |
| 4,320,536 A | 3/1982 | Dietrich ...................... 455/325 |
| 4,334,324 A | 6/1982 | Hoover ....................... 455/333 |
| 4,346,477 A | 8/1982 | Gordy ......................... 455/257 |
| 4,355,401 A | 10/1982 | Ikoma et al. .................. 375/5 |
| 4,356,558 A | 10/1982 | Owen et al. ................. 364/724 |
| 4,360,867 A | 11/1982 | Gonda ........................ 363/158 |
| 4,363,132 A | 12/1982 | Collin .......................... 455/52 |
| 4,365,217 A | 12/1982 | Berger et al. ................ 333/165 |
| 4,369,522 A | 1/1983 | Cerny, Jr. et al. ........... 455/333 |
| 4,370,572 A | 1/1983 | Cosand et al. .............. 307/353 |
| 4,384,357 A | 5/1983 | deBuda et al. |
| 4,389,579 A | 6/1983 | Stein .......................... 307/353 |
| 4,392,255 A | 7/1983 | Del Giudice ............... 455/328 |
| 4,393,395 A | 7/1983 | Hacke et al. ................. 358/23 |
| 4,430,629 A | 2/1984 | Betzl et al. .................. 333/165 |
| 4,446,438 A | 5/1984 | Chang et al. ............... 328/127 |
| 4,456,990 A | 6/1984 | Fisher et al. ................ 370/119 |
| 4,470,145 A | 9/1984 | Williams |
| 4,472,785 A | 9/1984 | Kasuga ....................... 364/718 |
| 4,479,226 A | 10/1984 | Prabhu et al. ................ 375/1 |
| 4,481,490 A | 11/1984 | Huntley ....................... 332/41 |
| 4,481,642 A | 11/1984 | Hanson ........................ 375/9 |
| 4,483,017 A * | 11/1984 | Hampel et al. ............... 382/17 |
| 4,484,143 A | 11/1984 | French et al. ................. 329/50 |
| 4,485,488 A | 11/1984 | Houdart ...................... 455/327 |
| 4,504,803 A | 3/1985 | Lee et al. .................. 332/31 R |
| 4,517,519 A | 5/1985 | Mukaiyama ................ 329/126 |
| 4,517,520 A | 5/1985 | Ogawa ........................ 329/145 |
| 4,518,935 A | 5/1985 | van Roermund ........... 333/173 |
| 4,521,892 A | 6/1985 | Vance et al. .................. 375/88 |
| 4,563,773 A | 1/1986 | Dixon, Jr. et al. .......... 455/327 |
| 4,577,157 A | 3/1986 | Reed .......................... 329/50 |
| 4,583,239 A | 4/1986 | Vance ......................... 375/94 |
| 4,591,736 A | 5/1986 | Hirao et al. ................. 307/267 |
| 4,602,220 A | 7/1986 | Kurihara ..................... 331/19 |
| 4,603,300 A | 7/1986 | Welles, II et al. ............ 329/50 |
| 4,612,464 A | 9/1986 | Ishikawa et al. ............ 307/496 |
| 4,612,518 A | 9/1986 | Gans et al. .................. 332/21 |
| 4,616,191 A | 10/1986 | Galani et al. ................. 331/4 |
| 4,621,217 A | 11/1986 | Saxe et al. .................... 315/1 |
| 4,628,517 A | 12/1986 | Schwarz et al. .............. 375/40 |
| 4,634,998 A | 1/1987 | Crawford ................... 331/1 A |
| 4,648,021 A | 3/1987 | Alberkrack ................. 363/157 |
| 4,651,034 A | 3/1987 | Sato ........................... 307/556 |
| 4,653,117 A | 3/1987 | Heck .......................... 455/209 |
| 4,675,882 A | 6/1987 | Lillie et al. ................... 375/80 |
| 4,688,253 A | 8/1987 | Gumm ......................... 381/7 |
| 4,716,376 A | 12/1987 | Daudelin ..................... 329/107 |
| 4,716,388 A | 12/1987 | Jacobs ........................ 333/173 |
| 4,718,113 A | 1/1988 | Rother et al. ............... 455/209 |
| 4,726,041 A | 2/1988 | Prohaska et al. ............. 375/91 |
| 4,733,403 A | 3/1988 | Simone ...................... 375/103 |
| 4,734,591 A | 3/1988 | Ichitsubo ................. 307/219.1 |
| 4,737,969 A | 4/1988 | Steel et al. .................... 375/67 |
| 4,743,858 A | 5/1988 | Everard ...................... 330/10 |
| 4,745,463 A | 5/1988 | Lu ................................ 358/23 |
| 4,751,468 A | 6/1988 | Agoston ..................... 328/133 |
| 4,757,538 A | 7/1988 | Zink ............................. 381/7 |
| 4,768,187 A | 8/1988 | Marshall .................... 370/69.1 |
| 4,769,612 A | 9/1988 | Tamakoshi et al. ......... 328/167 |
| 4,785,463 A | 11/1988 | Janc et al. ...................... 375/1 |
| 4,791,584 A | 12/1988 | Greivenkamp, Jr. ......... 364/525 |
| 4,801,823 A | 1/1989 | Yokoyama ................. 307/353 |
| 4,806,790 A | 2/1989 | Sone .......................... 307/353 |
| 4,810,904 A | 3/1989 | Crawford ................... 307/353 |
| 4,810,976 A | 3/1989 | Cowley et al. ......... 331/117 R |
| 4,811,362 A | 3/1989 | Yester, Jr. et al. ............ 375/75 |
| 4,816,704 A | 3/1989 | Fiori, Jr. ..................... 307/519 |
| 4,819,252 A | 4/1989 | Christopher ................ 375/122 |
| 4,833,445 A | 5/1989 | Buchele ...................... 341/118 |
| 4,841,265 A | 6/1989 | Watanabe et al. ........... 333/194 |
| 4,855,894 A | 8/1989 | Asahi et al. ................. 363/157 |
| 4,862,121 A | 8/1989 | Hochschild et al. ........ 333/173 |
| 4,868,654 A | 9/1989 | Juri et al. .................... 358/133 |
| 4,870,659 A | 9/1989 | Oishi et al. ................... 375/82 |
| 4,871,987 A | 10/1989 | Kawase ....................... 332/100 |
| 4,885,587 A | 12/1989 | Wiegand et al. ............... 42/14 |
| 4,885,756 A | 12/1989 | Fontanes et al. ............... 42/14 |
| 4,888,557 A | 12/1989 | Puckette, IV et al. ....... 329/341 |
| 4,890,302 A | 12/1989 | Muilwijk ..................... 375/80 |
| 4,893,316 A | 1/1990 | Janc et al. ..................... 375/44 |
| 4,893,341 A | 1/1990 | Gehring ........................ 381/7 |
| 4,894,766 A | 1/1990 | De Agro ..................... 363/159 |
| 4,896,152 A | 1/1990 | Tiemann .................... 340/853 |
| 4,902,979 A | 2/1990 | Puckette, IV ............... 329/343 |

| Patent No. | Date | Inventor | Class |
|---|---|---|---|
| 4,908,579 A | 3/1990 | Tawfik et al. | 328/167 |
| 4,910,752 A | 3/1990 | Yester, Jr. et al. | 375/75 |
| 4,914,405 A | 4/1990 | Wells | 331/25 |
| 4,920,510 A | 4/1990 | Senderowicz et al. | 364/825 |
| 4,922,452 A | 5/1990 | Larsen et al. | 365/45 |
| 4,931,921 A | 6/1990 | Anderson | 363/163 |
| 4,943,974 A | 7/1990 | Motamedi | 375/1 |
| 4,944,025 A | 7/1990 | Gehring et al. | 455/207 |
| 4,955,079 A | 9/1990 | Connerney et al. | 455/325 |
| 4,965,467 A | 10/1990 | Bilterijst | 307/352 |
| 4,967,160 A | 10/1990 | Quievy et al. | 328/16 |
| 4,970,703 A | 11/1990 | Hariharan et al. | 367/138 |
| 4,982,353 A | 1/1991 | Jacob et al. | 364/724.1 |
| 4,984,077 A | 1/1991 | Uchida | 358/140 |
| 4,995,055 A | 2/1991 | Weinberger et al. | 375/5 |
| 5,003,621 A | 3/1991 | Gailus | 455/209 |
| 5,005,169 A | 4/1991 | Bronder et al. | 370/76 |
| 5,006,810 A | 4/1991 | Popescu | 328/167 |
| 5,010,585 A | 4/1991 | Garcia | 455/118 |
| 5,014,304 A | 5/1991 | Nicollini et al. | 379/399 |
| 5,015,963 A | 5/1991 | Sutton | 329/361 |
| 5,016,242 A | 5/1991 | Tang | |
| 5,017,924 A | 5/1991 | Guiberteau et al. | 342/195 |
| 5,020,149 A | 5/1991 | Hemmie | 455/325 |
| 5,020,154 A | 5/1991 | Zierhut | 455/608 |
| 5,052,050 A | 9/1991 | Collier et al. | 455/296 |
| 5,065,409 A | 11/1991 | Hughes et al. | 375/91 |
| 5,083,050 A | 1/1992 | Vasile | 307/529 |
| 5,091,921 A | 2/1992 | Minami | 375/88 |
| 5,095,533 A | 3/1992 | Loper et al. | 455/245 |
| 5,095,536 A | 3/1992 | Loper | 455/324 |
| 5,111,152 A | 5/1992 | Makino | 329/300 |
| 5,113,094 A | 5/1992 | Grace et al. | 307/529 |
| 5,113,129 A | 5/1992 | Hughes | 323/316 |
| 5,115,409 A | 5/1992 | Stepp | 364/841 |
| 5,122,765 A | 6/1992 | Pataut | 332/105 |
| 5,124,592 A | 6/1992 | Hagino | 307/520 |
| 5,126,682 A | 6/1992 | Weinberg et al. | 329/304 |
| 5,136,267 A | 8/1992 | Cabot | 333/167 |
| 5,140,705 A | 8/1992 | Kosuga | 455/318 |
| 5,150,124 A | 9/1992 | Moore et al. | 342/68 |
| 5,151,661 A | 9/1992 | Caldwell et al. | 328/14 |
| 5,157,687 A | 10/1992 | Tymes | 375/1 |
| 5,159,710 A | 10/1992 | Cusdin | 455/304 |
| 5,170,414 A | 12/1992 | Silvian | 375/59 |
| 5,172,070 A | 12/1992 | Hiraiwa et al. | 329/304 |
| 5,191,459 A | 3/1993 | Thompson et al. | 359/133 |
| 5,204,642 A | 4/1993 | Asghar et al. | 331/135 |
| 5,212,827 A | 5/1993 | Meszko et al. | 455/219 |
| 5,214,787 A | 5/1993 | Karkota, Jr. | 455/3.2 |
| 5,220,583 A | 6/1993 | Solomon | 375/82 |
| 5,220,680 A | 6/1993 | Lee | 455/102 |
| 5,222,144 A | 6/1993 | Whikehart | 381/15 |
| 5,230,097 A | 7/1993 | Currie et al. | 455/226.1 |
| 5,239,686 A | 8/1993 | Downey | 455/78 |
| 5,241,561 A | 8/1993 | Barnard | 375/1 |
| 5,249,203 A | 9/1993 | Loper | 375/97 |
| 5,251,218 A | 10/1993 | Stone et al. | 370/120 |
| 5,251,232 A | 10/1993 | Nonami | 375/5 |
| 5,260,970 A | 11/1993 | Henry et al. | 375/10 |
| 5,263,194 A | 11/1993 | Ragan | 455/316 |
| 5,263,196 A | 11/1993 | Jasper | 455/324 |
| 5,267,023 A | 11/1993 | Kawasaki | 358/23 |
| 5,278,826 A | 1/1994 | Murphy et al. | 370/76 |
| 5,282,023 A | 1/1994 | Scarpa | 358/36 |
| 5,287,516 A | 2/1994 | Schaub | 375/88 |
| 5,293,398 A | 3/1994 | Hamao et al. | 375/1 |
| 5,303,417 A | 4/1994 | Laws | 455/314 |
| 5,307,517 A | 4/1994 | Rich | 455/306 |
| 5,315,583 A | 5/1994 | Murphy et al. | 370/18 |
| 5,319,799 A | 6/1994 | Morita | 455/78 |
| 5,321,852 A | 6/1994 | Seong | 455/182.1 |
| 5,325,204 A | 6/1994 | Scarpa | 348/607 |
| 5,337,014 A | 8/1994 | Najle et al. | 324/613 |
| 5,339,054 A | 8/1994 | Taguchi | 322/100 |
| 5,339,459 A | 8/1994 | Schiltz et al. | 455/333 |
| 5,353,306 A | 10/1994 | Yamamoto | 375/14 |
| 5,355,114 A | 10/1994 | Sutterlin et al. | 340/310 A |
| 5,361,408 A | 11/1994 | Watanabe et al. | 455/324 |
| 5,369,404 A | 11/1994 | Galton | 341/143 |
| 5,369,800 A | 11/1994 | Takagi et al. | 455/59 |
| 5,375,146 A | 12/1994 | Chalmers | 375/103 |
| 5,379,040 A | 1/1995 | Mizomoto et al. | 341/143 |
| 5,379,141 A | 1/1995 | Thompson et al. | 359/125 |
| 5,388,063 A | 2/1995 | Takatori et al. | 364/724.17 |
| 5,390,364 A | 2/1995 | Webster et al. | 455/52.3 |
| 5,400,084 A | 3/1995 | Scarpa | 348/624 |
| 5,404,127 A | 4/1995 | Lee et al. | 340/310.02 |
| 5,410,326 A | 4/1995 | Goldstein | |
| 5,410,541 A | 4/1995 | Hotto | 370/76 |
| 5,410,743 A | 4/1995 | Seely et al. | 455/326 |
| 5,412,352 A | 5/1995 | Graham | 332/103 |
| 5,416,803 A | 5/1995 | Janer | 375/324 |
| 5,422,913 A | 6/1995 | Wilkinson | 455/126 |
| 5,423,082 A | 6/1995 | Cygan et al. | 455/126 |
| 5,428,638 A | 6/1995 | Cioffi et al. | 375/224 |
| 5,428,640 A | 6/1995 | Townley | 375/257 |
| 5,434,546 A | 7/1995 | Palmer | 332/151 |
| 5,438,692 A | 8/1995 | Mohindra | 455/324 |
| 5,444,415 A | 8/1995 | Dent et al. | 329/302 |
| 5,444,416 A | 8/1995 | Ishikawa et al. | 329/341 |
| 5,444,865 A | 8/1995 | Heck et al. | 455/86 |
| 5,446,421 A | 8/1995 | Kechkaylo | 332/100 |
| 5,446,422 A | 8/1995 | Mattila et al. | 332/103 |
| 5,448,602 A | 9/1995 | Ohmori et al. | 375/347 |
| 5,451,899 A | 9/1995 | Lawton | 329/302 |
| 5,454,007 A | 9/1995 | Dutta | 375/322 |
| 5,454,009 A | 9/1995 | Fruit et al. | 372/202 |
| 5,463,356 A | 10/1995 | Palmer | 332/117 |
| 5,463,357 A | 10/1995 | Hobden | 332/151 |
| 5,465,071 A | 11/1995 | Kobayashi et al. | 329/315 |
| 5,465,410 A | 11/1995 | Hiben et al. | 455/266 |
| 5,465,415 A | 11/1995 | Bien | 455/326 |
| 5,465,418 A | 11/1995 | Zhou et al. | 455/332 |
| 5,471,162 A | 11/1995 | McEwan | 327/92 |
| 5,479,120 A | 12/1995 | McEwan | 327/91 |
| 5,479,447 A | 12/1995 | Chow et al. | 375/260 |
| 5,483,193 A | 1/1996 | Kennedy et al. | 329/300 |
| 5,483,549 A | 1/1996 | Weinberg et al. | 375/200 |
| 5,483,691 A | 1/1996 | Heck et al. | 455/234.2 |
| 5,483,695 A | 1/1996 | Pardoen | |
| 5,490,173 A | 2/1996 | Whikehart et al. | 375/316 |
| 5,493,581 A | 2/1996 | Young et al. | 375/339 |
| 5,493,721 A | 2/1996 | Reis | 455/339 |
| 5,495,200 A | 2/1996 | Kwan et al. | 327/554 |
| 5,495,202 A | 2/1996 | Hsu | 327/113 |
| 5,495,500 A | 2/1996 | Jovanovich et al. | 375/206 |
| 5,499,267 A | 3/1996 | Ohe et al. | 375/206 |
| 5,500,758 A | 3/1996 | Thompson et al. | 359/189 |
| 5,513,389 A | 4/1996 | Reeser et al. | 455/311 |
| 5,515,014 A | 5/1996 | Troutman | 332/178 |
| 5,517,688 A | 5/1996 | Fajen et al. | 455/333 |
| 5,519,890 A | 5/1996 | Pinckley | 455/307 |
| 5,523,719 A | 6/1996 | Longo et al. | 327/557 |
| 5,523,726 A | 6/1996 | Kroeger et al. | 332/103 |
| 5,523,760 A | 6/1996 | McEwan | 342/89 |
| 5,539,770 A | 7/1996 | Ishigaki | 375/206 |
| 5,555,453 A | 9/1996 | Kajimoto et al. | 455/266 |
| 5,557,641 A | 9/1996 | Weinberg | 375/295 |
| 5,557,642 A | 9/1996 | Williams | 375/316 |
| 5,563,550 A | 10/1996 | Toth | 329/347 |
| 5,564,097 A | 10/1996 | Swanke | |
| 5,574,755 A | 11/1996 | Persico | 375/295 |
| 5,579,341 A | 11/1996 | Smith et al. | 375/267 |
| 5,579,347 A | 11/1996 | Lindquist et al. | 375/346 |
| 5,584,068 A | 12/1996 | Mohindra | 455/324 |
| 5,592,131 A | 1/1997 | Labreche et al. | 332/103 |
| 5,600,680 A | 2/1997 | Mishima et al. | |
| 5,602,847 A | 2/1997 | Pagano et al. | 370/484 |
| 5,602,868 A | 2/1997 | Wilson | 375/219 |
| 5,604,592 A | 2/1997 | Kotidis et al. | 356/357 |
| 5,604,732 A | 2/1997 | Kim et al. | 370/342 |

| Patent | Date | Inventor | Class |
|---|---|---|---|
| 5,606,731 A | 2/1997 | Pace et al. | |
| 5,608,531 A | 3/1997 | Honda et al. | 386/1 |
| 5,610,946 A | 3/1997 | Tanaka et al. | 375/269 |
| RE35,494 E | 4/1997 | Nicollini | 327/554 |
| 5,617,451 A | 4/1997 | Mimura et al. | 375/340 |
| 5,619,538 A | 4/1997 | Sempel et al. | 375/328 |
| 5,621,455 A | 4/1997 | Rogers et al. | 348/6 |
| 5,628,055 A | 5/1997 | Stein | 455/89 |
| 5,630,227 A | 5/1997 | Bella et al. | 455/324 |
| 5,633,815 A | 5/1997 | Young | |
| 5,638,396 A | 6/1997 | Klimek | 372/92 |
| 5,640,415 A | 6/1997 | Pandula | 375/202 |
| 5,640,424 A | 6/1997 | Banavong et al. | 375/316 |
| 5,640,428 A | 6/1997 | Abe et al. | 375/334 |
| 5,640,698 A | 6/1997 | Shen et al. | 455/323 |
| 5,648,985 A | 7/1997 | Bjerede et al. | 375/219 |
| 5,650,785 A | 7/1997 | Rodal | 342/357 |
| 5,661,424 A | 8/1997 | Tang | 327/105 |
| 5,663,878 A | 9/1997 | Walker | 363/159 |
| 5,663,986 A | 9/1997 | Striffler | 375/260 |
| 5,668,836 A | 9/1997 | Smith et al. | 375/316 |
| 5,675,392 A | 10/1997 | Nayebi et al. | 348/584 |
| 5,678,220 A | 10/1997 | Fournier | 455/302 |
| 5,680,078 A | 10/1997 | Ariie | 332/178 |
| 5,680,418 A | 10/1997 | Croft et al. | 375/346 |
| 5,689,413 A | 11/1997 | Jaramillo et al. | 363/146 |
| 5,694,096 A | 12/1997 | Ushiroku et al. | 333/195 |
| 5,699,006 A | 12/1997 | Zele et al. | 327/341 |
| 5,705,949 A | 1/1998 | Alelyunas et al. | 329/304 |
| 5,705,955 A | 1/1998 | Freeburg et al. | 331/14 |
| 5,710,998 A | 1/1998 | Opas | 455/324 |
| 5,714,910 A | 2/1998 | Skoczen et al. | 331/3 |
| 5,715,281 A | 2/1998 | Bly et al. | 375/344 |
| 5,721,514 A | 2/1998 | Crockett et al. | 331/3 |
| 5,724,002 A | 3/1998 | Hulick | 329/361 |
| 5,724,653 A | 3/1998 | Baker et al. | 455/296 |
| 5,729,577 A | 3/1998 | Chen | 375/334 |
| 5,729,829 A | 3/1998 | Talwar et al. | 455/63 |
| 5,732,333 A | 3/1998 | Cox et al. | 455/126 |
| 5,736,895 A | 4/1998 | Yu et al. | 327/554 |
| 5,737,035 A | 4/1998 | Rotzoll | 348/725 |
| 5,742,189 A | 4/1998 | Yoshida et al. | 327/113 |
| 5,748,683 A | 5/1998 | Smith et al. | 375/347 |
| 5,757,870 A | 5/1998 | Miya et al. | 375/367 |
| RE35,829 E | 6/1998 | Sanderford, Jr. | 375/200 |
| 5,760,645 A | 6/1998 | Comte et al. | 329/304 |
| 5,764,087 A | 6/1998 | Clark | 327/105 |
| 5,767,726 A | 6/1998 | Wang | 327/356 |
| 5,768,118 A | 6/1998 | Faulk et al. | 363/72 |
| 5,768,323 A | 6/1998 | Kroeger et al. | 375/355 |
| 5,770,985 A | 6/1998 | Ushiroku et al. | 333/193 |
| 5,771,442 A | 6/1998 | Wang et al. | 455/93 |
| 5,777,692 A | 7/1998 | Ghosh | 348/725 |
| 5,777,771 E | 7/1998 | Smith | 359/180 |
| 5,778,022 A | 7/1998 | Walley | 375/206 |
| 5,786,844 A | 7/1998 | Rogers et al. | 348/6 |
| 5,793,801 A | 8/1998 | Fertner | 375/219 |
| 5,793,818 A | 8/1998 | Claydon et al. | 375/326 |
| 5,801,654 A | 9/1998 | Traylor | 341/144 |
| 5,802,463 A | 9/1998 | Zuckerman | 455/208 |
| 5,809,060 A | 9/1998 | Cafarella et al. | 375/206 |
| 5,812,546 A | 9/1998 | Zhou et al. | 370/342 |
| 5,818,582 A | 10/1998 | Fernandez et al. | 356/318 |
| 5,818,869 A | 10/1998 | Miya et al. | 375/206 |
| 5,825,254 A | 10/1998 | Lee | 331/25 |
| 5,834,985 A | 11/1998 | Sundegård | 332/100 |
| 5,841,324 A | 11/1998 | Williams | 331/17 |
| 5,841,811 A | 11/1998 | Song | 375/235 |
| 5,844,449 A | 12/1998 | Abeno et al. | 332/105 |
| 5,859,878 A | 1/1999 | Phillips et al. | 375/316 |
| 5,864,754 A | 1/1999 | Hotto | 455/280 |
| 5,870,670 A | 2/1999 | Ripley et al. | |
| 5,872,446 A | 2/1999 | Cranford, Jr. et al. | 323/315 |
| 5,881,375 A | 3/1999 | Bonds | 455/118 |
| 5,883,548 A | 3/1999 | Assard et al. | 329/306 |
| 5,892,380 A | 4/1999 | Quist | 327/172 |
| 5,894,239 A | 4/1999 | Bonaccio et al. | 327/176 |
| 5,894,496 A | 4/1999 | Jones | 455/126 |
| 5,896,562 A | 4/1999 | Heinonen | 455/76 |
| 5,898,912 A | 4/1999 | Heck et al. | |
| 5,900,747 A | 5/1999 | Brauns | 327/9 |
| 5,901,054 A | 5/1999 | Leu et al. | 363/41 |
| 5,901,187 A | 5/1999 | Iinuma | 375/347 |
| 5,901,344 A | 5/1999 | Opas | 455/76 |
| 5,901,347 A | 5/1999 | Chambers et al. | 455/234.1 |
| 5,901,348 A | 5/1999 | Bang et al. | 455/254 |
| 5,901,349 A | 5/1999 | Guegnaud et al. | 455/302 |
| 5,903,178 A | 5/1999 | Miyatsuji et al. | 327/308 |
| 5,903,187 A | 5/1999 | Claverie et al. | 329/342 |
| 5,903,196 A | 5/1999 | Salvi et al. | 331/16 |
| 5,903,421 A | 5/1999 | Furutani et al. | 361/58 |
| 5,903,553 A | 5/1999 | Sakamoto et al. | 370/338 |
| 5,903,595 A | 5/1999 | Suzuki | 375/207 |
| 5,903,609 A | 5/1999 | Kool et al. | 375/261 |
| 5,903,827 A | 5/1999 | Kennan et al. | 455/326 |
| 5,903,854 A | 5/1999 | Abe et al. | 455/575 |
| 5,905,449 A | 5/1999 | Tsubouchi et al. | 340/925.69 |
| 5,907,149 A | 5/1999 | Marckini | 235/487 |
| 5,907,197 A | 5/1999 | Faulk | 307/119 |
| 5,909,447 A | 6/1999 | Cox et al. | 370/508 |
| 5,911,116 A | 6/1999 | Nosswitz | 455/83 |
| 5,911,123 A | 6/1999 | Shaffer et al. | 455/554 |
| 5,914,622 A | 6/1999 | Inoue | 327/172 |
| 5,915,278 A | 6/1999 | Mallick | 73/658 |
| 5,920,199 A | 7/1999 | Sauer | 324/678 |
| 5,926,065 A | 7/1999 | Wakai et al. | 329/304 |
| 5,933,467 A | 8/1999 | Sehier et al. | 375/350 |
| 5,937,013 A | 8/1999 | Lam et al. | |
| 5,943,370 A | 8/1999 | Smith | 375/334 |
| 5,945,660 A | 8/1999 | Nakasuji et al. | 235/462.46 |
| 5,952,895 A | 9/1999 | McCune, Jr. et al. | 332/128 |
| 5,953,642 A | 9/1999 | Feldtkeller et al. | 455/195.1 |
| 5,956,025 A | 9/1999 | Goulden et al. | |
| 5,959,850 A | 9/1999 | Lim | 363/17 |
| 5,960,033 A | 9/1999 | Shibano et al. | 375/207 |
| 6,014,551 A | 1/2000 | Pesola et al. | |
| 6,028,887 A | 2/2000 | Harrison et al. | 375/206 |
| 6,041,073 A | 3/2000 | Davidovici et al. | 375/148 |
| 6,049,706 A | 4/2000 | Cook et al. | 455/313 |
| 6,054,889 A | 4/2000 | Kobayashi | 327/357 |
| 6,061,551 A | 5/2000 | Sorrells et al. | 455/118 |
| 6,061,555 A | 5/2000 | Bultman et al. | 455/313 |
| 6,073,001 A | 6/2000 | Sokoler | |
| 6,081,691 A | 6/2000 | Renard et al. | 455/12.1 |
| 6,084,922 A | 7/2000 | Zhou et al. | 375/316 |
| 6,085,073 A | 7/2000 | Palermo et al. | |
| 6,091,939 A | 7/2000 | Banh | 455/102 |
| 6,091,940 A | 7/2000 | Sorrells et al. | 455/118 |
| 6,091,941 A | 7/2000 | Moriyama et al. | 455/126 |
| 6,098,046 A | 8/2000 | Cooper et al. | |
| 6,098,886 A | 8/2000 | Swift et al. | 235/472.01 |
| 6,121,819 A | 9/2000 | Traylor | 327/359 |
| 6,125,271 A | 9/2000 | Rowland et al. | 455/313 |
| 6,127,941 A | 10/2000 | Van Ryzin | |
| 6,144,236 A | 11/2000 | Vice et al. | 327/113 |
| 6,144,846 A | 11/2000 | Durec | 455/323 |
| 6,147,340 A | 11/2000 | Levy | 250/214 R |
| 6,147,763 A | 11/2000 | Steinlechner | 356/484 |
| 6,150,890 A | 11/2000 | Damgaard et al. | 331/14 |
| 6,175,728 B1 | 1/2001 | Mitama | 455/323 |
| 6,215,475 B1 | 4/2001 | Meyerson et al. | 345/173 |
| 6,230,000 B1 | 5/2001 | Tayloe | |
| 6,266,518 B1 | 7/2001 | Sorrells et al. | 455/118 |
| 6,314,279 B1 | 11/2001 | Mohindra | |
| 6,330,244 B1 | 12/2001 | Swartz et al. | |
| 6,353,735 B1 | 3/2002 | Sorrells et al. | 455/118 |
| 6,370,371 B1 | 4/2002 | Sorrells et al. | 455/323 |
| 6,400,963 B1 | 6/2002 | Glöckler et al. | |
| 6,542,722 B1 | 4/2003 | Sorrells et al. | |
| 6,560,301 B1 | 5/2003 | Cook et al. | |

FOREIGN PATENT DOCUMENTS

| | | | | |
|---|---|---|---|---|
| DE | 196 27 640 A1 | 1/1997 | | H03D/7/12 |
| DE | 197 35 798 C1 | 7/1998 | | H04L/27/00 |
| EP | 0 087 336 A1 | 8/1983 | | H03D/7/12 |
| EP | 0 099 265 A1 | 1/1984 | | H03D/3/04 |
| EP | 0 035 166 A1 | 9/1984 | | H04B/1/26 |
| EP | 0 254 844 A2 | 2/1988 | | H03D/7/00 |
| EP | 0 276 130 A3 | 7/1988 | | H03D/7/00 |
| EP | 0 276 130 A2 | 7/1988 | | H03D/7/00 |
| EP | 0 193 899 B1 | 6/1990 | | G01S/7/52 |
| EP | 0 380 351 A2 | 8/1990 | | H03H/17/04 |
| EP | 0 380 351 A3 | 2/1991 | | H03H/17/04 |
| EP | 0 411 840 A2 | 2/1991 | | G01R/33/36 |
| EP | 0 423 718 A2 | 4/1991 | | H04N/7/01 |
| EP | 0 411 840 A3 | 7/1991 | | G01R/33/36 |
| EP | 0 486 095 A1 | 5/1992 | | H03D/3/00 |
| EP | 0 423 718 A3 | 8/1992 | | H04N/7/01 |
| EP | 0 512 748 A2 | 11/1992 | | H04N/9/64 |
| EP | 0 529 836 A1 | 3/1993 | | H03L/7/089 |
| EP | 0 548 542 A1 | 6/1993 | | H03B/19/14 |
| EP | 0 512 748 A3 | 7/1993 | | H04N/9/64 |
| EP | 0 560 228 A1 | 9/1993 | | H03D/7/12 |
| EP | 0 632 288 A2 | 1/1995 | | G01S/13/75 |
| EP | 0 632 577 A1 | 1/1995 | | H03D/7/16 |
| EP | 0 643 477 A3 | 3/1995 | | H03D/7/16 |
| EP | 0 643 477 A2 | 3/1995 | | H03D/7/16 |
| EP | 0 411 840 B1 | 10/1995 | | G01R/33/36 |
| EP | 0 696 854 A1 | 2/1996 | | H04B/1/26 |
| EP | 0 087 336 B1 | 7/1996 | | H03D/7/12 |
| EP | 0 632 288 A3 | 7/1996 | | G01S/13/75 |
| EP | 0 732 803 A1 | 9/1996 | | H03D/3/00 |
| EP | 0 486 095 B1 | 2/1997 | | H03D/3/00 |
| EP | 0 782 275 A2 | 7/1997 | | H04B/7/02 |
| EP | 0 785 635 A1 | 7/1997 | | H04B/1/713 |
| EP | 0 789 449 A2 | 8/1997 | | H03D/7/12 |
| EP | 0 795 955 A3 | 9/1997 | | H03D/13/00 |
| EP | 0 795 955 A2 | 9/1997 | | H03D/13/00 |
| EP | 0 795 978 A2 | 9/1997 | | H04L/5/06 |
| EP | 0 817 369 A2 | 1/1998 | | H03D/7/00 |
| EP | 0 817 369 A3 | 1/1998 | | H03D/7/00 |
| EP | 0 837 565 A1 | 4/1998 | | H04B/1/69 |
| EP | 0 862 274 A1 | 9/1998 | | H03M/1/06 |
| EP | 0 874 499 A2 | 10/1998 | | H04L/25/06 |
| EP | 0 512 748 B1 | 11/1998 | | H04N/9/64 |
| EP | 0 877 476 A1 | 11/1998 | | H03D/7/16 |
| EP | 0 977 351 A1 | 2/2000 | | H03D/7/16 |
| FR | 2 245 130 | 4/1975 | | H03K/5/13 |
| FR | 2 669 787 A1 | 5/1992 | | H03D/7/14 |
| FR | 2 743 231 A1 | 7/1997 | | H04B/7/12 |
| GB | 2 161 344 A | 1/1986 | | H04B/7/12 |
| GB | 2 215 945 A | 9/1989 | | H04L/27/00 |
| GB | 2 324 919 A | 11/1998 | | H03D/7/18 |
| JP | 47-2314 | 2/1972 | | |
| JP | 55-66057 | 5/1980 | | G06K/7/10 |
| JP | 56-114451 | 9/1981 | | H04B/7/02 |
| JP | 58-7903 | 1/1983 | | H03C/1/02 |
| JP | 58-133004 | 8/1983 | | H03D/1/00 |
| JP | 59-144249 | 8/1984 | | H04L/27/00 |
| JP | 60-58705 | 4/1985 | | H03D/7/00 |
| JP | 60-130203 | 7/1985 | | H03D/7/00 |
| JP | 63-54002 | 3/1988 | | H03B/19/114 |
| JP | 63-65587 | 3/1988 | | G06K/7/10 |
| JP | 63-153691 | 6/1988 | | G06K/7/00 |
| JP | 2-39632 | 2/1990 | | H04B/7/12 |
| JP | 2-131629 | 5/1990 | | H04B/7/12 |
| JP | 2-276351 | 11/1990 | | H04L/27/22 |
| JP | 4-123614 | 4/1992 | | H03K/19/0175 |
| JP | 4-127601 | 4/1992 | | H03D/7/00 |
| JP | 5-175730 | 7/1993 | | H03D/1/00 |
| JP | 5-175734 | 7/1993 | | H03D/3/00 |
| JP | 5-327356 | 12/1993 | | H03D/7/00 |
| JP | 6-237276 | 8/1994 | | H04L/27/20 |
| JP | 7-154344 | 6/1995 | | H04B/14/06 |
| JP | 7-307620 | 11/1995 | | H03D/1/18 |
| JP | 8-23359 | 1/1996 | | H04L/27/20 |
| JP | 8-32556 | 2/1996 | | H04L/1/04 |
| JP | 8-139524 | 5/1996 | | H03D/7/00 |
| WO | WO 80/01633 A1 | 8/1980 | | H04J/1/08 |
| WO | WO 91/18445 A1 | 11/1991 | | H03D/7/18 |
| WO | WO 94/05087 A1 | 3/1994 | | H03M/1/00 |
| WO | WO 95/01006 A1 | 1/1995 | | H03M/1/66 |
| WO | WO 96/02977 A1 | 2/1996 | | H04B/1/26 |
| WO | WO 96/08078 A1 | 3/1996 | | H03D/3/00 |
| WO | WO 96/37950 A1 | 12/1996 | | H04B/1/26 |
| WO | WO 97/08839 A2 | 3/1997 | | H05B/1/04 |
| WO | WO 97/08839 A3 | 3/1997 | | H04B/1/04 |
| WO | WO 97/38490 A1 | 10/1997 | | H03K/7/00 |
| WO | WO 98/00953 A1 | 1/1998 | | H04L/27/26 |
| WO | WO 98/24201 A1 | 6/1998 | | H04H/1/00 |
| WO | WO 98/40968 A3 | 9/1998 | | H03L/7/08 |
| WO | WO 98/40968 A2 | 9/1998 | | H03L/7/08 |
| WO | WO 99/23755 A1 | 5/1999 | | H03D/7/16 |

OTHER PUBLICATIONS

English–language Abstract of Japanese Patent Publication No. 05–327356, from http://www1.ipdl.jpo.go.jp, 1 page (Dec. 10, 1993 –Date of publication of application).

Tayloe, D., "A Low–noise, High–performance Zero IF Quadrature Detector/Preamplifier," *RF Design*, Primedia Business Magazines & Media, Inc., pp. 58, 60, 62 and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117–120 (Apr. 1996).

Simoni, A. et al., "A Digital Camera for Machine Vision," *20th International Conference on Industrial Electronics, Control and Instrumentation*, IEEE, pp. 879–883 (Sep. 1994).

Stewart, R.W. and Pfann, E., "Oversampling and sigma–delta strategies for data conversion," *Electronics & Communication Engineering Journal*, IEEE, pp. 37–47 (Feb. 1998).

Rudell, J.C. et al., "A 1.9–Ghz Wide–Band IF Double Conversion CMOS Receiver for Cordless Telephone Applications," *IEEE Journal of Solid–State Circuits*, IEEE, vol. 32, No. 12, pp. 2071–2088 (Dec. 1997).

Akos, D.M. et al., "Direct Bandpass Sampling of Multiple Distinct RF Signals," *IEEE Transactions on Communications*, vol. 47, No. 7, pp. 983–988 (Jul. 1999).

Patel, M. et al., "Bandpass Sampling for Software Radio Receivers, and the Effect of Oversampling on Aperture Jitter," *VTC 2002*, IEEE, pp. 1901–1905 (2002).

Translation of Japanese Patent Publication No. 60–130203, 3 pages.

Razavi, B., A 900–MHz/1.8–Ghz CMOS Transmitter for Dual–Band Applications, *Symposium on VLSI Circuits Digest of Technical Papers*, IEEE, pp. 128–131 (1998).

Ritter, G.M., "SDA, A New Solution for Transceivers," *16th European Microwave Conference, Microwave Exhibitions and Publishers*, pp. 729–733 (Sep. 8, 1986).

DIALOG File 351 (Derwent WPI) English Language Patent Abstract for FR 2 669 787, 1 page (May 29, 1992—Date of publicaton of application).

U.S. patent application Ser. No. 10/086,367, Sorrells et al., filing date Mar. 4, 2002.

Aghvami, H. et al., "Land Mobile Satellites Using the Highly Elliptic Orbits—The UK T–SAT Mobile Payload," *Fourth International Conference on Satellite Systems for Mobile Communications and Navigation*, IEE, pp. 147–153 (Oct. 17–19, 1988).

Akers, N.P. et al., "RF Smapling Gates: a Brief Review," *IEE Proceedings*, IEE, vol. 133, Part A, No. 1, pp. 45–49 (Jan. 1986).

Al–Ahmad, H.A.M. et al., "Doppler Frequency Correction for a Non–Geostationary Communications Satellite. Techniques for CERS and T–SAT," *Electronics Division Colloquium on Low Noise Oscillators and Synthesizers*, IEE, pp. 4/1–4/5 (Jan. 23, 1986).

Ali, I. et al., "Doppler Characterization for LEO Satellites," *IEEE Transactions on Communications*, IEEE, vol. 46, No. 3, pp. 309–313 (Mar. 1998).

Allan, D.W., "Statistics of Atomic Frequency Standards," *Proceedings of the IEEE Special Issue on Frequency Stability*, IEEE, pp. 221–230 (Feb. 1966).

Allstot, D.J. et al., "MOS Switched Capacitor Ladder Filters," *IEEE Journal of Solid–State Circuits*, IEEE vol. SC–13, No. 6, pp. 806–814 (Dec. 1978).

Allstot, D.J. and Black Jr. W.C., "Technological Design Considerations for Monolithic MOS Switched–Capacitor Filtering Systems," *Proceedings of the IEEE*, IEEE, vol. 71, No. 8, pp. 967–986 (Aug. 1983).

Alouini, M. et al., "Channel Characterization and Modeling for Ka–Band Very Small Aperture Terminals," *Proceedings Of the IEEE*, IEEE, vol. 85, No. 6, pp. 981–997 (Jun. 1997).

Andreyev, G.A. and Ogarev, S.A., "Phase Distortions of Keyed Millimeter–Wave Signals in the Case of Propagation in a Turbulent Atmosphere," *Telecommunications and Radio Engineering*, Scripta Technica, vol. 43, No. 12, pp. 87–90 (Dec. 1988).

Antonetti, A. et al., "Optoelectronic Sampling in the Picosecond Range," *Optics Communications*, North–Holland Publishing Company, vol. 21, No. 2, pp. 211–214 (May 1977).

Austin, J. et al., "Doppler Correction of the Telecommunication Payload Oscillators in the UK T–SAT," *18th European Microwave Conference*, Microwave Exhibition and Publishers Ltd., pp. 851–857 (Sep. 12–15, 1988).

Auston, D.H., "Picosecond optoelectronic switching and gating in silicon," *Applied Physics Letters*, American Institute of Physics, vol. 26, No. 3, pp. 101–103 (Feb. 1, 1975).

Baher, H., "Transfer Functions for Switched–Capacitor and Wave Digital Filters," *IEEE Transctions on Circuits and Systems*, IEEE Circuits and Systems Society, vol. CAS–33, No. 11, pp. 1138–1142 (Nov. 1986).

Baines, R., "The DSP Bottleneck,"*IEEE Communications Magazine*, IEEE Communications Society, pp. 46–54 (May 1995).

Banjo, O.P. and Vilar, E., "Binary Error Probabilities on Earth–Space Links Subjected to Scintillation Fading," *Electronics Letters*, IEE, vol. 21, No. 7, pp. 296–297 (Mar. 28, 1985).

Banjo, O.P. and Vilar, E., "The Dependence of Slant Path Amplitude Scintillations on Various Meteorological Parameters, " *Fifth International Conference on Antennas and Propagation (ICAP 87) Part 2: Propagation*, IEE, pp. 277–280 (Mar. 30–Apr. 2, 1987).

Banjo, O.P. and Vilar, E. "Measurement and Modeling of Amplitude Scintillations on Low–Elevation Earth–Space Paths and Impact on Communications Systems," *IEEE Transactions on Communications*, IEEE Communications Society, vol. COM–34, No. 8, pp. 774–780 (Aug. 1986).

Banjo, O.P. et al., "Tropospheric Amplitude Spectra Due to Absorption and Scattering in Earth–Space Paths," *Fourth International Conference on Antennas and Propagation (ICAP 85)*, IEE, pp. 77–82 (Apr. 16–19, 1985).

Basili, P. et al., "Case Study of Intense Scintillation Events on the OTS Path,"*IEEE Transactions on Antennas and Propagation*, IEEE, vol. 38, No. 1, pp. 107–113 (Jan. 1990).

Basili, P. et al., "Observations of High $C^2$ and Turbulent Path Length on OTS Space–Earth Link," *Electronics Letters*, IEE, vol. 24, No. 17, pp. 1114–1116 (Aug. 18, 1988).

Blakey, J.R. et al., "Measurement of Atmospheric Millimetre–Wave Phase Scintillations in an Absorption Region," *Electronics Letters*, IEE, vol. 21, No. 11, pp. 486–487 (May 23, 1985).

Burgueño, A. et al., "Influence of rain gauge integration time on the rain rate statistics used in microwave communications," *annales des tèlècommuniations*, International Union of Radio Science, pp. 522–527 (Sep./Oct. 1988).

Burgueño, A. et al., "Long–Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198–201 (Mar. 30–Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation*, IEE, pp. 297–301 (Apr. 4–7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359–1366 (Sep. 1990).

Catalan, C. and Vilar, E., "Approach for satellite slant path remote sensing,"*Electronic Letters*, IEE, vol. 34, No. 12, pp. 1238–1240 (Jun. 11, 1998).

Chan, P. et al., "A Highly Linear 1–GHz CMOS Downconversion Mixer," *European Solid State Circuits Conference*, IEEE Communication Society, pp. 210–213 (Sep. 22–24, 1993).

Copy of Declaration of Michael J. Bultman filed in patent application Ser. No. 09/176,022, which is directed to related subject matter.

Copy of Declaration of Robert W. Cook filed in patent application Ser. No. 09/176,022, which is directed to related subject matter.

Copy of Declaration of Alex Holtz filed in patent application Ser. No. 09/176,022, which is directed to related subject matter.

Copy of Declaration of Richard C. Looke filed in patent application Ser. No. 09/176,022, which is directed to related subject matter.

Copy of Declaration of Charley D. Moses, Jr. filed in patent application Ser. No. 09/176,022, which is directed to related subject matter.

Copy of Declaration of Jeffrey L. Parker and David F. Sorrells, with attachment Exhibit 1, filed in patent application Ser. No. 09/176,022, which is directed to related subject matter.

Dewey, R.J. and Collier C.J., "Multi–Mode Radio Receiver," *Electronics Division Colloquium on Digitally Implemented Radios*, IEE, pp. 3/1–3/5 (Oct. 18, 1985).

DIALOG File 347 (JAPIO) English Language Patent Abstract for JP 2–276351, 1 page (Nov. 13, 1990—Date of publication of application).

DIALOG File 347 (JAPIO) English Language Patent Abstract for JP 2–131629, 1 page (May 21, 1990—Date of publication of application).

DIALOG File 347 (JAPIO) English Language Patent Abstract for JP 2–39632, 1 page (Feb. 8, 1990—Date of publication of application).

DIALOG File 348 (European Patents) English Language Patent Abstract for EP 0 785 635 A1, 3 pages (Dec. 26, 1996—Date of publication of application).

DIALOG File 348 (European Patents) English Language Patent Abstracts for EP 35166 A1, 2 pages (Feb. 18, 1981—Date of publication of application).

"DSO takes rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET–Less Sample–and–Hold with High Charge–to–Droop Current Ratio, " *IEEE Journal of Solid–State Circuits*, IEEE, vol. SC–13, No. 6, pp. 864–873 (Dec. 1978).

Faulkner, N.D. and Vilar, E., "Subharmonic Sampling for the Measurement of Short Term Stability of Microwave Oscillators," *IEEE Transactions on Instrumentation and Measurment*, IEEE, vol. IM–32, No. 1, pp. 208–213 (Mar. 1983).

Faulkner, N.D. et al., "Sub–Harmonic Sampling for the Accurate Measurement of Frequency Stability of Microwave Oscillators," *CPEM 82 Digest: Conference on Precision Electromagnetic Measurements*, IEEE, pp. M–10 and M–11 (1982).

Faulkner, N.D. and Vilar, E., "Time Domain Analysis of Frequency Stability Using Non–Zero Dead–Time Counter Techniques," *CPEM 84 Digest Conference on Precision Electromagnetic Measurement*, IEEE, pp. 81–81 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958–1965 (Nov. 1990).

Fukahori, K., "A CMOS Narrow–Band Signaling Filter with Q Reduction," *IEEE Journal of Solid–State Circuits*, IEEE, vol. SC–19, No. 6, pp. 926–932 (Dec. 1984).

Fukuchi, H. and Otsu, Y., "Available time statistics of rain attenuation on earth–space path," *IEE Proceedings–H: Microwaves, Antennas and Propagation*, IEE, vol 135, Pt. H, No. 6, pp. 387–390 (Dec. 1988).

Gibbons, C.J. and Chadha, R., "Millimetre–wave propagation through hydrocarbon flame," *IEE Proceedings*, IEE, vol. 134, Pt. H, No. 2, pp. 169–173 (Apr. 1987).

Gilchrist, B. et al., "Sampling hikes performance of frequency synthesizers," *Microwaves & RF*, Hayden Publishing, vol. 23, No. 1, pp. 93–94, and 110 (Jan. 1984).

Gossard, E.E., "Clear weather meteorological effects on propagation at frequencies above 1 Ghz," *Radio Science*, American Geophysical Union, vol. 16, No. 5, pp. 589–608 (Sep.–Oct. 1981).

Gregorian, R. et al. "Switched–Capacitor Circuit Design" *Proceedings of the IEEE*, IEEE, vol. 71, No. 8, pp. 911–966 (Aug. 1983).

Groshong et al., "Undersampling Techniques Simplify Digital Radio," *Electronic Design*, Penton Publishing, pp. 67–68, 70, 73–75 and 78 (May 23, 1991).

Grove, W.M., "Sampling for Oscilloscopes and Other RF Systems: Dc through X–Band," *IEEE Transactions on Microwave Theory and Techniques*, IEEE, pp. 629–635 (Dec. 1966).

Haddon, J. et al., "Measurement of Microwave Scintillations on a Satellite Down–Link at X–Band," *Antennas and Propagation*, IEE, pp. 113–117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP–34, No. 5, pp. 646–657 (May 1986).

Hafdallah, H. et al., "2–4 Ghz MESFET Sampler," *Electronics Letters*, IEE, vol. 24, No. 3, pp. 151–153 (Feb. 4, 1988).

Herben, M.H.A.J., "Amplitude and Phase Scintillation Measurements on 8–2 km Line–of–Sight Path at 30 Ghz," *Electronices Letters*, IEE, vol. 18, No. 7, pp. 287–289 (Apr. 1, 1982).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136–1143 (Nov. 1989).

Hewitt, A. et al., "An 18 Ghz Wideband LOS Multipath Experiment," *International Conference on Measurements for Telecommunication Transmission Systems—MTTS 85*, IEE, pp. 112–116 (Nov. 27–28, 1985).

Hewitt, A. and Vilar, E., "Selective fading on LOS Microwave Links: Classical and Spread–Spectrum Measurement Techniques," *IEEE Transactions on Communications*, IEEE Communications Society, vol. 36, No. 7, pp. 789–796 (Jul. 1988).

Hospitalier, E., "Instruments for Recording and Observing Rapidly Varying Phenomena," *Science Abstracts*, IEE, vol. VII, pp. 22–23 (1904)

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115–121 (Sep. 18–20, 1990).

Hu, X., *A Switched–Current Sample–and–Hold Amplifier for FM Demodulation*, Thesis for Master of Applied Science, Dept. of Electrical and Computer Engineering, Univeristy of Toronto, UMI Dissertation Services, pp. 1–64 (1995).

Hung, H–L. A. et al., "Characterization of Microwave Integrated Circuits Using An Optical Phase–Locking and Sampling System," *IEEE MTT–S Digest*, IEEE, pp. 507–510 (1991).

Hurst, P.J., "Shifting the Frequency Response of Switched–Capacitor Filters by Nonuniform Sampling," *IEEE Transactions on Circuits and Systems*, IEEE Circuits and Systems Society, vol. 38, No. 1, pp. 12–19 (Jan. 1991).

Itakura, T., "Effects of the sampling pulse width on the frequency characteristics of a sample–and–hold circuit," *IEE Proceedings Circuits, Devices and Systems*, IEE, vol. 141, No. 4, pp. 328–336 (Aug. 1994).

Janssen, J.M.L., "An Experimental 'Stroboscopic' Oscilloscope for Frequencies up to about 50 Mc/s: I. Fundamentals," *Philips Technical Review,* Philips Research Laboratories, vol. 12, No. 2, pp. 52–59 (Aug. 1950).

Janssen, J.M.L. and Michels, A.J., "An Experimental 'Stroboscopic' Oscilloscope for Frequenceis up to about 50 Mc/s: II. Electrical Build–Up," *Philips Technical Review,* Philips Research Laboratories, vol. 12, No. 3, pp. 73–82 (Sep. 1950).

Jondral, V.F. et al., "Doppler Profiles for Communication Satellites," *Frequenz,* Herausberger, pp. 111–116 (May–Jun. 1996).

Kaleh, G.K., "A Frequency Diversity Spread Spectrum System for Communication in the Presence of In–band Interferece," *1995 IEEE Globecom,* IEEE Communications Society, pp. 66–70 (1995).

Karasawa, Y. et al., "A New Prediction Method for Tropospheric Scintillation on Earth–Space Paths," *IEEE Transactions on Antennas and Propagation,* IEEE Antennas and Propagation Society, vol. 36, No. 1, pp. 1608–1614 (Nov. 1988).

Kirsten, J. and Fleming, J., "Undersampling reduces data–acquisition costs for select applications," *EDN,* Cahners Publishing, vol. 35, No. 13, pp. 217–222, 224, 226–228 (Jun. 21, 1990).

Lam, W.K. et al., "Measurement of the Phase Noise Characteristics of an Unlocked Communications Channel Identifier," *Proceedings of the 1993 IEEE International Frequency Control Symposium,* IEEE pp. 283–288 (Jun. 2–4, 1993).

Lam, W.K. et al., "Wideband sounding of 11.6 Ghz transhorizon channel," *Electronics Letters,* IEE, vol. 30, No. 9, pp. 738–739 (Apr. 28, 1994).

Larkin, K.G., "Efficient demodulator for bandpass sampled AM signals," *Electronics Letters,* IEE, vol. 32, No. 2, pp. 101–102 (Jan. 18, 1996).

Lau, W.H. et al., "Analysis of the Time Variant Structure of Microwave Line–of–sight Multipath Phenomena," *IEEE Global Telecommunications Conference & Exhibition,* IEEE, pp. 1707–1711 (Nov. 28–Dec. 1, 1988).

Lau, W.H. et al., "Improved Prony Algorithm to Identify Multipath Componets," *Electronics Letters,* IEE, vol. 23, No. 20, pp. 1059–1060 (Sep. 24, 1987).

Lesage, P. and Audoin, C., "Effect of Dead–Time on the Estimation of the Two–Sample Variance," *IEEE Transactions on Instrumentation and Measurement,* IEEE Instrumentation and Measurement Society, vol. IM–28, No. 1, pp. 6–10 (Mar. 1979).

Liechti, C.A., "Performance of Dual–gate GaAs Mesfet's as Gain–Controlled Low–Noise Amplifiers and High–Speed Modulators," *IEEE Transactions on Microwave Theory and Techniques,* IEEE Microwave Theory and Techniques Society, vol. MTT–23, No. 6, pp. 461–469 (Jun. 1975).

Linnenbrink, T.E. et al., "A One Gigasample Per Second Transient Recorder," *IEEE Transactions on Nuclear Science,* IEEE Nuclear and Plasma Sciences Society, vol. NS–26, No. 4, pp. 4443–4449 (Aug. 1979).

Liou, M.L., "A Tutorial on Computer–Aided Analysis of Switched–Capacitor Circuits," *Proceedings of the IEEE,* IEEE, vol. 71, No. 8, pp. 987–1005 (Aug. 1983).

Lo, P. et al., "Coherent Automatic Gain Control," *IEE Colloquium on Phase Locked Techniques,* IEE, pp. 2/1–2/6 (Mar. 26, 1980).

Lo, P. et al., "Computation of Rain Induced Scintillations on Satellite Down–Links at Microwave Frequencies," *Third International Conference on Antennas and Propagation (ICAP 83),* pp. 127–131 (Apr. 12–15, 1983).

Lo, P.S.L.O. et al., "Observations of Amplitude Scintillations on a Low–Elevation Earth–Space Path," *Electronics Letters,* IEE, vol. 20, No. 7, pp. 307–308 (Mar. 29, 1984).

Madani, K. and Aithison, C.S., "A 20 Ghz Microwave Sampler," *IEEE Transactions on Microwave Theory and Techniques,* IEEE Microwave Theory and Techniques Society, vol. 40, No. 10, pp. 1960–1963 (Oct. 1992).

Marsland, R.A. et al., "130 Ghz GaAs monolithic integrated circuit sampling head," *Appl. Phys. Lett.,* American Institute of Physics, vol. 55, No. 6, pp. 592–594 (Aug. 7, 1989).

Martin, K. and Sedra, A.S., "Switched–Capacitor Building Blocks for Adaptive Systems," *IEEE Transactions on Circuits and Systems,* IEEE Circuits and Systems Society, vol. CAS–28, No. 6, pp. 576–584 (Jun. 1981).

Marzano, F.S. and d'Auria, G., "Model–based Prediction of Amplitude Scintillation variance due to Clear–Air Tropospheric Turbulence on Earth–Satellite Microwave Links," *IEEE Transactions on Antennas and Propagation,* IEEE Antennas and Propagation Society, vol. 46, No. 10, pp. 1506–1518 (Oct. 1998).

Matricciani, E., "Prediction of fade durations due to rain in satellite communication systems," *Radio Science,* American Geophysical Union, vol. 32, No. 3, pp. 935–941 (May–Jun. 1997).

McQueen, J.G., "The Monitoring of High–Speed Waveforms," *Electronic Engineering,* Morgan Brothers Limited, vol. XXIV, No. 296, pp. 436–441 (Oct. 1952).

Merkelo, J. and Hall, R.D., "Broad–Band Thin–Film Signal Sampler," *IEEE Journal of Solid–State Circuits,* IEEE, vol. SC–7, No. 1, pp. 50–54 (Feb. 1972).

Merlo, U. et al., "Amplitude Scintillation Cycles in a Sirio Satellite–Earth Link," *Electronics Letters,* IEE, vol. 21, No. 23, pp. 1094–1096 (Nov. 7, 1985).

Morris, D., "Radio–holographic reflector measurement of the 30–m millimeter radio telescope at 22 Ghz with a cosmic signal source," *Astronomy and Astrophysics,* Springer–Verlag, vol. 203, No. 2, pp. 399–406 (Sep. (II) 1988).

Moulsley, T.J. et al., "The efficient acquistion and processing of propagation statistics," *Journal of the Institution of Electronic and Radio Engineers,* IERE, vol. 55, No. 3, pp. 97–103 (Mar. 1985).

Ndzi, D. et al., "Wide–Band Statistical Characterization of an Over–the–Sea Experimental Transhorizon Link," *IEE Colloquium on Radio Communications at Microwave and Millimetre Wave Frequencies,* IEE, pp. 1/1–1/6 (Dec. 16, 1996).

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of–Sight Radio,* IEE, pp. 9/1–9/6 (Nov. 24, 1997).

"New zero IF chipset from Philips," *Electronic Engineering,* United News & Media, vol. 67, No. 825, p. 10 (Sep. 1995).

Ohara, H. et al., "First monolithic PCM filter cuts cost of telecomm systems," *Electronic Design,* Hayden Publishing Company, vol. 27, No. 8, pp. 130–135 (Apr. 12, 1979).

Oppenheim, A.V. et al., *Signals and Systems,* Prentice–Hall, pp. 527–531 and 561–562 (1983).

Ortgies, G., "Experimental Parameters Affecting Amplitude Scintillation Measurements on Satellite Links," *Electronics Letters*, IEE, vol. 21, No. 17, pp. 771–772 (Aug. 15, 1985).

Pärssinen et al., "A 2–GHz Subharmonic Sampler for Signal Downconversion," *IEEE Transactions on Microwave Theory and Techniques*, IEE, vol. 45, No. 12, 7 pages (Dec. 1997).

Peeters, G. et al., "Evaluation of Statistical Models for Clear–Air Scintillation Prediction Using Olympus Satellite Measurements," *International Journal of Satellite Communications*, John Wiley and Sons, vol. 15, No. 2, pp. 73–88 (Mar.–Apr. 1997).

Perrey, A.G. and Schoenwetter, H.K., *NBS Technical Note 1121: A Schottky Diode Bridge Sampling Gate*, U.S. Dept. of Commerce, pp. 1–14 (May 1980).

Poulton, K. et al., "A 1–Ghz 6–bit ADC System," *IEEE Journal of Solid–State Circuits*, IEEE, vol. SC–22, No. 6, pp. 962–969 (Dec. 1987).

Press Release, "Parkervision, Inc. Announces Fiscal 1993 Results," Lippert/Heilshorn and Associates, 2 Pages (Apr. 6, 1994).

Press Release, "Parkervision, Inc. Announces the Appointment of Michael Baker to the New Position of National Sales Manager," Lippert/Heilshorn and Associates, 1 Page (Apr. 7, 1994).

Press Release, "Parkervision's Cameraman Well–Received By Distance Learning Market," Lippert/Heilshorn and Associates, 2 Pages (Apr. 8, 1994).

Press Release, "Parkervision, Inc. Announces First Quarter Financial Results," Lippert/Heilshorn and Associates, 2 Pages (Apr. 26, 1994).

Press Release, "Parkervision, Inc. Announces The Retirement of William H. Fletcher, Chief Financial Officer," Lippert/Heilshorn and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Announces Appointments to its National Sales Force," Lippert/Heilshorn and Associates, 2 Pages (Jun. 17, 1994).

Press Release, "Parkervision, Inc. Announces Second Quarter and Six Months Financial Results," Lippert/Heilshorn and Associates, 3 Pages (Aug. 9, 1994).

Press Release, "Parkervision, Inc. Announces Third Quarter and Nine Months Financial Results," Lippert/Heilshorn and Associates, 3 Pages (Oct. 28, 1994).

Press Release, "Parkervision, Inc. Announces First Significant Dealer Sale of its Cameraman® System II," Lippert/Heilshorn and Associates, 2 Pages (Nov. 7, 1994).

Press Release, "Parkervision, Inc. Announces Fourth Quarter and Year End Results," Lippert/Heilshorn and Associates, 2 Pages (Mar. 1, 1995).

Press Release, "Parkervision, Inc. Announces Joint Product Developments With VTEL," Lippert/Heilshorn and Associates, 2 Pages (Mar. 21, 1995).

Press Release, "Parkervision, Inc. Announces First Quarter Financial Results," Lippert/Heilshorn and Associates, 3 Pages (Apr. 28, 1995).

Press Release, "Parkervision Wins Top 100 Product Districts' Choice Award," Parkervision Marketing and Manufacturing Headquarters, 1 Page (Jun. 29, 1995).

Press Release, "Parkervision National Sales Manager Next President of USDLA," Parkervision Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Announces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecon XV Award," Parkervision Marketing and Manufacturing Headquarters, 2 Pages (Nov. 1, 1995).

Press Release, "Parkervision, Inc. Announces Purchase Commitment From VTEL Corporation," Parkervision Marketing and Manufacturing Headquarters, 1 Page (Feb. 26, 1995).

Press Release, "ParkerVision, Inc. Announces Fourth Quarter and Year End Results," Parkervision Marketing and Manufacturing Headquarters, 2 Pages (Feb. 27, 1996).

Press Release, "ParkerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 page (Mar. 28, 1996).

Press Release, "Parkervision, Inc. Announces First Significant Sale of Its Cameraman® Three–Chip System," Parkervision Marketing and Manufacturing Headquarters, 2 pages (Apr. 12, 1996).

Press Release, "Parkervision, Inc. Introduces New Product Line for Studio Production Market," Parkervision Marketing and Manufacturing Headquarters, 2 Pages (Apr. 15, 1996).

Press Release, "Parkervision, Inc. Announces Private Placement of 800,000 Shares," Parkervision Marketing and Manufacturing Headquarters, 1 Page (Apr. 15, 1996).

Press Release, "Parkervision, Inc. Announces First Quarter Financial Results," Parkervision Marketing and Manufacturing Headquarters, 3 Pages (Apr. 30, 1996).

Press Release, "ParkerVision's New Studio Product Wins Award," Parkervision Marketing and Manufacturing Headquarters, 2 Pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "PictureTel and ParkerVision Sign Reseller Agreement," Parkervision Marketing and Manufacturing Headquarters, 2 Pages (Oct. 30, 1996).

Press Release, "CLI and ParkerVision Bring Enhanced Ease-of-Use to Videoconferencing," CLI/Parkervision, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer,"NEC America, 2 Pages (Jun. 18, 1997).

Press Release, "Parkervision Supplies JPL with Robotic Cameras, Cameraman and Shot Director for Mars Mission," Parkervision Marketing and Manufacturing Headquarters, 2 Pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 23, 1997).

Press Release, "Parkervision, Inc. Announces Private Placement of 990,000 Shares," Parkervision Marketing and Manufacturing Headquarters, 2 Pages (Sep. 8, 1997).

Press Release, "Wal-Mart Chooses Parkervision for Broadcast Production," Parkervision Marketing and Manufacturing Headquarters, 2 Pages (Oct. 24, 1997).

Press Release, "Parkervision, Inc. Announces Third Quarter Financial Results," Parkervision Marketing and Manufacturing Headquarters, 3 Pages (Oct. 30, 1997).

Press Release, "ParkerVision, Inc. Announces Breakthrough in Wireless Radio Frequency Technology," Parkervision Marketing and Manufacturing Headquarters, 3 Pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).

Press Release, "Parkervision Announces Existing Agreement with IBM Terminates—Company Continues with Strategic Focus Announced in December," Parkervision Marketing and Manufacturing Headquarters, 2 Pages (Jan. 27, 1998).

Press Release, "Laboratory Tests Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).

Press Release, "Parkervision Awarded Editors' Pick of Show for NAB 98," Parkervision Marketing and Manufacturing Headquarters, 2 Pages (Apr. 15, 1998).

Press Release, "Parkervision Announces First Quarter Financial Results," Parkervision Marketing and Manufacturing Headquarters, 3 Pages (May 4, 1998).

Press Release, "Parkervision 'DIRECT2DATA' Introduced in Response to Market Demand," Parkervision Marketing and Manufacturing Headquarters, 3 Pages, (Jul. 9, 1998).

Press Release, "Parkervision Expands Senior Management Team," Parkervision Marketing and Manufacturing Headquarters, 2 Pages (Jul. 29, 1998).

Press Release, "Parkervision Announces Second Quarter and Six Month Financial Results," Parkervision Marketing and Manufacturing Headquarters, 4 Pages (Jul. 30, 1998).

Press Release, "Parkervision Announces Third Quarter and Nine Month Financial Results," Parkervision Marketing and Manufacturing Headquarters, 3 Pages (Oct. 30, 1998).

Press Release, "Questar Infocomm, Inc. Invests $5 Million in Parkervision Common Stock," Parkervision Marketing and Manufacturing Headquarters, 3 Pages (Dec. 2, 1998).

Press Release, "Parkervision Adds Two New Directors," Parkervision Marketing and Manufacturing Headquarters, 2 Pages (Mar. 5, 1999).

Press Release, "Parkervision Announces Fourth Quarter and Year End Financial Results," Parkervision Marketing and Manufacturing Headquarters, 3 Pages (Mar. 5, 1999).

Press Release, "Joint Marketing Agreement Offers New Automated Production Solution," Parkervision Marketing and Manufacturing Headquarters, 2 Pages (Apr. 13, 1999).

"Project COST 205: Scintillations in Earth–satellite links," *Alta Frequenza: Scientific Review in Electronics*, AEI, vol. LIV, No. 3, pp. 209–211 (May–Jun., 1985).

Razavi, B., *RF Microelectronics*, Prentice–Hall, pp. 147–149 (1998).

Reeves, R.J.D., "The Recording and Collocation of Waveforms (Part 1)," *Electronic Engineering*, Morgan Brothers Limited, vol. 31, No. 373, pp. 130–137 (Mar. 1959).

Reeves, R.J.D., "The Recording and Collocation of Waveforms (Part 2)," *Electronic Engineering*, Morgan Brothers Limited, vol. 31, No. 374, pp. 204–212 (Apr. 1959).

Rein, H.M. and Zahn, M., "Subnonosecond–Pulse Generator with Variable Pulsewidth Using Avalanche Transistors," *Electronics Letters*, IEE, vol. 11, No. 1, pp. 21–23 (Jan. 9, 1975).

Riad, S.M. and Nahman, N.S., "Modeling of the Feed–through Wideband (DC to 12.4 Ghz) Sampling Head," *IEEE MTT–S International Microwave Symposium Digest*, IEEE, pp. 267–269 (Jun. 27–29, 1978).

Rizzoli, V. et al., "Computer–Aided Noise Analysis of MESFET and HEMT Mixers," *IEEE Transations on Microwave Theory and Techniques*, IEEE, vol. 37, No. 9, pp. 1401–1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelmann, F., "Effect of Antenna Size on OTS Signal Scintillations and Their Seasonal Dependence," *Electronics Letters*, IEE, vol. 19, No. 24, pp. 1032–1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238–242 (Oct. 25–27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218–223 (Oct. 16–18, 1990).

Salous, S., "IF digital generation of FMCW waveforms for wideband channel characterization," *IEE Proceedings–I*, IEE, vol. 139, No. 3, pp. 281–288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched–Capacitor Biquad," *Proceedings of the IEEE*, IEEE, vol. 71, No. 8, pp. 1008–1009 (Aug. 1983).

Saul, P.H ., "A GaAs MESFET Sample and Hold Switch," *Fifth European Solid State Circuits Conference–ESSCIRC 79*, IEE, pp 5–7 (1979).

Shen, D.H. et al., "A 900–MHZ RF Front–End with Integrated Discrete–Time Filtering," *IEEE Journal of Solid–State Circuits*, IEEE Solid–State Circuits Council, vol. 31. No. 12, pp. 1945–1954 (Dec. 1996).

Shen, X.D. and Vilar, E., "Anomalous transhorizon propagation and meteorological processes of a multilink path," *Radio Science*, American Geophysical Union, vol. 30, No. 5, pp. 1467–1479 (Sep.–Oct. 1995).

Shen, X. and Tawfik A.N., "Dynamic Behaviour of Radio Channels Due to Trans–Horizon Propagation Mechanisms," *Electronics Letters*, lEE, vol. 29, No. 17, pp. 1582–1583 (Aug. 19, 1993).

Shen, X. et al, "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, lEE, pp. 4/1–4/7 (Mar. 5,1996).

Shen, X. and Vilar, E., "Path loss statistics and mechanisms of transhorizon propagation over a sea path," *Electronics Letters*, IEE, vol. 32, No. 3, pp. 259–261 (Feb. 1, 1996).

Shen, D. et al.,"A 900 MHZ Integrated Discrete–Time Filtering RF Front–End," *IEEE International Solid State Circuits Conference*, IEEE, vol. 39, pp. 54–55 and 417 (Feb. 1996).

Spillard, C. et al., "X–Band Tropospheric Transhorizon Propagation Under Differing Meteorological Conditions," *Sixth International Conference on Antennas and Propagation (ICAP 89) Part 2: Propagation*, IEE, pp. 451–455 (Apr. 4–7, 1989).

Stafford K.R. et al., "A Complete Monolithic Sample/Hold Amplifier," *IEEE Journal of Solid–State Circuits*, IEEE, vol. SC–9, No. 6, pp. 381–387 (Dec. 1974).

Staruk, W. Jr. et al., "Pushing HF Data Rates," *Defense Electronics*, pp. 211, 213, 215, 217, 220 and 222 (May 1985).

Stephenson, A.G., "Digitizing multiple RF signals requires an optimum sampling rate," *Electronics*, pp. 106–110 (Mar. 27, 1972).

Sugarman, R.,"Sampling Oscilloscope for Statistically Varying Pulses," *The Review of Scientific Instruments*, American Institute of Physics, vol. 28, No. 11, pp. 933–938 (Nov. 1957).

Sylvain, M., "Experimental probing of multipath microwave channels," *Radio Science*, American Geophysical Union, vol. 24, No. 2, pp. 160–178 (Mar.–Apr. 1989).

Takano, T., "NOVEL GaAs Pet Phase Detector Operable To Ka Band," *IEEE MT–S Digest*, IEEE, pp. 381–383 (1984).

Tan, M.A., "Biquadratic Transconductance Switched–Capacitor Filters," *IEEE Transactions on Circuits and Systems–I: Fundamental Theory and Applications*, IEEE Circuits and Systems Society, vol. 40, No. 4, pp. 272–275 (Apr. 1993).

Tanaka, K. et al., "Single Chip Multisystem AM Stereo Decoder IC," *IEEE Transactions on Consumer Electronics*, IEEE Consumer Electronics Society, vol. CE–32, No. 3, pp. 482–496 (Aug. 1986).

Tawfik, A.N., "Amplitude, Duration and Predictability of Long Hop Trans–Horizon X–band Signals Over the Sea," *Electronics Letters*, IEE, vol. 28, No. 6, pp. 571–572 (Mar. 12, 1992).

Tawfik, A.N. and Vilar, E., "Correlation of Transhorizon Signal Level Strength with Localized Surface Meteorological Parameters." *Eighth International Conference on Antennas and Propagation*, Electronics Division of the IEE, pp. 335–339 (Mar. 30–Apr. 2. 1993).

Tawfik, A.N. and Vilar, E., "Dynamic Structure of a Transhorizon Signal at X–brand Over a Sea Path," *Sixth International Conference on Antennas and Propagation (ICAP 89) Part 2: Propagation*, IEE, pp. 446–450 (Apr. 4–7, 1989).

Tawfik, A.N. and Vilar, E., "Statistics of Duration and Intensity of Path Loss in a Microwave Transhorizon Sea–Path," *Electronics Letters*, IEE, vol. 26, No. 7, pp. 474–476 (Mar. 29, 1990).

Tawfik, A.N. and Vilar, E., "X–Band Transhorizon Measurements of CW Transmissions Over the Sea—Part 1: Path Loss, Duration of Events, and Their Modeling," *IEEE Transactions on Antennas and Propagation*, IEEE Antennas and Propagaton Society, vol. 41, No. 11, pp. 1491–1500 (Nov. 1993).

Temes, G.C. and Tsividis, T., "The Special Section on Switched–Capacitor Circuits," *Proceedings of the IEEE*, IEEE, vol. 71, No. 8, pp. 915–916 (Aug. 1983).

Thomas, G.B., *Calculus and Analytic Geometry*, Third Edition, Addison–Wesley Publishing, pp. 119–133 (1960).

Tomassetti, Q., "An Unusual Microwave Mixer," *16th European Microwave Conference*, Microwave Exhibitions and Publishers, pp. 754–759 (Sep. 8–12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1–3, (Jan. 1984).

Tsividis, Y. and Antognetti, P. (Ed.), *Design of MOS VLSI Circuits for Telecommunications*, Prentice–Hall, p. 304 (1985).

Tsividis, Y., "Principles of the Operation and Analysis of Switched–Capacitor Circuits," *Proceedings of the IEEE*, IEEE, vol. 71, No. 8, pp. 926–940 (Aug. 1983).

Tsurumi, H. and Maeda, T., "Design Study on a Direct Conversion Receiver Front–End for 280 MHZ, 900 MHZ, and 2.6 Ghz Band Radio Communication Systems," *41st IEEE Vehicular Technology Conference*, IEEE Vehicular Technology Society, pp. 457–462, (May 19–22, 1991).

Valdamanis, J.A. et al., "Picosecond and Subpicosend Optoelectronics for Measurements of Future High Speed Electronic Devices," *IEDM Technical Digest*, IEEE, pp. 597–600 (Dec. 5–7, 1983).

van de Kamp, M.M.J.L., "Asymmectric signal level distribution due to tropospheric scintillation,"*Electronics Letters*, IEE, vol. 34, No. 11, pp. 1145–1146 (May 28, 1998).

Vasseur, H. and Vanhoenacker, D., "Characterization of tropospheric turbulent layers from radiosonde data," *Electronics Letters*, IEE, vol. 34, No. 4, pp. 318–319 (Feb. 19, 1998).

Verdone, R., "Outage Probability Analysis for Short–Range Communication Systems at 60 Ghz in ATT Urban Enviroments," *IEEE Transactions on Vehicular Technology,* IEEE Vehicular Technology Society, vol. 46, No. 4, pp. 1027–1039 (Nov. 1997).

Vierira–Ribeiro, S.A., *Single–IF DECT Receiver Architecture using a Quadrature Sub–Sampling Band–Pass Sigma–Delta Modulator,* Thesis for Degree of Master's of Engineering, Carleton University, UMI Dissertation Services, pp. 1–180, (Apr. 1995).

Vilar, E. et al., "A Comprehensive/Selectivek MM–Wave Satellite Downlink Experiment on Fade Dynamics," *Tenth International Conference on Antennas and Propagation,* Electronics Division of the IEE, pp. 2.98–2.101 (Apr. 14–17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation,* AGARD, pp. 8–1–8–16 (Oct. 4–7, 1983).

Vilar, E. and Smith, H., "A Theorectical and Experimental Study of Angular Scintillations in Earth Space Paths," *IEEE Transactions on Antennas and Propagation,* IEEE, vol. AP–34, No. 1, pp. 2–10 (Jan. 1986).

Vilar, E. et al., "A Wide Band Transhorizon Experiment at 11.6 Ghz," *Eighth International Conference on Antennas and Propagation,* Electronics Division of the IEE, pp. 441–445 (Mar. 30–Apr. 2, 1993).

Vilar, E. and Matthews, P.A., "Amplitude Dependence of Frequency in Oscillators," *Electronics Letters,* IEE, vol. 8, No. 20, pp. 509–511 (Oct. 5, 1972).

Vilar, E. et al., "An experimental mm–wave receiver system for measuring phase noise due to atmospheric turbulence," *Proceedings of the 25$^{th}$ European Microwave Conference,* Nexus House, pp. 114–119 (1995).

Vilar, E. and Burgueño, A., "Analysis and Modeling to Time Intervals Between Rain Rate Exceedances in the Context of Fade Dynamics," *IEEE Transactions on Communications,* IEEE Communications Society, vol. 39, No. 9, pp. 1306–1312 (Sep. 1991).

Vilar, E. et al., "Angle of Arrival Fluctuations in High and Low Elevation Earth Space Paths," *Fourth International Conference on Antennas and Propagation (ICAP 85),* Electronics Division of the IEE, pp. 83–88 (Apr. 16–19, 1985).

Vilar, E., "Antennas and Propagation: A Telecommunications Systems Subject," *Electronics Division Colloquium on Teaching Antennas and Propagation to Undergraduates,* IEE, pp. 7/1–7/6 (Mar. 8, 1988).

Vilar, E., et al., "CERS*. Millimetre–Wave Beacon Package and Related Payload Doppler Correction Strategies," *Electronics Division Colloquium on CERS—Communications Engineering Research Satellite,* IEE, pp. 10/1–10/10 (Apr. 10, 1984).

Vilar, E. and Moulsley, T.J., "Comment and Reply: Probability Density Function of Amplitude Scintillations", *Electronics Letters,* IEE, vol. 21, No. 14, pp. 620–622 (Jul. 4, 1985).

Vilar, E. et al., "Comparison of Rainfall Rate Duration Distributions for ILE–IFE and Barcelona," *Electronics Letters,* IEE, vol. 28, No. 20, pp. 1922–1924 (Sep. 24, 1992).

Vilar, E., "Depolarization and Field Transmittances in Indoor Communications," *Electronics Letters,* IEE, vol. 27, No. 9, pp. 732–733 (Apr. 25, 1991).

Vilar, E. and Larsen, J.R. "Elevation Dependence of Amplitude Scintillations on Low Elevation Earth Space Paths," *Sixth International Conference on Antennas and Propagation (ICAP 89) Part 2: Propagation,* IEE, pp. 150–154 (Apr. 4–7, 1989).

Vilar, E. et al., "Experimental System and Measurements of Transhorizon Signal Levels at 11 Ghz," *18$^{th}$ European Microwave Conference,* pp. 429–435 (Sep. 12–15, 1988).

Vilar, E. and Matthews, P.A., "Importance of Amplitude Scintillations in Millimetric Radio Links," *Proceedings of the 4$^{th}$ European Microwave Conference,* Microwave Exhibitions and Publishers, pp. 202–206 (Sep. 10–13, 1974).

Vilar, E. and Haddon, J., "Measurement and Modeling of Scintillation Intensity to Estimate Turbulence Parameters in an Earth–Space Path," *IEEE Transactions on Antennas and Propagation,* IEEE Antennas and Propagation Society, vol. AP–32, No. 4, pp. 340–346 (Apr. 1984).

Vilar, E. and Matthews, P.A., "Measurement of Phase Fluctuations on Millimetric Radiowave Propagation," *Electronics Letters,* IEE, vol. 7, No. 18, pp. 566–568 (Sep. 9, 1971).

Vilar, E. and Wan, K.W., "Narrow and Wide Band Estimates of Field Strength for Indoor Communications in the Millimetre Band," *Electronics Division Colloquium on Radiocommunciations in the Range 30–60 Ghz,* IEE, pp. 5/1–5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer,* IEE, 5 pages (Jan. 23, 1986).

Vilar, E. and Senin, S., "Propagaton phase noise identified using 40 Ghz satellite downlink," *Electronics Letters,* IEE, vol. 33, No. 22, pp. 19901–19902 (Oct. 23, 1997).

Vilar, E. et al., "Scattering and Extinction: Dependence Upon Raindrop Size Distibution in Temperate (Barcelona) and Tropical (Belem) Regions," *Tenth International Conference on Antennas and Propagaton,* Electronics Division of the IEE, pp. 2.230–2.233 (Apr. 14–17, 1997).

Vilar, E. and Haddon, J., "Scintillation Modeling and Measurement—A Tool for Remote–Sensing Slant Paths," *AGARD Conference Proceedings No. 332: Propagation Aspects of Frequency Sharing, Interference and System Diversity,* AGARD, pp. 27–1–27–13 (Oct. 18–22, 1982).

Vilar, E., "Some Limitations on Digital Transmission Through Turbulent Atmosphere," *International Conference on Satellite Communication Systems Technology,* Electronics Division of the IEE (Apr. 7–10, 1975).

Vilar, E. and Matthews, P.A., "Summary of Scintillation Observations in a 36 Ghz Link Across London," *International Conference on Antennas and Propagation Part 2: Propagation,* IEE, pp. 36–40 (Nov. 28–30, 1978).

Vilar, E. et al., "Wideband Characterization of Scattering Channels," *Tenth International Conference on Antennas and Propagation,* Electronics Division of the IEE, pp. (Apr. 14–17, 1997).

Vollmer A., "Completer GPS Receiver Fits on Two Chips," *Electronic Design,* Penton Publishing, pp. 50, 52, 54 and 56 (Jul. 6, 1998).

*Voltage and Time Resolution in Digitizing Oscilloscopes: Application Note 348,* Hewlett Packard, pp. 1–11 (Nov. 1986).

Wan, K.W. et al., "A Novel Approach to the Simultaneous Measurement of Phase and Amplitude Noises in Oscillator," *Proceedings of the 19th European Microwave Conference*, Microwave Exhibitions and Publishers Ltd., pp. 809–813 (Sep. 4–7, 1989).
Wan, K.W. et al., "Extended Variances and Autoregressive/ Moving Average Algorithm for the Measurement and Synthesis of Oscillator Phase Noise," *Proceedings of the 43rd Annual Symposiom on Frequency Control*, IEEE, pp. 331–335 (1989).
Wan, K.W. et al., "Wideband Transhorizon Channel Sounder At 11 Ghz," *Electronics Division Colloquium on High Bit Rate UHF/SHF Channel Sounders—Technology and Measurement*, IEE, pp. 3/1–3/5 (Dec. 3, 1993).
Wang, H., "A 1–V Multigigahertz RF Mixer Core in 0.5–$\mu$m CMOS," *IEEE Journal of Solid–State Circuits*, IEEE Solid–State Circuits Society, vol. 33, No. 12, pp. 2265–2267 (Dec. 1998).
Watson, A.W.D. et al., "Digital Conversion and Signal Processing for High Performance Communications Receivers," pp. 367–373.
Weast, R.C. et al., (Ed.), *Handbook of Mathematical Tables*, Second Edition, The Chemical Rubber Co., pp. 480–485 (1964).
Wiley, R.G., "Approximate FM Demodulation Using Zero Crossings," *IEEE Transactions on Communications*, IEEE, vol. COM–29, No. 7, pp. 1061–1065 (Jul 1981).
Worthman, W., "Convergence . . . Again," RF Design, Primedia, p. 102 (Mar. 1999).
Young, I.A. and Hodges, D.A., "MOS Switched–Capacitor Analog Sampled–Data Direct–Form Recursive Filters," *IEEE Journal of Solid–State Circuits*, IEEE, vol. SC–14, No. 6, pp. 1020–1033 (Dec. 1979).
Translation of Specification and Claims of FR Patent No. 2245130, 3 pages.
Fest, Jean–Pierre, "Le Convertisseur A/N Revolutionne Le Recepteur Radio," *Electronique*, No. 54, pp. 40–42 (Dec. 1995).
Translation of DE Patent No. 35 41 031 A1, 22 pages.
Translation of EP Patent No. 0 732 803 A1, 9 pages.
Fest, Jean–Pierre, "The A/D Converter Revolutionizes the Radio Reciever," *Electronique*, No. 54, 3 pages (Dec. 1995). (Translation of Doc. AQ50).
Translation of German Patent No. DE 197 35 798 C1, 8 pages.
Miki, S. and Nagahama, R., *Modulation System II*, Common Edition 7, Kyoritsu Publishing Co., Ltd., pp. 146–154 (Apr. 30, 1956).
Miki, S. and Nagahama, R., *Modulation System II*, Common Edition 7, Kyoritsu Publishing Co., Ltd., pp. 146–149 (Apr. 30, 1956). (Partial Translation of Doc. AQ51).
Rabiner, L.R. and Gold, B., *Theory and Application of Digital Signal Processing*, Prentice–Hall, Inc., pp. xiii–xii and 40–46 (1975).
English–language Abstract of Japanese Patent Publication No. 08–032556, from http://www1.ipdl.jpo.go.jp, 2 Pages (Feb. 2, 1996—Date of publication of application).
English–language Abstract of Japanese Patent Publication No. 08–139524, from http://www1.ipdl.jpo.go.jp, 2 Pages (May. 31, 1996—Date of publication of application).
English–language Abstract of Japanese Patent Publication No. 59–144249, from http://www1.ipdl.jpo.go.jp, 2 Pages (Aug. 18, 1984—Date of publication of application).
English–language Abstract of Japanese Patent Publication No. 63–054002, from http://www1.ipdl.jpo.go.jp, 2 Pages (Mar. 8, 1988—Date of publication of application).
English–language Abstract of Japanese Patent Publication No. 06–237276, from http://www1.ipdl.jpo.go.jp, 2 Pages (Aug. 23, 1994—Date of publication of application).
English–language Abstract of Japanese Patent Publication No. 08–023359, from http://www1.ipdl.jpo.go.jp, 2 Pages (Jan. 23, 1996—Date of publication of application).
Translation of Japanese Patent Publication No. 47–2314, 7 pages.
Partial Translation of Japanese Patent Publication No. 58–7903, 3 pages.
English–language Abstract of Japanese Patent Publication No. 58–133004, from http://www1.ipdl.jpo.go.jp, 2 Pages (Aug. 8, 1993—Date of publication of application).
English–language Abstract of Japanese Patent Publication No. 60–058705, from http://www1.ipdl.jpo.go.jp, 2 Pages (Apr. 4, 1985—Date of publication of application).
English–language Abstract of Japanese Patent Publication No. 04–123614, from http://www1.ipdl.jpo.go.jp, 2 Pages (Apr. 23, 1992—Date of publication of application).
English–language Abstract of Japanese Patent Publication No. 04–127601, from http://www1.ipdl.jpo.go.jp, 2 Pages (Apr. 28, 1992—Date of publication of application).
English–language Abstract of Japanese Patent Publication No. 05–175730, from http://www1.ipdl.jpo.go.jp, 2 Pages (Jul. 13, 1993—Date of publication of application).
English–language Abstract of Japanese Patent Publication No. 05–175734, from http://www1.ipdl.jpo.go.jp, 2 Pages (Jul. 13, 1993—Date of publication of application).
English–language Abstract of Japanese Patent Publication No. 07–154344, from http://www1.ipdl.jpo.go.jp, 2 Pages (Jun. 16, 1995—Date of publication of application).
English–language Abstract of Japanese Patent Publication No. 07–307620, from http://www1.ipdl.jpo.go.jp, 2 Pages (Nov. 21, 1995—Date of publication of application).
Oppenheim, A.V. and Schafer, R.W., *Digital Signal Processing*, Prentice–Hall, pp. vii–x, 6–35, 45–78, 87–121 and 136–165 (1975).
English–language Abstract of Japanese Patent Publication No. 55–066057, from http://www1.ipdl.jpo.go.jp, 1 page (May 19, 1980—Date of publication of application).
English–language Abstract of Japanese Patent Publication No. 63–065587, from http://www1.ipdl.jpo.go.jp, 1 page (Mar. 24, 1988—Date of publication of application).
English–language Abstract of Japanese Patent Publication No. 63–153691, from http://www1.ipdl.jpo.go.jp, 1 page (Jun. 27, 1988—Date of publication of application).

* cited by examiner

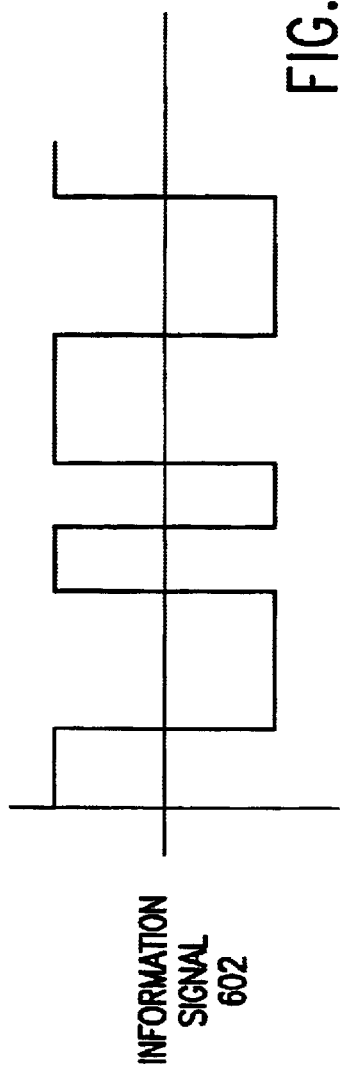
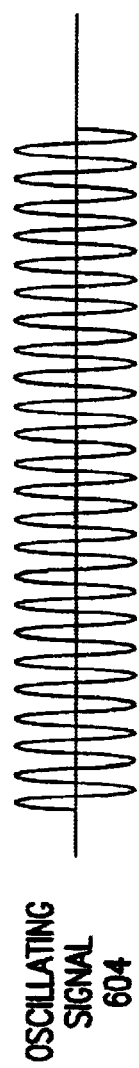
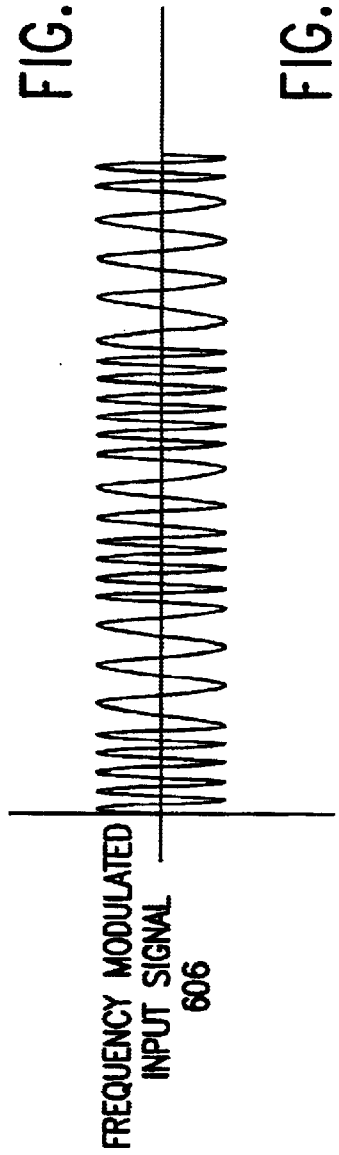
FIG. 6A — INFORMATION SIGNAL 602
FIG. 6B — OSCILLATING SIGNAL 604
FIG. 6C — FREQUENCY MODULATED INPUT SIGNAL 606
FIG. 6D — HARMONICALLY RICH SIGNAL (SHOWN AS SQUARE WAVE) 608
SEE FIG. 6E

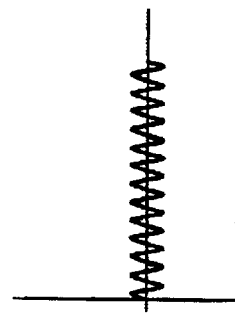
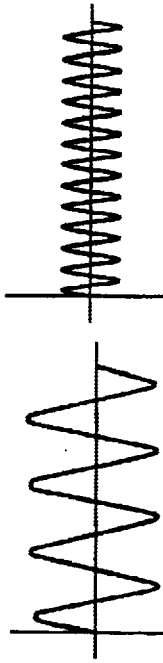
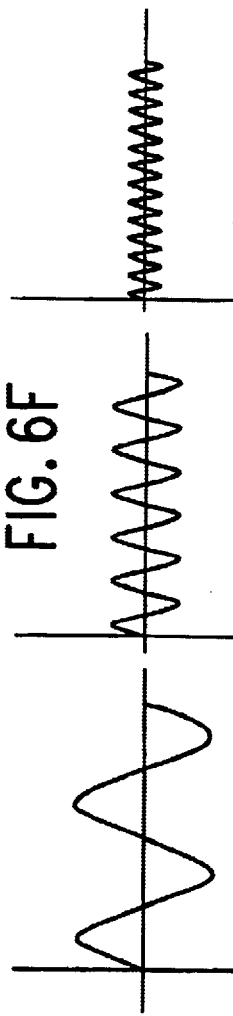

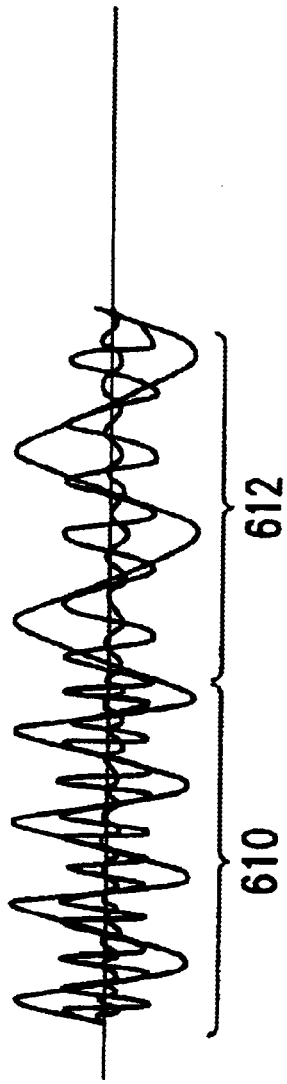
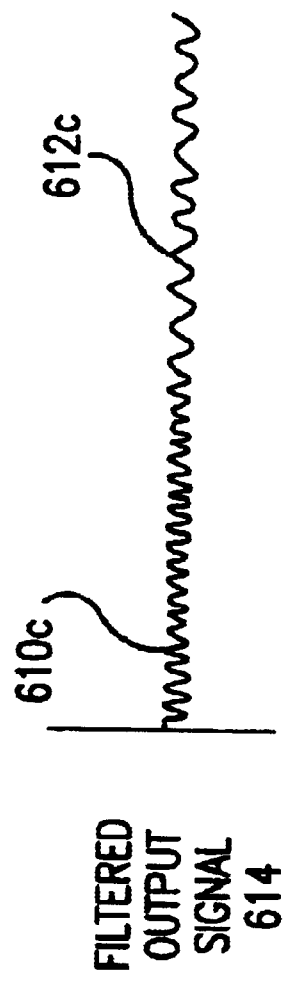

| TIME NODE | t-1 (RISING EDGE OF φ₁) | t-1 (RISING EDGE OF φ₂) | t (RISING EDGE OF φ₁) | t (RISING EDGE OF φ₂) | t+1 (RISING EDGE OF φ₁) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | 1807 | — | $VO_{t-1}$ 1824 | $VO_{t-1}$ 1834 | $VO_t$ 1846 |
| 1912 | — | 1815 | — | $VO_{t-1}$ 1836 | $VO_{t-1}$ 1848 |
| 1918 | — | — | — | — | $VI_t -$ 1850 $0.1*VO_t - 0.8*VO_{t-1}$ |

FIG. 18

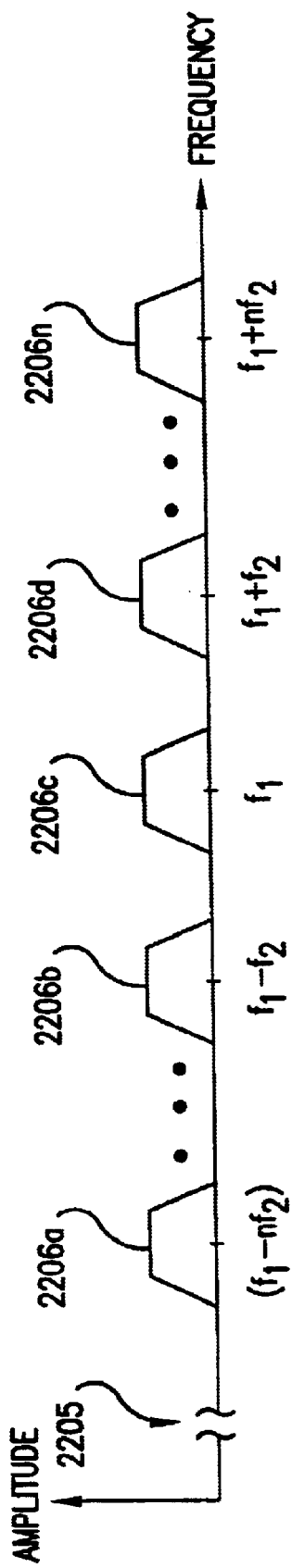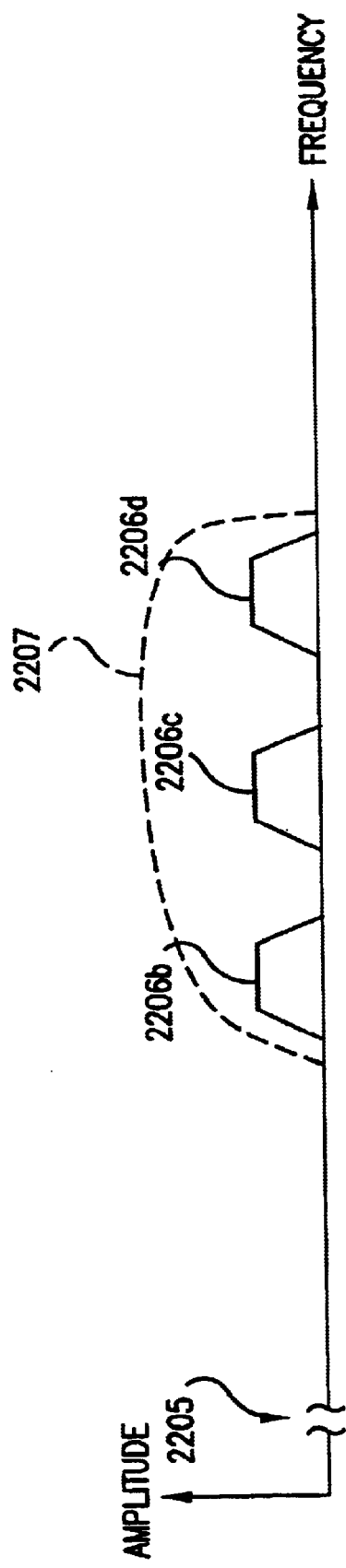
FIG. 23B
FIG. 23C

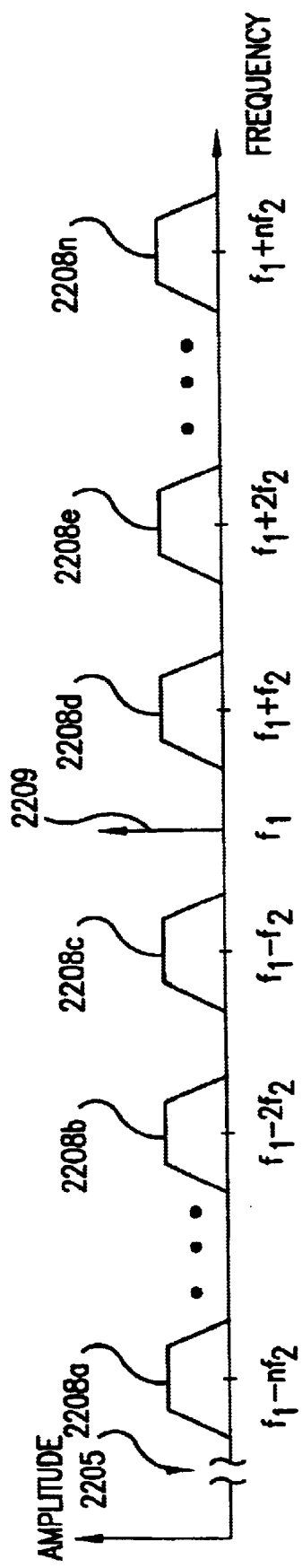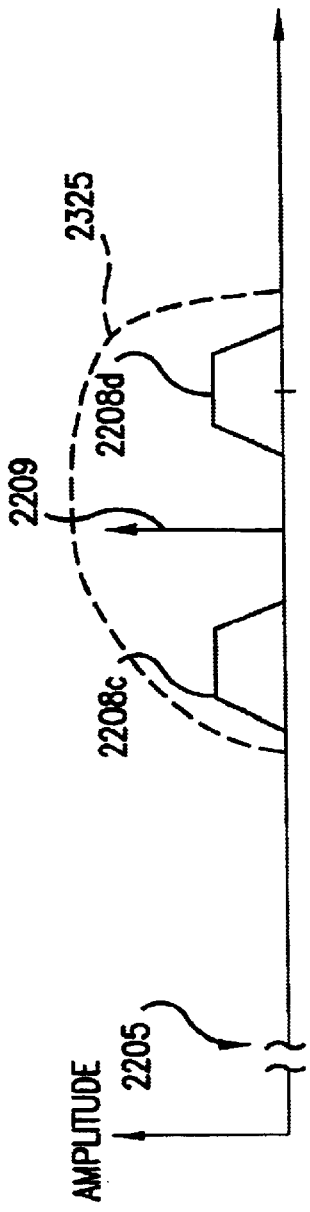
FIG. 23E
FIG. 23F

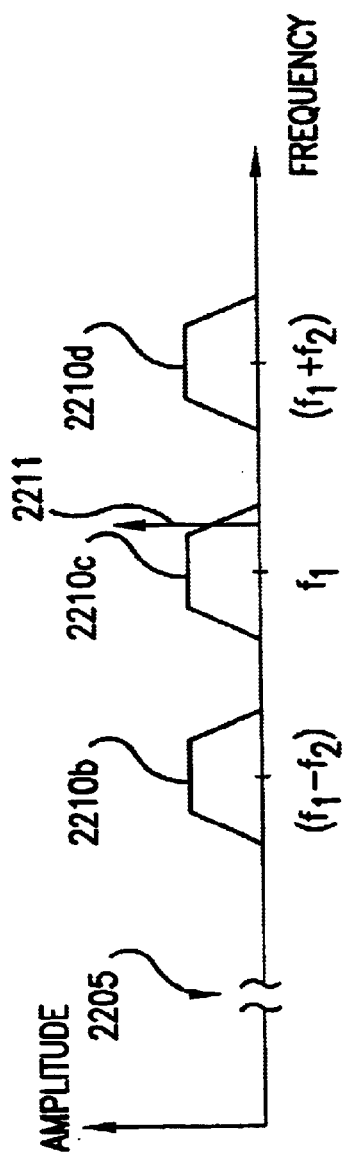
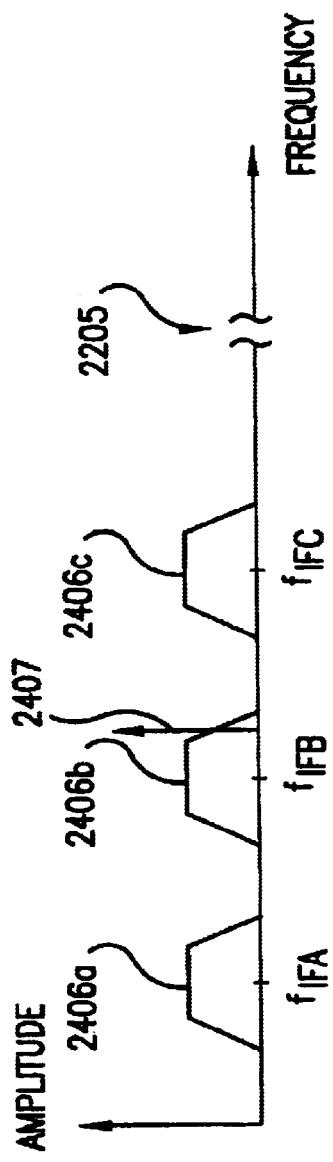

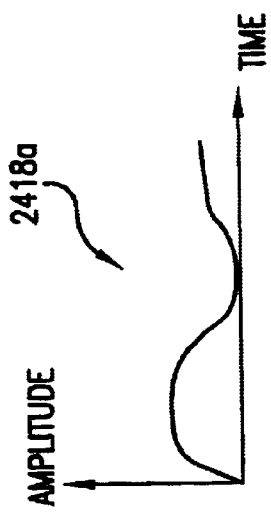
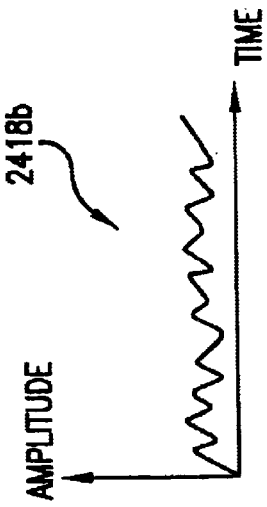
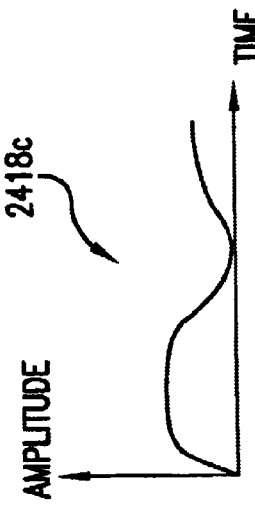
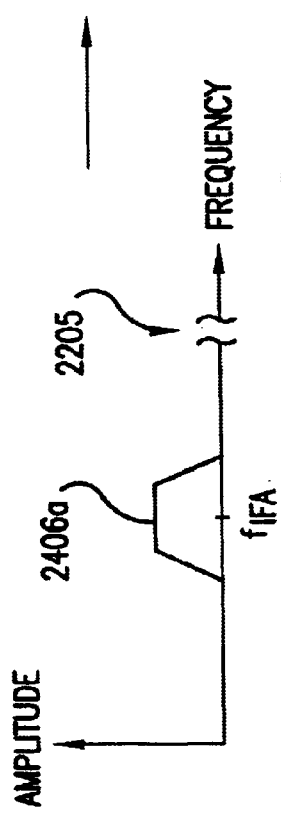
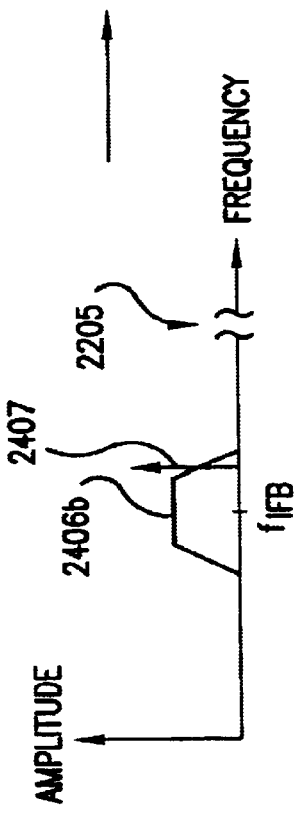
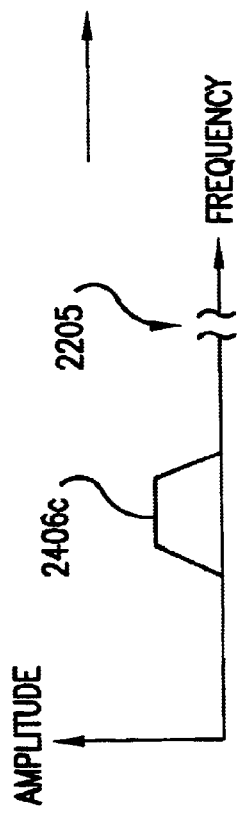

FREQUENCY SPECTRUM OF SIGNAL GENERATOR

FREQUENCY SPECTRA OF THE OUTPUT OF THE FIRST GENERALIZED FREQUENCY TRANSLATION DEVICE

FREQUENCY SPECTRUM OF THE OUTPUT OF FIRST FILTER

FREQUENCY SPECTRA OF THE OUTPUT OF THE SECOND
GENERALIZED FREQUENCY TRANSLATION DEVICE
(IMPLEMENTATION WHEREIN $f_2 < f_1$)

FREQUENCY SPECTRA OF THE OUTPUT OF THE SECOND
GENERALIZED FREQUENCY TRANSLATION DEVICE
(IMPLEMENTATION WHEREIN $f_2 > f_1$)

FREQUENCY SPECTRA OF THE OUTPUT OF THE
SECOND FILTER (IMPLEMENTATION WHEREIN $f_2 > f_1$)

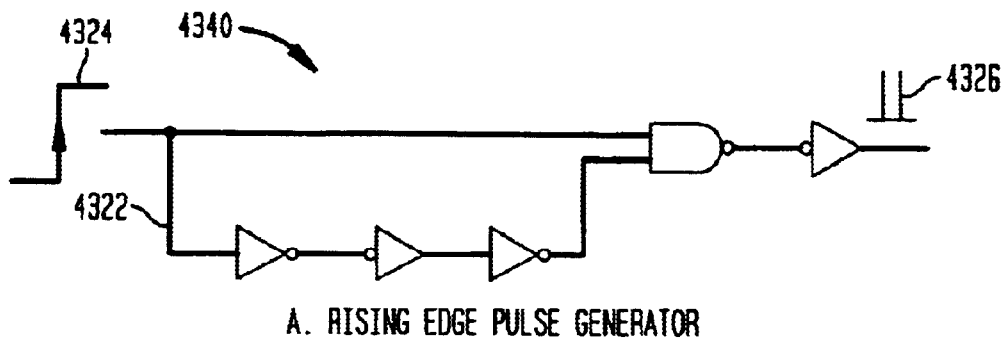
A. RISING EDGE PULSE GENERATOR
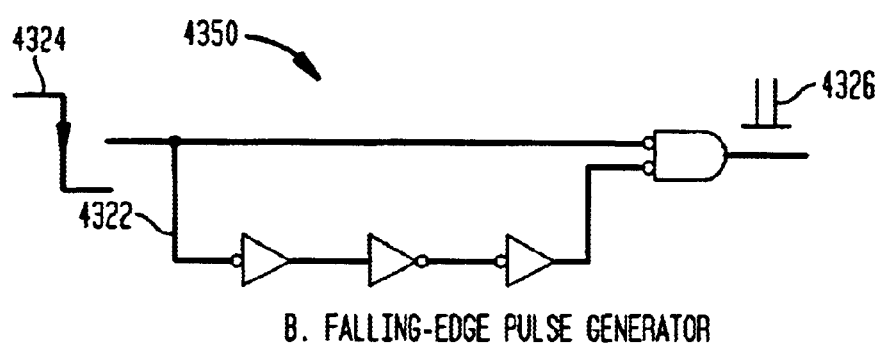
B. FALLING-EDGE PULSE GENERATOR
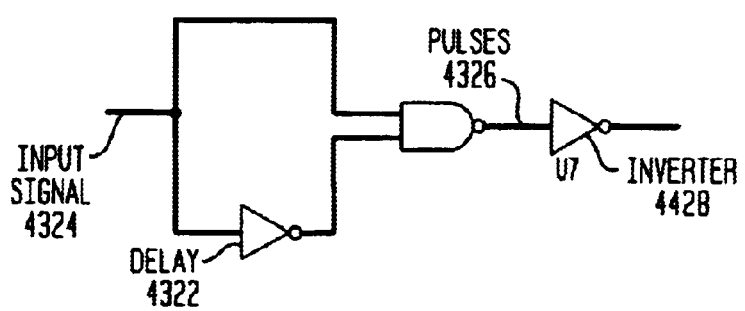

IMPEDANCE MATCHED ALIASING MODULE

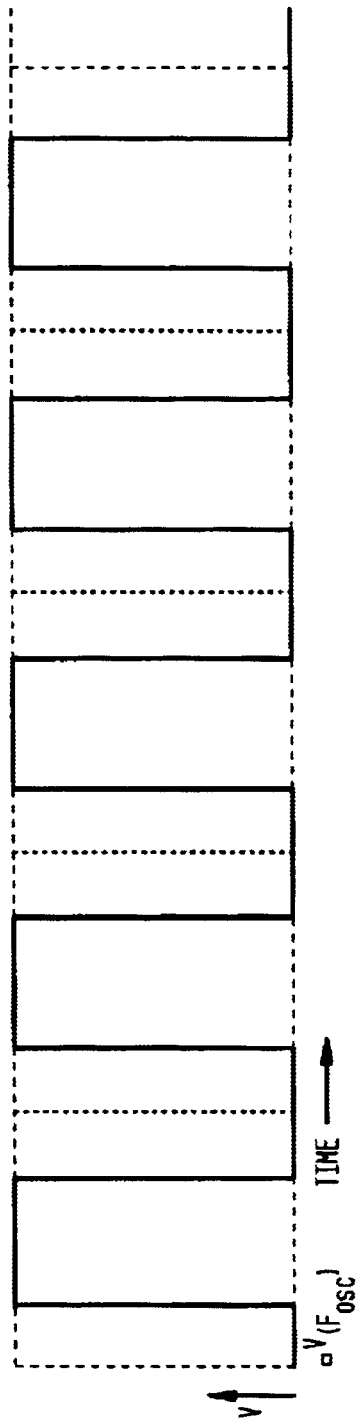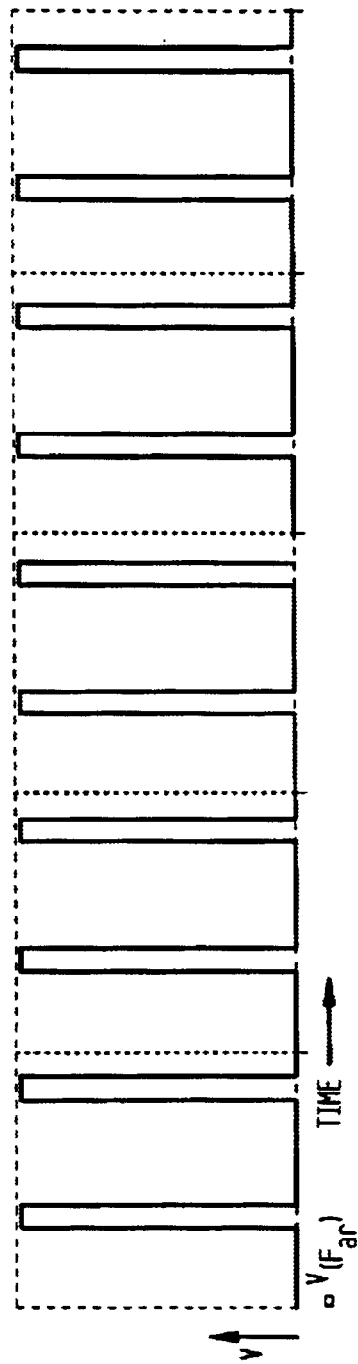

ALIASING MODULE

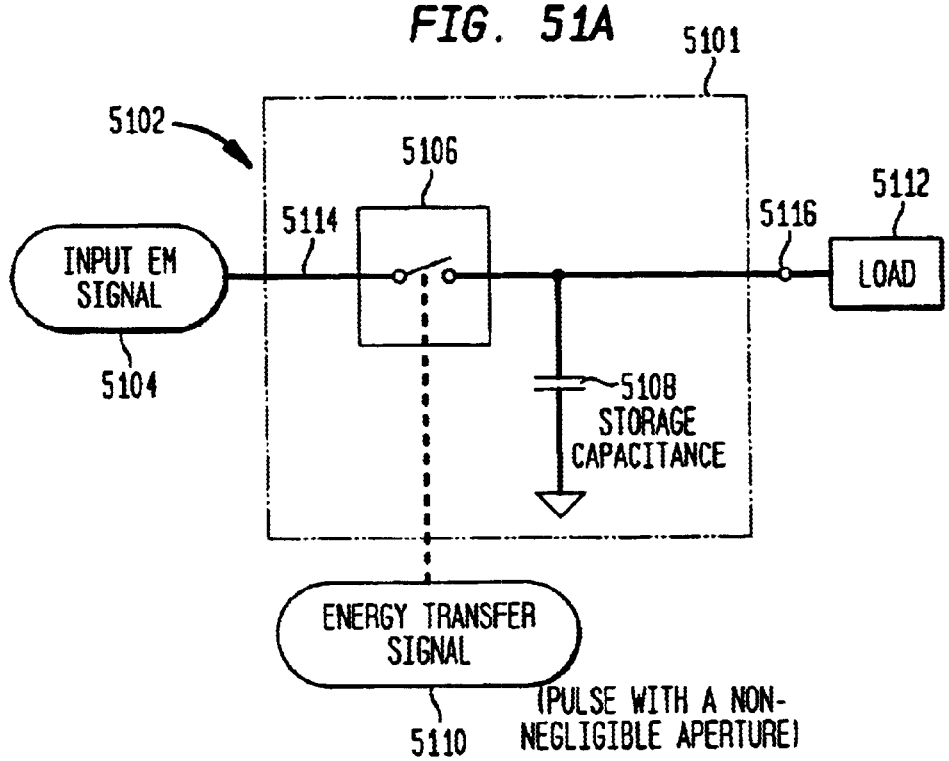
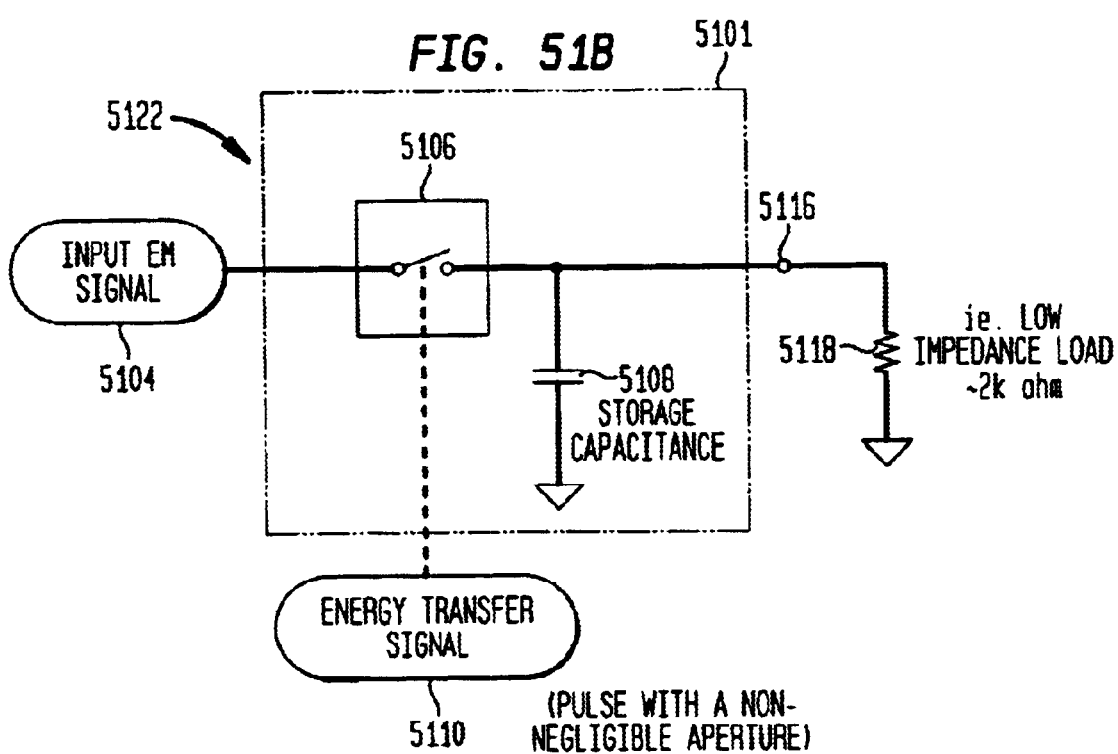

STATE MACHINE FLOWCHART

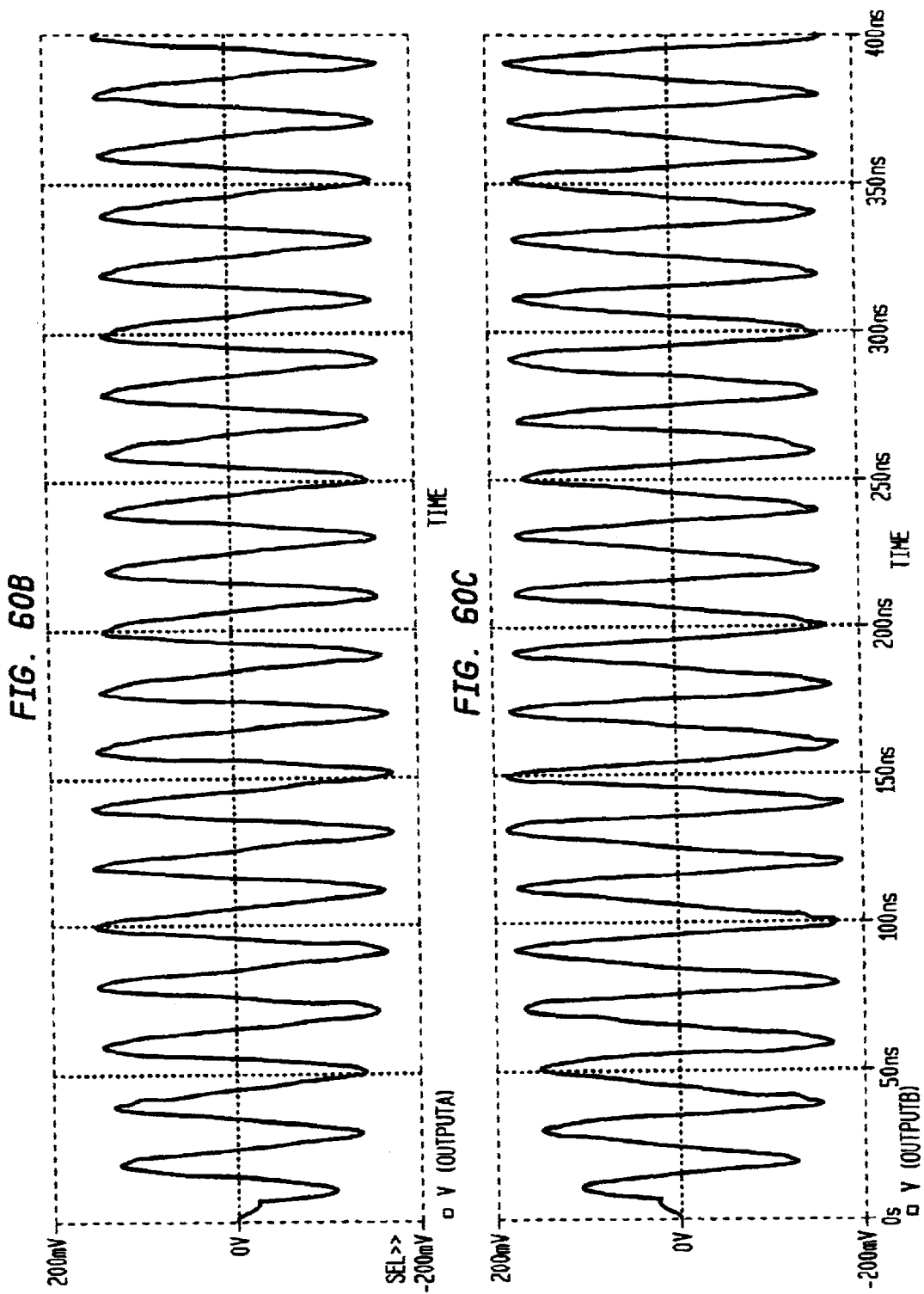

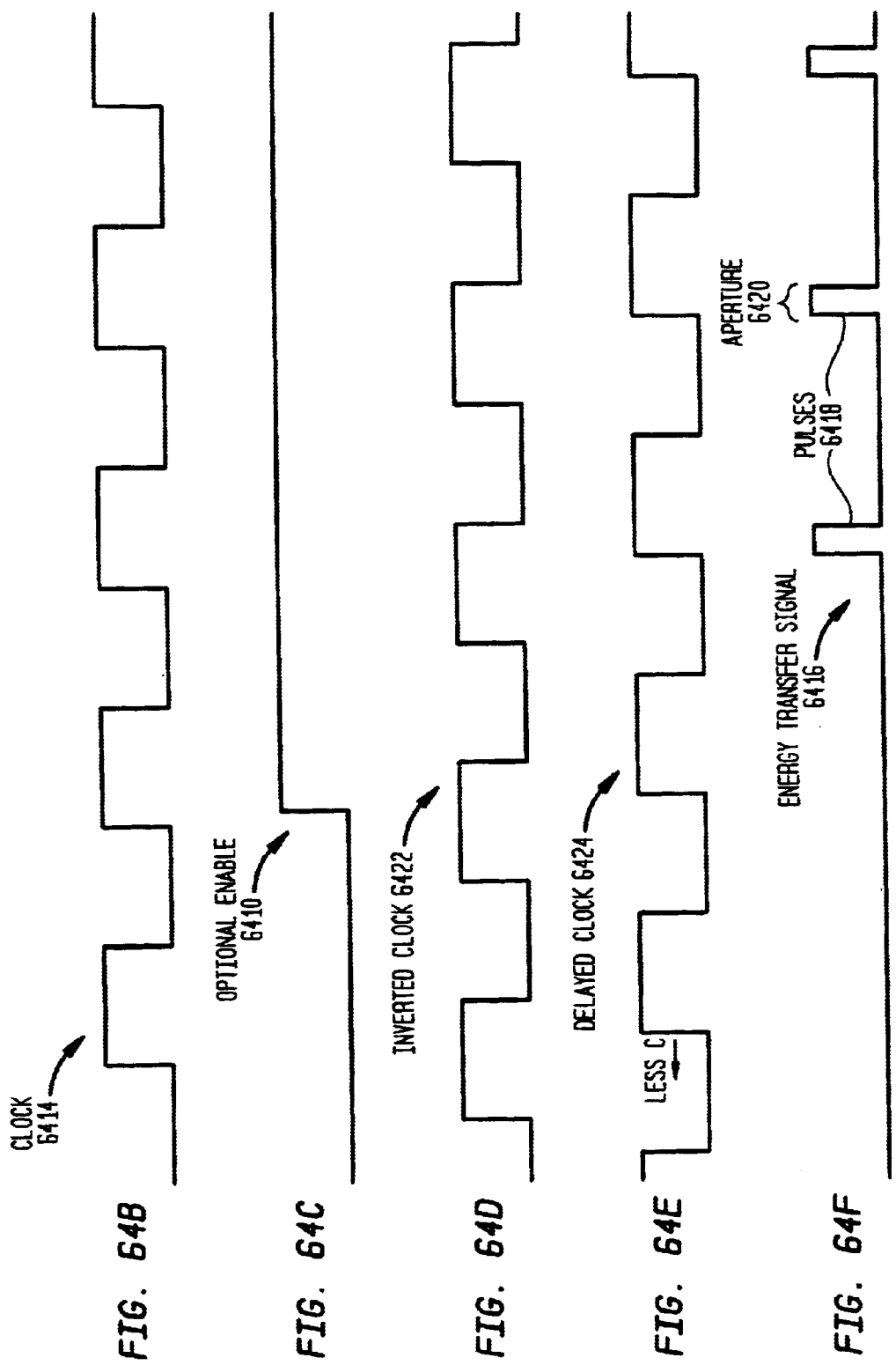

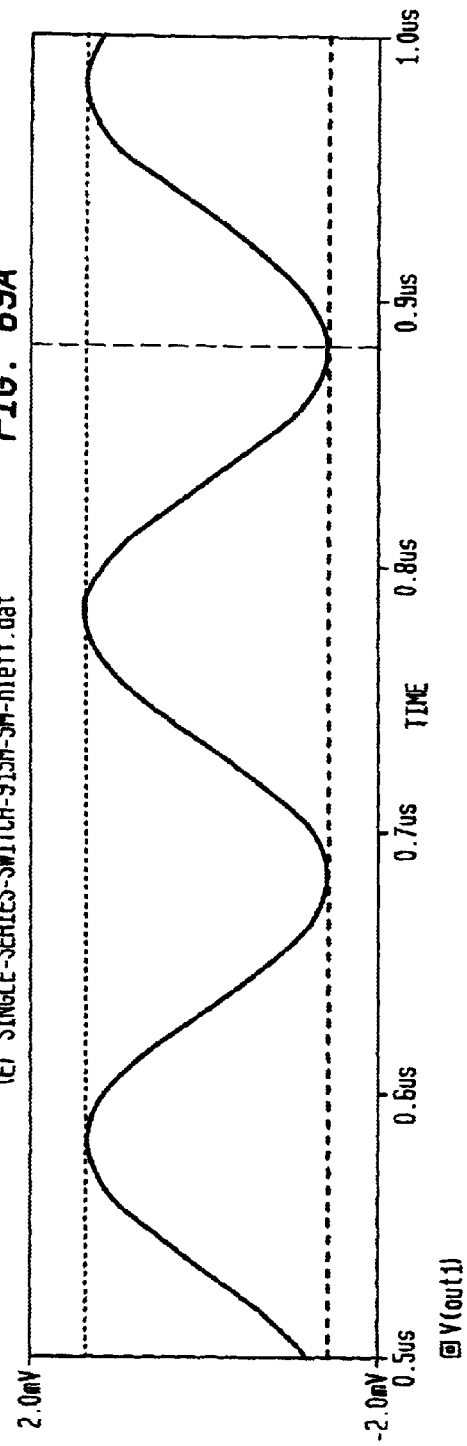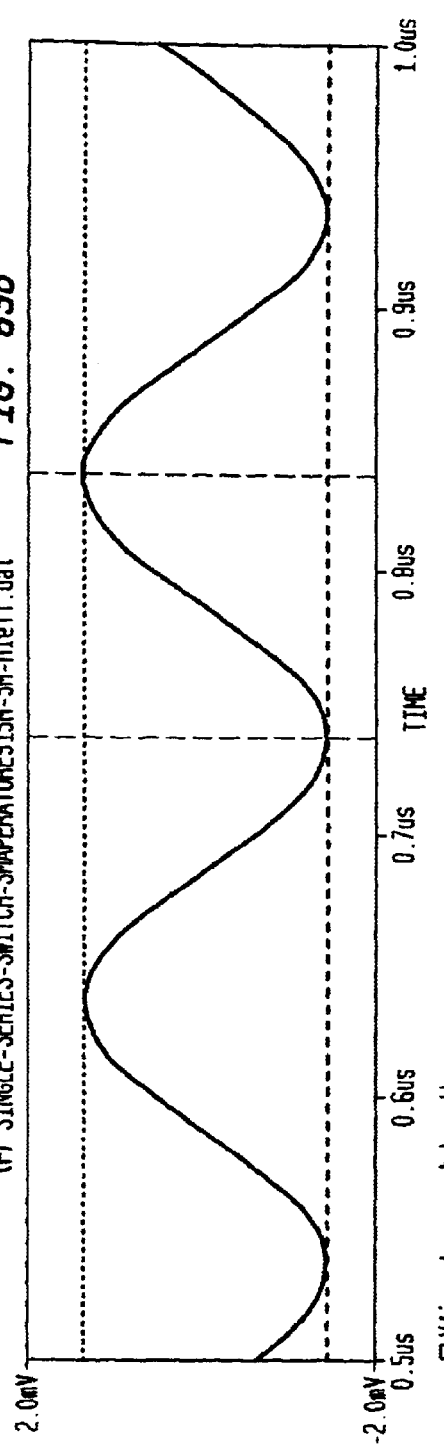

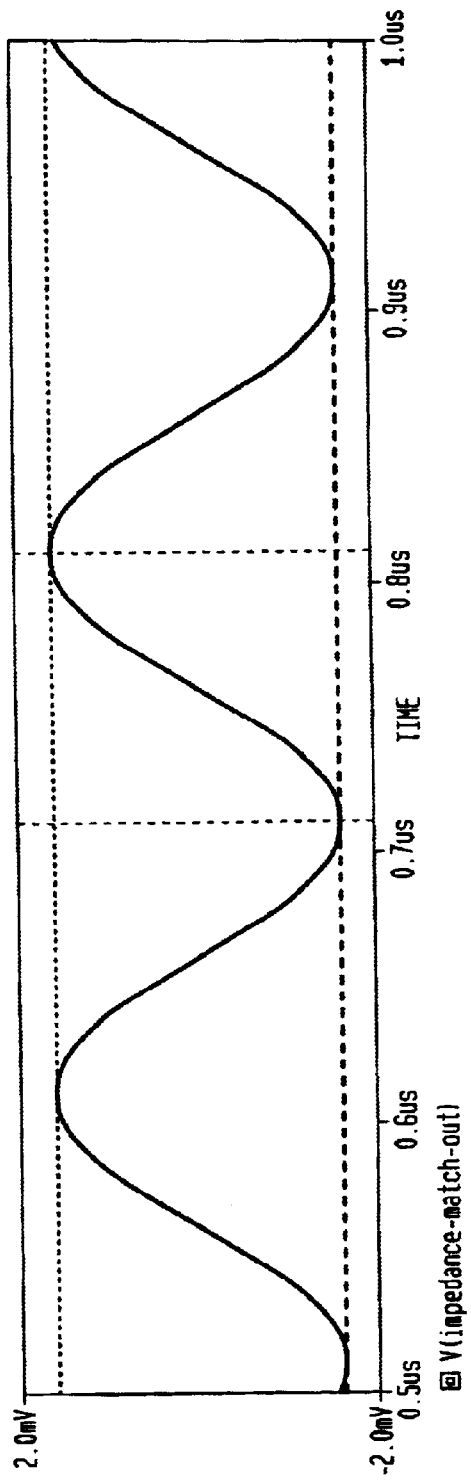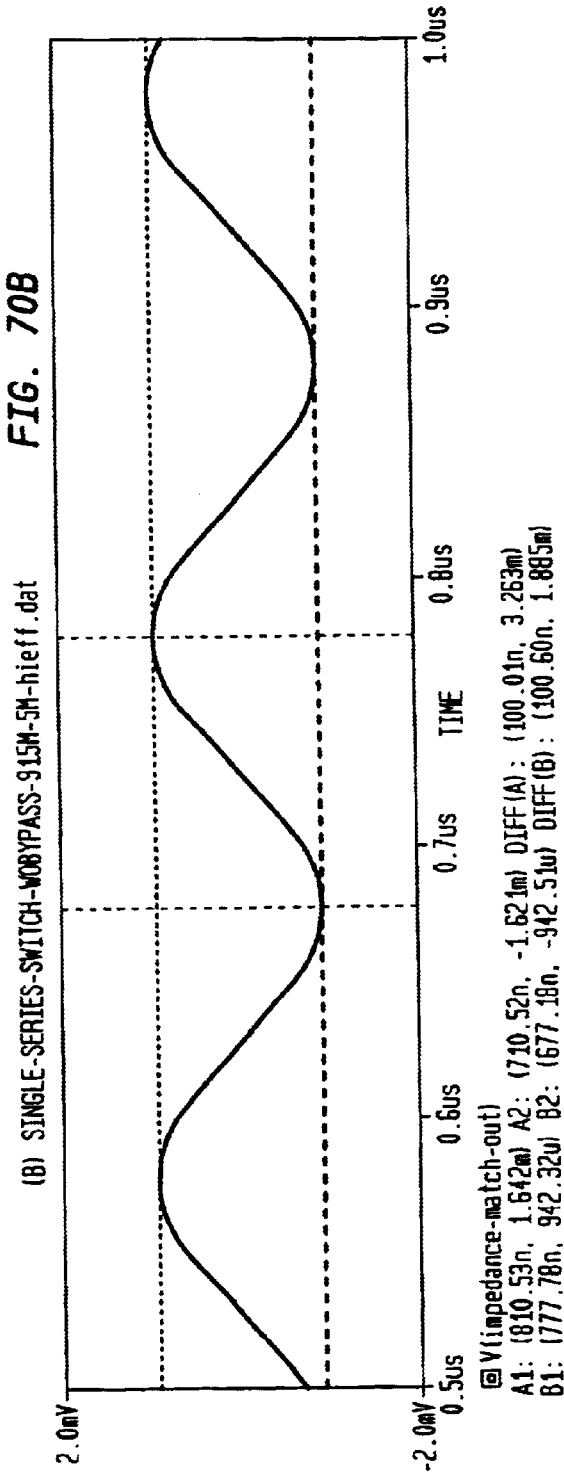

FIG. 71A

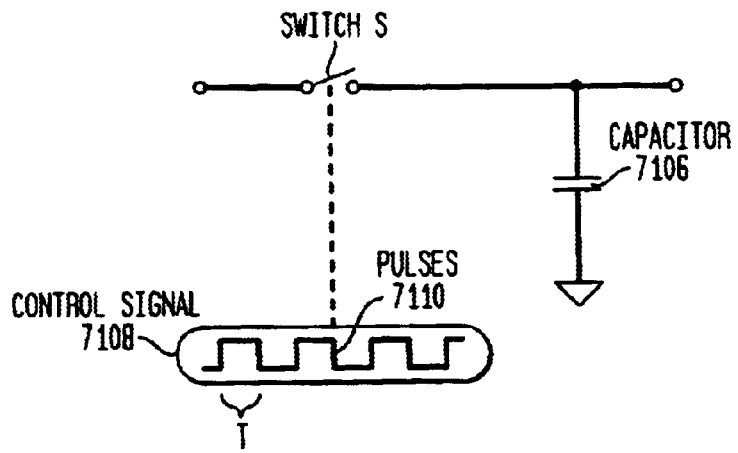

FIG. 71B

| | |
|---|---|
| $q = C \cdot V$ | EQ. 2 |
| $V = A \cdot \sin(t)$ | EQ. 3 |
| $q(t) = C \cdot A \cdot \sin(t)$ | EQ. 4 |
| $\Delta q(t) = C \cdot A \cdot \sin(t) - C \cdot A \cdot \sin(t-T)$ | EQ. 5 |
| $\Delta q(t) = C \cdot A \cdot (\sin(t) - \sin(t-T))$ | EQ. 6 |
| $\sin(\alpha) - \sin(\beta) = 2 \cdot \sin(\frac{\alpha-\beta}{2}) \cdot \cos(\frac{\alpha+\beta}{2})$ | EQ. 7 |
| $\Delta q(t) = 2 \cdot C \cdot A \cdot \sin(\frac{t-(t-T)}{2}) \cdot \cos(\frac{t+(t-T)}{2})$ | EQ. 8 |
| $\Delta q(t) = 2 \cdot C \cdot A \cdot \sin(\frac{1}{2} \cdot T) \cdot \cos(t - \frac{1}{2} \cdot T)$ | EQ. 9 |
| $q(t) = \int C \cdot A \cdot (\sin(t) - \sin(t-T))dt$ | EQ. 10 |
| $q(t) = -\cos(t) \cdot C \cdot A + \cos(t-T) \cdot C \cdot A$ | EQ. 11 |
| $q(t) = C \cdot A \cdot (\cos(t-T) - \cos(t))$ | EQ. 12 |

FIG. 71C
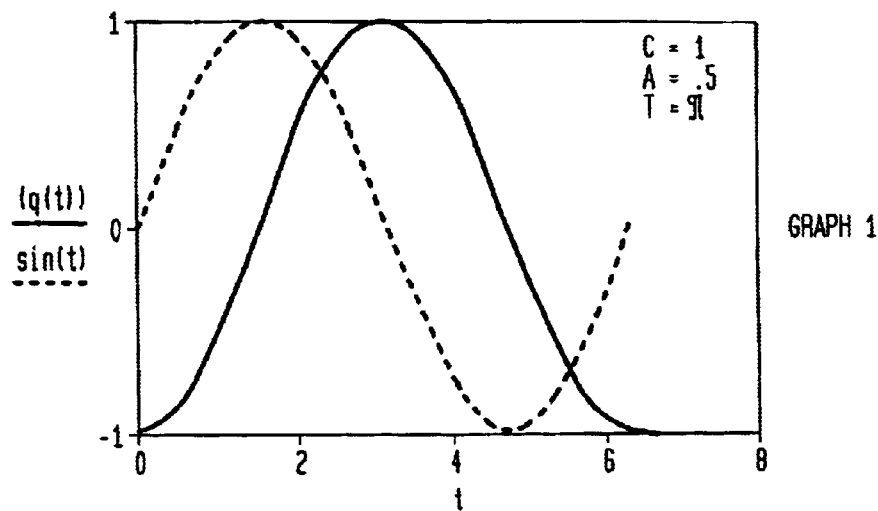
GRAPH 1
FIG. 71D
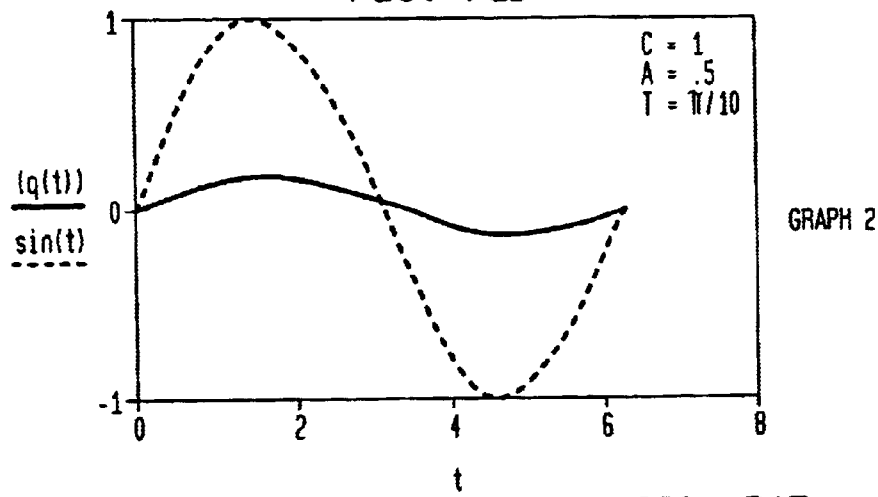
GRAPH 2
FIG. 71E
POWER-CHARGE RELATIONSHIP
$q = C \cdot V$     EQ. 13
$V = q/C$     EQ. 14
$V = J/q$     EQ. 15
$J = q^2/C$     EQ. 16
$P = J/S$     EQ. 17
$P = \dfrac{q^2}{C \cdot S}$     EQ. 18
FIG. 71F
INSERTION LOSS
INSERTION LOSS IN dB IS EXPRESSED BY:
$IL dB = 10 \cdot \log\left(\dfrac{P_{in}}{P_{out}}\right)$     EQ. 19
OR
$IL dB = 10 \cdot \log\left[\dfrac{\left(\dfrac{V_{in}^2}{R_{in}}\right)}{\left(\dfrac{V_{out}^2}{R_{out}}\right)}\right]$     EQ. 20

FREQUENCY SYNTHESIZER USING UNIVERSAL FREQUENCY TRANSLATION TECHNOLOGY

The present application is a continuation-in-part of the following pending U.S. applications, which are incorporated herein by reference in their entireties:

"Method and System for Frequency Up-Conversion," Ser. No. 09/176,154, filed Oct. 21, 1998 now U.S. Pat. No. 6,061,551;

"Method and System for Down-Converting Electromagnetic Signals," Ser. No. 09/376,359, filed Aug. 18, 1999, now U.S. Pat. No. 6,266,518, which itself is a continuation of U.S. patent application entitled "Method and System for Down-Converting Electromagnetic Signals," Ser. No. 09/176,022, filed Oct. 21, 1998, now U.S. Pat. No. 6,061,551;

"Matched Filter Characterization and Implementation of Universal Frequency Translation Method and Apparatus," Ser. No. 09/521,879, filed Mar. 9, 2000, which itself is a continuation-in-part of U.S. patent application entitled "Method and System for Down-Converting Electromagnetic Signals Including Resonant Structures for Enhanced Energy Transfer," Ser. No. 09/293,342, filed Apr. 16, 1999, which itself is a continuation-in-part of U.S. patent application entitled "Method and System for Down-Converting Electromagnetic Signals," Ser. No. 09/176,022, filed Oct. 21, 1998, now U.S. Pat. No. 6,061,551; and "Method and System for Down-Converting an Electromagnetic Signal, Transforms for Same, and Aperture Relationships," Ser. No. 09/550,644, filed Apr. 14, 2000, which is a continuation-in-part of U.S. patent application entitled "Matched Filter Characterization and Implementation of Universal Frequency Translation Method and Apparatus," Ser. No. 09/521,879, filed Mar. 9, 2000, which itself is a continuation-in-part of U.S. patent application entitled "Method and System for Down-Converting Electromagnetic Signals Including Resonant Structures for Enhanced Energy Transfer," Ser. No. 09/293,342, filed Apr. 16, 1999, which itself is a continuation-in-part of U.S. patent application entitled "Method and System for Down-Converting Electromagnetic Signals," Ser. No. 09/176,022, filed Oct. 21, 1998, now U.S. Pat. No. 6,061,551.

CROSS-REFERENCE TO OTHER APPLICATIONS

The following applications of common assignee are related to the present application, and are herein incorporated by reference in their entireties:

"Method and System for Down-Converting Electromagnetic Signals," Ser. No. 09/176,022, filed Oct. 21, 1998, now U.S. Pat. No. 6,061,551.

"Method and System for Frequency Up-Conversion," Ser. No. 09/176,154, filed Oct. 21, 1998, now U.S. Pat. No. 6,091,940.

"Method and System for Ensuring Reception of a Communications Signal," Ser. No. 09/176,415, filed Oct. 21, 1998, now U.S. Pat. No. 6,061,555.

"Integrated Frequency Translation And Selectivity," Ser. No. 09/175,966, filed Oct. 21, 1998, now U.S. Pat. No. 6,049,706.

"Applications of Universal Frequency Translation," Ser. No. 09/261,129, filed Mar. 3, 1999, now U.S. Pat. No. 6,370,371.

"Method and System for Down-Converting Electromagnetic Signals Having Optimized Switch Structures," Ser. No. 09/293,095, filed Apr. 16, 1999, now allowed.

"Method and System for Down-Converting Electromagnetic Signals Including Resonant Structures for Enhanced Energy Transfer," Ser. No. 09/293,342, filed Apr. 16, 1999.

"Method and System for Frequency Up-Conversion with a Variety of Transmitter Configurations," Ser. No. 09/293,580, filed Apr. 16, 1999, now allowed.

"Integrated Frequency Translation and Selectivity with a Variety of Filter Embodiments," Ser. No. 09/293,283, filed Apr. 16, 1999.

"Matched Filter Characterization and Implementation of Universal Frequency Translation Method and Apparatus," Ser. No. 09/521,879, filed Mar. 9, 2000.

"Method, System, and Apparatus for Balanced Frequency Up-Conversion of a Baseband Signal," Ser. No. 09/525,615, filed Mar. 14, 2000.

"DC Offset, Re-radiation, and I/Q Solutions using Universal Frequency Translation Technology," Ser. No. 09/526,041, filed Mar. 14, 2000.

"Method and System for Down-converting an Electromagnetic Signal, and Transforms for Same, and Aperture Relationships," Ser. No. 09/550,644, filed Apr. 4, 2000.

BACKGROUND OF THE INVENTION

1. Field of the Invention

The present invention is generally related to frequency translation, and applications of same. More particularly, the present invention relates to a frequency synthesizer and applications of the same. Particularly, it is directed to a system and method for providing an output signal at a precise frequency or set of frequencies. As an example, a set of frequencies centered 30 KHz apart may be generated for use in cellular communications implementations.

2. Related Art

Conventional frequency synthesizers require precise frequency sources at or near the frequency of interest. These precise frequency sources are often very expensive. The present invention permits the use of a very stable frequency source centered at any frequency, thereby permitting the use of a lower cost frequency source.

SUMMARY OF THE INVENTION

The present invention is directed to frequency translation, and applications of same. Such applications include, but are not limited to, frequency down-conversion, frequency up-conversion, enhanced signal reception, unified down-conversion and filtering, and combinations and applications of same.

The invention may include one or more receivers, transmitters, and transceivers. According to embodiments of the invention, at least some of these receivers, transmitters, and transceivers are implemented using universal frequency translation (UFT) modules. The UFT modules perform frequency translation operations. Embodiments of the present invention incorporating various applications of the UFT module are described below.

Implementations of the invention exhibit multiple advantages by using UFT modules. These advantages include, but are not limited to, lower power consumption, longer power source life, fewer parts, lower cost, less tuning, and more effective signal transmission and reception. The present invention can receive and transmit signals across a broad frequency range. The structure and operation of embodiments of the UFT module, and various applications thereof are described in detail in the following sections.

Further features and advantages of the invention, as well as the structure and operation of various embodiments of the invention, are described in detail below with reference to the accompanying drawings.

BRIEF DESCRIPTION OF THE FIGURES

The present invention is described with reference to the accompanying drawings, wherein:

FIGS. 6A–6I illustrate exemplary waveforms used to describe the operation of the UFU module;

FIG. 18 is a table of exemplary values at nodes in the UDF module of FIG. 17;

FIGS. 20A and 20A-1 are exemplary aliasing modules according to embodiments of the invention;

FIGS. 23B and 23C are exemplary waveforms used to further describe the enhanced signal reception system according to an embodiment of the invention;

FIGS. 23E and 23F are exemplary waveforms used to further describe the enhanced signal reception system according to an embodiment of the invention;

FIGS. 24B–24J are exemplary waveforms used to further describe the enhanced signal reception system according to an embodiment of the invention;

FIGS. 43A–B illustrate exemplary aperture generators;

FIGS. 44–45 illustrate exemplary aperture generators;

FIGS. 49B and C illustrate exemplary waveforms related to the pulse generator of FIG. 49A;

FIGS. 51A–B illustrate exemplary energy transfer systems according to embodiments of the invention;

FIGS. 60B–C illustrate exemplary timing diagrams for the exemplary system of FIG. 60A;

FIG. 64B illustrates a timing diagram of an exemplary clock signal for real time aperture control, according to an embodiment of the invention;

FIG. 64C illustrates a timing diagram of an exemplary optional enable signal for real time aperture control, according to an embodiment of the invention;

FIG. 64D illustrates a timing diagram of an inverted clock signal for real time aperture control, according to an embodiment of the invention;

FIG. 64E illustrates a timing diagram of an exemplary delayed clock signal for real time aperture control, according to an embodiment of the invention;

FIG. 64F illustrates a timing diagram of an exemplary energy transfer including pulses having apertures that are controlled in real time, according to an embodiment of the invention;

FIG. 69A is a timing diagram for the exemplary embodiment of FIG. 65;

FIG. 69B is a timing diagram for the exemplary embodiment of FIG. 66;

FIG. 70A is a timing diagram for the exemplary embodiment of FIG. 67;

FIG. 70B is a timing diagram for the exemplary embodiment of FIG. 68;

FIG. 71A illustrates and exemplary embodiment of the invention;

FIG. 71B illustrates exemplary equations for determining charge transfer, in accordance with the present invention;

FIG. 71C illustrates relationships between capacitor charging and aperture, in accordance with an embodiment of the present invention;

FIG. 71D illustrates relationships between capacitor charging and aperture, in accordance with an embodiment of the present invention;

FIG. 71E illustrates power-charge relationship equations, in accordance with an embodiment of the present invention;

FIG. 71F illustrates insertion loss equations, in accordance with an embodiment of the present invention.

DETAILED DESCRIPTION OF THE PREFERRED EMBODIMENTS

Table of Contents
1. Universal Frequency Translation
2. Frequency Down-conversion
  2.1 Optional Energy Transfer Signal Module
  2.2 Smoothing the Down-converted Signal
  2.3 Impedance Matching
  2.4 Tanks and Resonant Structures
  2.5 Charge and Power Transfer Concepts
  2.6 Optimizing and Adjusting the Non-negligible Aperture Width/Duration
    2.6.1 Varying Input and Output Impedances
    2.6.2 Real Time Aperture Control
  2.7 Adding a Bypass Network
  2.8 Modifying the Energy Transfer Signal Using Feedback 2.9 Other Implementations
2.10 Exemplary Energy Transfer Down-converters
3. Frequency Up-conversion
4. Enhanced Signal Reception
5. Unified Down-Conversion and Filtering
6. Exemplary Application Embodiments of the Invention
7. Specific Implementation Application
   7.1 System of Operation
   7.2 Method of Operation
8. Other Exemplary Applications
9. Conclusions 1. Universal Frequency Translation The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
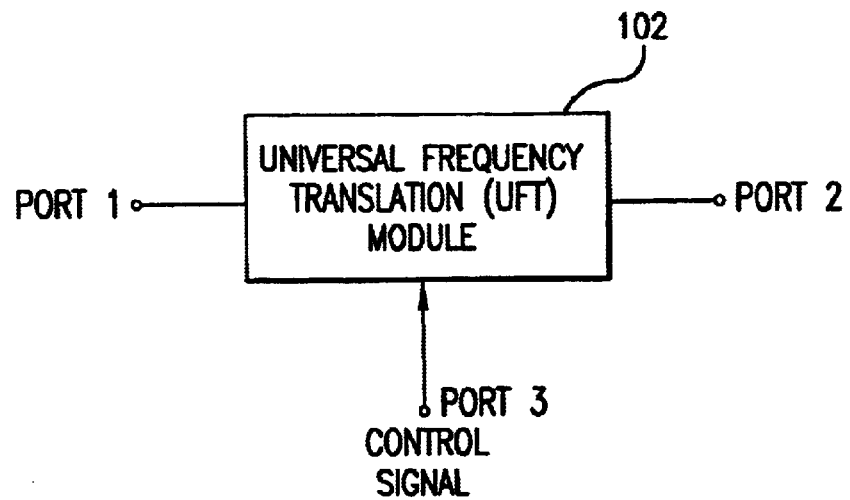
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of UFT module 102 include three ports (nodes), designated in FIG. 1A as Port 1, Port 2, and Port 3. Other UFT embodiments include other than three ports.

Generally, UFT module 102 (perhaps in combination with other components) operates to generate an output signal from an input signal, where the frequency of the output signal differs from the frequency of the input signal. In other words, UFT module 102 (and perhaps other components) operates to generate the output signal from the input signal by translating the frequency (and perhaps other characteristics) of the input signal to the frequency (and perhaps other characteristics) of the output signal.

Figure 1B:
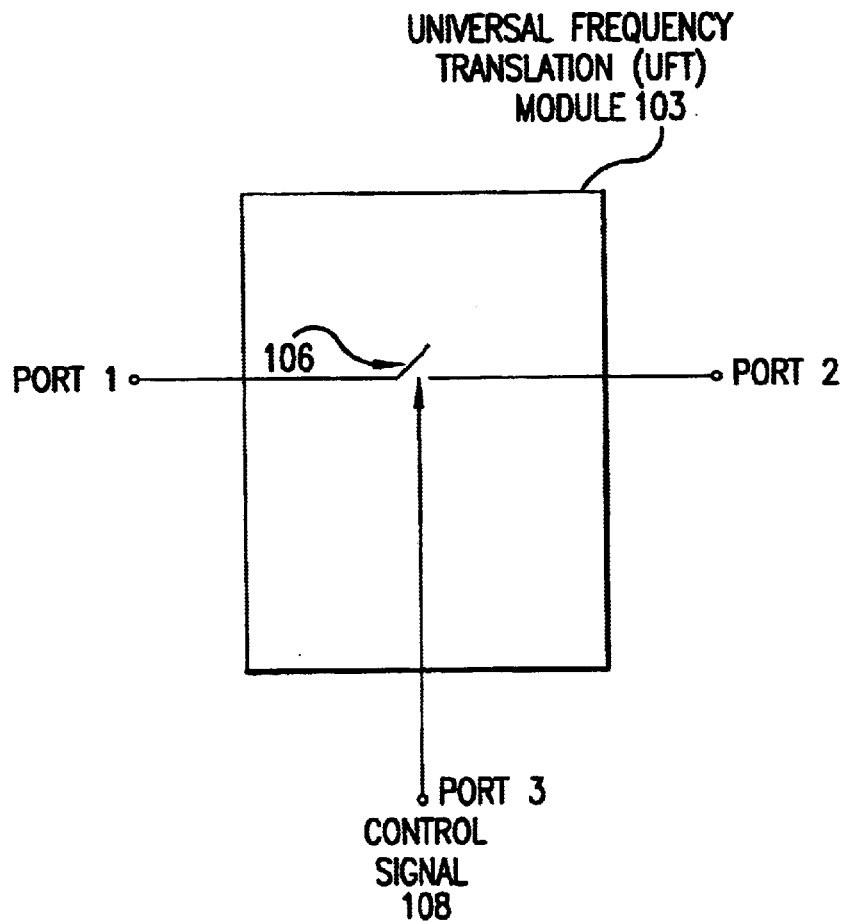
FIG. 1B is a more detailed diagram of a UFT module according to an embodiment of the invention.

An exemplary embodiment of UFT module 103 is generally illustrated in FIG. 1B. Generally, UFT module 103 includes a switch 106 controlled by a control signal 108. Switch 106 is said to be a controlled switch.

Figure 2:
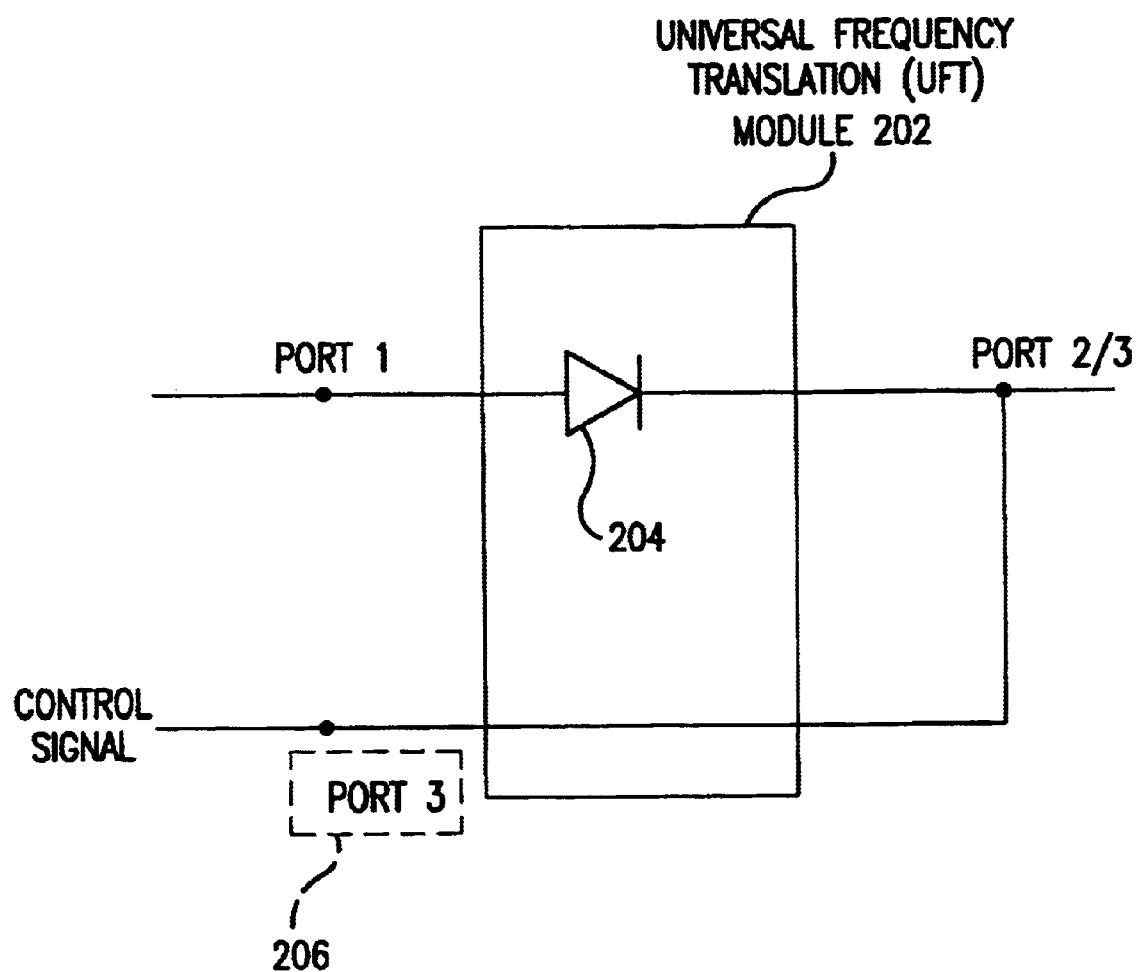
FIG. 2 is a block diagram of a UFT module according to an alternative embodiment of the invention.

As noted above, some UFT embodiments include other than three ports. For example, and without limitation, FIG. 2 illustrates an exemplary UFT module 202. Exemplary UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
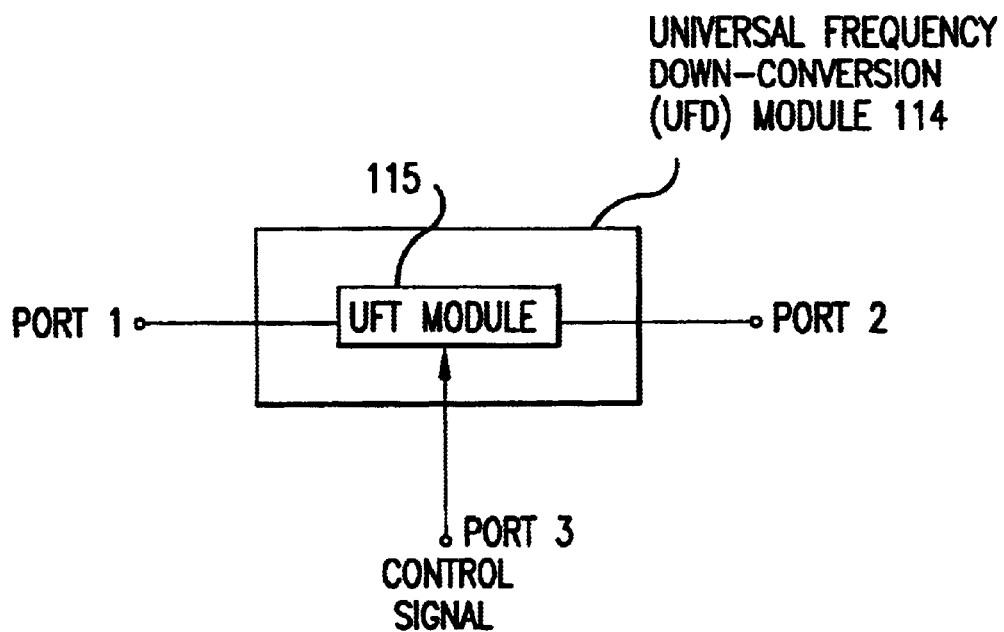
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, UFT module 115 frequency down-converts an input signal to an output signal.

Figure 1D:
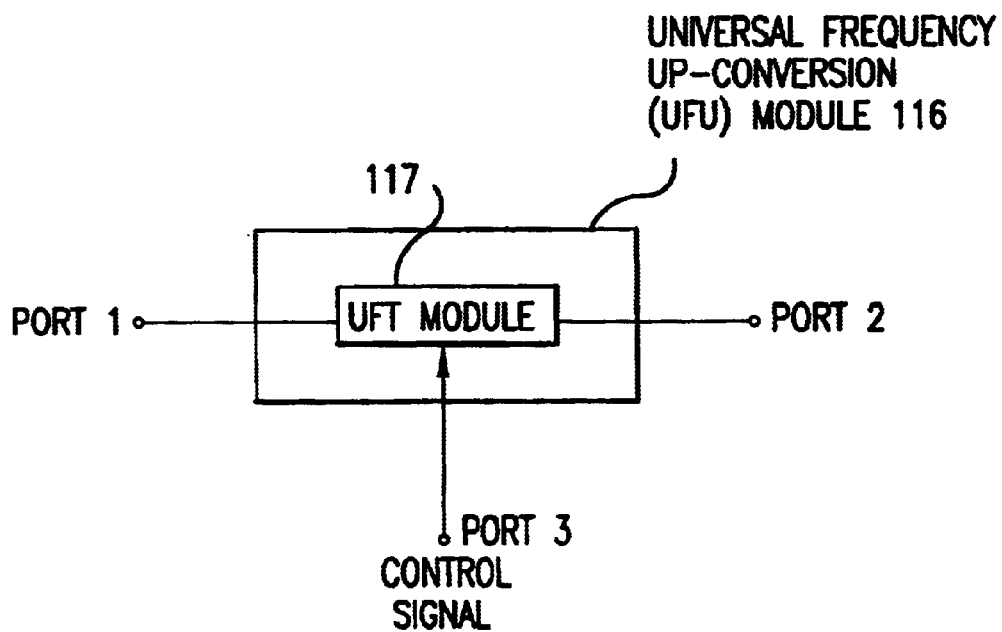
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2. Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. patent application entitled "Method and System for Down-Converting Electromagnetic Signals," Ser. No. 09/176,022, filed Oct. 21, 1998, the full disclosure of which is incorporated herein by reference. A relevant portion of the above mentioned patent application is summarized below to describe down-converting an input signal to produce a down-converted signal that exists at a lower frequency or a baseband signal.

Figure 20A:
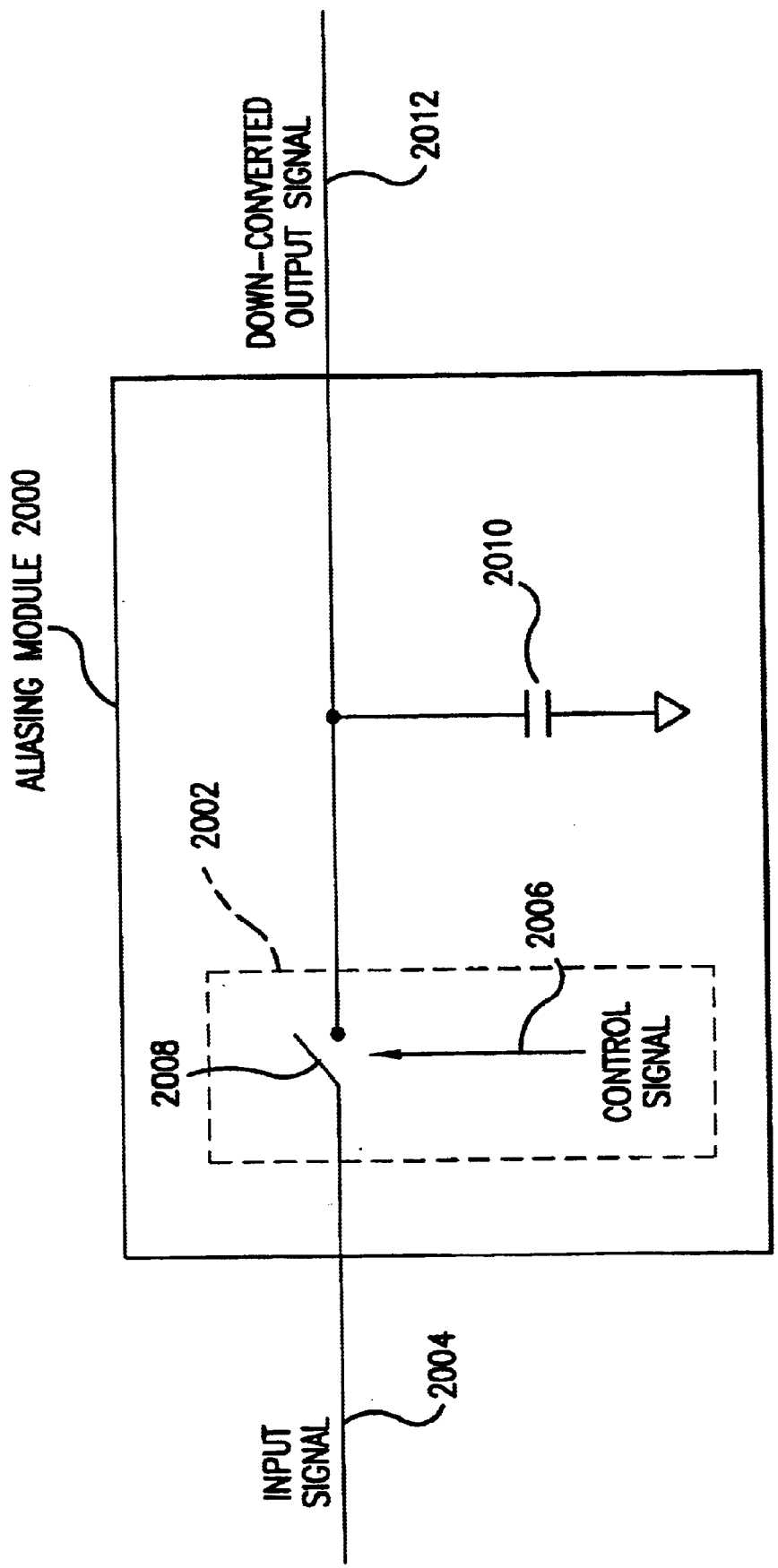

FIG. 20A illustrates an aliasing module 2000 for down-conversion using a universal frequency translation (UFT) module 2002 which down-converts an EM input signal 2004. In particular embodiments, aliasing module 2000 includes a switch 2008 and a capacitor 2010. The electronic alignment of the circuit components is flexible. That is, in one implementation, switch 2008 is in series with input signal 2004 and capacitor 2010 is shunted to ground (although it may be other than ground in configurations such as differential mode). In a second implementation (see FIG. 20A-1), capacitor 2010 is in series with input signal 2004 and switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of EM input signal 2004.

In one implementation, aliasing module 2000 down-converts input signal 2004 to an intermediate frequency (IF) signal. In another implementation, aliasing module 2000 down-converts input signal 2004 to a demodulated baseband signal. In yet another implementation, input signal 2004 is a frequency modulated (FM) signal, and aliasing module 2000 down-converts it to a non-FM signal, such as a phase modulated (PM) signal or an amplitude modulated (AM) signal. Each of the above implementations is described below.

In an embodiment, control signal 2006 includes a train of pulses that repeat at an aliasing rate that is equal to, or less than, twice the frequency of input signal 2004. In this embodiment, control signal 2006 is referred to herein as an aliasing signal because it is below the Nyquist rate for the frequency of input signal 2004. Preferably, the frequency of control signal 2006 is much less than input signal 2004.

Figure 20B:
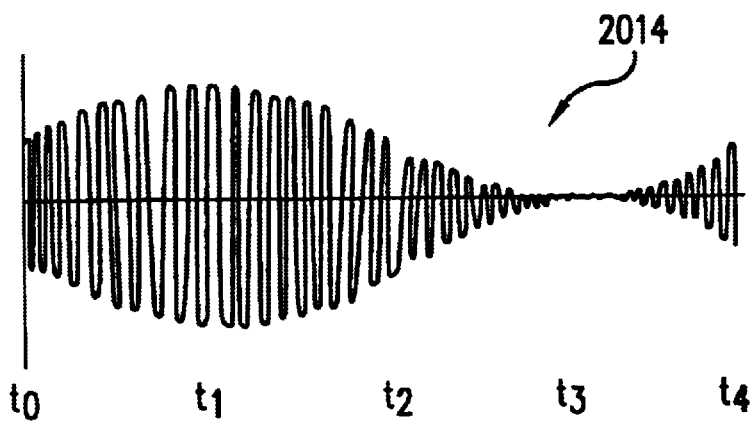
FIGS. 20B–20F are exemplary waveforms used to describe the operation of the aliasing modules of FIGS. 20A and 20A-1.
Figure 20C:
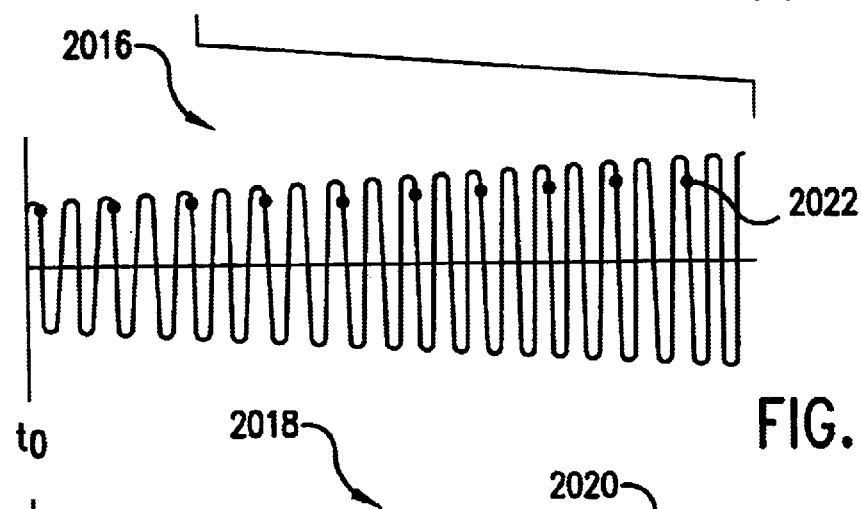
Figure 20D:
Figure 20E:
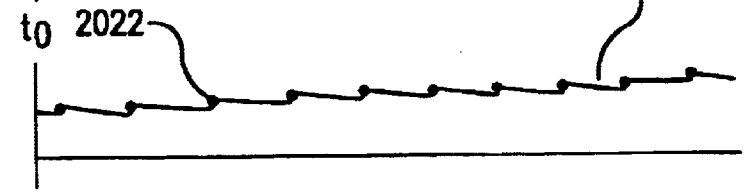

A train of pulses 2018 as shown in FIG. 20D controls switch 2008 to alias input signal 2004 with control signal 2006 to generate a down-converted output signal 2012. More specifically, in an embodiment, switch 2008 closes on a first edge of each pulse 2020 of FIG. 20D and opens on a second edge of each pulse. When switch 2008 is closed, input signal 2004 is coupled to capacitor 2010, and charge is transferred from input signal 2004 to capacitor 2010. The charge stored during successive pulses forms a down-converted output signal 2012.

Exemplary waveforms are shown in FIGS. 20B–20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of analog AM carrier signal 2014 on an expanded time scale. Analog AM carrier signal portion 2016 illustrates analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as analog AM carrier signal portion 2016. In the example shown in FIG. 20D, aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). Pulses 2020 repeat at an aliasing rate, or pulse repetition rate of aliasing signal 2018. The aliasing rate is determined as described below, and further described in U.S. patent application entitled "Method and System for Down-converting Electromagnetic Signals," application Ser. No. 09/176,022, Filed Oct. 21, 1998, and is incorporated herein by reference in its entirety.

Figure 20F:
Figure 20G:
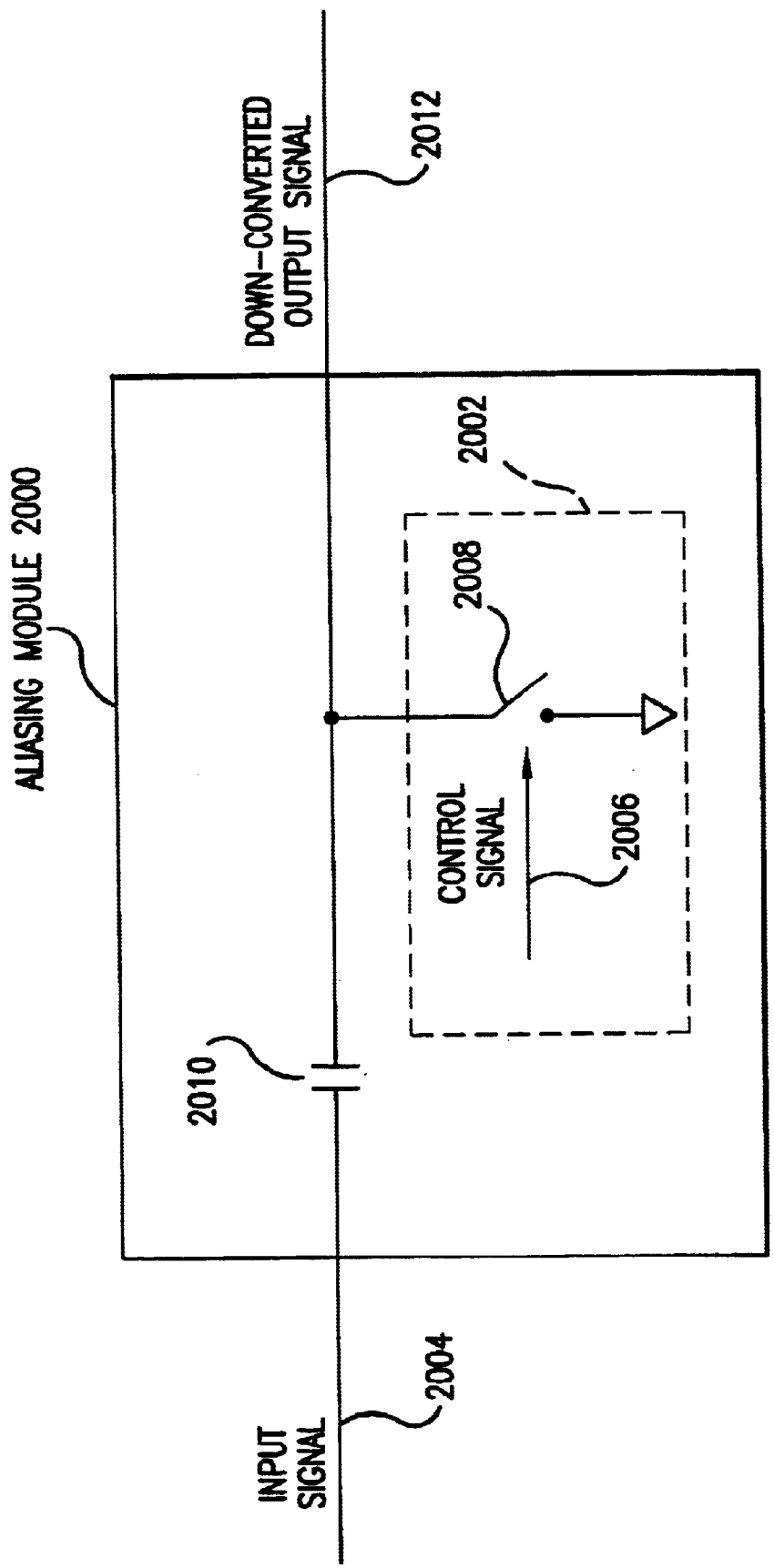

As noted above, train of pulses 2020 (i.e., control signal 2006) control switch 2008 to alias analog AM carrier signal 2016 (i.e., input signal 2004) at the aliasing rate of aliasing signal 2018. Specifically, in this embodiment, switch 2008 closes on a first edge of each pulse and opens on a second edge of each pulse. When switch 2008 is closed, input signal 2004 is coupled to capacitor 2010, and charge is transferred from input signal 2004 to capacitor 2010. The charge transferred during a pulse is referred to herein as an under-sample. Exemplary under-samples 2022 form down-converted signal portion 2024 (FIG. 20E) that corresponds to analog AM carrier signal portion 2016 (FIG. 20C) and train of pulses 2020 (FIG. 20D). The charge stored during successive under-samples of AM carrier signal 2014 form down-converted signal 2024 (FIG. 20E) that is an example of down-converted output signal 2012 (FIG. 20A). In FIG. 20F, a demodulated baseband signal 2026 represents demodulated baseband signal 2024 after filtering on a compressed time scale. As illustrated, down-converted signal 2026 has substantially the same "amplitude envelope" as AM carrier signal 2014. Therefore, FIGS. 20B–20F illustrate down-conversion of AM carrier signal 2014.

The waveforms shown in FIGS. 20B–20F are discussed herein for illustrative purposes only, and are not limiting. Additional exemplary time domain and frequency domain drawings, and exemplary methods and systems of the invention relating thereto, are disclosed in U.S. patent application entitled "Method and System for Down-converting Electromagnetic Signals," application Ser. No. 09/176,022, Filed Oct. 21, 1998, and is incorporated herein by reference in its entirety.

The aliasing rate of control signal 2006 determines whether input signal 2004 is down-converted to an IF signal, down-converted to a demodulated baseband signal, or down-converted from an FM signal to a PM or an AM signal. Generally, relationships between input signal 2004, the aliasing rate of control signal 2006, and down-converted output signal 2012 are illustrated below:

(Freq. of input signal 2004)=$n$·(Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, ...).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHz input signal to a 1 MHz IF signal, the frequency of control signal 2006 would be calculated as follows:

$$(\text{Freq}_{input} - \text{Freq}_{IF})/n = \text{Freq}_{control}$$

$$(901 \text{ MHz} - 1 \text{ MHz})/n = 900/n$$

For n=0.5, 1, 2, 3, 4, etc., the frequency of control signal 2006 would be substantially equal to 1.8 GHz, 900 MHz, 450 MHz, 300 MHz, 225 MHz, etc.

Exemplary time domain and frequency domain drawings, illustrating down-conversion of analog and digital AM, PM and FM signals to IF signals, and exemplary methods and systems thereof, are disclosed in U.S. patent application entitled "Method and System for Down-converting Electromagnetic Signals," U.S. patent application Ser. No. 09/176,022, Filed Oct. 21, 1998, and is incorporated herein by reference in its entirety.

Alternatively, when the aliasing rate of control signal 2006 is substantially equal to the frequency of input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of input signal 2004. As a result, the under-samples form a constant output baseband signal. If input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHz input signal to a demodulated baseband signal (i.e., zero IF), the frequency of control signal 2006 would be calculated as follows:

$$(\text{Freq}_{input} - \text{Freq}_{IF})/n = \text{Freq}_{control}$$

$$(900 \text{ MHz} - 0 \text{ MHz})/n = 900 \text{ MHz}/n$$

For n=0.5, 1, 2, 3, 4, etc., the frequency of control signal 2006 should be substantially equal to 1.8 GHz, 900 MHz, 450 MHz, 300 MHz, 225 MHz, etc.

Exemplary time domain and frequency domain drawings, illustrating direct down-conversion of analog and digital AM and PM signals to demodulated baseband signals, and exemplary methods and systems thereof, are disclosed in the U.S. patent application entitled "Method and System for Down-converting Electromagnetic Signals," U.S. patent application Ser. No. 09/176,022, Filed Oct. 21, 1998, and is incorporated herein by reference in its entirety.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)+2]$) of the FSK signal is down-converted to zero IF. For example, to down-convert an FSK signal having $F_1$ equal to 899 MHz and $F_2$ equal to 901 MHz, to a PSK signal, the aliasing rate of control signal 2006 would be calculated as follows:

Frequency of the input $= (F_1 + F_2) \div 2$ $= (899 \text{ MHz} + 901 \text{ MHz}) \div 2$ $= 900 \text{ MHz}$ Frequency of the down-converted signal=0 (i.e., baseband)

$(\text{Freq}_{input} - \text{Freq}_{IF})/n = \text{Freq}_{control}$ $(900 \text{ MHz} - 0 \text{ MHz})/n = 900 \text{ MHz}/n$ For n=0.5, 1, 2, 3, etc., the frequency of control signal 2006 should be substantially equal to 1.8 GHz, 900 MHz, 450 MHz, 300 MHz, 225 MHz, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHz and $F_2$ equal to 901 MHz, to an ASK signal, the aliasing rate of control signal 2006 should be substantially equal to:

$(900 \text{ MHz} - 0 \text{ MHz})/n = 900 \text{ MHz}/n$, or $(901 \text{ MHz} - 0 \text{ MHz})/n = 901 \text{ MHz}/n$.

For the former case of 900 MHz/n, and for n=0.5, 1, 2, 3, 4, etc., the frequency of control signal 2006 should be substantially equal to 1.8 GHz, 900 MHz, 450 MHz, 300 MHz, 225 MHz, etc. For the latter case of 901 MHz/n, and for n=0.5, 1, 2, 3, 4, etc., the frequency of control signal 2006 should be substantially equal to 1.802 GHz, 901 MHz, 450.5 MHz, 300.333 MHz, 225.25 MHz, etc. The frequency of the down-converted AM signal is substantially equal to the difference between the lower frequency $F_1$ and the upper frequency $F_2$ (i.e., 1 MHz).

Exemplary time domain and frequency domain drawings, illustrating down-conversion of FM signals to non-FM signals, and exemplary methods and systems thereof, are disclosed in the U.S. patent application entitled "Method and System for Down-converting Electromagnetic Signals," U.S. patent application Ser. No. 09/176,022, Filed Oct. 21, 1998, and is incorporated herein by reference in its entirety.

In an embodiment, the pulses of control signal 2006 have negligible apertures that tend towards zero. This makes UFT module 2002 a high input impedance device. This configuration is useful for situations where minimal disturbance of the input signal may be desired.

In another embodiment, the pulses of control signal 2006 have non-negligible apertures that tend away from zero. This makes UFT module 2002 a lower input impedance device. This allows the lower input impedance of UFT module 2002 to be substantially matched with a source impedance of input signal 2004. This also improves the energy transfer from input signal 2004 to down-converted output signal 2012, and hence the efficiency and signal to noise (s/n) ratio of UFT module 2002. In this embodiment, control signal 2006 has an aliasing frequency selected as described above, an aliasing period, "T," that is the inverse of the aliasing frequency, and each of the non-negligible apertures of the pulses of control signal 2006 are said to have an aliasing pulse width, "$PW_A$." The output of UFT module 2002 is stored in capacitor 2010.

In order to effectively transfer energy from input signal 2004 to down-converted output signal 2012, the size of capacitor 2010 is selected based on the ratio of "$PW_A$" to "T" and must be matched with the other circuit elements. Preferably, the capacitor will be "large," as will be understood by one skilled in the relevant art(s). When the size of the capacitor is properly selected for the open-switch and closed-switch impedances and for a specific "$PW_A$" to "T" ratio, the capacitor will charge quickly when switch 2008 of UFT 2002 is closed, and will discharge slowly when switch 2008 is open. The difference in the charging and discharging rates is due to the switching of impedances in and out of the circuit. That is, when switch 2008 is closed, the closed-switch impedance can be said to be $R_C$, and when switch 2008 is open, the open-switch impedance can be said to be $R_O$.

The voltage on capacitor 2010 during charging (i.e., when switch 2008 is closed) can be represented by the equation (assuming there is no charge on the capacitor at t=0)

$$V_{cap/charging} = V_{input} \cdot (1 - e^{-[t/(R_C \cdot C)]})$$

and the voltage on capacitor 2010 during discharge (i.e., when switch 2008 is open) can be seen by the equation (assuming the capacitor is fully charged at t=0)

$$V_{cap/discharging} = V_{full} \cdot e^{-[t/(R_O \cdot C)]}$$

It should be noted that for the capacitor to charge quickly and discharge slowly, the discharging time constant, $R_O \cdot C$, must be greater than the charging time constant, $R_C \cdot C$.

Capacitor 2010 can be characterized as having a first charged state corresponding to the charge on capacitor 2010 at the end of each pulse of control signal 2006 (i.e., at the end of the charging cycle); a second charged state corresponding to the charge on capacitor 2010 at the beginning of the next pulse in control signal 2006 (i.e., at the end of the discharge cycle); and a discharge rate which is the rate at which the first charged state changes to the second charged state and is a function of the size of capacitor 2010. The ratio of the second charged state to the first charged state is the charged ratio, and to effect large energy transfer, the capacitance should be chosen so that the charged ratio is substantially equal to or greater than 0.10. In an alternate embodiment, the capacitor fully discharges while switch 2008 is closed. The discussion herein is provided for illustrative purposes only, and is not meant to be limiting. In another embodiment, the capacitor is replaced by another storage device, such as, and without limitation, an inductor.

Exemplary systems and methods for generating and optimizing control signal 2006, and for otherwise improving energy transfer and s/n ratio, are disclosed in the U.S. patent application entitled "Method and System for Down-converting Electromagnetic Signals," U.S. patent application Ser. No. 09/176,022, Filed Oct. 21, 1998, and is incorporated herein by reference in its entirety.

2.1. Optional Energy Transfer Signal Module

Figure 47:
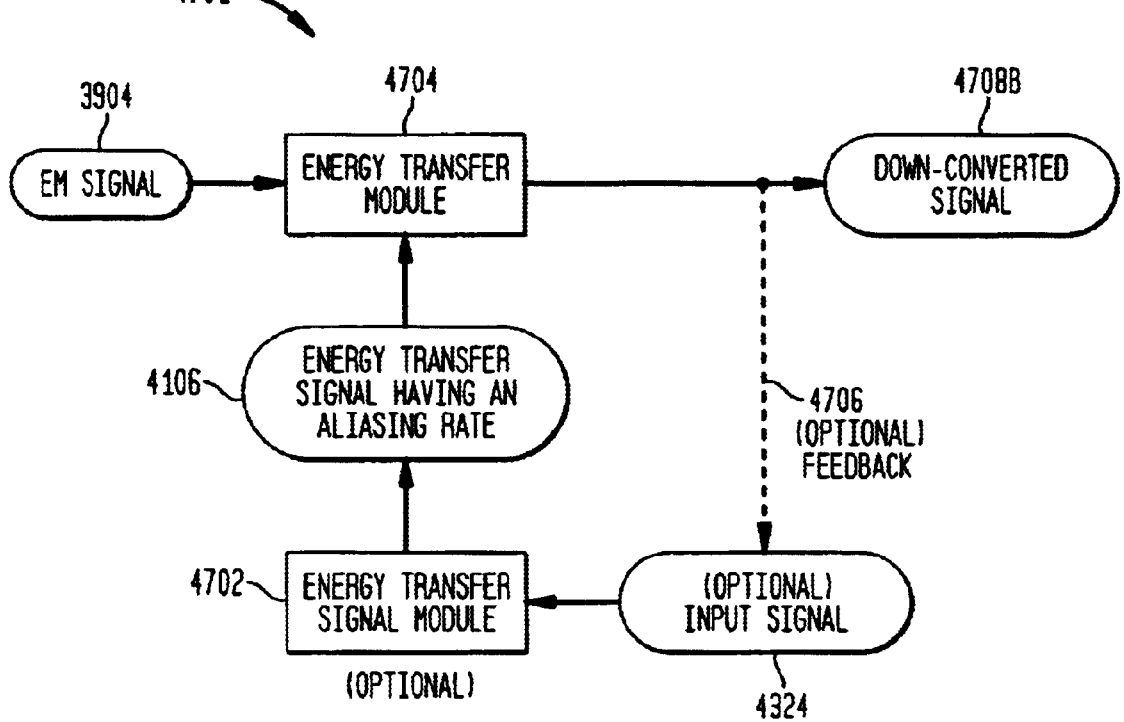
FIG. 47 illustrates an energy transfer system with an optional energy transfer signal module according to an embodiment of the invention.

FIG. 47 illustrates an energy transfer system 4701 that includes an optional energy transfer signal module 4702, which can perform any of a variety of functions or combinations of functions including, but not limited to, generating an energy transfer signal 4106.

In an embodiment, optional energy transfer signal module 4702 includes an aperture generator, an example of which is illustrated in FIG. 44 as an aperture generator 4420. Aperture generator 4420 generates non-negligible aperture pulses 4326 from an input signal 4324. Input signal 4324 can be any type of periodic signal, including, but not limited to, a sinusoid, a square wave, a saw-tooth wave, etc. Systems for generating input signal 4324 are described below.

The width or aperture of pulses 4326 is determined by delay through branch 4322 of aperture generator 4420. Generally, as the desired pulse width increases, the difficulty in meeting the requirements of aperture generator 4420 decrease. In other words, to generate non-negligible aperture pulses for a given EM input frequency, the components used in exemplary aperture generator 4420 do not require as fast reaction times as those that are required in an under-sampling system operating with the same EM input frequency.

The exemplary logic and implementation shown in aperture generator 4420 are provided for illustrative purposes only, and are not limiting. The actual logic employed can take many forms. Exemplary aperture generator 4420 includes an optional inverter 4428, which is shown for polarity consistency with other examples provided herein.

Figure 45:
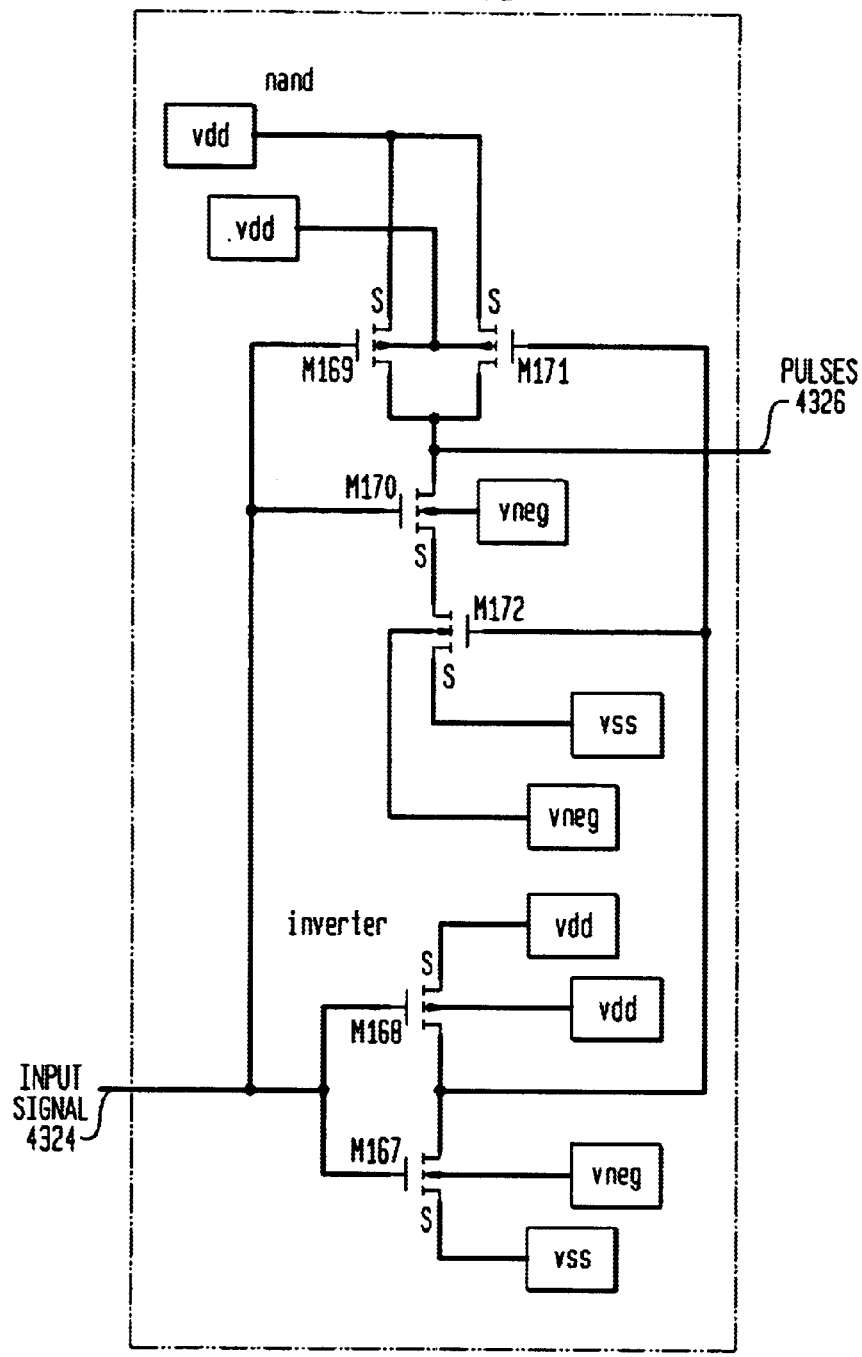

An exemplary implementation of aperture generator 4420 is illustrated in FIG. 45. Additional examples of aperture generation logic are provided in FIGS. 43A and 43B. FIG. 43A illustrates a rising edge pulse generator 4340, which generates pulses 4326 on rising edges of input signal 4324. FIG. 43B illustrates a falling edge pulse generator 4350, which generates pulses 4326 on falling edges of input signal 4324.

Figure 46:
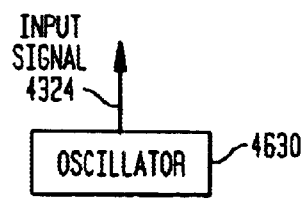
FIG. 46 illustrates an oscillator according to an embodiment of the present invention.

In an embodiment, input signal 4324 is generated externally of energy transfer signal module 4702, as illustrated in FIG. 47. Alternatively, input signal 4724 is generated internally by energy transfer signal module 4702. Input signal 4324 can be generated by an oscillator, as illustrated in FIG. 46 by an oscillator 4630. Oscillator 4630 can be internal to the energy transfer signal module 4702 or external to the energy transfer signal module 4702. Oscillator 4630 can be external to energy transfer system 4701. The output of oscillator 4630 may be any periodic waveform.

The type of down-conversion performed by energy transfer system 4701 depends upon the aliasing rate of energy transfer signal 4106, which is determined by the frequency of pulses 4326. The frequency of pulses 4326 is determined by the frequency of input signal 4324.

For example, when the frequency of input signal 4324 is substantially equal to a harmonic or a sub-harmonic of EM signal 3904, EM signal 3904 is directly down-converted to baseband (e.g. when the EM signal is an AM signal or a PM signal), or converted from FM to a non-FM signal. When the frequency of input signal 4324 is substantially equal to a harmonic or a sub-harmonic of a difference frequency, EM signal 3904 is down-converted to an intermediate signal.

The optional energy transfer signal module 4702 can be implemented in hardware, software, firmware, or any combination thereof.

2.2 Smoothing the Down-Converted Signal

Referring back to FIG. 20A, down-converted output signal 2012 may be smoothed by filtering as desired.

2.3 Impedance Matching

Energy transfer module 2000 has input and output impedances generally defined by (1) the duty cycle of the switch module (i.e., UFT 2002), and (2) the impedance of the storage module (e.g., capacitor 2010), at the frequencies of interest (e.g. at the EM input, and intermediate/baseband frequencies).

Starting with an aperture width of approximately ½the period of the EM signal being down-converted as a preferred embodiment, this aperture width (e.g. the "closed time") can be decreased. As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be used to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Figure 48:
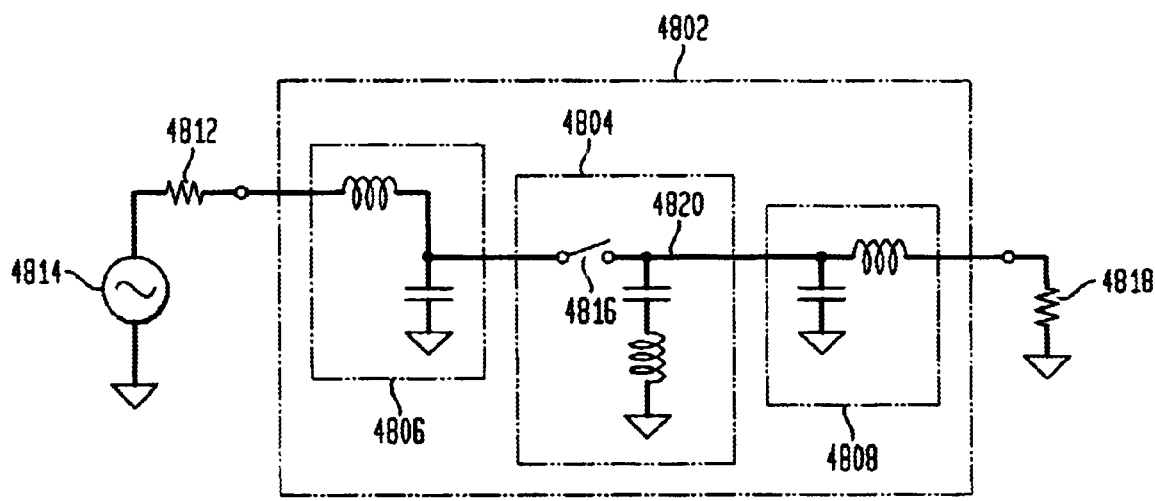
FIG. 48 illustrates an aliasing module with input and output impedance match according to an embodiment of the invention.
Figure 50:
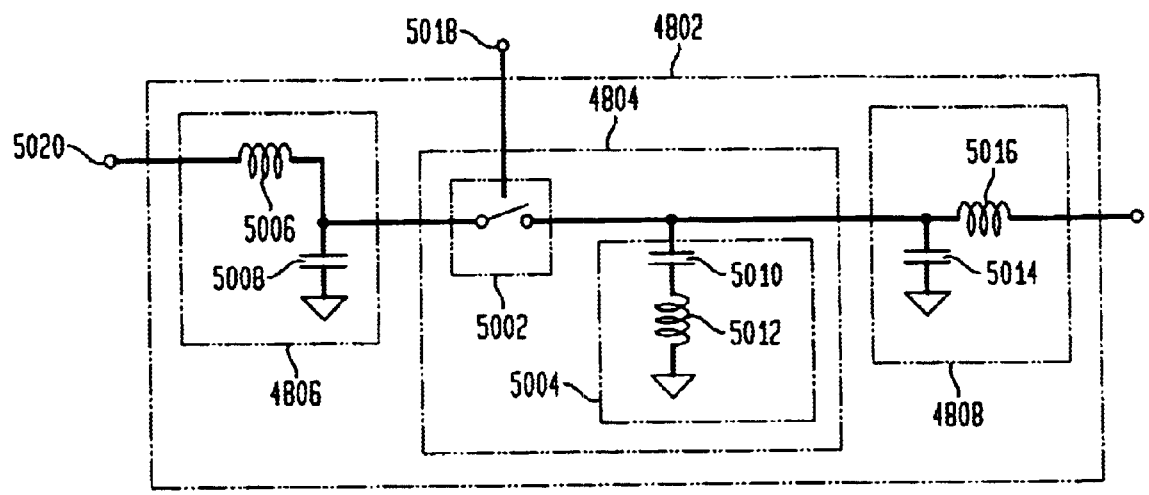
FIG. 50 illustrates an exemplary energy transfer module with a switch module and a reactive storage module according to an embodiment of the invention.

Referring to FIG. 48, a specific embodiment using an RF signal as an input, assuming that impedance 4812 is a relatively low impedance of approximately 50 Ohms, for example, and input impedance 4816 is approximately 300 Ohms, an initial configuration for input impedance match module 4806 can include an inductor 5006 and a capacitor 5008, configured as shown in FIG. 50. The configuration of inductor 5006 and capacitor 5008 is a possible configuration when going from a low impedance to a high impedance. Inductor 5006 and capacitor 5008 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be used to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 5014 and an inductor 5016 can be configured as shown in FIG. 50. Capacitor 5014 and inductor 5016 constitute an L match, the calculation of the component values being well known to those skilled in the relevant arts.

The configuration of input impedance match module 4806 and the output impedance match module 4808 are considered to be initial starting points for impedance matching, in accordance with the present invention. In some situations, the initial designs may be suitable without further optimization. In other situations, the initial designs can be optimized in accordance with other various design criteria and considerations.

As other optional optimizing structures and/or components are used, their affect on the characteristic impedance of the energy transfer module should be taken into account in the match along with their own original criteria.

2.4 Tanks and Resonant Structures

Resonant tank and other resonant structures can be used to further optimize the energy transfer characteristics of the invention. For example, resonant structures, resonant about the input frequency, can be used to store energy from the input signal when the switch is open, a period during which one may conclude that the architecture would otherwise be limited in its maximum possible efficiency. Resonant tank and other resonant structures can include, but are not limited to, surface acoustic wave (SAW) filters, dielectric resonators, diplexers, capacitors, inductors, etc.

Figure 55:
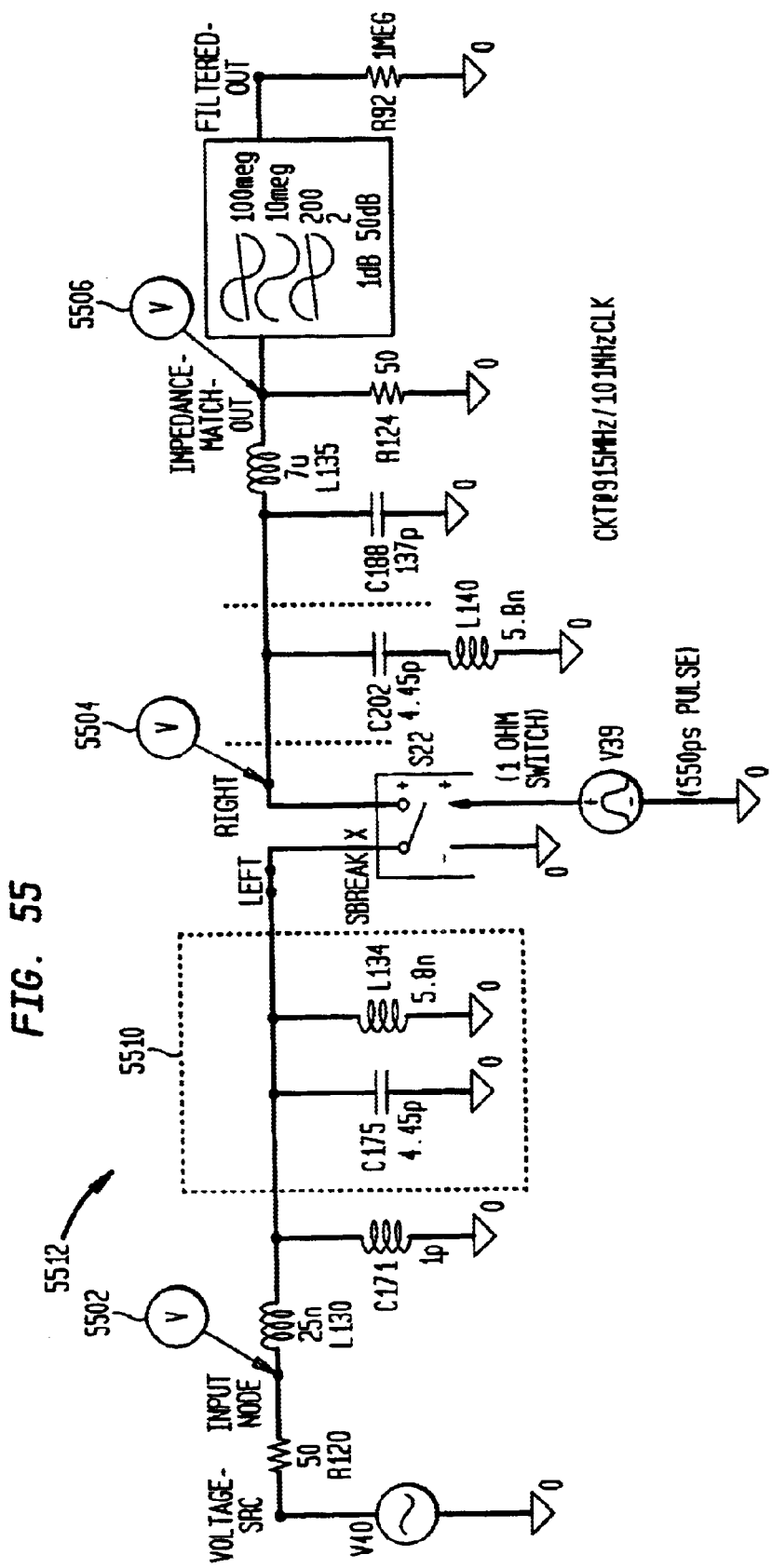
FIG. 55 is a schematic diagram of a circuit to down-convert a 915 MHz signal to a 5 MHz signal using a 101 MHz clock according to an embodiment of the present invention.
Figure 60A:
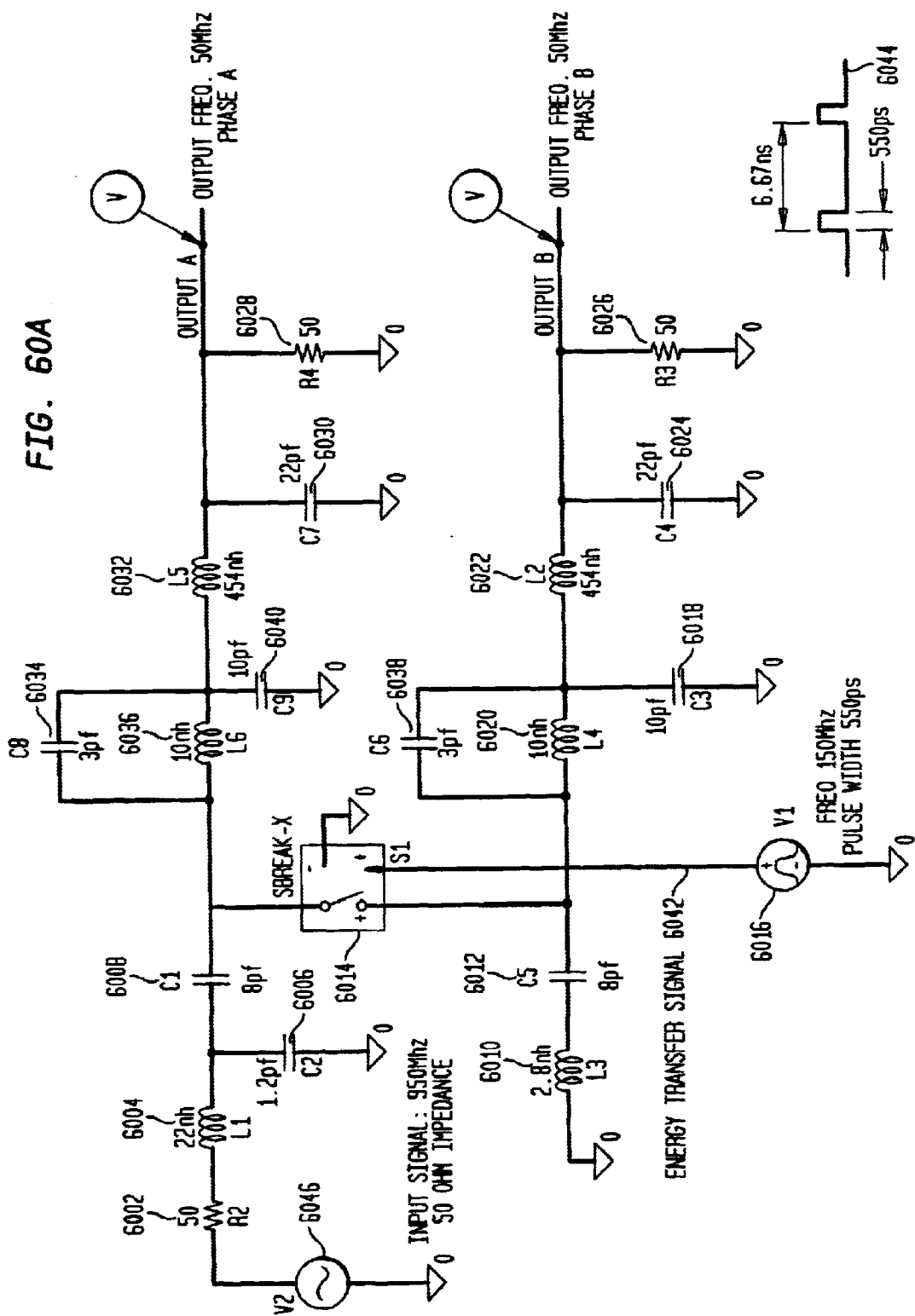
FIG. 60A illustrates an exemplary energy transfer system according to an embodiment of the invention.
Figure 63:
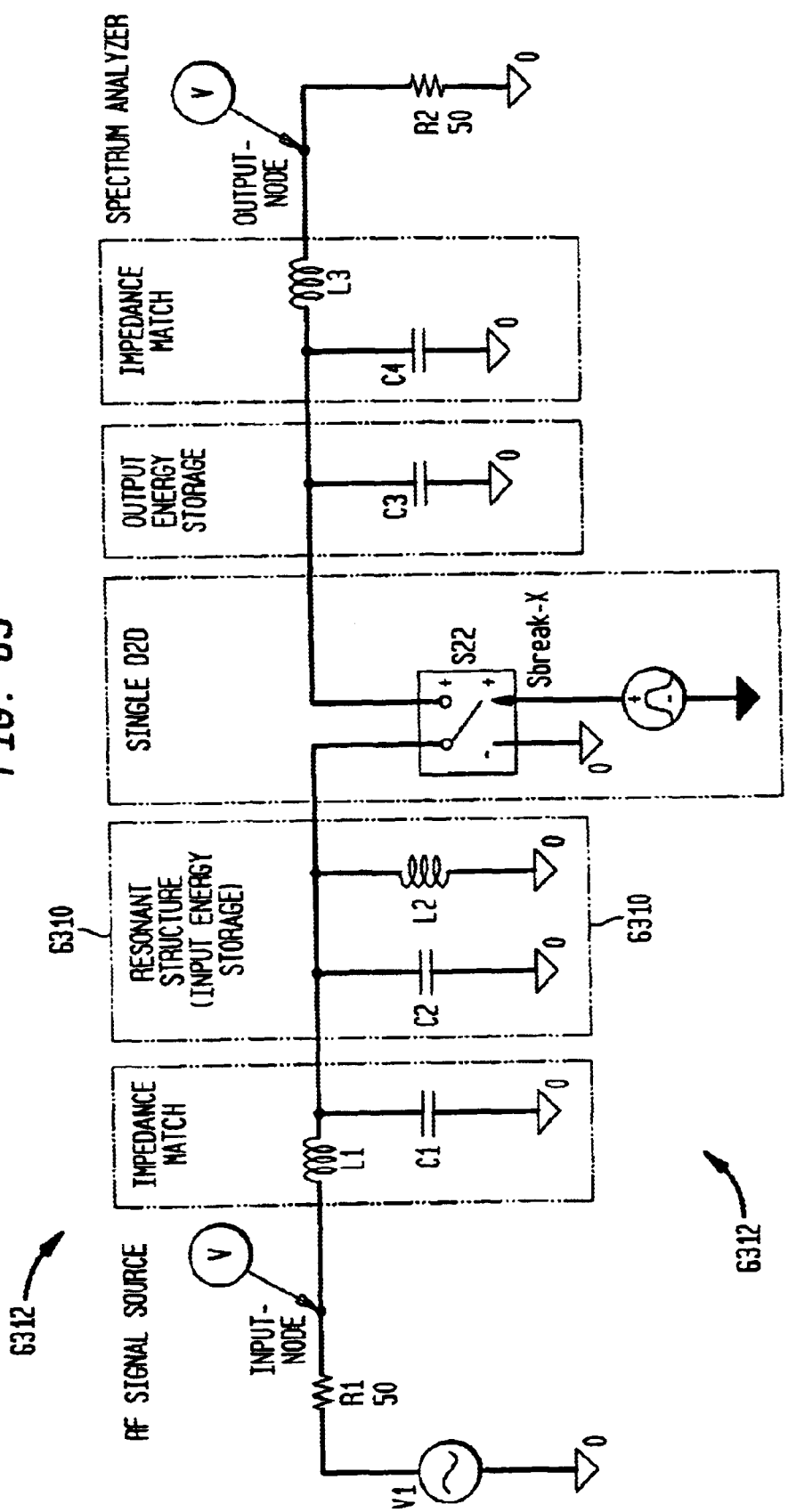
FIG. 63 illustrates an exemplary embodiment of the invention.

An exemplary embodiment is shown in FIG. 60A. Two additional embodiments are shown in FIG. 55 and FIG. 63. Alternate implementations will be apparent to persons skilled in the relevant art(s) based on the teachings contained herein. Alternate implementations fall within the scope and spirit of the present invention. These implementations take advantage of properties of series and parallel (tank) resonant circuits.

FIG. 60A illustrates parallel tank circuits in a differential implementation. A first parallel resonant or tank circuit consists of a capacitor 6038 and an inductor 6020 (tank1). A second tank circuit consists of a capacitor 6034 and an inductor 6036 (tank2).

As is apparent to one skilled in the relevant art(s), parallel tank circuits provide:

low impedance to frequencies below resonance;
low impedance to frequencies above resonance; and
high impedance to frequencies at and near resonance.

In the illustrated example of FIG. 60A, the first and second tank circuits resonate at approximately 920 MHz. At and near resonance, the impedance of these circuits is relatively high. Therefore, in the circuit configuration shown in FIG. 60A, both tank circuits appear as relatively high impedance to the input frequency of 950 MHz, while simultaneously appearing as relatively low impedance to frequencies in the desired output range of 50 MHz.

An energy transfer signal 6042 controls a switch 6014. When energy transfer signal 6042 controls switch 6014 to open and close, high frequency signal components are not allowed to pass through tank1 or tank2. However, the lower signal components (50MHz in this embodiment) generated by the system are allowed to pass through tank1 and tank2 with little attenuation. The effect of tank1 and tank2 is to further separate the input and output signals from the same node thereby producing a more stable input and output impedance. Capacitors 6018 and 6040 act to store the 50 MHz output signal energy between energy transfer pulses.

Further energy transfer optimization is provided by placing an inductor 6010 in series with a storage capacitor 6012 as shown. In the illustrated example, the series resonant frequency of this circuit arrangement is approximately 1 GHz. This circuit increases the energy transfer characteristic of the system. The ratio of the impedance of inductor 6010 and the impedance of storage capacitor 6012 is preferably kept relatively small so that the majority of the energy available will be transferred to storage capacitor 6012 during operation. Exemplary output signals A and B are illustrated in FIGS. 60B and 60C, respectively.

In FIG. 60A, circuit components 6004 and 6006 form an input impedance match. Circuit components 6032 and 6030 form an output impedance match into a 50 ohm resistor 6028. Circuit components 6022 and 6024 form a second output impedance match into a 50 ohm resistor 6026. Capacitors 6008 and 6012 act as storage capacitors for the embodiment. Voltage source 6046 and resistor 6002 generate a 950 MHz signal with a 50 ohm output impedance, which are used as the input to the circuit. Circuit element 6016 includes a 150 MHz oscillator and a pulse generator, which are used to generate energy transfer signal 6042.

FIG. 55 illustrates a shunt tank circuit 5510 in a single-ended to-single-ended system 5512. Similarly, FIG. 63 illustrates a shunt tank circuit 6310 in a system 6312. Tank circuits 5510 and 6310 lower driving source impedance, which improves transient response. Tank circuits 5510 and 6310 are able store the energy from the input signal and provide a low driving source impedance to transfer that energy throughout the aperture of the closed switch. The transient nature of the switch aperture can be viewed as having a response that, in addition to including the input frequency, has large component frequencies above the input frequency, (i.e. higher frequencies than the input frequency are also able to effectively pass through the aperture). Resonant circuits or structures, for example, resonant tanks 5510 or 6310, can take advantage of this by being able to transfer energy throughout the switch's transient frequency response (i.e. the capacitor in the resonant tank appears as a low driving source impedance during the transient period of the aperture).

The exemplary tank and resonant structures described above are for illustrative purposes and are not limiting. Alternate configurations can be used. The various resonant tanks and structures discussed can be combined or used independently as is now apparent.

2.5 Charge and Power Transfer Concepts

Concepts of charge transfer are now described with reference to FIGS. 71A–F. FIG. 71A illustrates a circuit 7102, including a switch S and a capacitor 7106 having a capacitance C. The switch S is controlled by a control signal 7108, which includes pulses 7110 having apertures T.

In FIG. 71B, Equation 2 illustrates that the charge q on a capacitor having a capacitance C, such as capacitor 7106, is proportional to the voltage V across the capacitor, where:

q=Charge in Coulombs
C=Capacitance in Farads
V=Voltage in Volts
A=Input Signal Amplitude Where the voltage V is represented by Equation 3, Equation 2 can be rewritten as Equation 4. The change in charge Δq over time t is illustrated as in Equation 5 as Δq(t), which can be rewritten as Equation 6. Using the sum-to-product trigonometric identity of Equation 7, Equation 6 can be rewritten as Equation 8, which can be rewritten as Equation 9.

Note that the sin term in Equation 3 is a function of the aperture T only. Thus, Δq(t) is at a maximum when T is equal to an odd multiple of $\pi$ (i.e., $\pi$, $3\pi$, $5\pi$, . . . ). Therefore, capacitor 7106 experiences the greatest change in charge when the aperture T has a value of $\pi$ or a time interval representative of 180 degrees of the input sinusoid. Conversely, when T is equal to $2\pi$, $4\pi$, $6\pi$, . . . , minimal charge is transferred.

Equations 10, 11, and 12 solve for q(t) by integrating Equation 2, allowing the charge on capacitor 7106 with respect to time to be graphed on the same axis as the input sinusoid sin(t), as illustrated in the graph of FIG. 71 C. As the aperture T decreases in value or tends toward an impulse, the phase between the charge on the capacitor C or q(t) and sin(t) tend toward zero. This is illustrated in the graph of FIG. 71D, which indicates that the maximum impulse charge transfer occurs near the input voltage maxima. As this graph indicates, considerably less charge is transferred as the value of T decreases.

Power/charge relationships are illustrated in Equations 13–18 of FIG. 71E, where it is shown that power is proportional to charge, and transferred charge is inversely proportional to insertion loss.

Concepts of insertion loss are illustrated in FIG. 71F. Generally, the noise figure of a lossy passive device is numerically equal to the device insertion loss. Alternatively, the noise figure for any device cannot be less that its insertion loss. Insertion loss can be expressed by Equation 19 or 20.

From the above discussion, it is observed that as the aperture T increases, more charge is transferred from the input to capacitor 7106, which increases power transfer from the input to the output. It has been observed that it is not necessary to accurately reproduce the input voltage at the output because relative modulated amplitude and phase information is retained in the transferred power.

2.6 Optimizing and Adjusting the Non-Negligible Aperture Width/Duration 2.6.1 Varying Input and Output Impedances In an embodiment of the invention, the energy transfer signal (i.e., control signal 2006 in FIG. 20A), is used to vary the input impedance seen by EM Signal 2004 and to vary the output impedance driving a load. An example of this embodiment is described below using a gated transfer module 5101 shown in FIG. 51A. The method described below is not limited to the gated transfer module 5101.

In FIG. 51A, when switch 5106 is closed, the impedance looking into circuit 5102 is substantially the impedance of a storage module, illustrated here as a storage capacitance 5108, in parallel with the impedance of a load 5112. When switch 5106 is open, the impedance at point 5114 approaches infinity. It follows that the average impedance at point 5114 can be varied from the impedance of the storage module illustrated in parallel with the load 5112, to the highest obtainable impedance when switch 5106 is open, by varying the ratio of the time that switch 5106 is open to the time that switch 5106 is closed. Switch 5106 is controlled by an energy transfer signal 5110. Thus the impedance at point 5114 can be varied by controlling the aperture width of the energy transfer signal in conjunction with the aliasing rate.

Figure 49A:
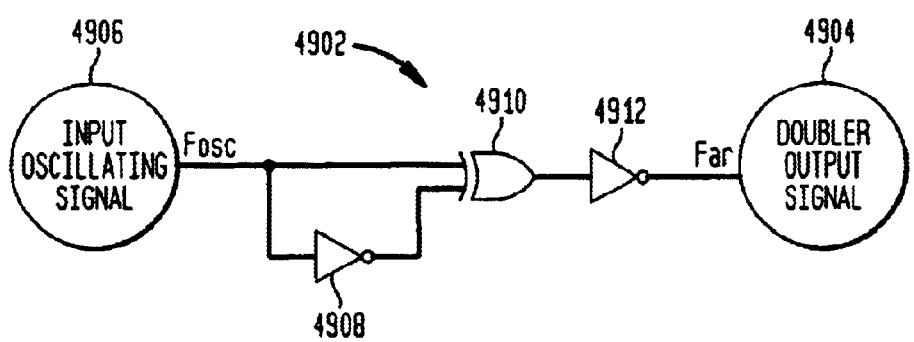
FIG. 49A illustrates an exemplary pulse generator.

An exemplary method of altering energy transfer signal 5106 of FIG. 51A is now described with reference to FIG. 49A, where a circuit 4902 receives an input oscillating signal 4906 and outputs a pulse train shown as a doubler output signal 4904. Circuit 4902 can be used to generate energy transfer signal 5106. An example of waveforms of doubler output signal 4904 are shown on FIG. 49C.

It can be shown that by varying the delay of the signal propagated by an inverter 4908, the width of the pulses in doubler output signal 4904 can be varied. Increasing the delay of the signal propagated by inverter 4908, increases the width of the pulses. The signal propagated by inverter 4908 can be delayed by introducing a R/C low pass network in the output of inverter 4908. Other means of altering the delay of the signal propagated by inverter 4908 will be well known to those skilled in the art.

2.6.2 Real Time Aperture Control

In an embodiment, the aperture width/duration is adjusted in real time. For example, referring to the timing diagrams in FIGS. 64B–F, a clock signal 6414 (FIG. 64B) is used to generate an energy transfer signal 6416 (FIG. 64F), which includes energy transfer pluses 6418, having variable apertures 6420. In an embodiment, the clock signal 6414 is inverted as illustrated by inverted clock signal 6422 (FIG. 64D). The clock signal 6414 is also delayed, as illustrated by delayed clock signal 6424 (FIG. 64E). The inverted clock signal 6414 and the delayed clock signal 6424 are then ANDed together, generating an energy transfer signal 6416, which is active—energy transfer pulses 6418—when delayed clock signal 6424 and inverted clock signal 6422 are both active. The amount of delay imparted to delayed clock signal 6424 substantially determines the width or duration of apertures 6420. By varying the delay in real time, the apertures are adjusted in real time.

In an alternative implementation, inverted clock signal 6422 is delayed relative to original clock signal 6414, and then ANDed with original clock signal 6414. Alternatively, original clock signal 6414 is delayed then inverted, and the result ANDed with original clock signal 6414.

Figure 64A:
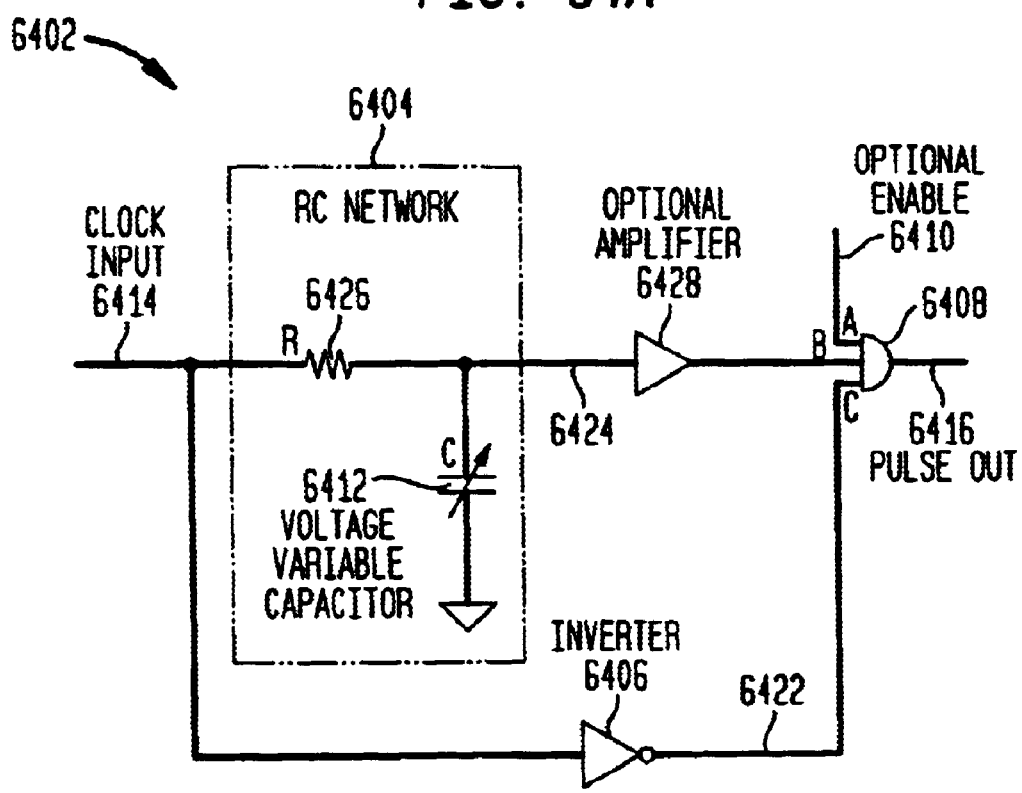
FIG. 64A illustrates an exemplary real time aperture control circuit according to an embodiment of the invention.

FIG. 64A illustrates an exemplary real time aperture control system 6402 that can be used to adjust apertures in real time. The exemplary real time aperture control system 6402 includes an RC circuit 6404, which includes a voltage variable capacitor 6412 and a resistor 6426. The real time aperture control system 6402 also includes an inverter 6406 and an AND gate 6408. The AND gate 6408 optionally includes an enable input 6410 for enabling/disabling the AND gate 6408 and RC circuit 6404. The real time aperture control system 6402 optionally includes an amplifier 6428.

Operation of the real time aperture control circuit is described with reference to the timing diagrams of FIGS. 64B–F. The real time control system 6402 receives input clock signal 6414, which is provided to both inverter 6406 and to RC circuit 6404. Inverter 6406 outputs inverted clock signal 6422 and presents it to AND gate 6408. RC circuit 6404 delays clock signal 6414 and outputs delayed clock signal 6424. The delay is determined primarily by the capacitance of voltage variable capacitor 6412. Generally, as the capacitance decreases, the delay decreases.

Delayed clock signal 6424 is optionally amplified by optional amplifier 6428, before being presented to AND gate 6408. Amplification is desired, for example, where the RC constant of RC circuit 6404 attenuates the signal below the threshold of AND gate 6408.

AND gate 6408 ANDs delayed clock signal 6424, inverted clock signal 6422, and optional Enable signal 6410, to generate energy transfer signal 6416. Apertures 6420 are adjusted in real time by varying the voltage to voltage variable capacitor 6412.

In an embodiment, apertures 6420 are controlled to optimize power transfer. For example, in an embodiment, apertures 6420 are controlled to maximize power transfer. Alternatively, apertures 6420 are controlled for variable gain control (e.g. automatic gain control—AGC). In this embodiment, power transfer is reduced by reducing apertures 6420.

As can now be readily seen from this disclosure, many of the aperture circuits presented, and others, can be modified as in circuits illustrated in FIGS. 46H–K. Modification or selection of the aperture can be done at the design level to remain a fixed value in the circuit, or in an alternative embodiment, may be dynamically adjusted to compensate for, or address, various design goals such as receiving RF signals with enhanced efficiency that are in distinctively different bands of operation, e.g. RF signals at 900 MHz and 1.8 GHz.

2.7 Adding a Bypass Network

In an embodiment of the invention, a bypass network is added to improve the efficiency of the energy transfer module. Such a bypass network can be viewed as a means of synthetic aperture widening. Components for a bypass network are selected so that the bypass network appears substantially lower impedance to transients of the switch module (i.e., frequencies greater than the received EM signal) and appears as a moderate to high impedance to the input EM signal (e.g., greater that 100 Ohms at the RF frequency).

The time that the input signal is now connected to the opposite side of the switch module is lengthened due to the shaping caused by this network, which in simple realizations may be a capacitor or series resonant inductor-capacitor. A network that is series resonant above the input frequency would be a typical implementation. This shaping improves the conversion efficiency of an input signal that would otherwise, if one considered the aperture of the energy transfer signal only, be relatively low in frequency to be optimal.

Figure 57:
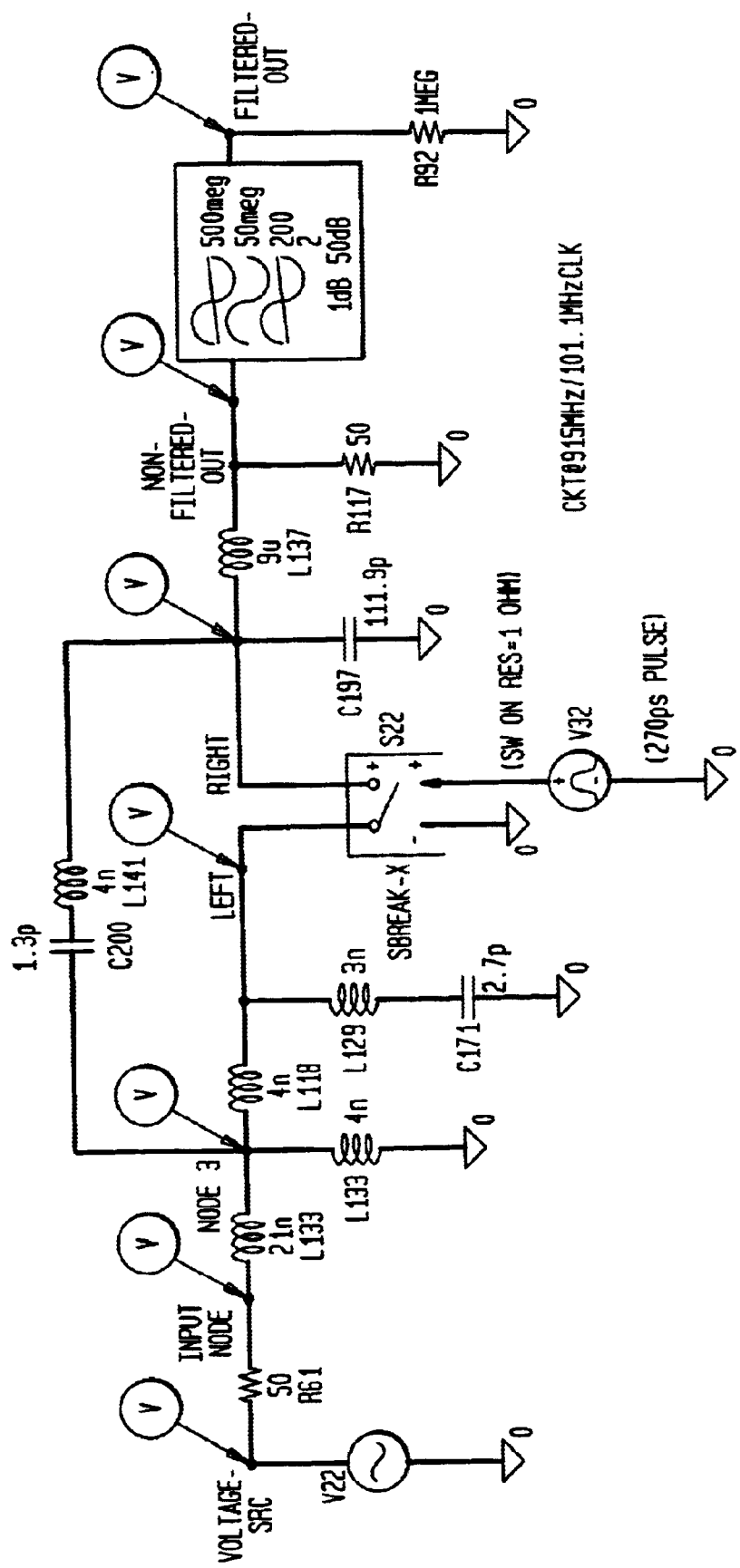
FIG. 57 is a schematic diagram of a circuit to down-convert a 915 MHz signal to a 5 MHz signal using a 101.1 MHz clock according to an embodiment of the present invention.
Figure 61:
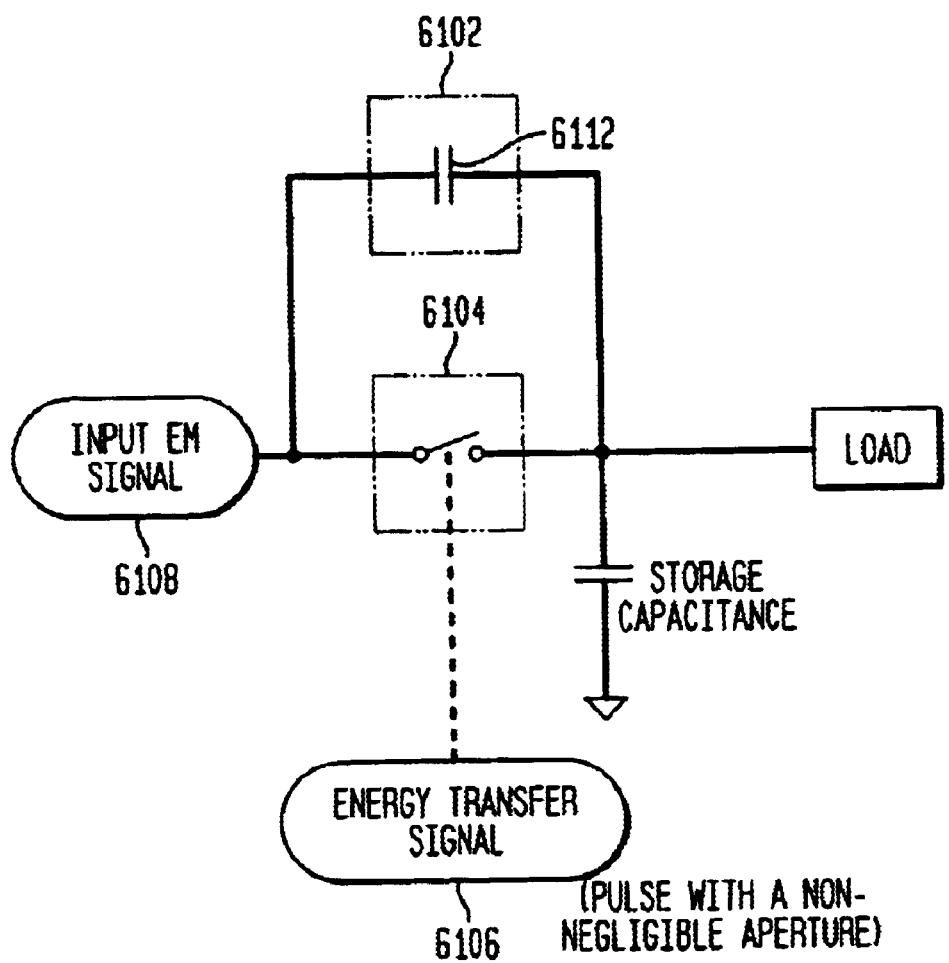
FIG. 61 illustrates an exemplary bypass network according to an embodiment of the invention.
Figure 62:
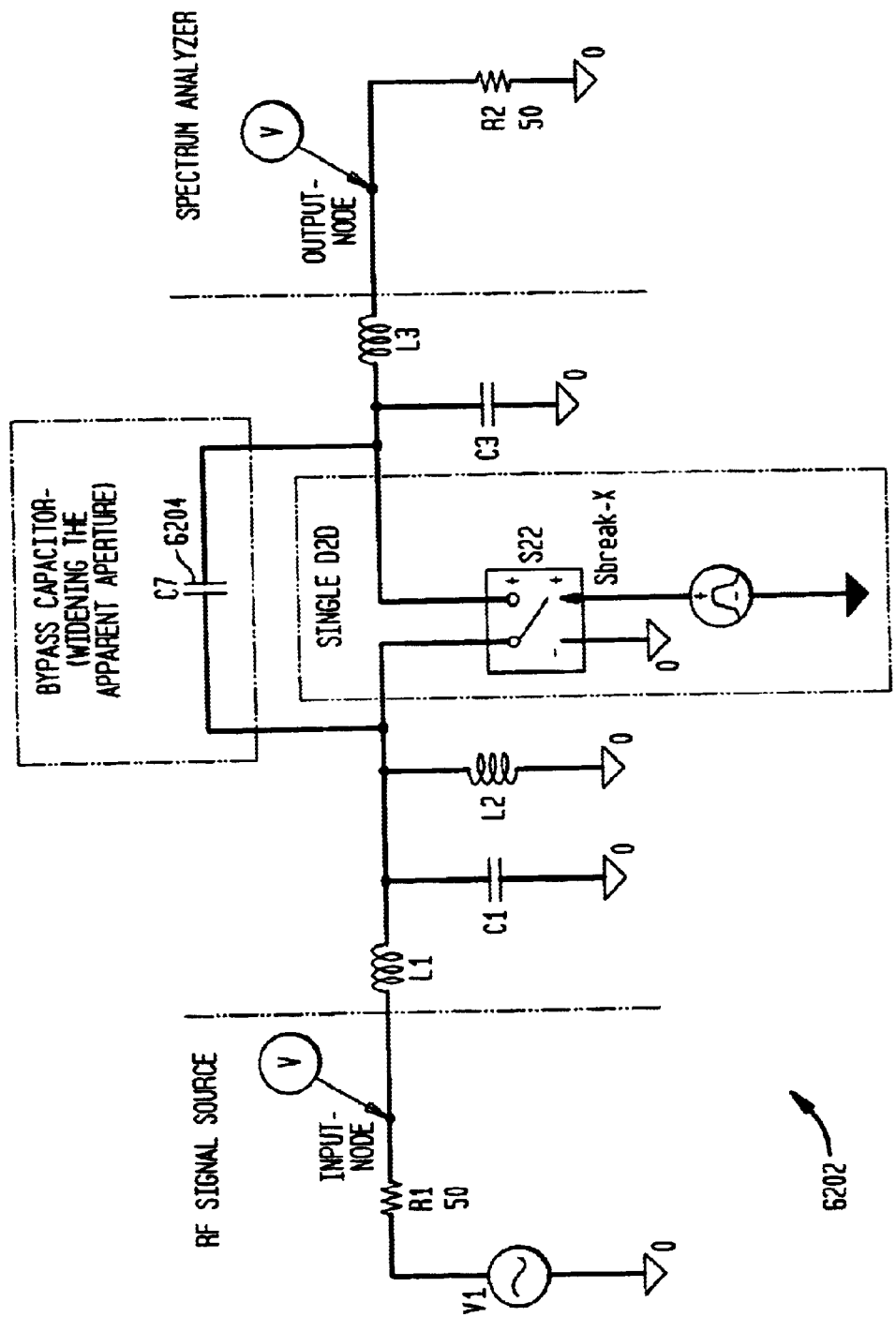
FIG. 62 illustrates an exemplary bypass network according to an embodiment of the invention.

For example, referring to FIG. 61 a bypass network 6102 (shown in this instance as capacitor 6112), is shown bypassing switch module 6104. In this embodiment the bypass network increases the efficiency of the energy transfer module when, for example, less than optimal aperture widths were chosen for a given input frequency on the energy transfer signal 6106. Bypass network 6102 could be of different configurations than shown in FIG 61. Such an alternate is illustrated in FIG. 57. Similarly, FIG. 62 illustrates another exemplary bypass network 6202, including a capacitor 6204.

Figure 65:
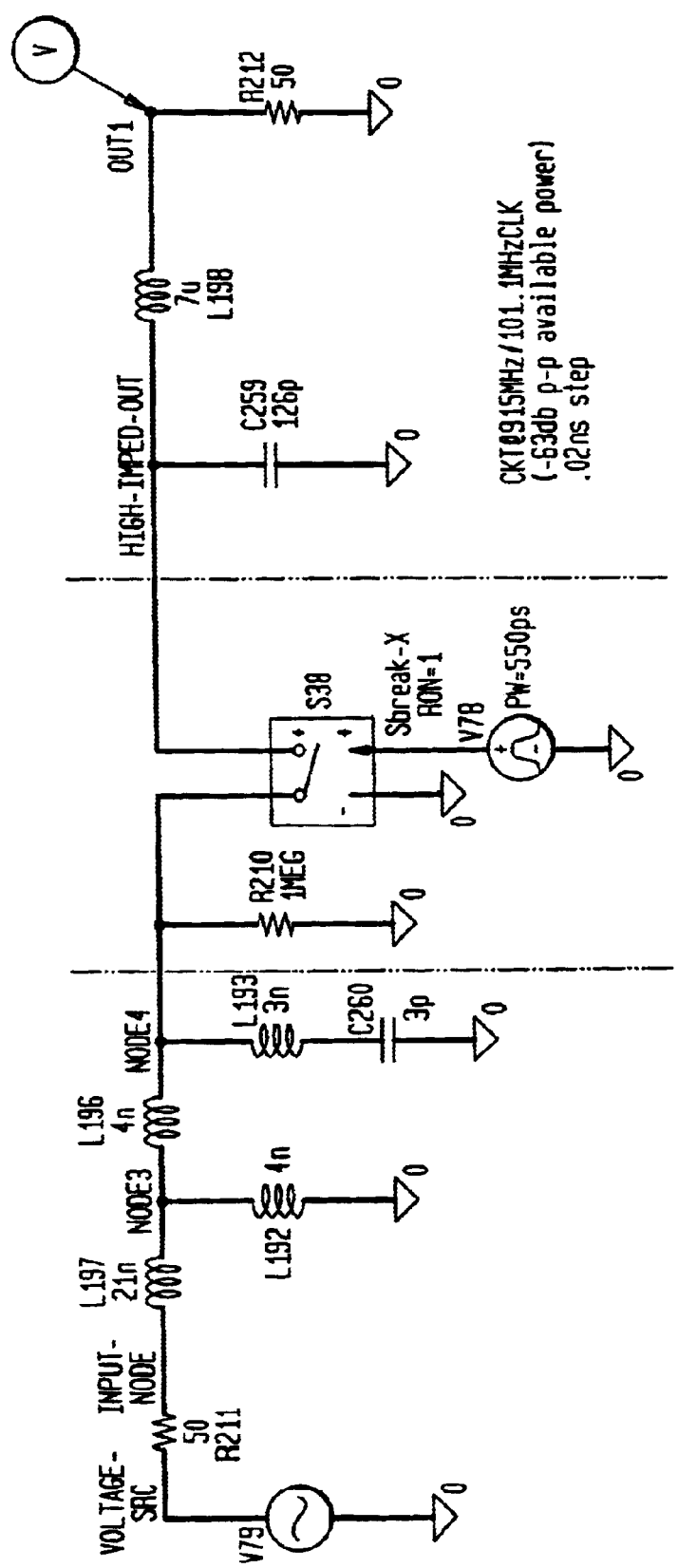
FIG. 65 illustrates an exemplary embodiment of the invention.
Figure 66:
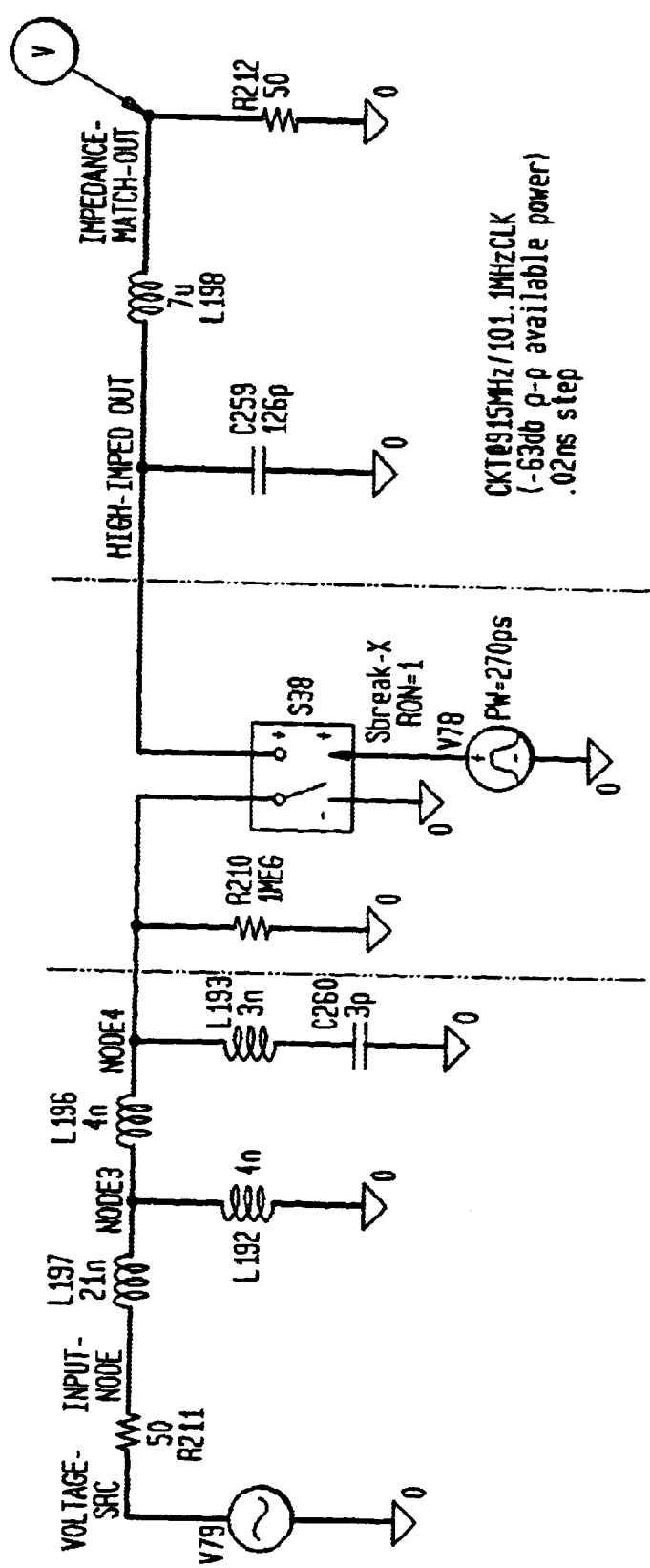
FIG. 66 illustrates an exemplary embodiment of the invention.
Figure 67:
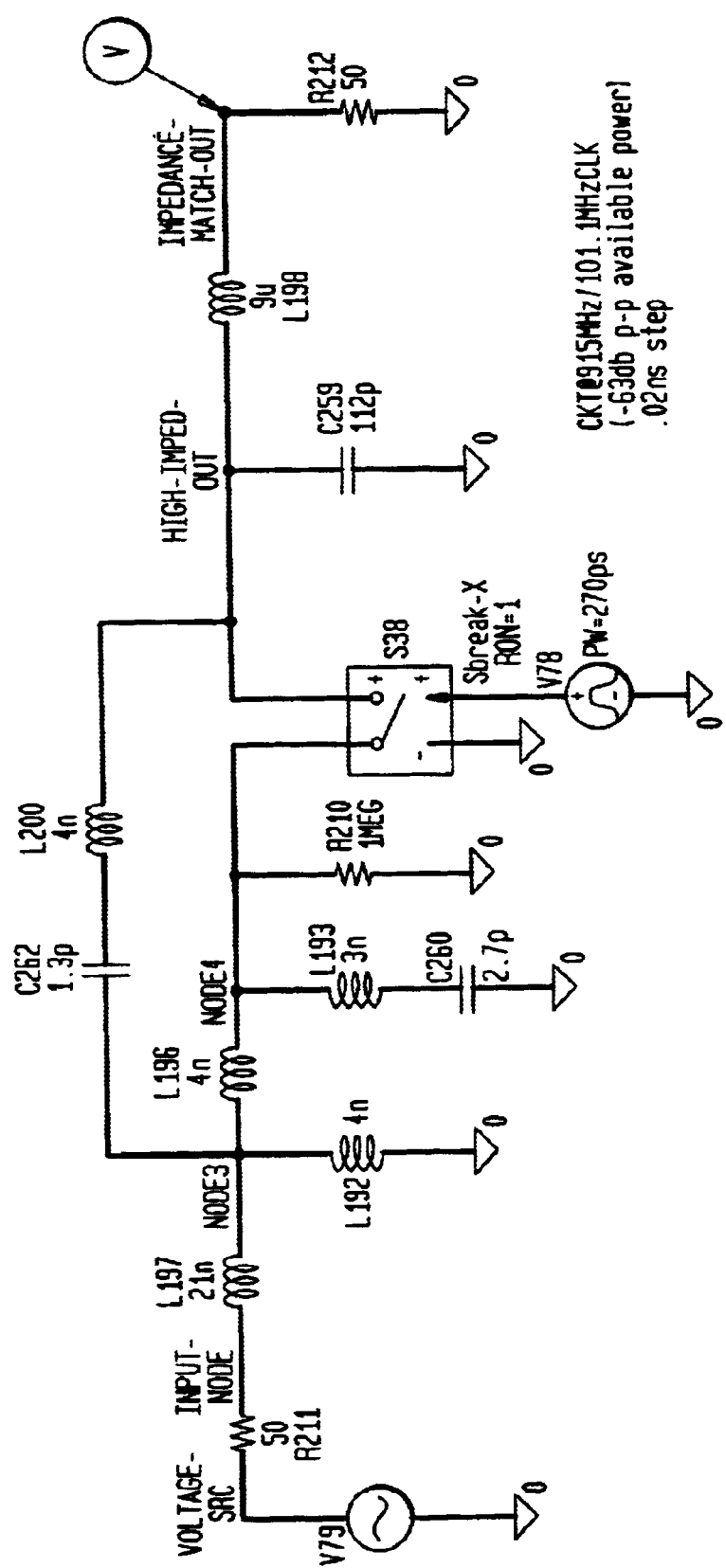
FIG. 67 illustrates an exemplary embodiment of the invention.
Figure 68:
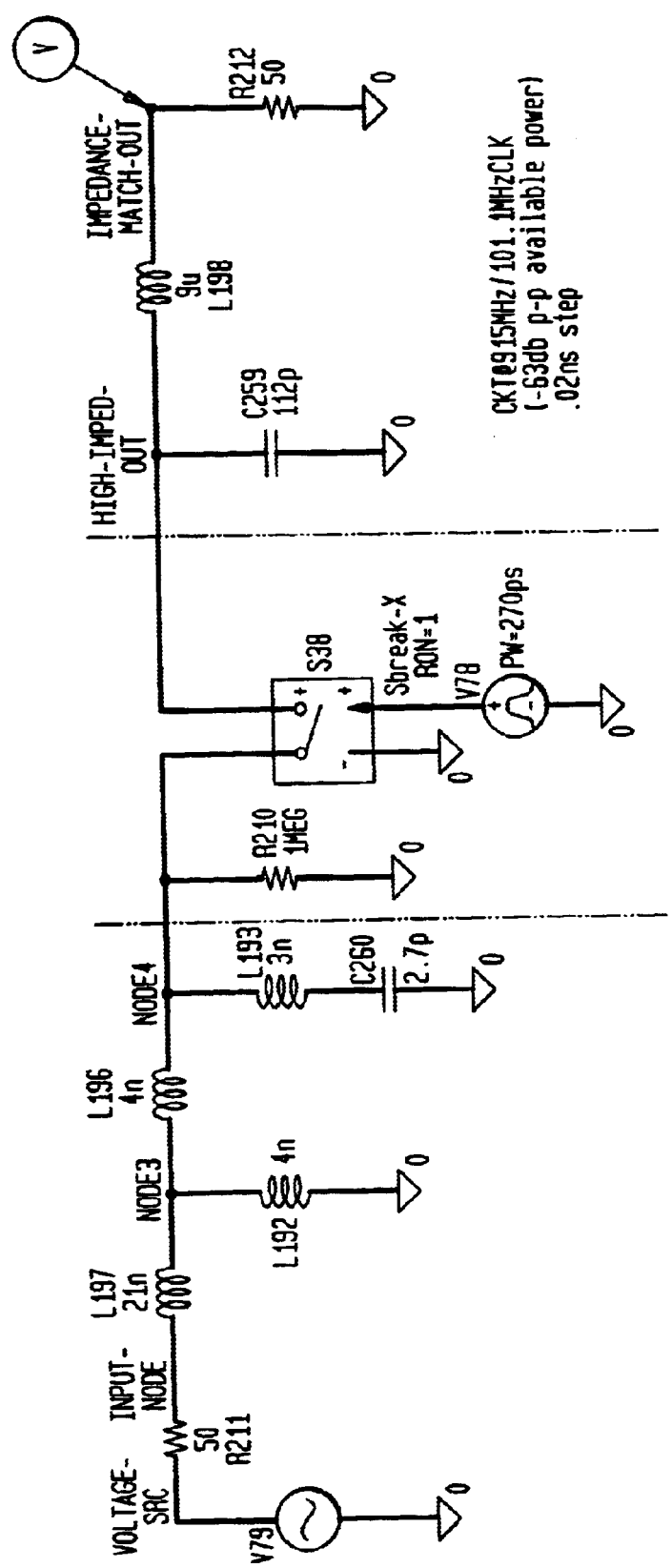
FIG. 68 illustrates an exemplary embodiment of the invention.

The following discussion will demonstrate the effects of a minimized aperture and the benefit provided by a bypassing network. Beginning with an initial circuit having a 550 ps aperture in FIG. 65, its output is seen to be 2.8 mVpp applied to a 50 ohm load in FIG. 69A. Changing the aperture to 270 ps as shown in FIG. 66 results in a diminished output of 2.5 Vpp applied to a 50 ohm load as shown in FIG. 69B. To compensate for this loss, a bypass network may be added, a specific implementation is provided in FIG. 67. The result of this addition is that 3.2 Vpp can now be applied to the 50 ohm load as shown in FIG. 70A. The circuit with the bypass network in FIG. 67 also had three values adjusted in the surrounding circuit to compensate for the impedance changes introduced by the bypass network and narrowed aperture. FIG. 68 verifies that those changes added to the circuit, but without the bypass network, did not themselves bring about the increased efficiency demonstrated by the embodiment in FIG. 67 with the bypass network. FIG. 70B shows the result of using the circuit in FIG. 68 in which only 1.88 Vpp was able to be applied to a 50 ohm load.

2.8 Modifying the Energy Transfer Signal Using Feedback

FIG. 47 shows an embodiment of a system 4701 which uses down-converted Signal 4708B as feedback 4706 to control various characteristics of energy transfer module 4704 to modify down-converted signal 4708B.

Generally, the amplitude of down-converted signal 4708B varies as a function of the frequency and phase differences between EM signal 3904 and energy transfer signal 4106. In an embodiment, down-converted signal 4708B is used as feedback 4706 to control the frequency and phase relationship between EM signal 3904 and energy transfer signal 4106. This can be accomplished using the exemplary logic in FIG. 52A. The exemplary circuit in FIG. 52A can be included in energy transfer signal module 4702. Alternate implementations will be apparent to persons skilled in the relevant art(s) based on the teachings contained herein. Alternate implementations fall within the scope and spirit of the present invention. In this embodiment a state-machine is used as an example.

Figure 52A:
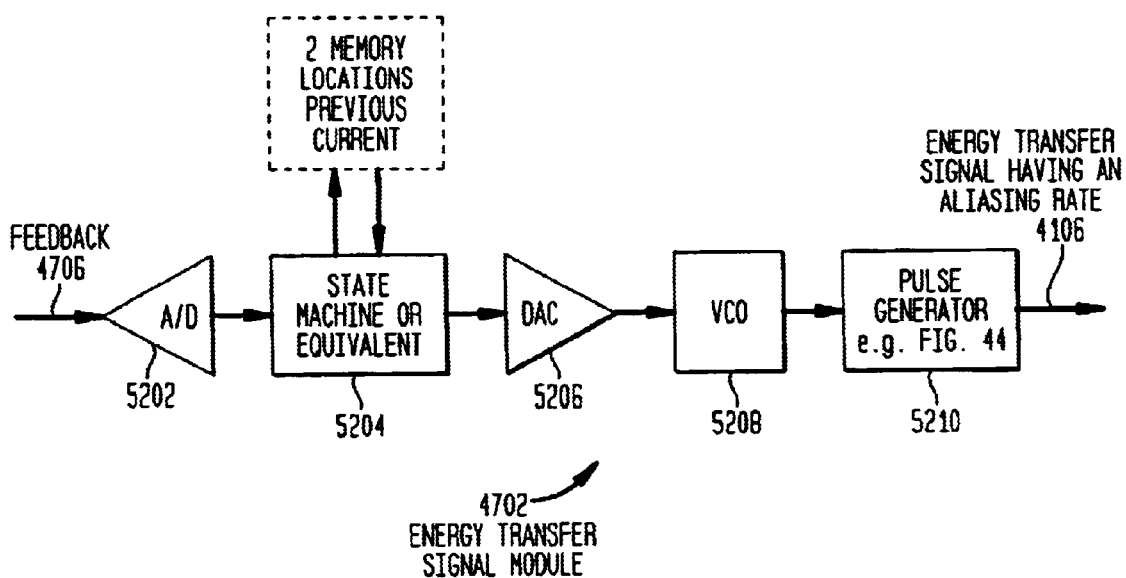
FIG. 52A illustrates an exemplary energy transfer signal module according to an embodiment of the present invention.

In the example of FIG. 52A, a state machine 5204 reads an analog to digital converter, A/D 5202, and controls a digital to analog converter, DAC 5206. In an embodiment, state machine 5204 includes 2 memory locations, Previous and Current, to store and recall the results of reading A/D 5202. In an embodiment, state machine 5204 uses at least one memory flag.

DAC 5206 controls an input to a voltage controlled oscillator, VCO 5208. VCO 5208 controls a frequency input of a pulse generator 5210, which, in an embodiment, is substantially similar to the pulse generator shown in FIG. 44. Pulse generator 5210 generates energy transfer signal 4106.

Figure 52B:
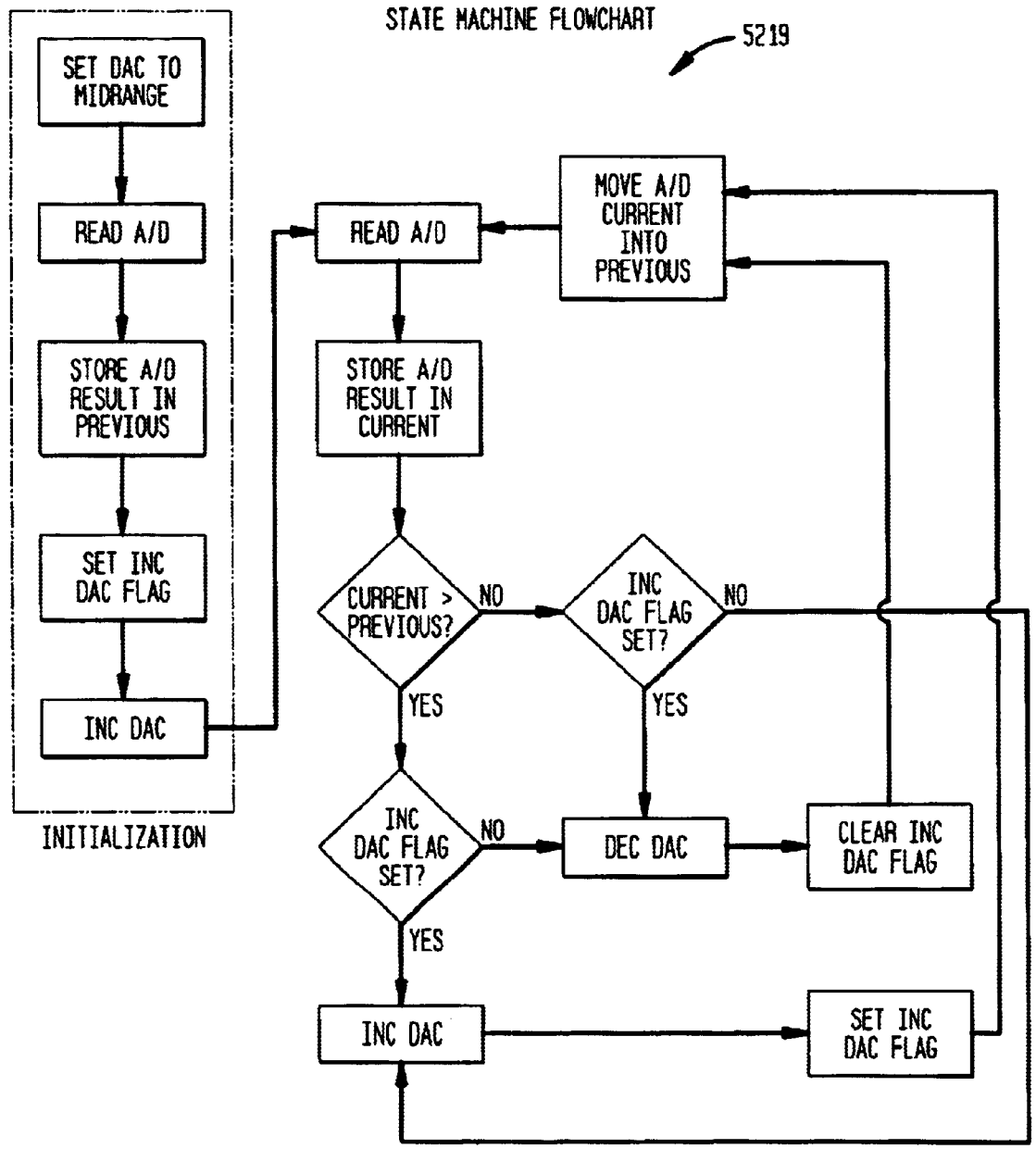
FIG. 52B illustrates a flowchart of state machine operation according to an embodiment of the present invention.

In an embodiment, state machine 5204 operates in accordance with a state machine flowchart 5219 in FIG. 52B. The result of this operation is to modify the frequency and phase relationship between energy transfer signal 4106 and EM signal 3904, to substantially maintain the amplitude of down-converted signal 4708B at an optimum level.

Figure 38:
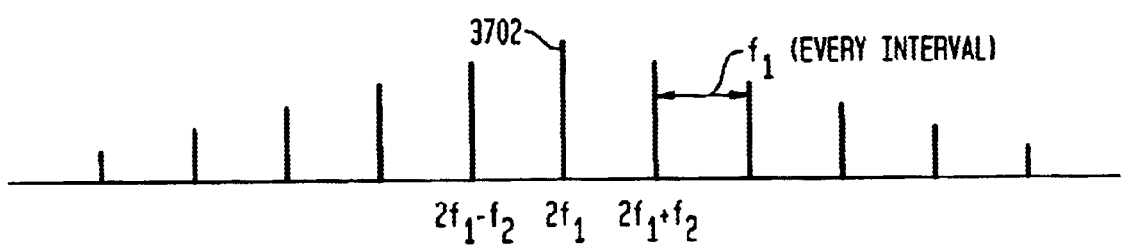
FIG. 38 illustrates an exemplary frequency spectra of the output of the second generalized frequency translation device in an alternate embodiment of the present invention.
Figure 39:
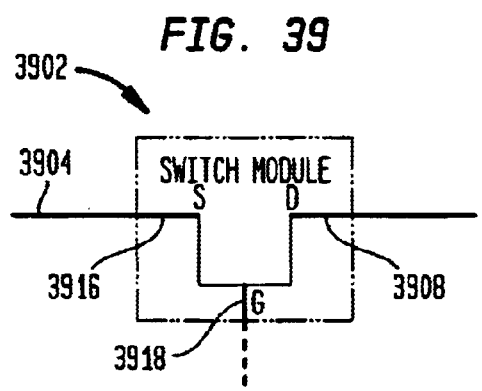
FIGS. 39–42 illustrate exemplary implementations of a switch module according to embodiments of the invention.
Figure 40:
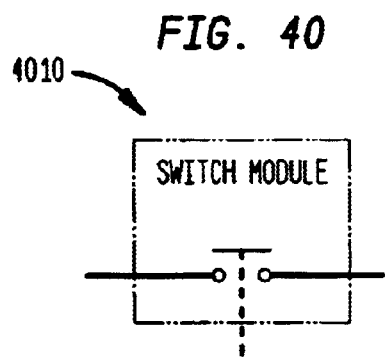
Figure 41:
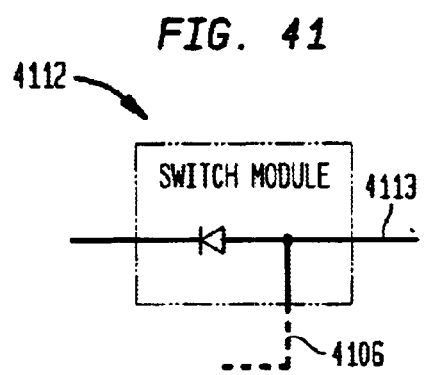
Figure 42:
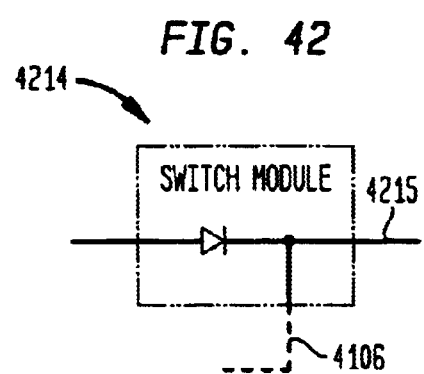
Figure 52C:
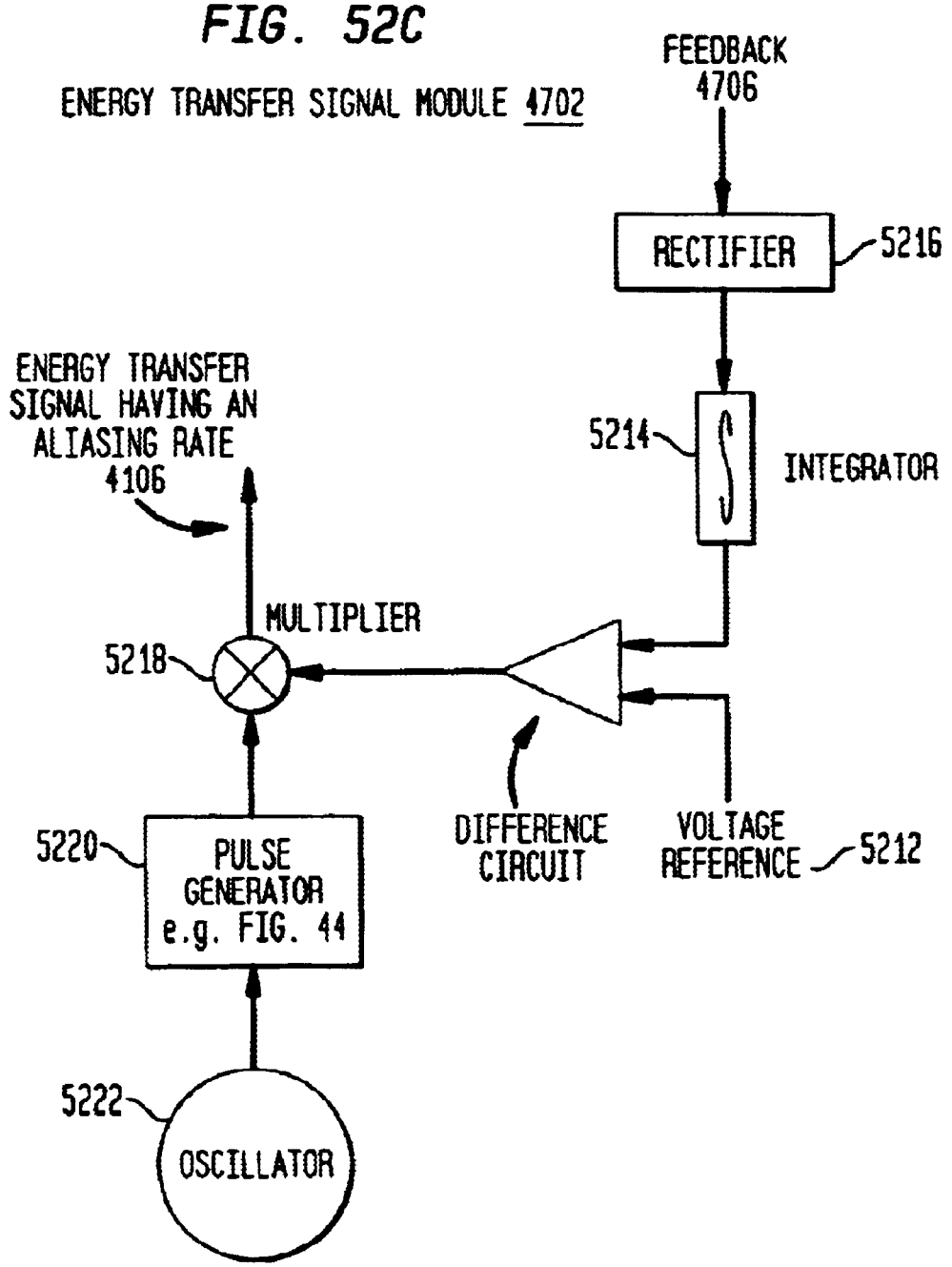
FIG. 52C is an exemplary energy transfer signal module.

The amplitude of down-converted signal 4708B can be made to vary with the amplitude of energy transfer signal 4106. In an embodiment where switch module 6502 is a FET as shown in FIG. 38, wherein gate 3918 receives energy transfer signal 4106, the amplitude of energy transfer signal 4106 can determine the "on" resistance of the FET, which affects the amplitude of down-converted signal 4708B. Energy transfer signal module 4702, as shown in FIG. 52C, can be an analog circuit that enables an automatic gain control function. Alternate implementations will be apparent to persons skilled in the relevant art(s) based on the teachings contained herein. Alternate implementations fall within the scope and spirit of the present invention.

2.9 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

2.10 Exemplary Energy Transfer Down-Converters

Exemplary implementations are described below for illustrative purposes. The invention is not limited to these examples.

Figure 53:
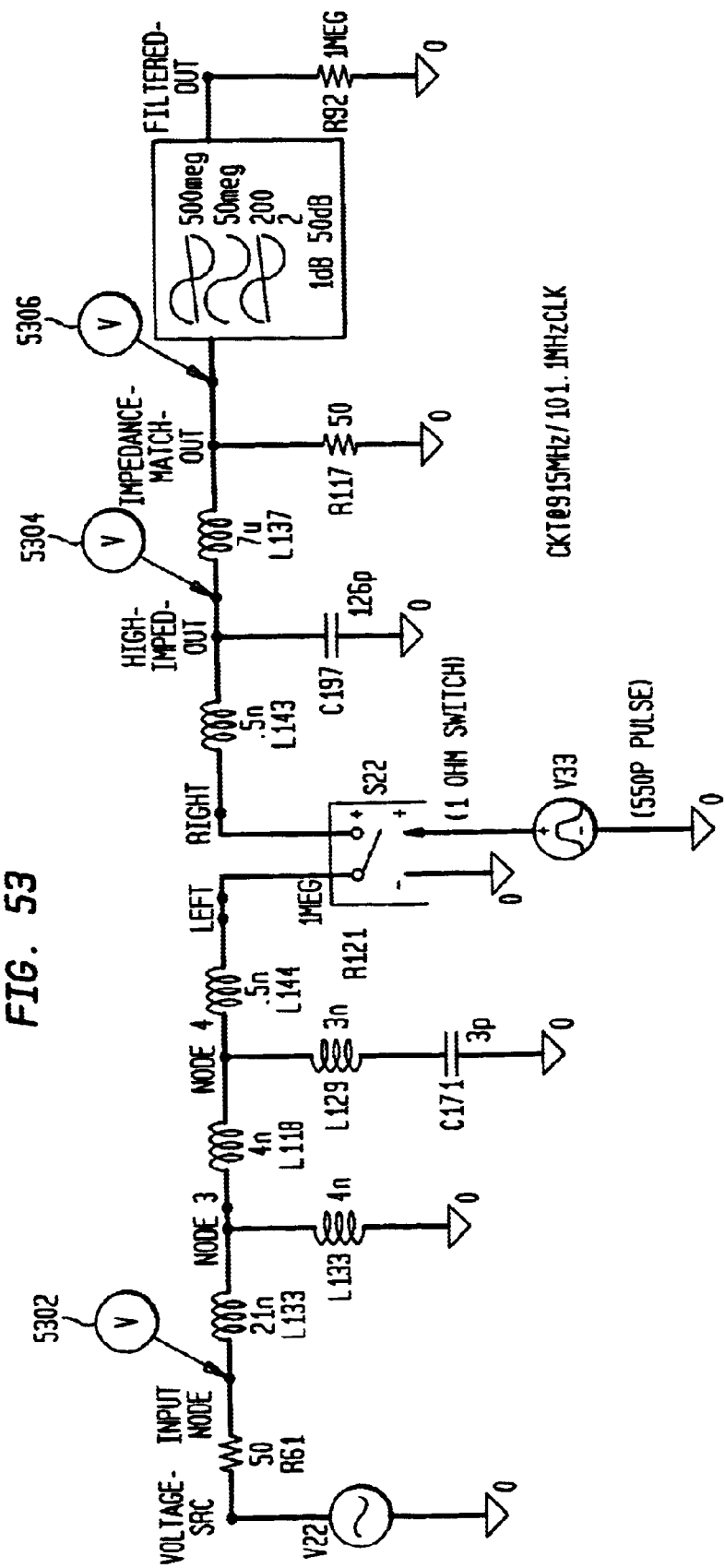
FIG. 53 is a schematic diagram of a circuit to down-convert a 915 MHz signal to a 5 MHz signal using a 101.1 MHz clock according to an embodiment of the present invention.

FIG. 53 is a schematic diagram of an exemplary circuit to down convert a 915 MHz signal to a 5 MHz signal using a 101.1 MHz clock.

Figure 54:
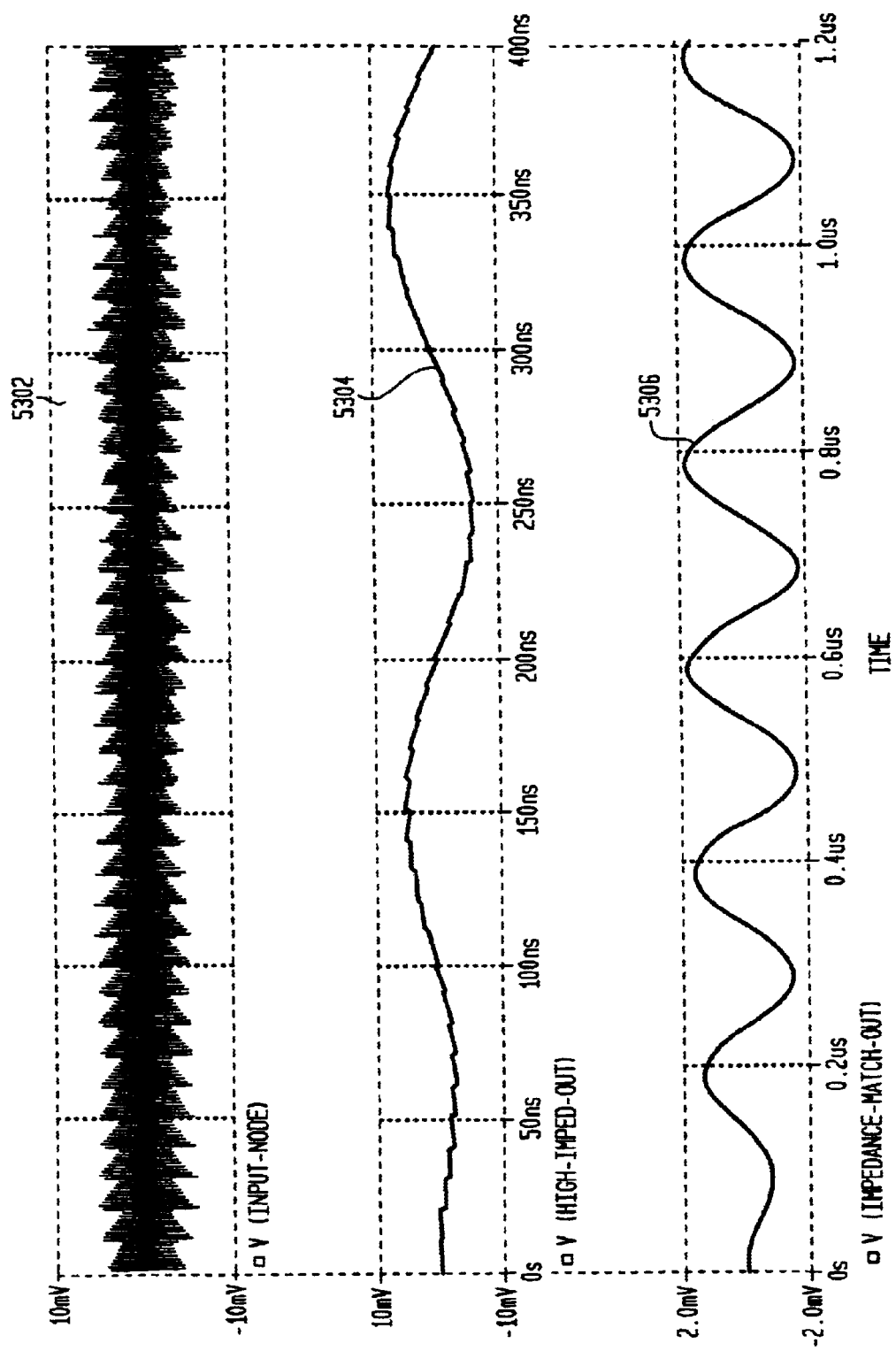
FIG. 54 shows exemplary simulation waveforms for the circuit of FIG. 53 according to embodiments of the present invention.

FIG. 54 shows exemplary simulation waveforms for the circuit of figure 53. Waveform 5302 is the input to the circuit showing the distortions caused by the switch closure. Waveform 5304 is the unfiltered output at the storage unit. Waveform 5306 is the impedance matched output of the down-converter on a different time scale.

FIG. 55 is a schematic diagram of an exemplary circuit to down-convert a 915 MHz signal to a 5 MHz signal using a 101.1 MHz clock. The circuit has additional tank circuitry to improve conversion efficiency.

Figure 56:
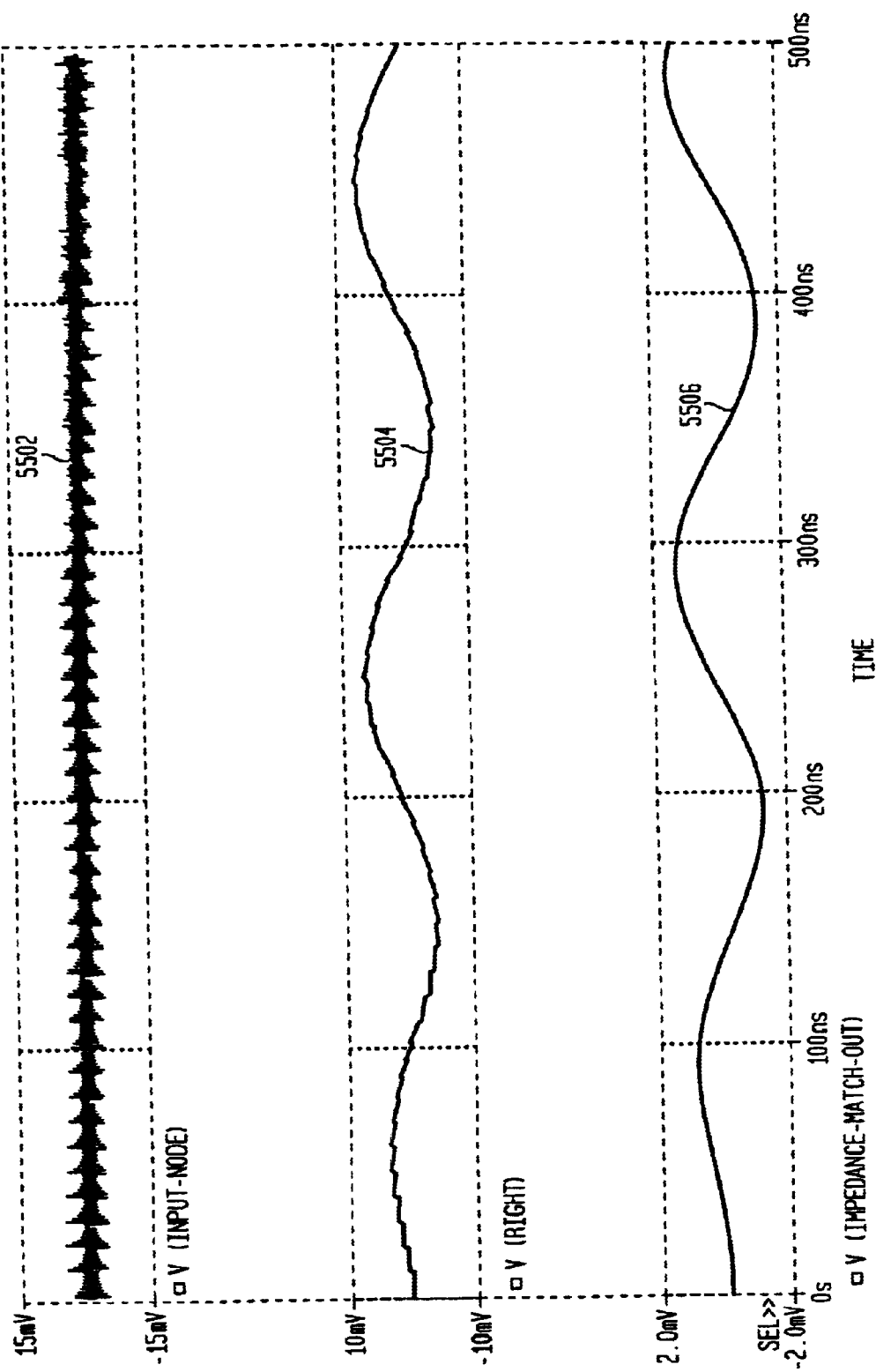
FIG. 56 shows exemplary simulation waveforms for the circuit of FIG. 55 according to embodiments of the present invention.

FIG. 56 shows exemplary simulation waveforms for the circuit of figure 55. Waveform 5502 is the input to the circuit showing the distortions caused by the switch closure. Waveform 5504 is the unfiltered output at the storage unit. Waveform 5506 is the output of the down-converter after the impedance match circuit.

FIG. 57 is a schematic diagram of an exemplary circuit to down-convert a 915 MHz signal to a 5 MHz signal using a 101.1 MHz clock. The circuit has switch bypass circuitry to improve conversion efficiency.

Figure 58:
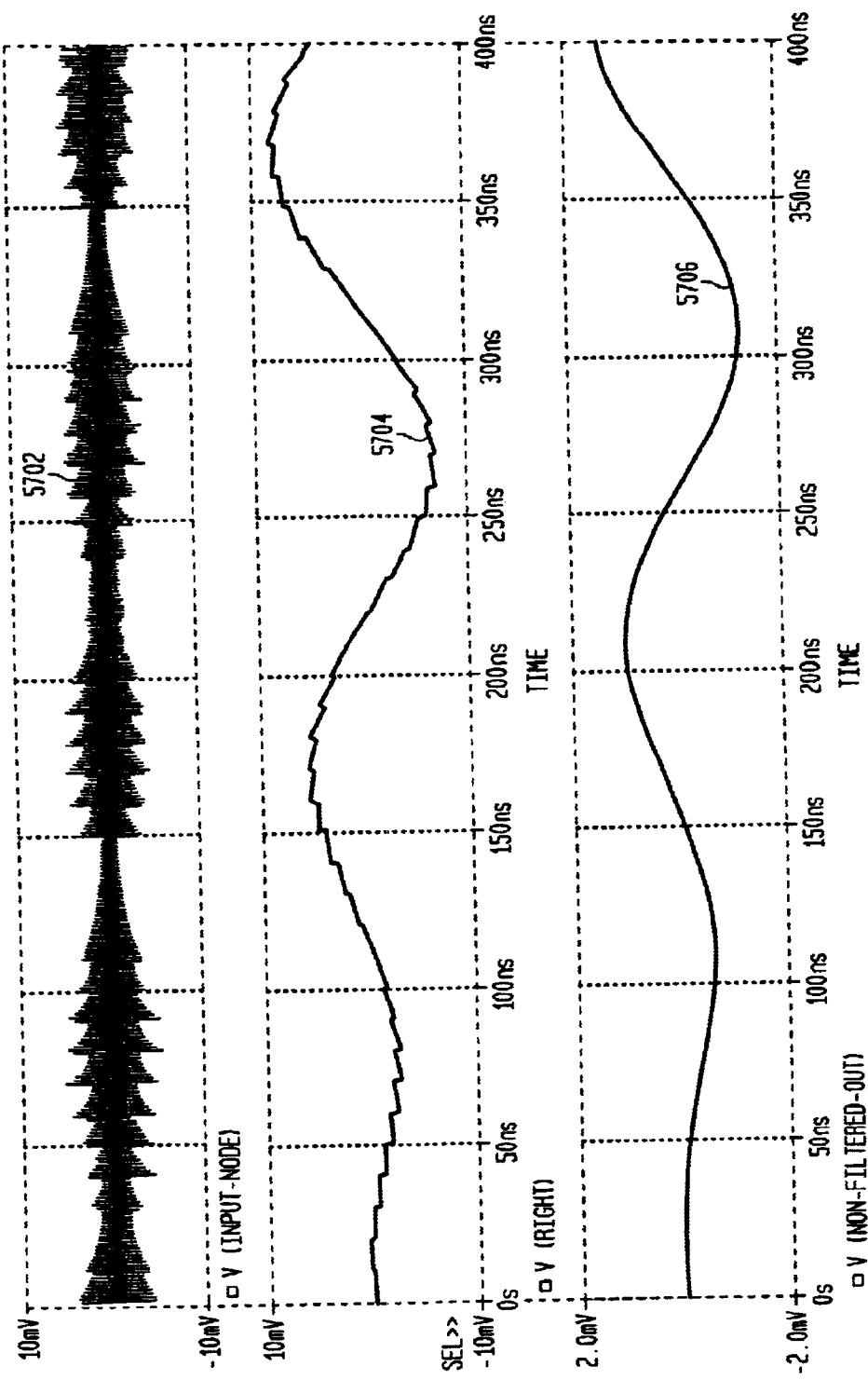
FIG. 58 shows exemplary simulation waveforms for the circuit of FIG. 57 according to an embodiment of the present invention.

FIG. 58 shows exemplary simulation waveforms for the circuit of FIG. 57. Waveform 5702 is the input to the circuit showing the distortions caused by the switch closure. Waveform 5704 is the unfiltered output at the storage unit. Waveform 5706 is the output of the down-converter after the impedance match circuit.

Figure 59:
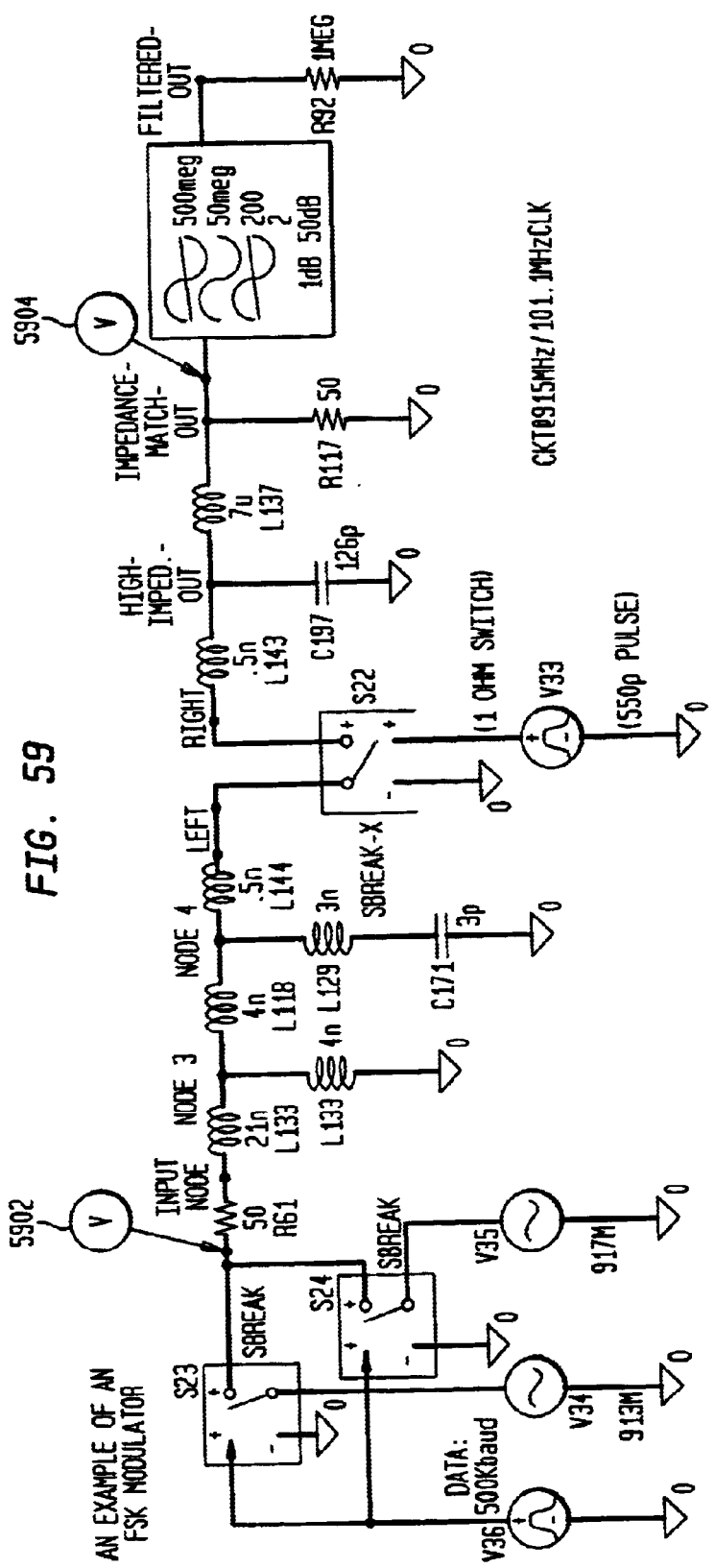
FIG. 59 shows a schematic of the circuit in FIG. 53 connected to an FSK source that alternates between 913 and 917 MHz at a baud rate of 500 Kbaud according to an embodiment of the present invention.
Figure 72:
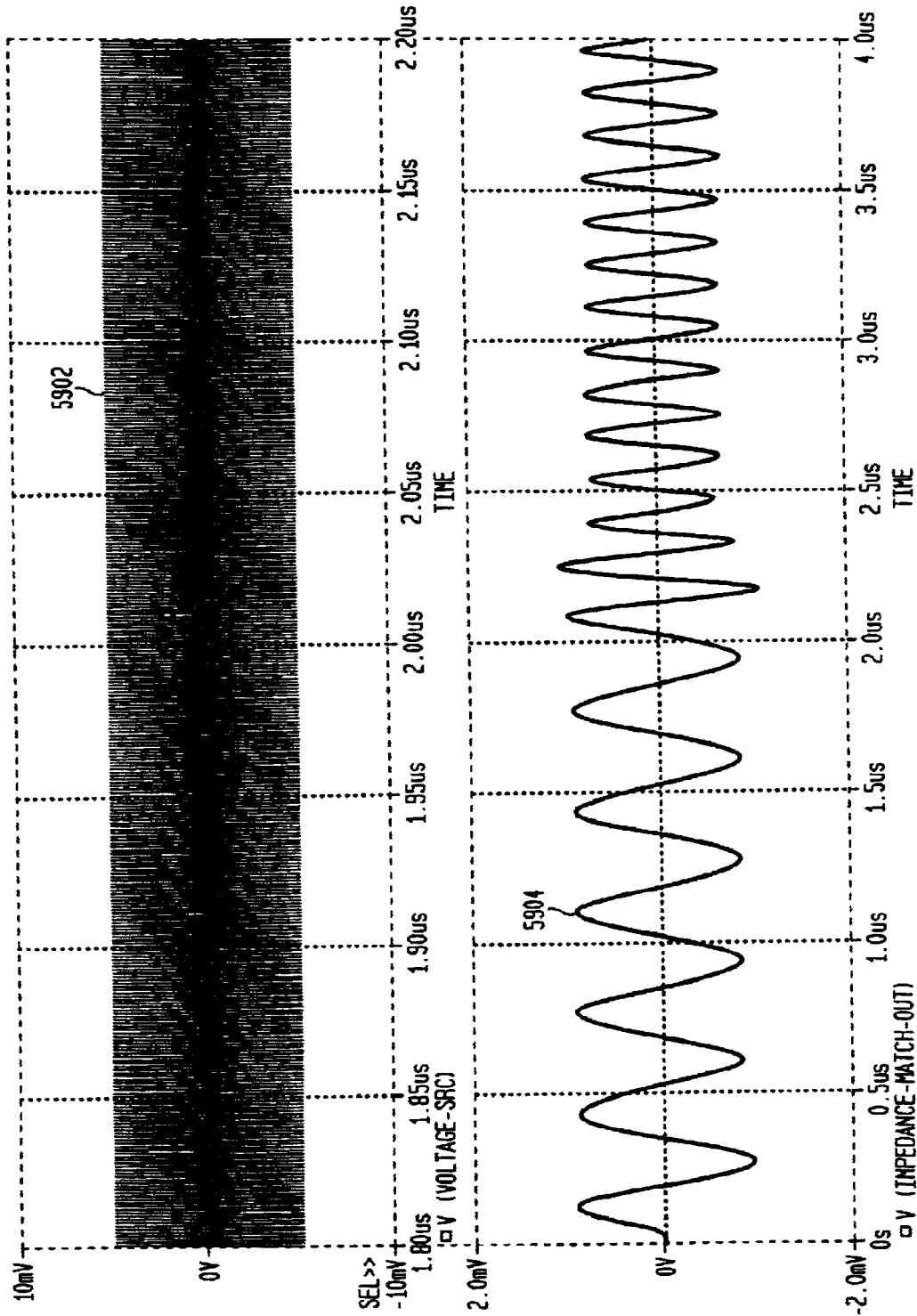
FIG. 72 shows an original FSK waveform and a down-converted waveform.

FIG. 59 shows a schematic of the exemplary circuit in FIG. 53 connected to an FSK source that alternates between 913 and 917 MHz, at a baud rate of 500 Kbaud. FIG. 72 shows the original FSK waveform 5902 and down-converted waveform 5904 at the output of the load impedance match circuit.

3. Frequency Up-Conversion

The present invention is directed to systems and methods of frequency up-conversion, and applications of same.

Figure 3:
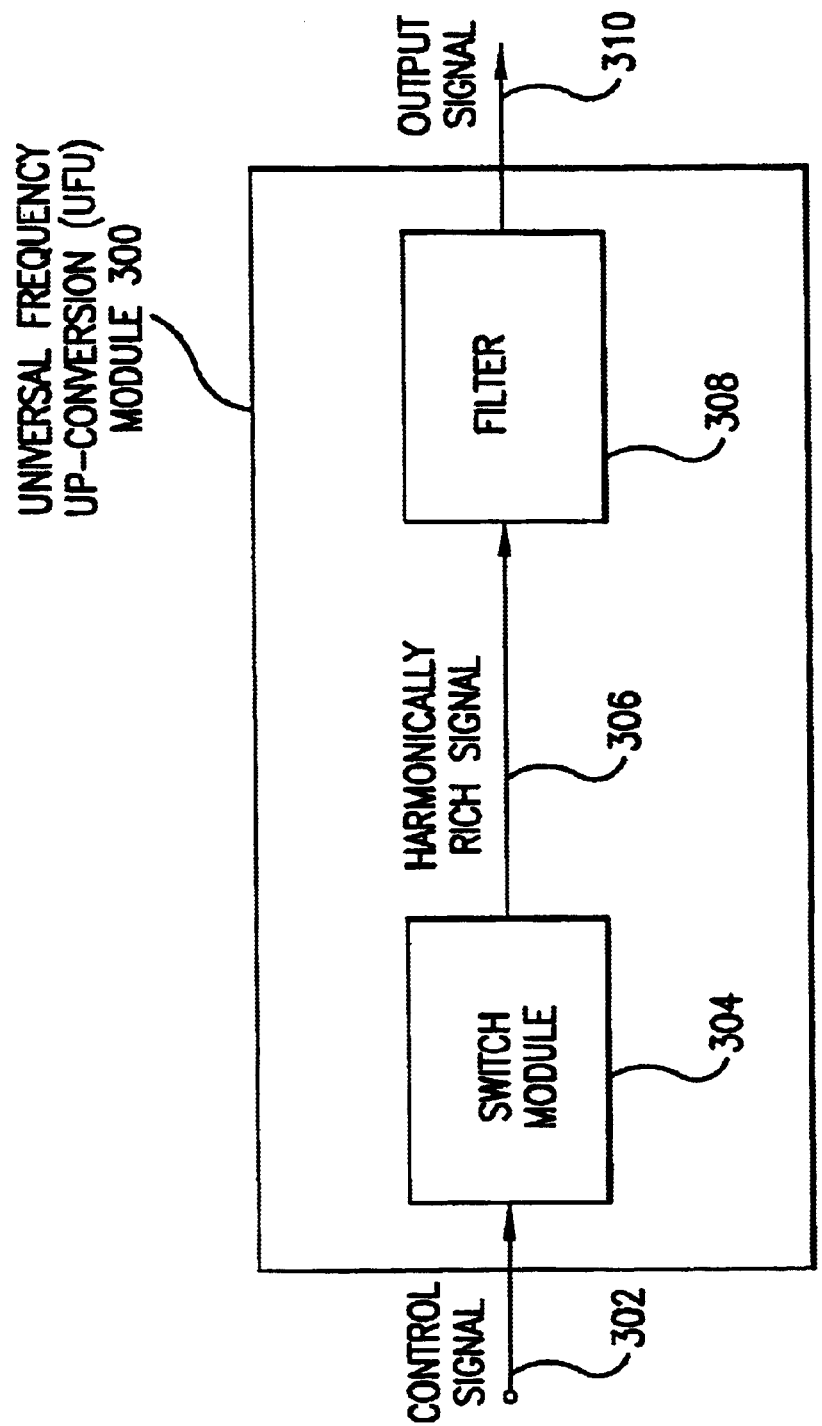
FIG. 3 is a block diagram of a UFU module according to an embodiment of the invention.

An exemplary frequency up-conversion system 300 is illustrated in FIG. 3. Frequency up-conversion system 300 is now described.

An input signal 302 (designated as "Control Signal" in FIG. 3) is accepted by a switch module 304. For purposes of example only, assume that input signal 302 is an FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. Information signal 602 can be analog, digital, or any combination thereof, and any modulation scheme can be used.

The output of switch module 304 is a harmonically rich signal 306, shown for example in FIG. 6D as a harmonically rich signal 608. Harmonically rich signal 608 has a continuous and periodic waveform.

FIG. 6E is an expanded view of two sections of harmonically rich signal 608, section 610 and section 612. Harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Harmonically rich signal 608 is comprised of a plurality of sinusoidal waves whose frequencies are integer multiples of the fundamental frequency of the waveform of harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, input signal 606 may be shaped to ensure that the amplitude of the desired harmonic is sufficient for its intended use (e.g., transmission).

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
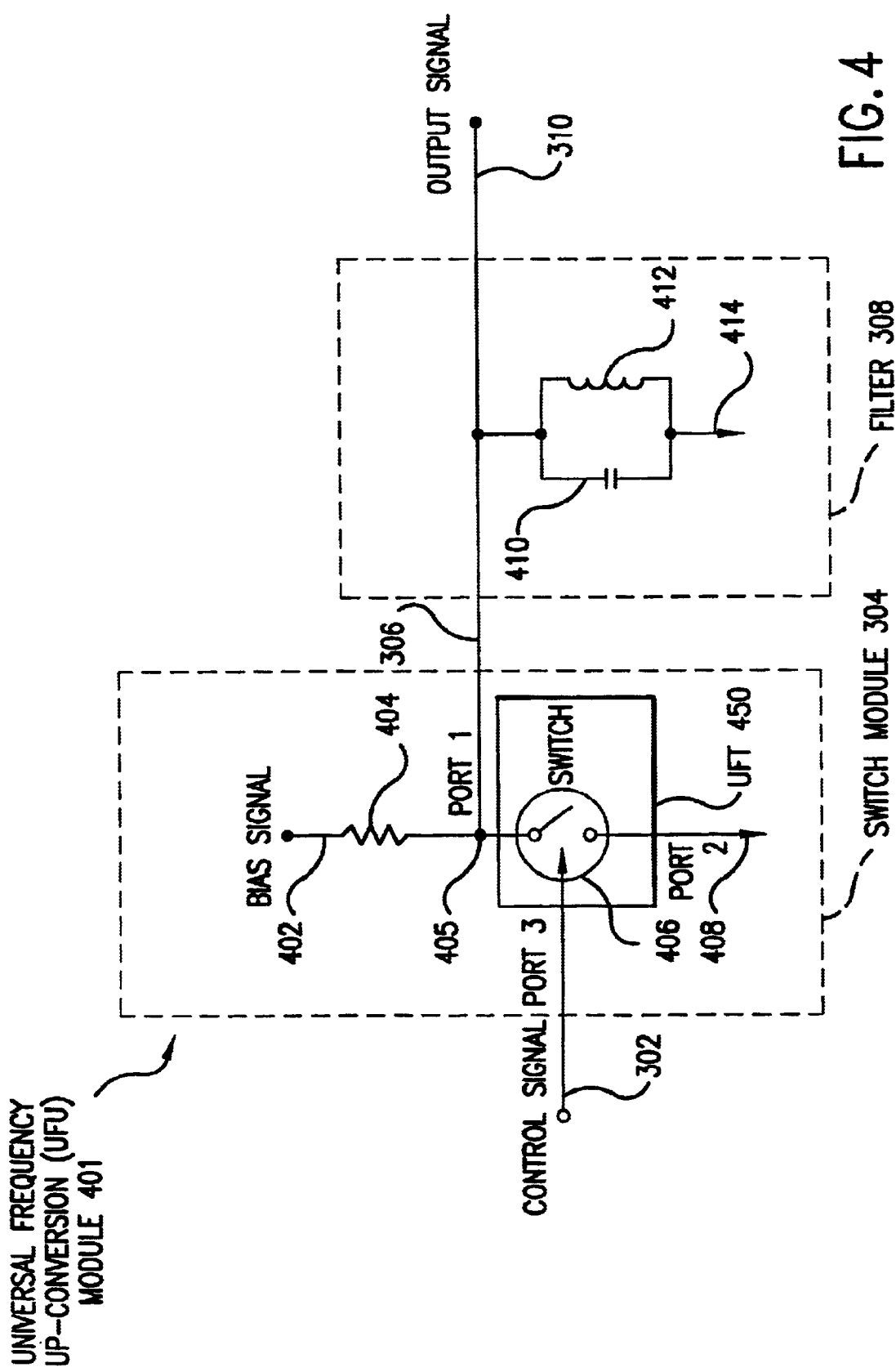
FIG. 4 is a more detailed diagram of a UFU module according to an embodiment of the invention.

FIG. 4 illustrates an exemplary universal frequency up-conversion (UFU) module 401. UFU module 401 includes an exemplary switch module 304, which comprises a bias signal 402, a resistor (or impedance) 404, a universal frequency translator (UFT) 450, and a ground 408. UFT 450 includes a switch 406. Input signal 302 (designated as "Control Signal" in FIG. 4) controls switch 406 in UFT 450, and causes it to close and open. Harmonically rich signal 306 is generated at a node 405 located between resistor (or impedance) 404 and switch 406.

Also in FIG. 4, it can be seen that an exemplary filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
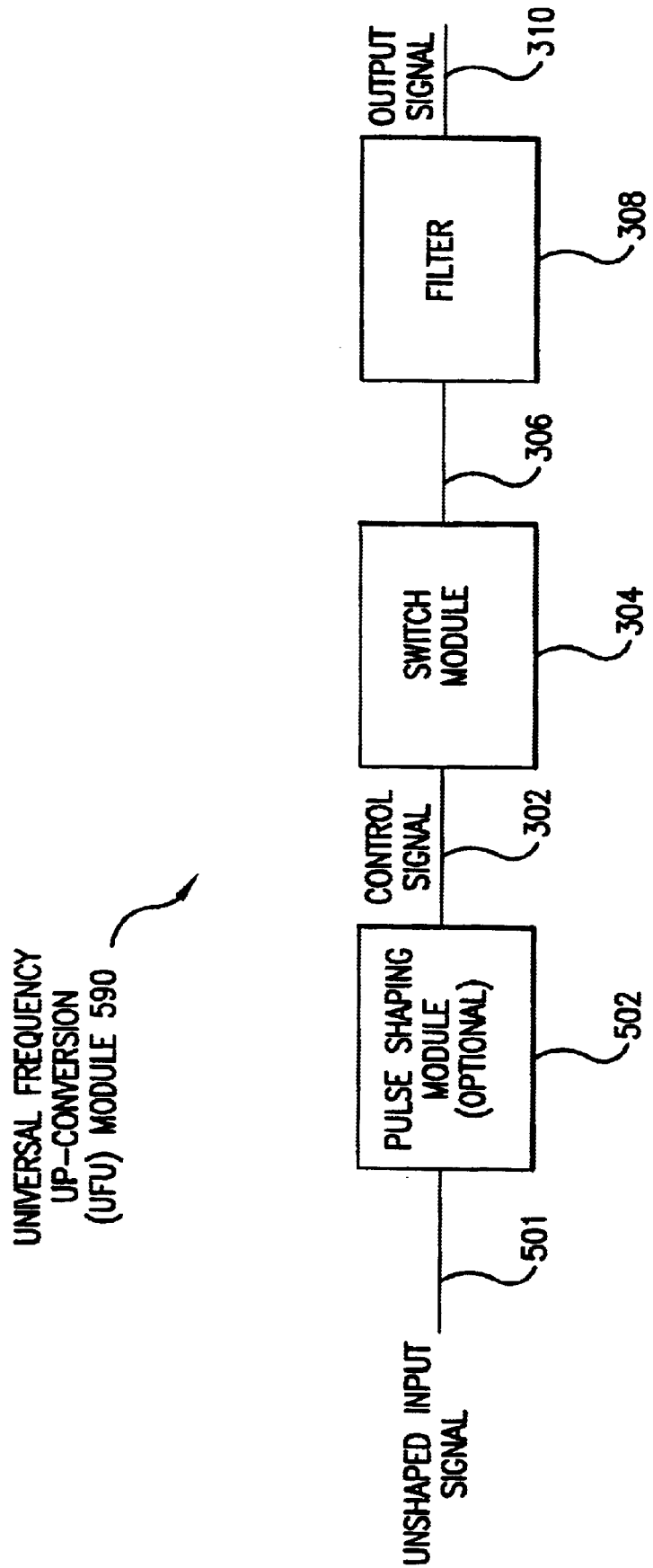
FIG. 5 is a block diagram of a UFU module according to an alternative embodiment of the invention.

For example, in an alternate embodiment shown in FIG. 5, an unshaped input signal 501 is routed to a pulse shaping module 502. Pulse shaping module 502 modifies unshaped input signal 501 to generate a (modified) input signal 302 (designated as the "Control Signal" in FIG. 5). Input signal 302 is routed to switch module 304, which operates in the manner described above. Also, filter 308 of FIG. 5 operates in the manner described above.

The purpose of pulse shaping module 502 is to define the pulse width of input signal 302. Recall that input signal 302 controls the opening and closing of switch 406 in switch module 304. During such operation, the pulse width of input signal 302 establishes the pulse width of harmonically rich signal 306. As stated above, the relative amplitudes of the harmonics of harmonically rich signal 306 are a function of at least the pulse width of harmonically rich signal 306. As such, the pulse width of input signal 302 contributes to setting the relative amplitudes of the harmonics of harmonically rich signal 306.

Further details of up-conversion as described in this section are presented in U.S. application "Method and System for Frequency Up-Conversion," Ser. No. 09/176, 154, filed Oct. 21, 1998, incorporated herein by reference in its entirety.

4. Enhanced Signal Reception

The present invention is directed to systems and methods of enhanced signal reception (ESR), and applications of same.

Figure 21:
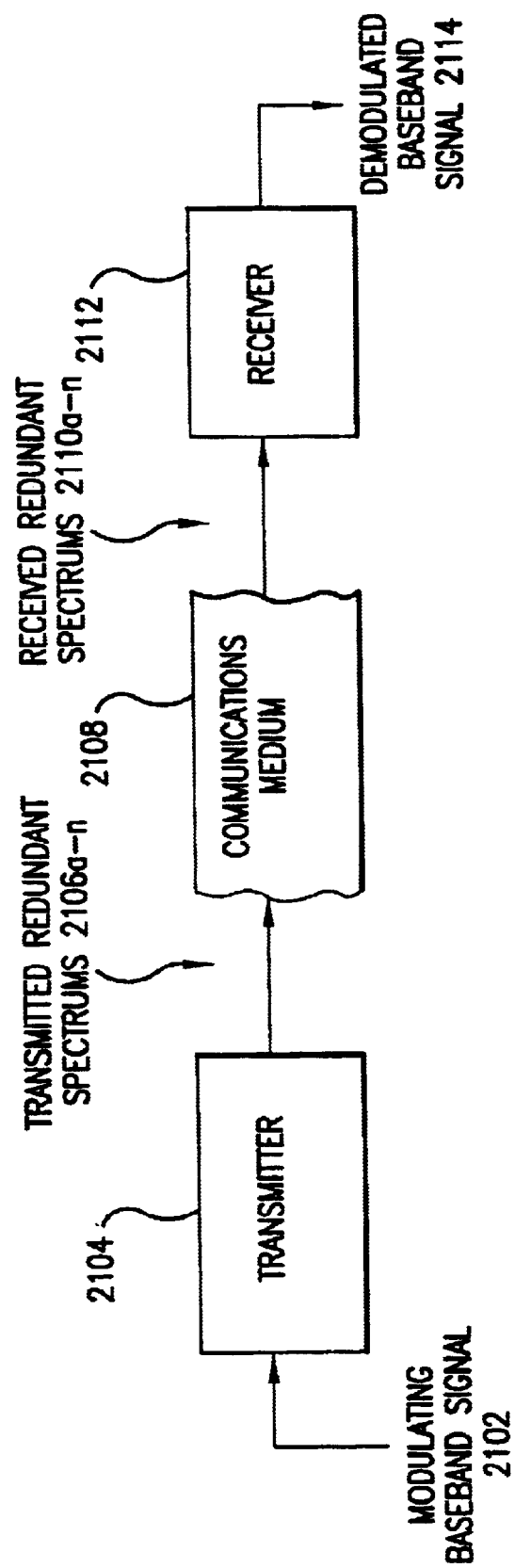
FIG. 21 illustrates an enhanced signal reception system according to an embodiment of the invention.

Referring to FIG. 21, transmitter 2104 accepts a modulating baseband signal 2102 and generates (transmitted) redundant spectra 2106*a–n*, which are sent over a communications medium 2108. Receiver 2112 recovers a demodulated baseband signal 2114 from (received) redundant spectra 2110*a–n*. Demodulated baseband signal 2114 is representative of modulating baseband signal 2102, where the level of similarity between modulating baseband signal 2114 and modulating baseband signal 2102 is application dependent.

Figure 22A:
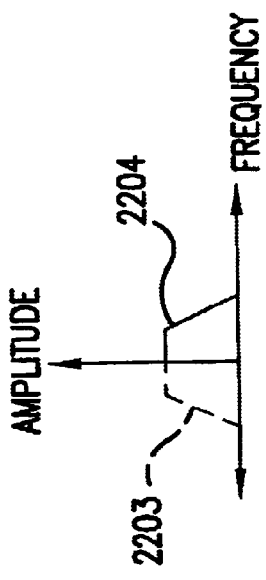
FIGS. 22A–22F are exemplary waveforms used to describe the system of FIG. 21.
Figure 22B:
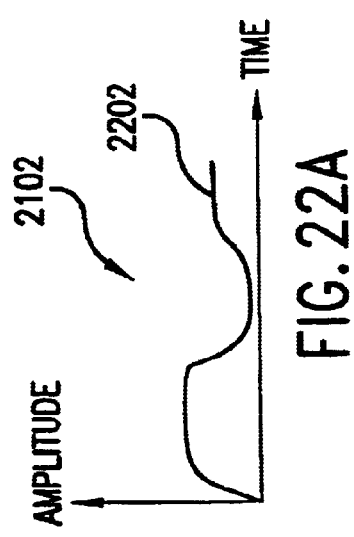

Modulating baseband signal 2102 is preferably any information signal desired for transmission and/or reception. An exemplary modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22*a*, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106*a–n* contains the necessary information to substantially reconstruct modulating baseband signal 2102. In other words, each redundant spectrum 2106*a–n* contains the necessary amplitude, phase, and frequency information to reconstruct modulating baseband signal 2102.

Figure 22C:
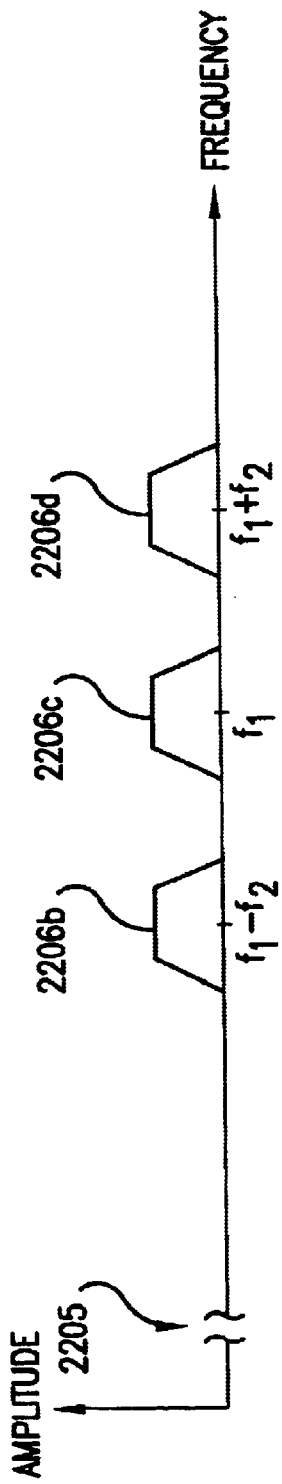

FIG. 22C illustrates exemplary transmitted redundant spectra 2206b–d. Transmitted redundant spectra 2206b–d are illustrated to contain three redundant spectra for illustration purposes only. Any number of redundant spectra could be generated and transmitted as will be explained in following discussions.

Figure 22D:
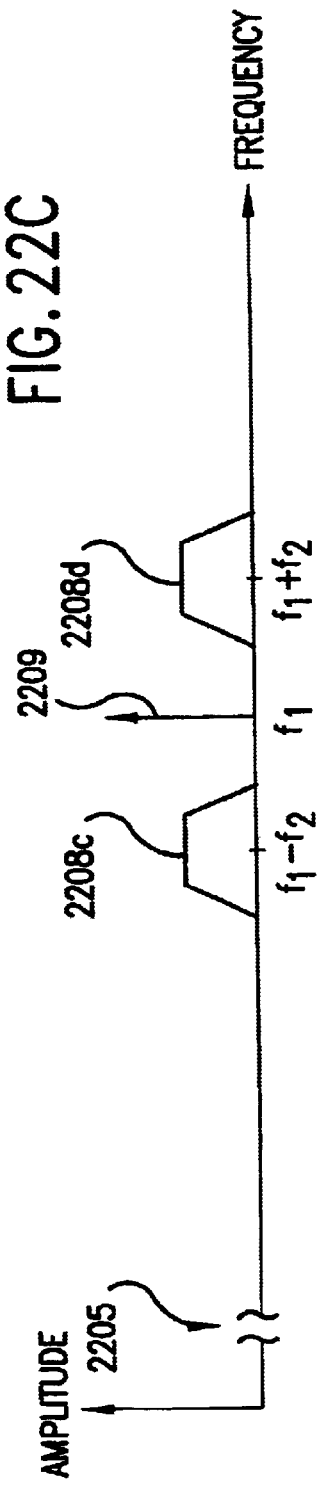

Transmitted redundant spectra 2206b–d are centered at $f_1$, with a frequency spacing $f_2$ between adjacent spectra. Frequencies $f_1$ and $f_2$ are dynamically adjustable in real-time as will be shown below. FIG. 22D illustrates an alternate embodiment, where redundant spectra 2208c,d are centered on unmodulated oscillating signal 2209 at $f_1$(Hz). Oscillating signal 2209 may be suppressed if desired using, for example, phasing techniques or filtering techniques. Transmitted redundant spectra are preferably above baseband frequencies as is represented by break 2205 in the frequency axis of FIGS. 22C and 22D.

Figure 22E:
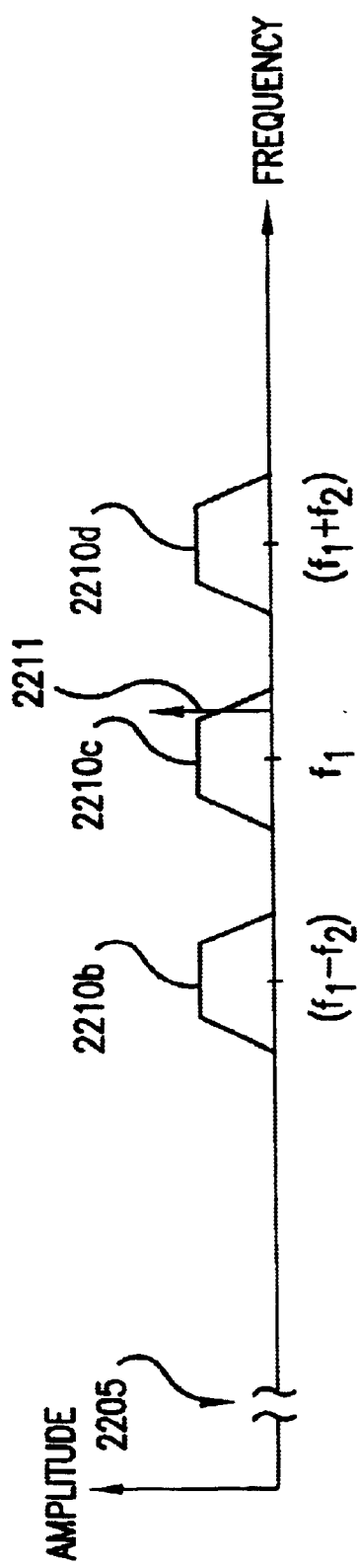

Received redundant spectra 2110a–n are substantially similar to transmitted redundant spectra 2106a–n, except for the changes introduced by communications medium 2108. Such changes can include but are not limited to signal attenuation, and signal interference. FIG. 22E illustrates exemplary received redundant spectra 2210b–d. Received redundant spectra 2210b–d are substantially similar to transmitted redundant spectra 2206b–d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

Figure 22F:
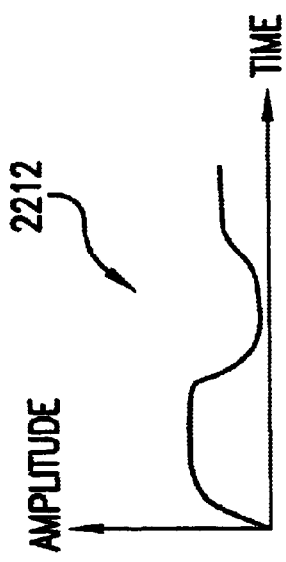

As stated above, demodulated baseband signal 2114 is extracted from one or more of received redundant spectra 2210b–d. FIG. 22F illustrates exemplary demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectra are transmitted, where each redundant spectrum carries the necessary information to reconstruct the baseband signal. At the destination, the redundant spectra are isolated from each other so that the baseband signal can be recovered even if one or more of the redundant spectra are corrupted by a jamming signal.

Figure 23A:
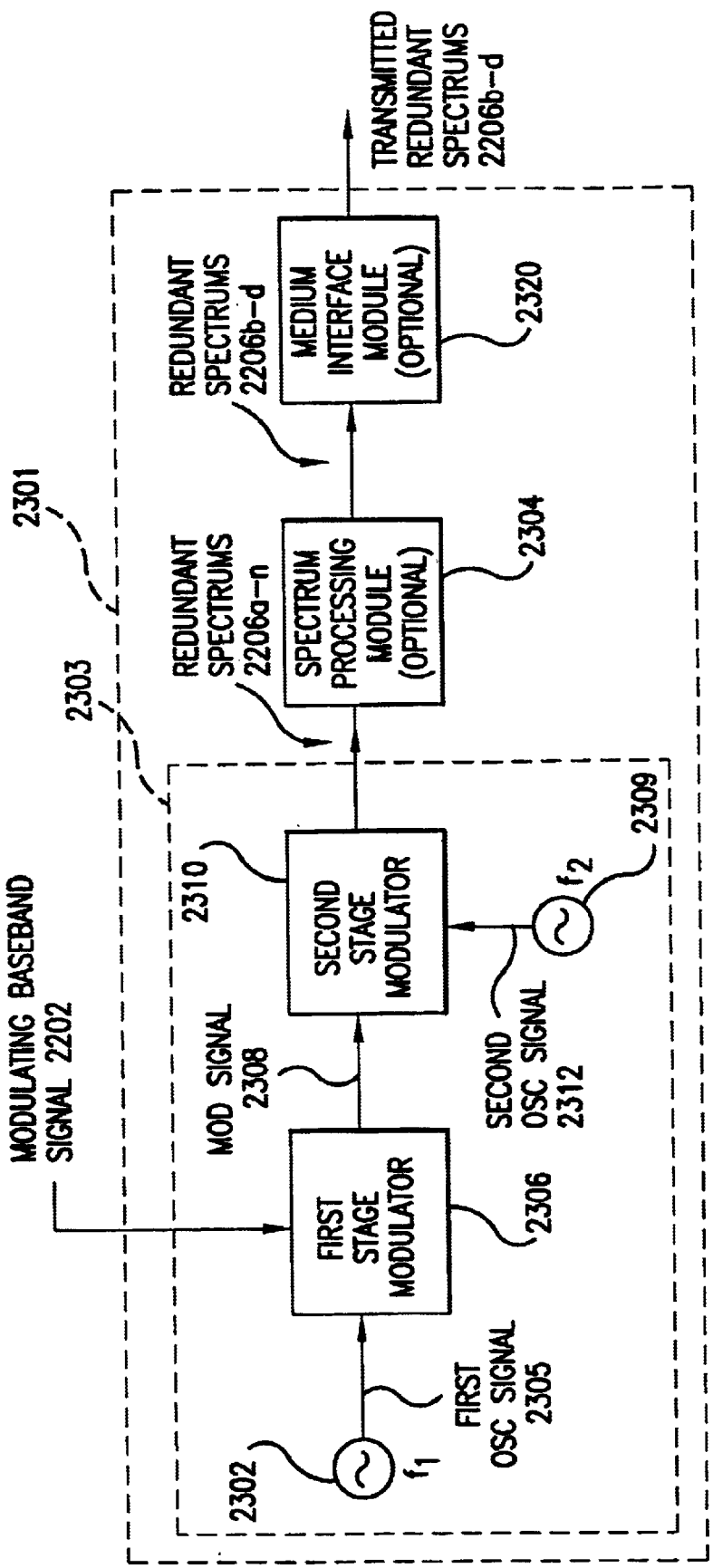
FIG. 23A illustrates an exemplary transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectra configured similar to redundant spectra 2206b–d. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectra 2206a–n shown in FIG. 23B. Second stage modulator 2310 is preferably a phase modulator, or a frequency modulator, although other types of modulation may be implemented including but not limited to amplitude modulation. Each redundant spectrum 2206a–n contains the necessary amplitude, phase, and frequency information to substantially reconstruct modulating baseband signal 2202.

Redundant spectra 2206a–n are substantially centered around $f_1$, which is the characteristic frequency of first oscillating signal 2305. Also, each redundant spectrum 2206a–n (except for 2206c) is offset from $f_1$ by approximately a multiple of $f_2$ (Hz), where $f_2$ is the frequency of second oscillating signal 2312. Thus, each redundant spectrum 2206a–n is offset from an adjacent redundant spectrum by $f_2$ (Hz). This allows the spacing between adjacent redundant spectra to be adjusted (or tuned) by changing $f_2$ that is associated with second oscillator 2309. Adjusting the spacing between adjacent redundant spectra allows for dynamic real-time tuning of the bandwidth occupied by redundant spectra 2206a–n.

In one embodiment, the number of redundant spectra 2206a–n generated by transmitter 2301 is arbitrary and may be unlimited as indicated by the "a–n" designation for redundant spectra 2206a–n. However, a typical communications medium will have a physical and/or administrative limitations (i.e. FCC regulations) that restrict the number of redundant spectra that can be practically transmitted over the communications medium. Also, there may be other reasons to limit the number of redundant spectra transmitted. Therefore, preferably, transmitter 2301 will include an optional spectrum processing module 2304 to process redundant spectra 2206a–n prior to transmission over communications medium 2108.

In one embodiment, spectrum processing module 2304 includes a filter with a passband 2207 (FIG. 23C) to select redundant spectra 2206b–d for transmission. This will substantially limit the frequency bandwidth occupied by the redundant spectra to passband 2207. In one embodiment, spectrum processing module 2304 also up converts redundant spectra and/or amplifies redundant spectra prior to transmission over communications medium 2108. Finally, medium interface module 2320 transmits redundant spectra over communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
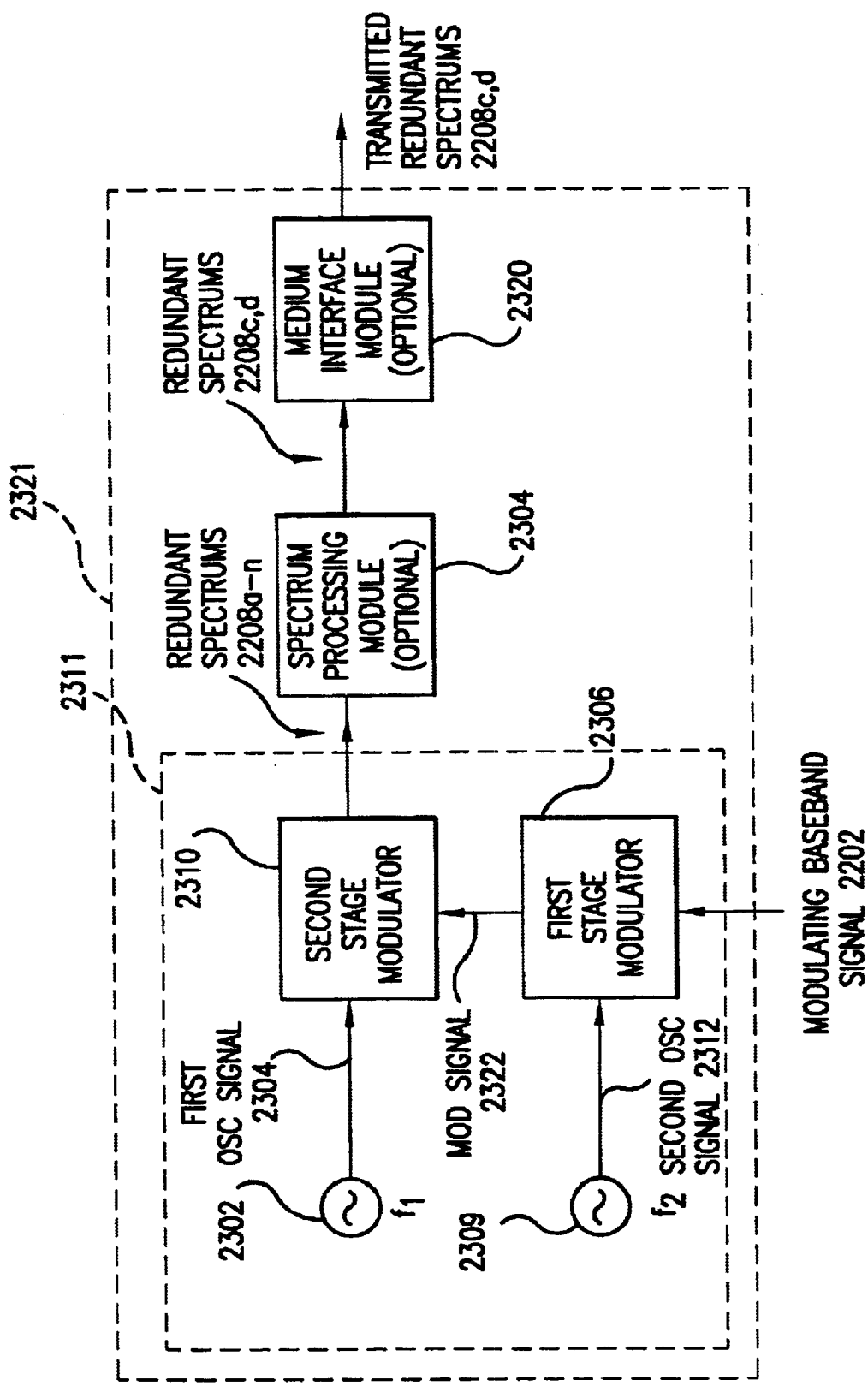
FIG. 23D illustrates another exemplary transmitter in an enhanced signal reception system according to an embodiment of the invention.

FIG. 23D illustrates transmitter 2321, which is one embodiment of transmitter 2104 that generates redundant spectra configured similar to redundant spectra 2208c–d and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

As shown in FIG. 23D, many of the components in transmitter 2321 are similar to those in transmitter 2301.

However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectra 2208a–n, as shown in FIG. 23E. Second stage modulator 2310 is preferably a phase or frequency modulator, although other modulators could used including but not limited to an amplitude modulator.

Redundant spectra 2208a–n are centered on unmodulated spectrum 2209 (at $f_1$ Hz), and adjacent spectra are separated by $f_2$ Hz. The number of redundant spectra 2208a–n generated by generator 2311 is arbitrary and unlimited, similar to spectra 2206a–n discussed above. Therefore, optional spectrum processing module 2304 may also include a filter with passband 2325 to select, for example, spectra 2208c,d for transmission over communications medium 2108. In addition, optional spectrum processing module 2304 may also include a filter (such as a bandstop filter) to attenuate unmodulated spectrum 2209. Alternatively, unmodulated spectrum 2209 maybe attenuated by using phasing techniques during redundant spectrum generation. Finally, (optional) medium interface module 2320 transmits redundant spectra 2208c,d over communications medium 2108.

Figure 24A:
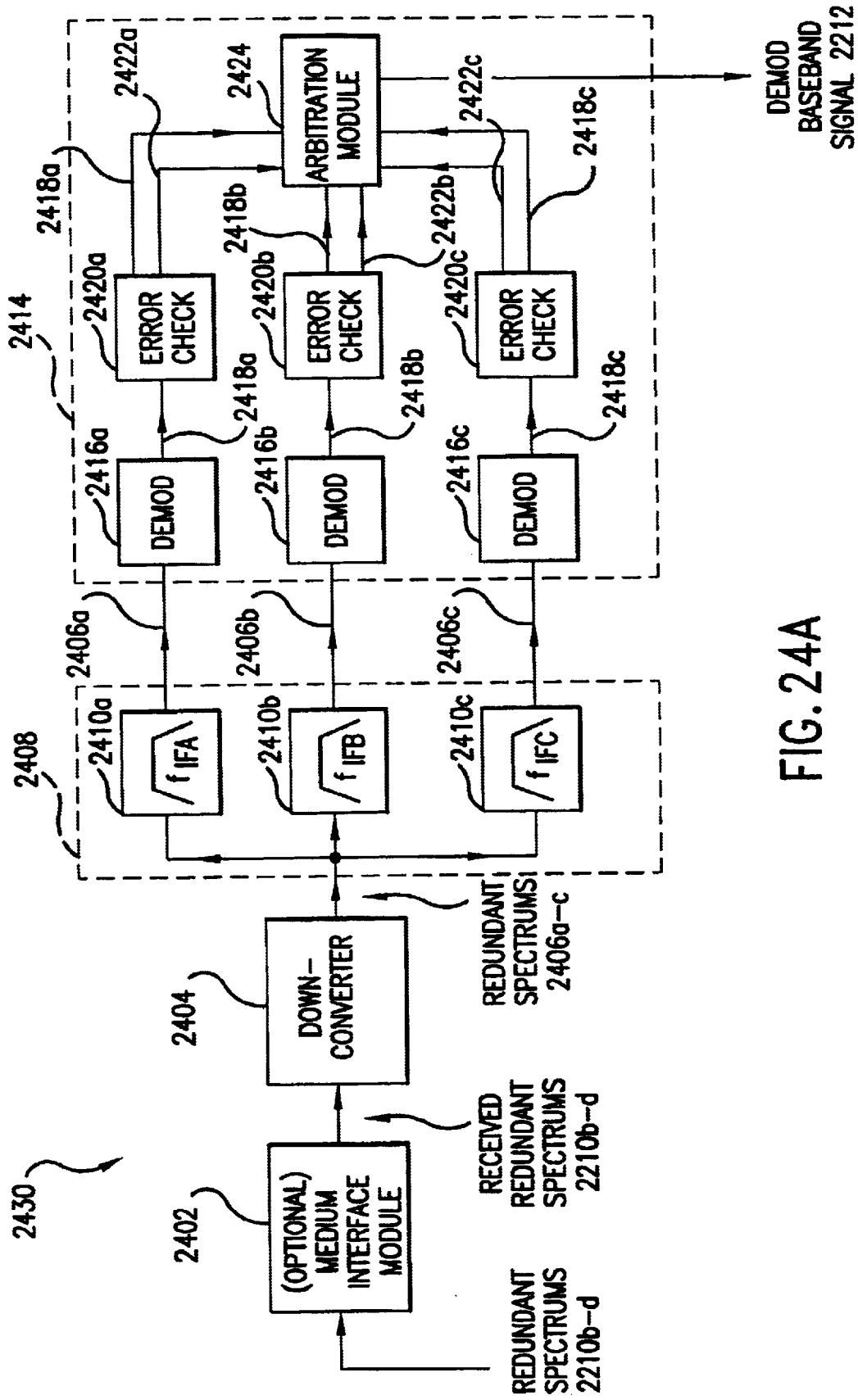
FIG. 24A illustrates an exemplary receiver in an enhanced signal reception system according to an embodiment of the invention.

Receiver 2112 will now be explored in greater detail to illustrate recovery of a demodulated baseband signal from received redundant spectra. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a–c. Data extraction module 2414 includes demodulators 2416a–c, error check modules 2420a–c, and arbitration module 2424. Receiver 2430 will be discussed in relation to the signal diagrams in FIGS. 24B–24J.

Figure 24J:
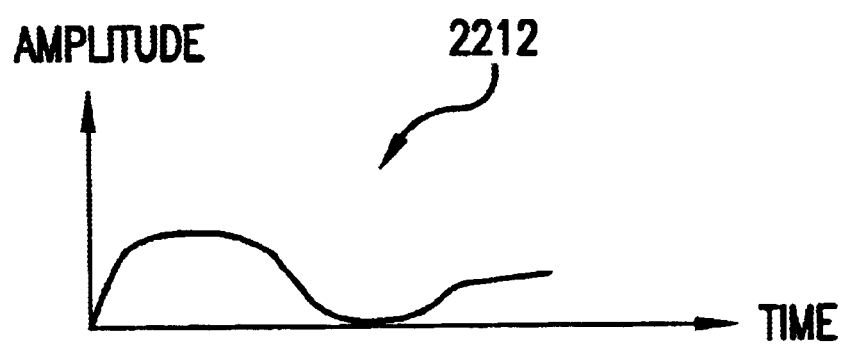

In one embodiment, optional medium interface module 2402 receives redundant spectra 2210b–d (FIG. 22E, and FIG. 24B). Each redundant spectrum 2210b–d includes the necessary amplitude, phase, and frequency information to substantially reconstruct the modulating baseband signal used to generated the redundant spectra. However, in the present example, spectrum 2210c also contains jamming signal 2211, which may interfere with the recovery of a baseband signal from spectrum 2210c. Down-converter 2404 down-converts received redundant spectra 2210b–d to lower intermediate frequencies, resulting in redundant spectra 2406a–c (FIG. 24C). Jamming signal 2211 is also down-converted to jamming signal 2407, as it is contained within redundant spectrum 2406b. Spectrum isolation module 2408 includes filters 2410a–c that isolate redundant spectra 2406a–c from each other (FIGS. 24D–24F, respectively). Demodulators 2416a–c independently demodulate spectra 2406a–c, resulting in demodulated baseband signals 2418a–c, respectively (FIGS. 24G–24I). Error check modules 2420a–c analyze demodulate baseband signal 2418a–c to detect any errors. In one embodiment, each error check module 2420a–c sets an error flag 2422a–c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectra, where the degree of similarity is application dependent.

Referring to FIGS. 24G–I, arbitration module 2424 will select either demodulated baseband signal 2418a or 2418c, because error check module 2420b will set error flag 2422b that is associated with demodulated baseband signal 2418b.

The error detection schemes implemented by the error detection modules include but are not limited to: cyclic redundancy check (CRC) and parity check for digital signals, and various error detections schemes for analog signal.

Further details of enhanced signal reception as described in this section are presented in U.S. application "Method and System for Ensuring Reception of a Communications Signal," Ser. No. 09/176,415, filed Oct. 21, 1998, incorporated herein by reference in its entirety.

5. Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
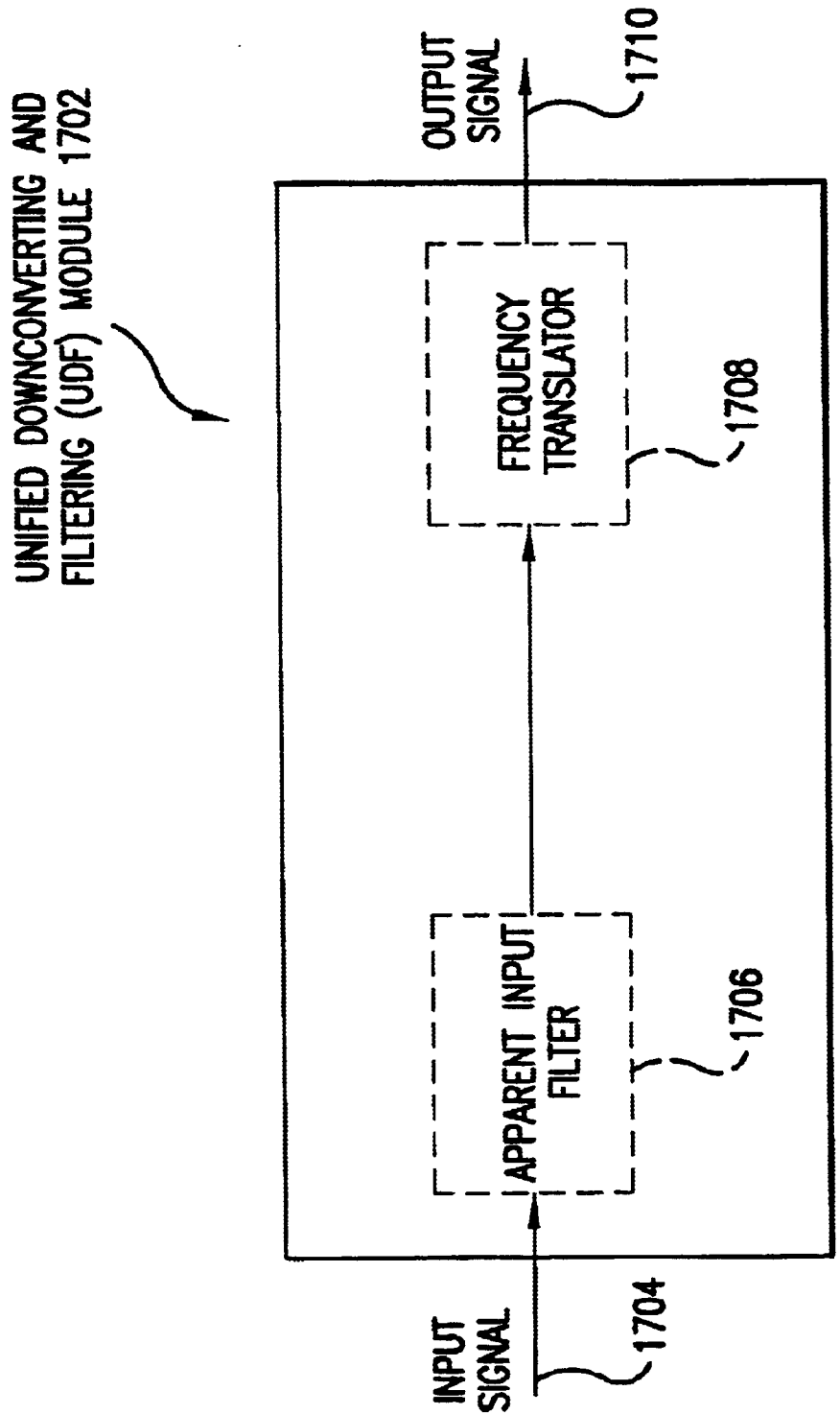
FIG. 17 illustrates a UDF module according to an embodiment of the invention.

FIG. 17 is a conceptual block diagram of a UDF module 1702 according to an embodiment of the present invention. UDF module 1702 performs at least frequency translation and frequency selectivity.

The effect achieved by UDF module 1702 is to perform the frequency selectivity operation prior to the performance of the frequency translation operation. Thus, UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by UDF module 1702 are at radio frequencies. UDF module 1702 effectively operates to input filter these RF input signals 1704. Specifically, in these embodiments, UDF module 1702 effectively performs input, channel select filtering of RF input signal 1704. Accordingly, the invention achieves high selectivity at high frequencies.

UDF module 1702 effectively performs various types of filtering, including but not limited to bandpass filtering, low pass filtering, high pass filtering, notch filtering, all pass filtering, band stop filtering, etc., and combinations thereof.

Conceptually, UDF module 1702 includes a frequency translator 1708. Frequency translator 1708 conceptually represents that portion of UDF module 1702 that performs frequency translation (down conversion).

UDF module 1702 also conceptually includes an apparent input filter 1706 (also sometimes called an input filtering emulator). Conceptually, apparent input filter 1706 represents that portion of UDF module 1702 that performs input filtering.

In practice, the input filtering operation performed by UDF module 1702 is integrated with the frequency translation operation. The input filtering operation can be viewed as being performed concurrently with the frequency translation operation. This is a reason why input filter 1706 is herein referred to as an "apparent" input filter 1706.

UDF module 1702 of the present invention includes a number of advantages. For example, high selectivity at high frequencies is realizable using UDF module 1702. This feature of the invention is evident by the high Q factors that are attainable. For example, and without limitation, UDF module 1702 can be designed with a filter center frequency $f_C$ on the order of 900 MHz, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of UDF module 1702 can be electrically adjusted, either statically or dynamically.

Also, UDF module 1702 can be designed to amplify input signals.

Further, UDF module 1702 can be implemented without large resistors, capacitors, or inductors. Also, UDF module 1702 does not require that tight tolerances be maintained on the values of its individual components, i.e., its resistors, capacitors, inductors, etc. As a result, the architecture of UDF module 1702 is friendly to integrated circuit design techniques and processes.

The features and advantages exhibited by UDF module 1702 are achieved at least in part by adopting a new technological paradigm with respect to frequency selectivity and translation. Specifically, according to the present invention, UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
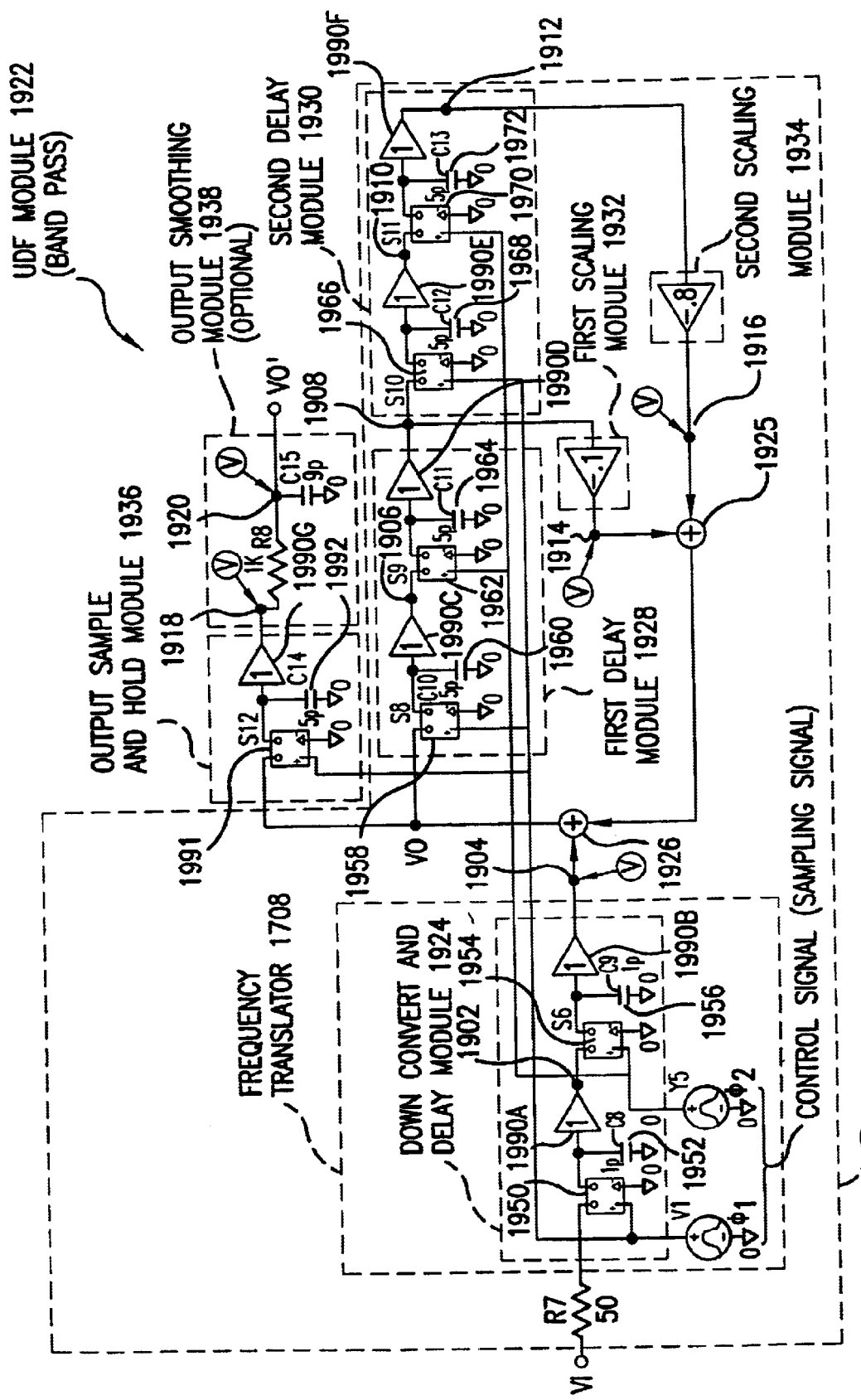
FIG. 19 is a detailed diagram of an exemplary UDF module according to an embodiment of the invention.

FIG. 19 illustrates an exemplary implementation of a unified down-converting and filtering (UDF) module 1922. UDF module 1922 performs the frequency translation operation and the frequency selectivity operation in an integrated, unified manner as described above, and as further described below.

In the example of FIG. 19, the frequency selectivity operation performed by UDF module 1922 comprises a band-pass filtering operation according to EQ. 1, below, which is an exemplary representation of a band-pass filtering transfer function.

$$VO = \alpha_1 z^{-1} VI - \beta_1 z^{-1} VO - \beta_0 z^{-2} VO \qquad \text{EQ.1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ.1 is referred to herein for illustrative purposes only, and is not limiting.

UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, output smoothing module 1938 is optional.

As further described below, in the example of FIG. 19, down-convert and delay module 1924 and first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of down-convert and delay module 1924 is not scaled. As evident from the embodiments described above, however, the invention is not limited to this example.

Exemplary UDF module 1922 has a filter center frequency of 900.2 MHz and a filter bandwidth of 570 KHz.

The pass band of the UDF module 1922 is on the order of 899.915 MHz to 900.485 MHz. The Q factor of UDF module 1922 is approximately 1879 (i.e., 900.2 MHz divided by 570 KHz).

The operation of UDF module 1922 shall now be described with reference to a Table 1802 (FIG. 18) that indicates exemplary values at nodes in UDF module 1922 at a number of consecutive time increments. It is assumed in Table 1802 that UDF module 1922 begins operating at time t−1. As indicated below, UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of switch 1950 and capacitor 1952 in down-convert and delay module 1924 operates to translate the frequency of the input signal VI to a desired lower frequency, such as IF or baseband. Thus, the value stored in capacitor 1952 represents an instance of a down-converted image of the input signal VI.

The manner in which down-convert and delay module 1924 performs frequency down-conversion is further described elsewhere in this application, and is additionally described in U.S. application "Method and System for Down-Converting Electromagnetic Signals," Ser. No. 09/176,022, filed Oct. 21, 1998, which is herein incorporated by reference in its entirety.

Also at the rising edge of $\phi_1$ at time t−1, a switch 1958 in first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 in second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in down-convert and delay module 1924 closes, allowing a capacitor 1956 to charge to the level of capacitor 1952. Accordingly, capacitor 1956 charges to $VI_{t-1}$, such that node 1904 is at $VI_{t-1}$. This is indicated by cell 1810 in Table 1802.

UDF module 1922 may optionally include a unity gain module 1990A between capacitors 1952 and 1956. Unity gain module 1990A operates as a current source to enable capacitor 1956 to charge without draining the charge from capacitor 1952. For a similar reason, UDF module 1922 may include other unity gain modules 1990B–1990G. It should be understood that, for many embodiments and applications of the invention, unity gain modules 1990A–1990G are optional. The structure and operation of unity gain modules 1990 will be apparent to persons skilled in the relevant art(s).

Also at the rising edge of $\phi_2$ at time t−1, a switch 1962 in first delay module 1928 closes, allowing a capacitor 1964 to charge to the level of capacitor 1960. Accordingly, capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, switch 1950 in down-convert and delay module 1924 closes. This allows capacitor 1952 to charge to $VI_t$, such that node 1902 is at $VI_t$. This is indicated in cell 1816 of Table 1802.

Also at the rising edge of $\phi_1$ at time t, switch 1958 in first delay module 1928 closes, thereby allowing capacitor 1960 to charge to $VO_t$. Accordingly, node 1906 is at $VO_t$. This is indicated in cell 1820 in Table 1802.

Further at the rising edge of $\phi_1$ at time t, switch 1966 in second delay module 1930 closes, allowing a capacitor 1968 to charge to the level of capacitor 1964. Therefore, capacitor 1968 charges to $VO_{t-1}$, such that node 1910 is at $VO_{t-1}$. This is indicated by cell 1824 in Table 1802.

At the rising edge of $\phi_2$ at time t, switch 1954 in down-convert and delay module 1924 closes, allowing capacitor 1956 to charge to the level of capacitor 1952. Accordingly, capacitor 1956 charges to $VI_t$, such that node 1904 is at $VI_t$. This is indicated by cell 1828 in Table 1802.

Also at the rising edge of $\phi_2$ at time t, switch 1962 in first delay module 1928 closes, allowing capacitor 1964 to charge to the level in capacitor 1960. Therefore, capacitor 1964 charges to $VO_t$, such that node 1908 is at $VO_t$. This is indicated by cell 1832 in Table 1802.

Further at the rising edge of $\phi_2$ at time t, switch 1970 in second delay module 1930 closes, allowing capacitor 1972 in second delay module 1930 to charge to the level of capacitor 1968 in second delay module 1930. Therefore, capacitor 1972 charges to $VO_{t-1}$, such that node 1912 is at $VO_{t-1}$. This is indicated in cell 1836 of FIG. 18.

At time t+1, at the rising edge of $\phi_1$, switch 1950 in down-convert and delay module 1924 closes, allowing capacitor 1952 to charge to $VI_{t+1}$. Therefore, node 1902 is at $VI_{t+1}$, as indicated by cell 1838 of Table 1802.

Also at the rising edge of $\phi_1$ at time t+1, switch 1958 in first delay module 1928 closes, allowing capacitor 1960 to charge to $VO_{t+1}$. Accordingly, node 1906 is at $VO_{t+1}$, as indicated by cell 1842 in Table 1802.

Further at the rising edge of $\phi_1$ at time t+1, switch 1966 in second delay module 1930 closes, allowing capacitor 1968 to charge to the level of capacitor 1964. Accordingly, capacitor 1968 charges to $VO_t$, as indicated by cell 1846 of Table 1802.

In the example of FIG. 19, first scaling module 1932 scales the value at node 1908 (i.e., the output of first delay module 1928) by a scaling factor of −0.1. Accordingly, the value present at node 1914 at time t+1 is $-0.1*VO_t$. Similarly, second scaling module 1934 scales the value present at node 1912 (i.e., the output of second scaling module 1930) by a scaling factor of −0.8. Accordingly, the value present at node 1916 is $-0.8*VO_{t-1}$ at time t+1.

At time t+1, the values at the inputs of summer 1926 are: $VI_t$ at node 1904, $-0.1*VO_t$ at node 1914, and $-0.8*VO_{t-1}$ at node 1916 (in the example of FIG. 19, the values at nodes 1914 and 1916 are summed by a second summer 1925, and this sum is presented to summer 1926). Accordingly, at time t+1, the summer generates a signal equal to $VI_t - 0.1*VO_t - 0.8*VO_{t-1}$.

At the rising edge of $\phi_1$ at time t+1, a switch 1991 in the output sample and hold module 1936 closes, thereby allowing a capacitor 1992 to charge to $VO_{t+1}$. Accordingly, capacitor 1992 charges to $VO_{t+1}$, which is equal to the sum generated by summer 1926. As just noted, this value is equal to: $VI_t - 0.1*VO_t - 0.8*VO_{t-1}$. This is indicated in cell 1850 of Table 1802. This value is presented to optional output smoothing module 1938, which smooths the signal to thereby generate the instance of the output signal $VO_{r+1}$. It is apparent from inspection that this value of $VO_{r+1}$ is consistent with the band pass filter transfer function of EQ. 1.

Further details of unified down-conversion and filtering as described in this section are presented in U.S. application "Integrated Frequency Translation And Selectivity," Ser. No. 09/175,966, filed Oct. 21, 1998, incorporated herein by reference in its entirety.

6. Exemplary Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Exemplary applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these exemplary applications. Additional applications of the UFT module will be apparent to persons skilled in the relevant art(s), based on the teachings contained herein.

Figure 7:
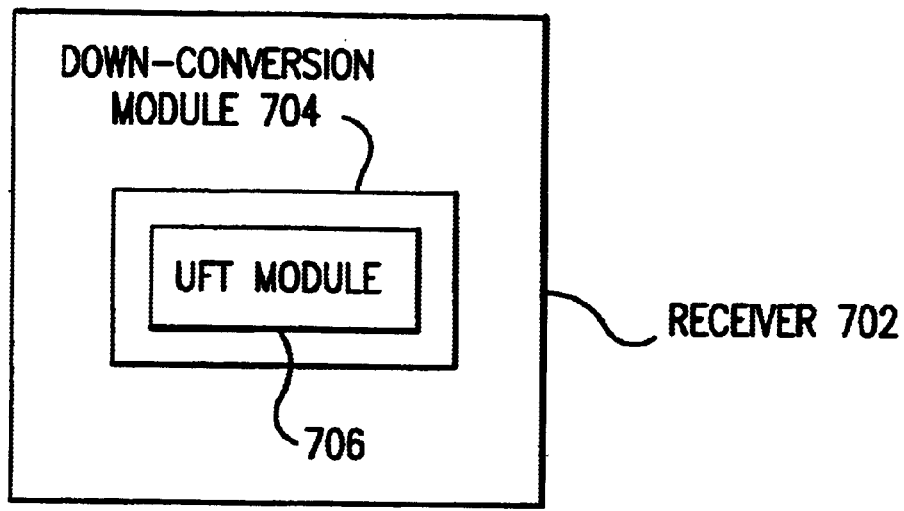
FIG. 7 illustrates a UFT module used in a receiver according to an embodiment of the invention.

For example, the present invention can be used in applications that involve frequency down-conversion. This is shown in FIG. 1C, for example, where an exemplary UFT module 115 is used in a down-conversion module 114. In this capacity, UFT module 115 frequency down-converts an input signal to an output signal. This is also shown in FIG. 7, for example, where an exemplary UFT module 706 is part of a down-conversion module 704, which is part of a receiver 702.

Figure 8:
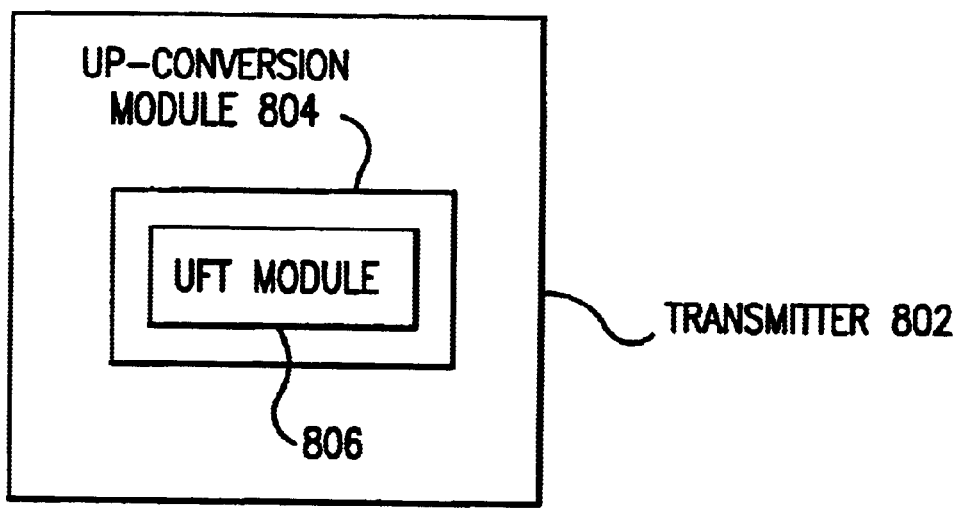
FIG. 8 illustrates a UFT module used in a transmitter according to an embodiment of the invention.

The present invention can be used in applications that involve frequency up-conversion. This is shown in FIG. 1D, for example, where an exemplary UFT module 117 is used in a frequency up-conversion module 116. In this capacity, UFT module 117 frequency up-converts an input signal to an output signal. This is also shown in FIG. 8, for example, where an exemplary UFT module 806 is part of up-conversion module 804, which is part of a transmitter 802.

Figure 9:
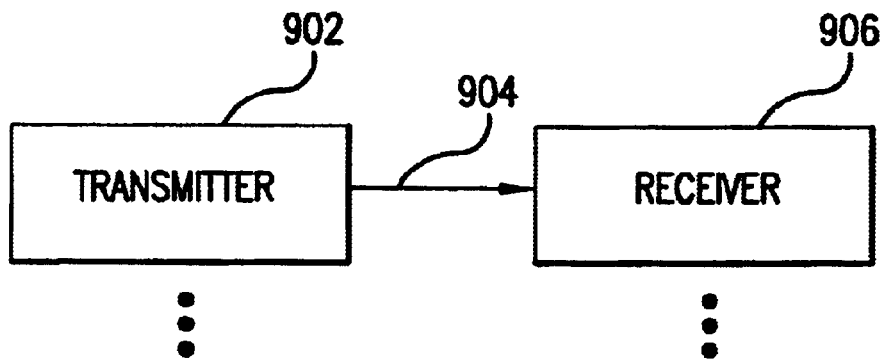
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more transmitters 902 may be implemented using a UFT module, as shown for example in FIG. 8. Also, one or more receivers 906 may be implemented using a UFT module, as shown for example in FIG. 7.

Figure 10:
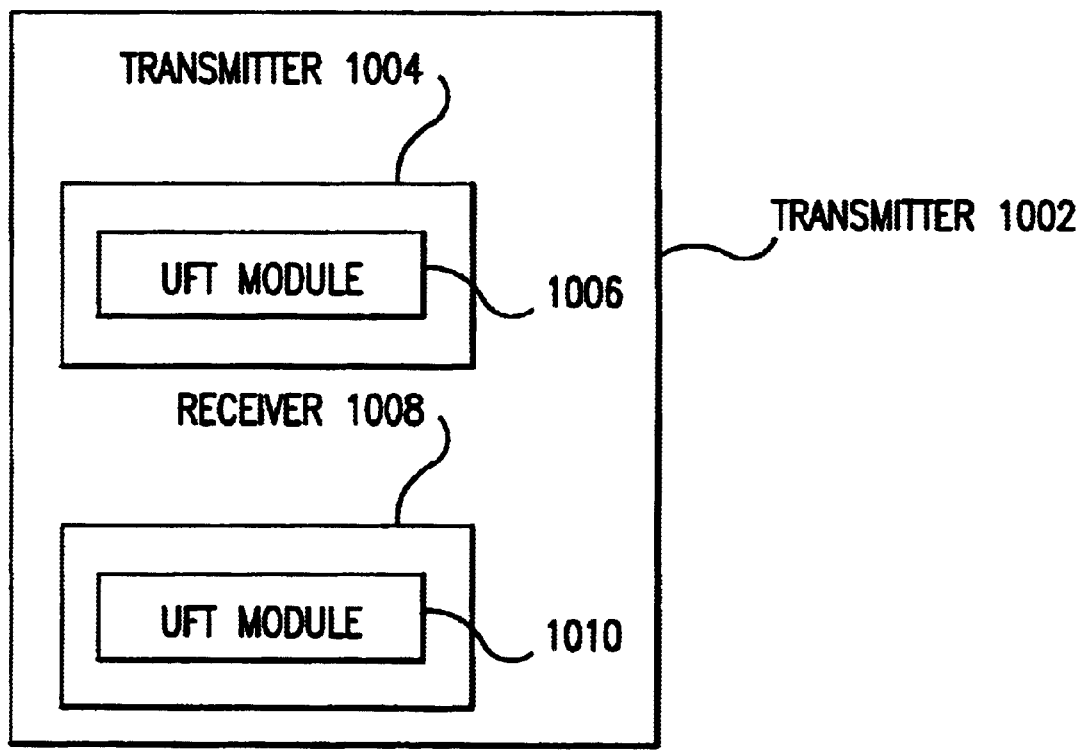
FIG. 10 illustrates a transceiver according to an embodiment of the invention.

The invention can be used to implement a transceiver. An exemplary transceiver 1002 is illustrated in FIG. 10. Transceiver 1002 includes a transmitter 1004 and a receiver 1008. Either transmitter 1004 or receiver 1008 can be implemented using a UFT module. Alternatively, transmitter 1004 can be implemented using a UFT module 1006, and receiver 1008 can be implemented using a UFT module 1010. This embodiment is shown in FIG. 10.

Figure 11:
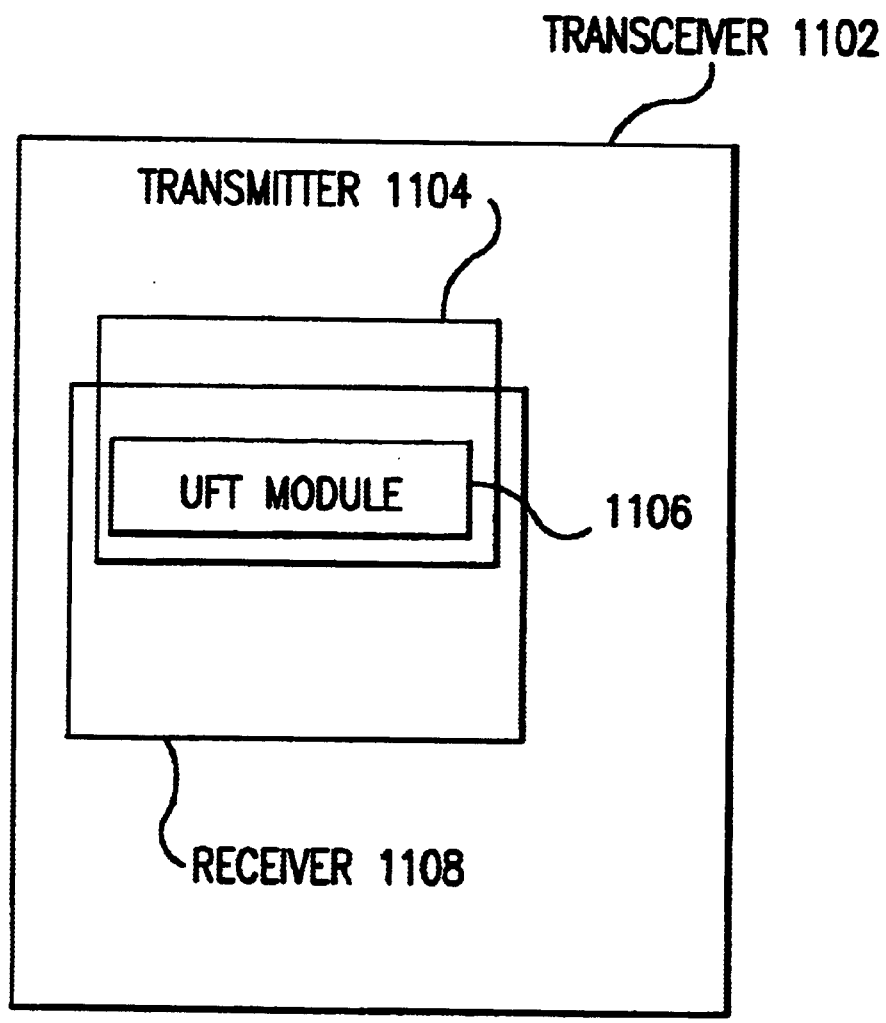
FIG. 11 illustrates a transceiver according to an alternative embodiment of the invention.

Another transceiver embodiment according to the invention is shown in FIG. 11. In this transceiver 1102, transmitter 1104 and receiver 1108 are implemented using a single UFT module 1106. In other words, transmitter 1104 and receiver 1108 share a UFT module 1106.

Figure 12:
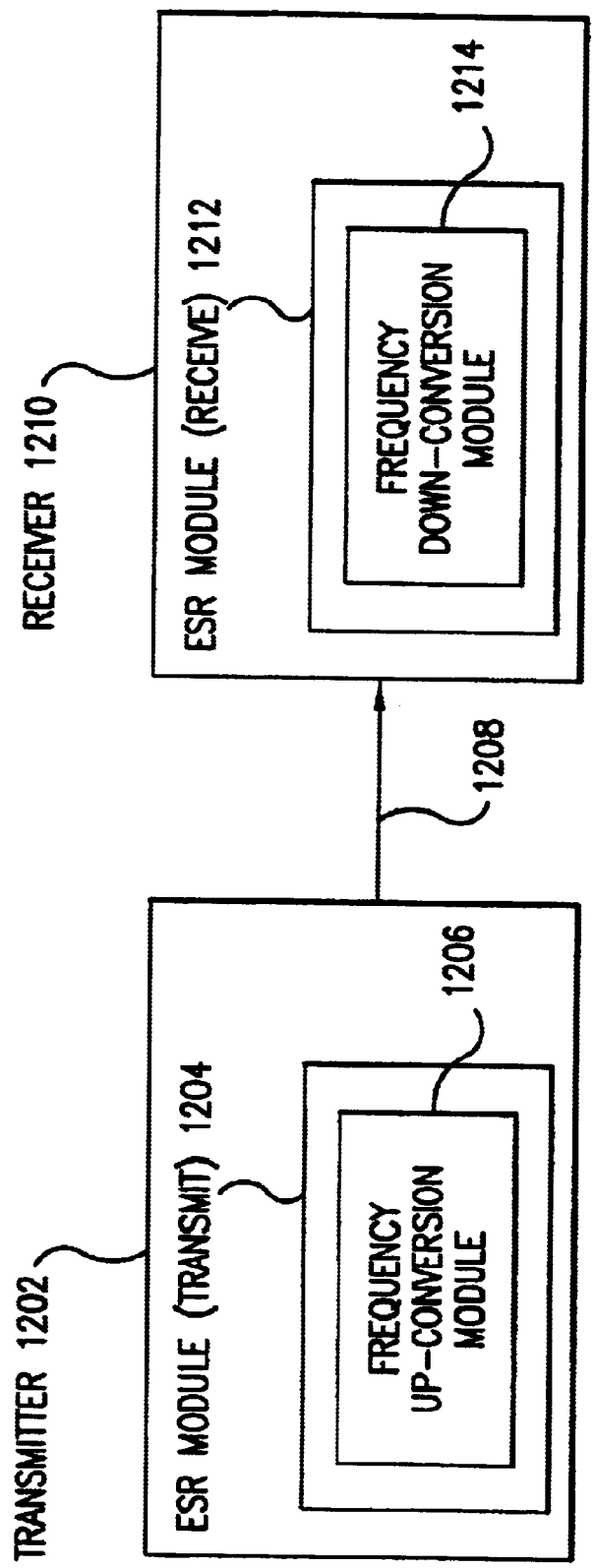
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) 1204 in a transmitter 1202, and an ESR module (receive) 1212 in a receiver 1210. An exemplary ESR embodiment configured in this manner is illustrated in FIG. 12.

ESR module (transmit) 1204 includes a frequency up-conversion module 1206. Some embodiments of frequency up-conversion module 1206 may be implemented using a UFT module, such as that shown in FIG. 1D.

ESR module (receive) 1212 includes a frequency down-conversion module 1214. Some embodiments of frequency down-conversion module 1214 may be implemented using a UFT module, such as that shown in FIG. 1C.

Figure 13:
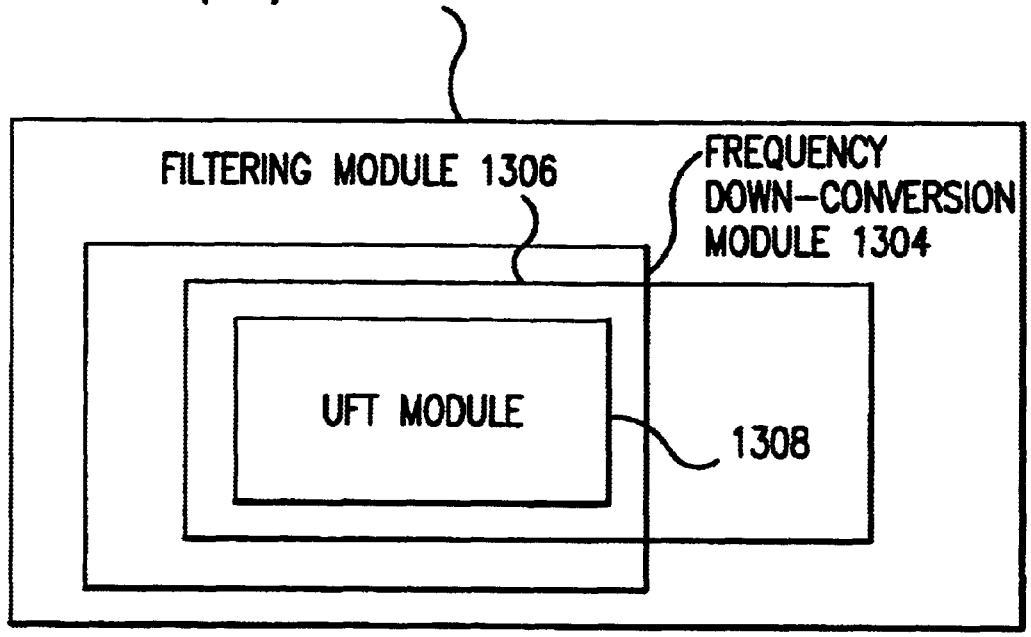
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An exemplary unified down-conversion and filtering module 1302 is illustrated in FIG. 13. Unified down-conversion and filtering module 1302 includes a frequency down-conversion module 1304 and a filtering module 1306. According to the invention, frequency down-conversion module 1304 and filtering module 1306 are implemented using a UFT module 1308, as indicated in FIG. 13.

Figure 15A:
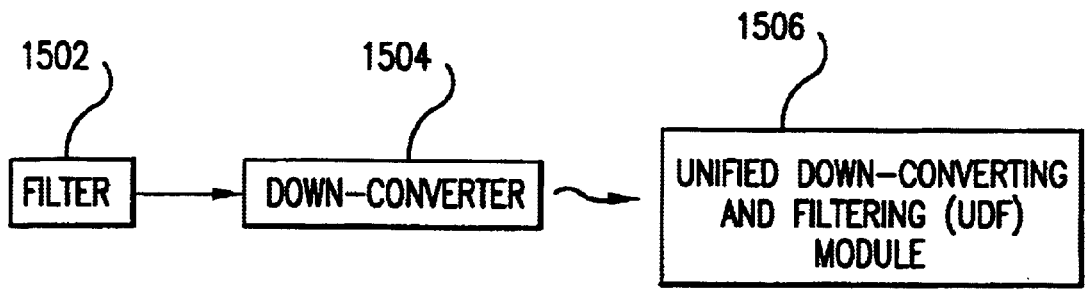
FIGS. 15A–15F illustrate exemplary applications of the UDF module according to embodiments of the invention.
Figure 15B:
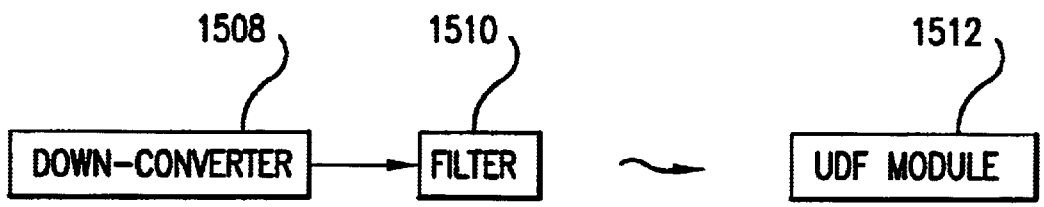
Figure 15C:
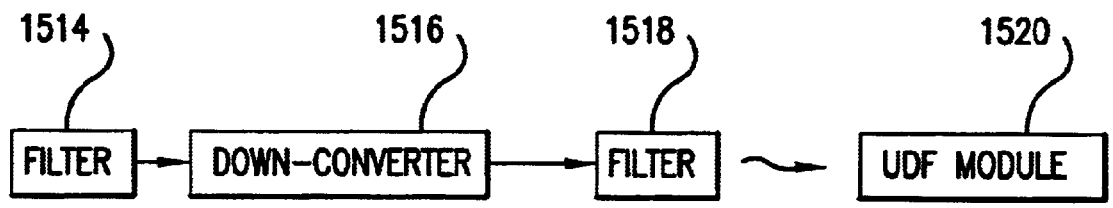
Figure 15D:
Figure 15E:
Figure 15F:
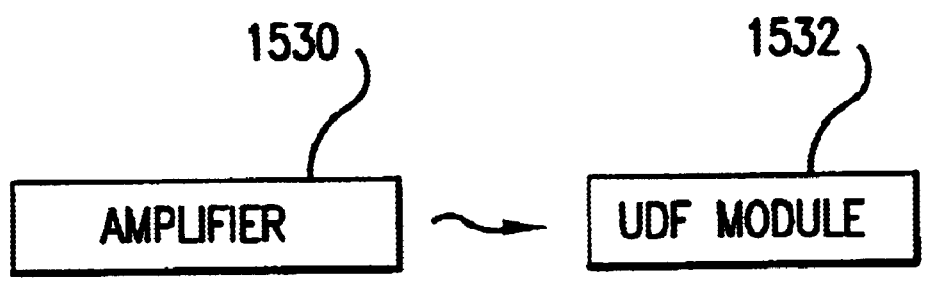

Unified down-conversion and filtering according to the invention is useful in applications involving filtering and/or frequency down-conversion. This is depicted, for example, in FIGS. 15A–15F. FIGS. 15A–15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be used as a filter 1522 (i.e., where the extent of frequency down-conversion by the down-converter in unified down-conversion and filtering module 1524 is minimized). FIG. 15E indicates that a unified down-conversion and filtering module 1528 according to the invention can be used as a down-converter 1526 (i.e., where the filter in unified down-conversion and filtering module 1528 passes substantially all frequencies). FIG. 15F illustrates that unified down-conversion and filtering module 1532 can be used as an amplifier. It is noted that one or more UDF modules can be used in applications that involve at least one or more of filtering, frequency translation, and amplification.

Figure 14:
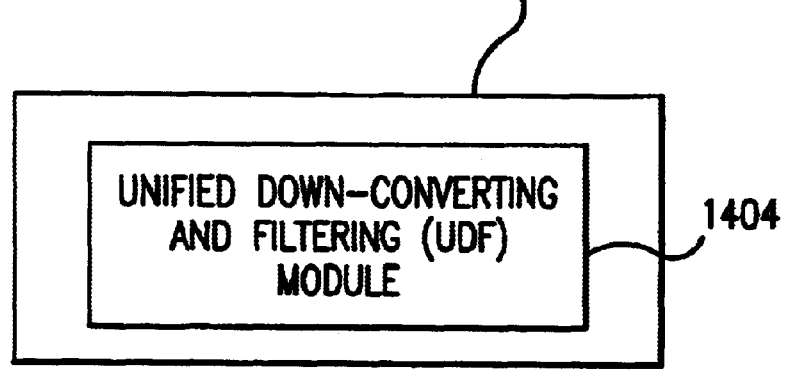
FIG. 14 illustrates an exemplary receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
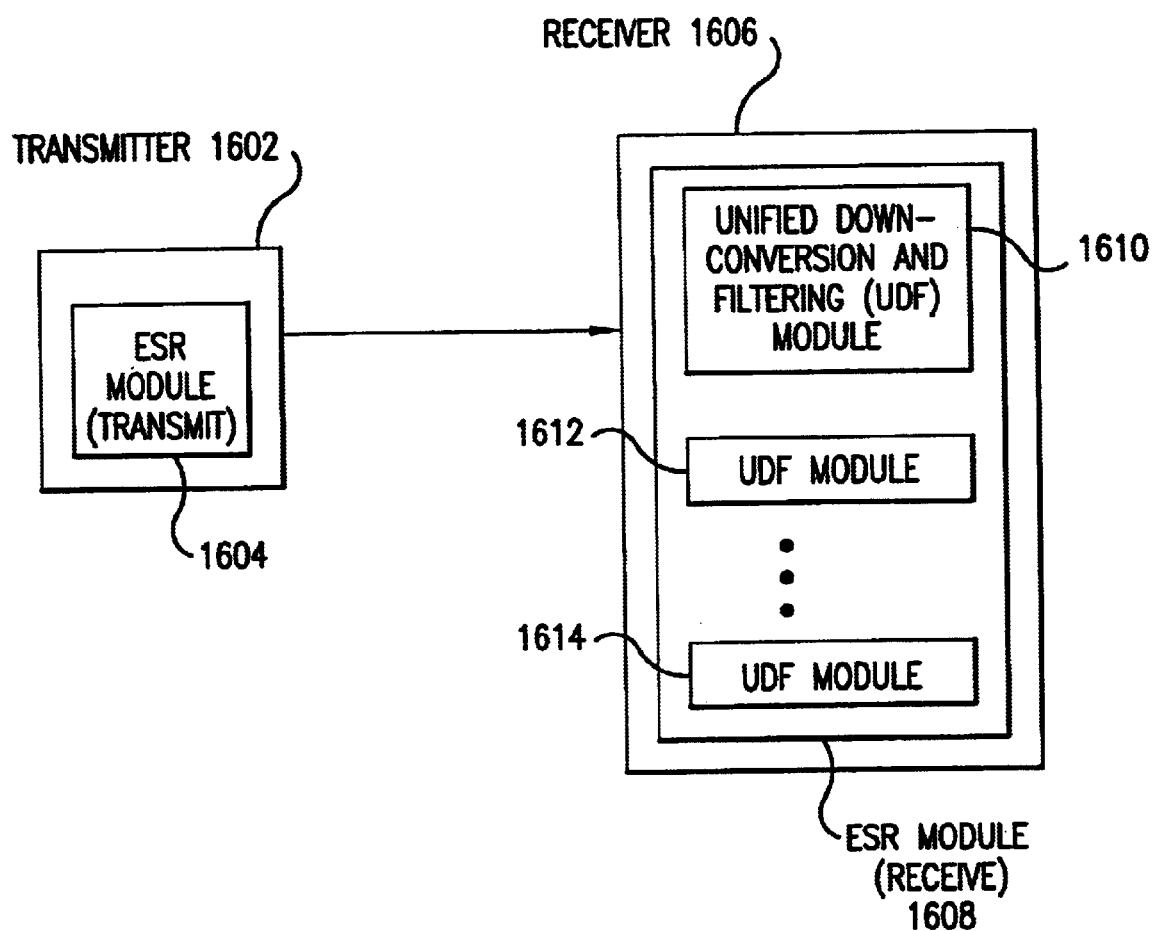
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectra. The ESR module (receive) also operates to isolate the spectra in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of UDF modules 1610, 1612, 1614 operates to down-convert a received signal. UDF modules 1610, 1612, 1614 also operate to filter the down-converted signal so as to isolate the spectrum or spectra contained therein. As noted above, UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the exemplary applications of the UFT module discussed herein. Also, the invention is not limited to the exemplary combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional exemplary applications are described below.

7. Specific Implementation Application

The present implementation of the invention is directed to a frequency synthesizer and applications of the same. Particularly, it is directed to a system and method for providing an output signal at a precise frequency or set of frequencies. As an example, a set of frequencies centered 30 KHz apart may be generated for use in cellular communications implementations.

7.1 System of Operation

Figure 25:
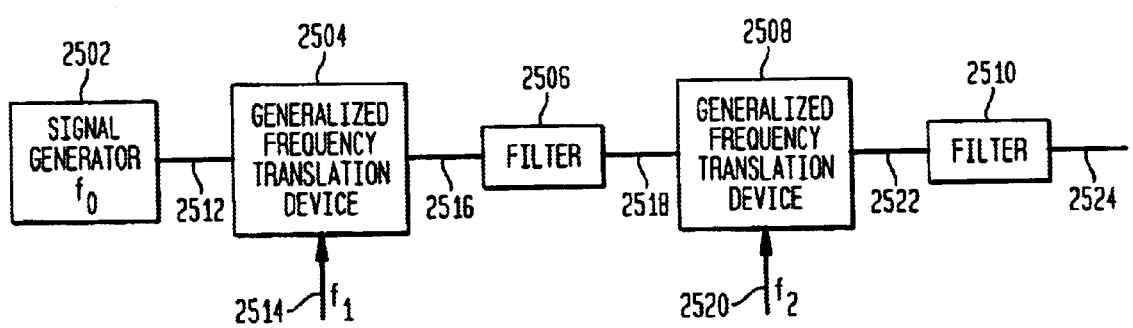
FIG. 25 illustrates a system diagram of a frequency synthesizer according to the present invention.

Looking to FIG. 25, the first embodiment of the present implementation of the present invention is displayed. In this embodiment, a signal generator 2502 generates a signal 2512. Signal 2512 may be a tone having a frequency $f_0$, but the invention is not limited to this example. Signal 2512 is input to a first generalized frequency translation device 2504. First generalized frequency translation device 2504 also accepts a control signal 2514 having a frequency $f_1$. The output of first generalized frequency translation device 2504 is an output 2516 having a plurality of spectra having frequencies that may be represented by $(f_0+n \cdot f_1)$, where "n" is any integer. Output 2516 is routed to a filter 2506 where undesired frequencies are filtered, resulting in a first filtered output 2518. First filtered output 2518 is preferably comprised of a single frequency, for example, and not meant to be limiting, $(f_0+2 \cdot f_1)$.

First filtered output signal 2518 is routed to a second generalized frequency translation device 2508. Second generalized frequency translation device 2508 also accepts a second control signal 2520 having a frequency $f_2$. The output of second generalized frequency translation device 2508 is an output 2522 having a plurality of spectra having frequencies that may be represented by the expression $(f_0+n \cdot f_1 \pm m \cdot f_2)$, where "n" is an integer that is determined by filter 2506, and "m" is any integer. Output 2522 is routed to a filter where undesired frequencies are eliminated, resulting in a desired output 2524.

In an exemplary implementation, filter 2510 is a selectable filter, and can select one or more of the spectra of output 2522. As an example, filter 2510 may, at one point, select a signal having a frequency of $(f_0+2 \cdot f_1+3 \cdot f_2)$ and then subsequently select a signal having a frequency of $(f_0+2f_1-2f_2)$. In another example, filter 2510 is fixed, and selects only a single output frequency. In yet another example, filter 2510 selects a range of frequencies simultaneously. These examples are provided for purposes of illustration only, and are not meant to be limiting.

Figure 26:
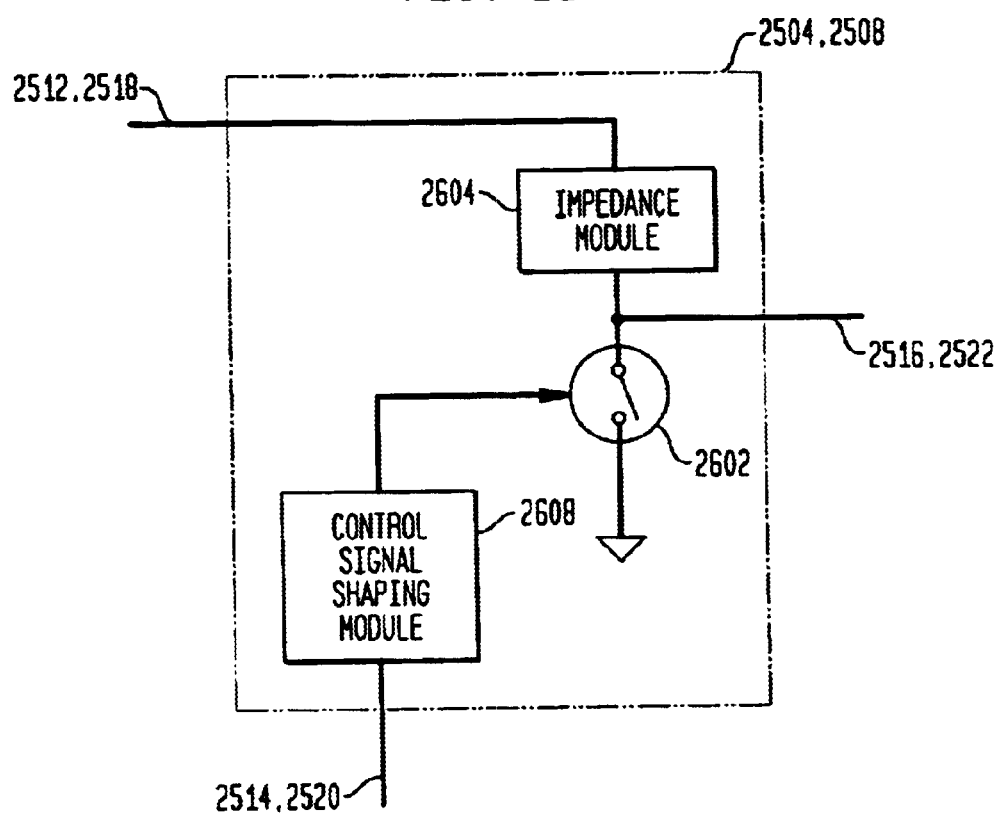
FIG. 26 illustrates a first exemplary implementation of a generalized frequency translation device.

FIG. 26 illustrates a first example of generalized frequency translation devices 2504/2508. In this example, signal 2512/first filtered output signal 2518 is routed to an impedance module 2604. Impedance module 2604 may be a resistor, and inductor, a capacitor, or any combination thereof, although the invention is not limited to these examples. The output of impedance module 2604 is gated by a switch 2602 at a rate that is a function of control signals 2514/2520 which have been routed through a control signal shaping module 2606. It is noted that control signal shaping module 2606 is optional. The gating thereby creates outputs 2516/2522.

Figure 27:
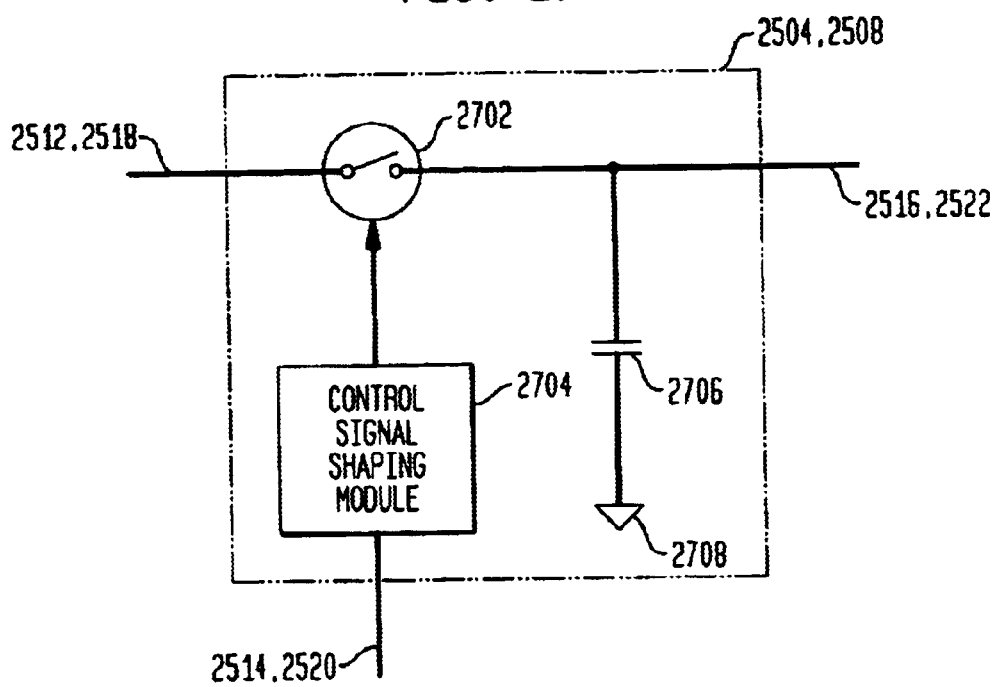
FIG. 27 illustrates a second exemplary implementation of a generalized frequency translation device.

FIG. 27 illustrates a second example of generalized frequency translation devices 2504/2508. In this example, signal 2512/first filtered output signal 2518 is routed to a switch 2702. Switch 2702 may be a semiconductor device, such as a field effect transistor, although the invention is not limited to this embodiment. Switch 2702 is controlled by control signals 2514/2520 which have been routed through a control signal shaping module 2704. It is noted that control signal shaping module 2704 is optional. The output of switch 2702 is connected through a capacitor 2706 to a ground 2707. Also present at the output of switch 2702 is outputs 2516/2522.

Figure 28:
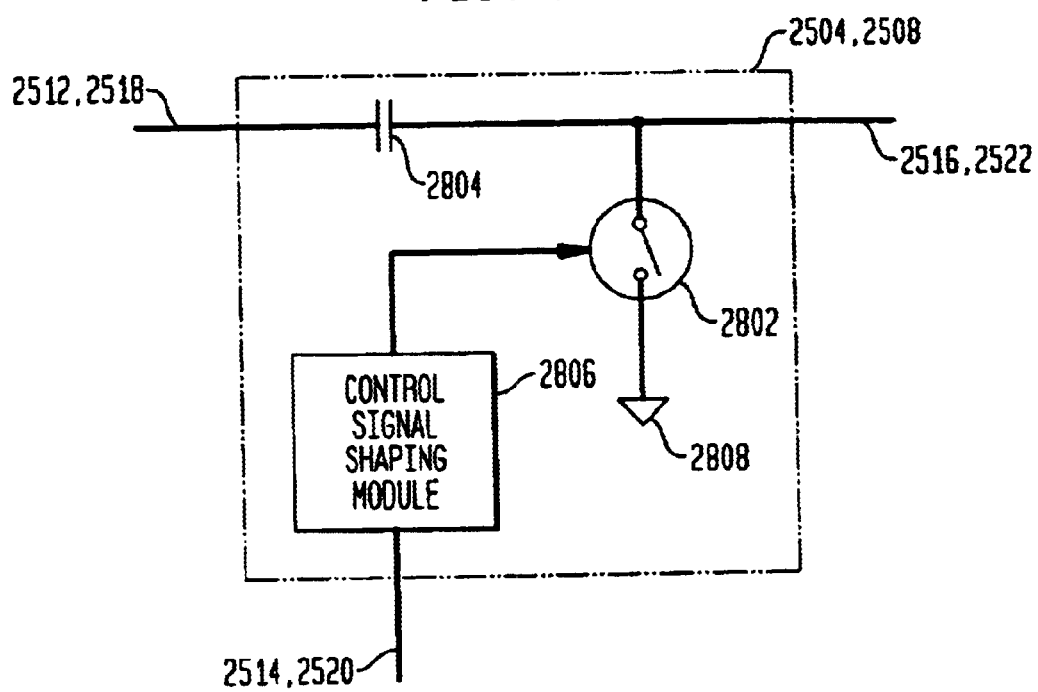
FIG. 28 illustrates a third exemplary implementation of a generalized frequency translation device.

FIG. 28 illustrates a third example of generalized frequency translation devices 2504/2508. In this example, signal 2512/first filtered output signal 2518 is routed to a capacitor 2804. The size of capacitor is selected to optimize energy transfer. In an example, capacitor 2804 is large, although the invention is not limited to this example. The output of capacitor 2804 is gated by a switch 2802 at a rate that is a function of control signals 2514/2520 which have been routed through a control signal shaping module 2806. It is noted that control signal shaping module 2806 is optional. The gating thereby creates outputs 2516/2522.

Figure 29:
FIG. 29 illustrates an exemplary frequency spectrum of the output of the signal generator.

FIG. 29 illustrates the positive portion of a spectrum 2900 of signal 2512 at a frequency $f_0$.

Figure 30:
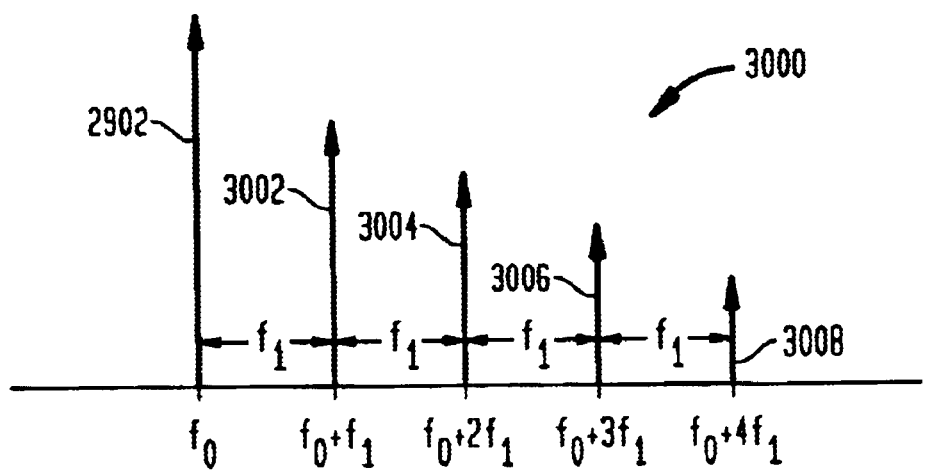
FIG. 30 illustrates an exemplary frequency spectra of the output of the first generalized frequency translation device.

FIG. 30 illustrates a spectra 3000 that results from first generalized frequency translation device 2502. The spectrum 2902 is displayed at $f_0$, while the remaining spectra 3002 through 3008 are at frequencies $(f_0+f_1)$ through $(f_0+4 \cdot f_1)$. These frequencies are provided for purposes of illustration only, and in fact the spectra continue through $(f_0+n \cdot f_1)$, where "n" is any integer. Note that each spectrum is located at a frequency distance of $f_1$ from adjacent spectra.

Figure 31:
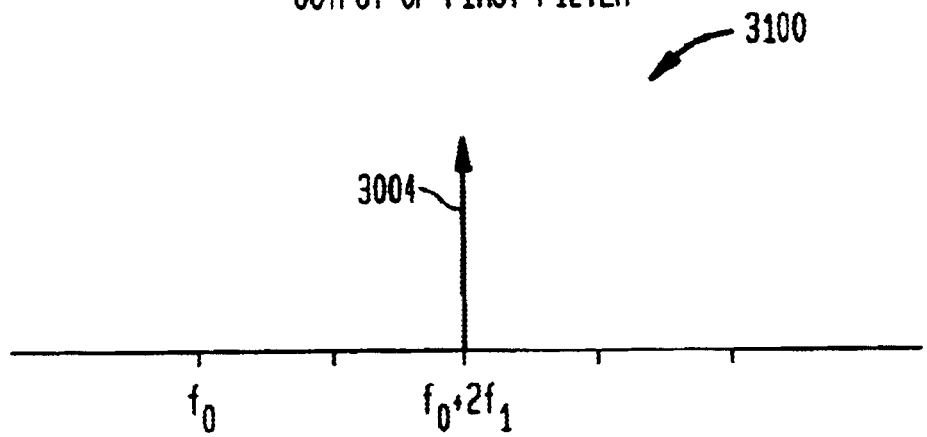
FIG. 31 illustrates an exemplary frequency spectrum of the output of the first filter.

FIG. 31 illustrates a spectrum 3100 of first filtered output signal 2518. For purposes of example only, first filtered output signal 2518 is shown at a frequency of $(f_0+2 \cdot f_1)$. First filtered output signal 2518 may be at any frequency $(f_0+n \cdot f_1)$, where "n" is any integer.

Figure 32:
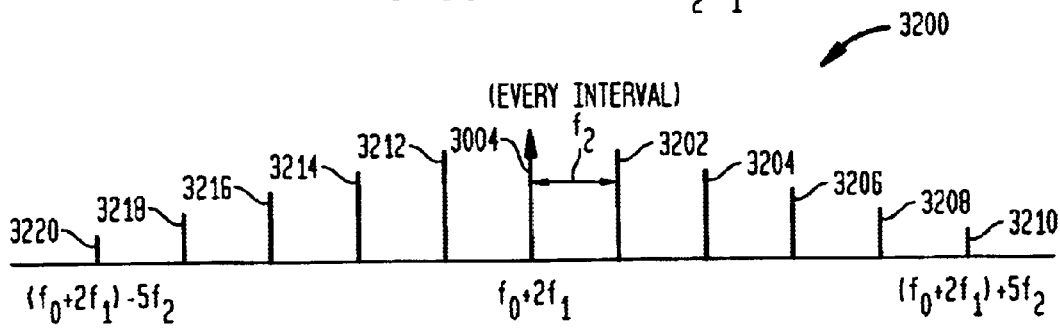
FIG. 32 illustrates an exemplary frequency spectra of the output of the second generalized frequency translation device, in the implementation wherein $f_2 < f_1$.

FIG. 32 illustrates a spectra 3200 that results from second generalized frequency translation device 2508. FIG. 32 is for the example wherein $f_2$ is less than $f_1$. The spectrum 3004 is displayed at $(f_0+2f_1)$, while the remaining spectra 3202 through 3220 are at frequencies $(f_0+2 \cdot f_1-5 \cdot f_2)$ through $(f_0+2f_1+5 \cdot f_2)$. These frequencies are provided for purposes of illustration only, and in fact the spectra continue between ($f_0+2f_1-m\cdot f_2$) through ($f_0+2\cdot f_1+m\cdot f_2$), where "m" is any integer. Note that each spectrum is located at a frequency distance of $f_2$ from adjacent spectra.

Figure 33:
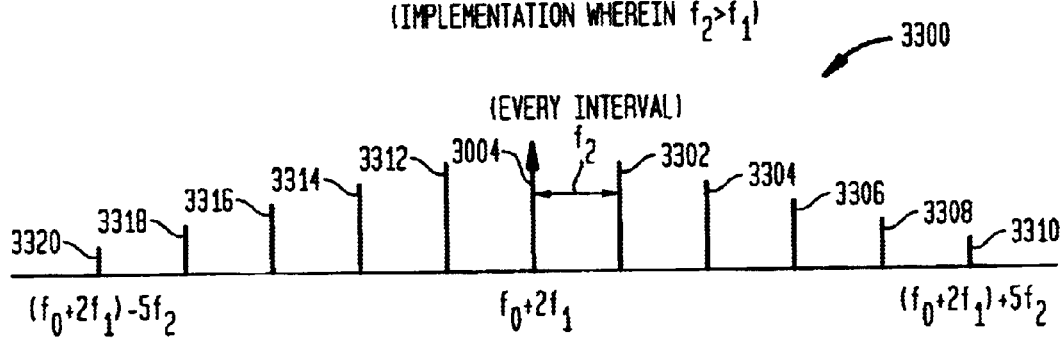
FIG. 33 illustrates an exemplary frequency spectra of the output of the second generalized frequency translation device, in the implementation wherein $f_2 > f_1$.

FIG. 33 illustrates a spectra 3200 that results from second generalized frequency translation device 2508. FIG. 33 is for the example wherein $f_2$ is less than $f_1$. The spectrum 3004 is displayed at ($f_0+2f_1$), while the remaining spectra 3202 through 3220 are at frequencies ($f_0+2\cdot f_1-5\cdot f_2$) through ($f_0+2f_1+5\cdot f_2$). These frequencies are provided for purposes of illustration only, and in fact the spectra continue between ($f_0+2f_1-m\cdot f_2$) through ($f_0+2\cdot f_1+m\cdot f_2$), where "m" is any integer. Note that each spectrum is located at a frequency distance of $f_2$ from adjacent spectra.

Figure 34:
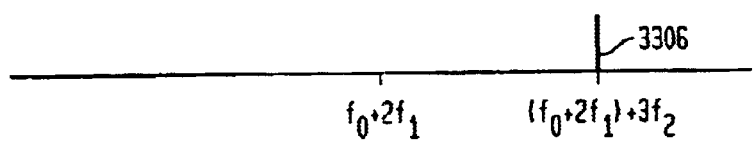
FIG. 34 illustrates an exemplary frequency spectrum of the output of the second filter, in the implementation wherein $f_2 > f_1$.

FIG. 34 illustrates a frequency spectrum 3400 of the output of filter 2510 for the example wherein $f_2$ is larger than $f_1$. As an example, and not meant to be limiting, desired output 2524 is illustrated as a signal having a frequency ($f_0+2\cdot f_1-3f_2$). In one embodiment, filter 2510 is fixed, and desired output 2524 is illustrated by spectrum 3306. In an alternate embodiment, desired output 2524 may be illustrated first by spectrum 3306, then by spectrum 3312, then by spectrum 3302, and so on. In this embodiment, filter 2510 is not fixed, and may select different spectra at different times. In yet another embodiment, filter 2510 passes more than one spectrum at a time, so that, for example, spectra 3302, 3304, and 3306 are all present simultaneously at desired output 2524. These examples are provided for illustrative purposes only, and are not meant to be limiting.

Figure 37:
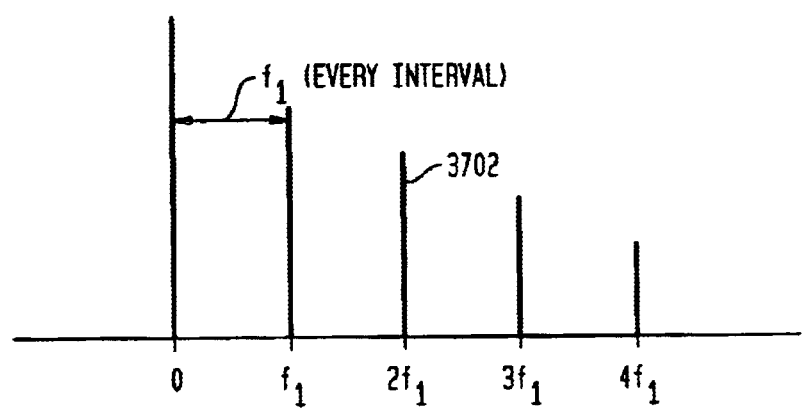
FIG. 37 illustrates an exemplary frequency spectra of the output of the first generalized frequency translation device in an alternate embodiment of the present invention.

In an alternate embodiment of the present invention, signal generator 2502 of FIG. 25 is replaced by a direct current signal source. In the representative spectral diagrams, signal 2512 would then have $f_0$ equal to zero. However, as shown in FIG. 37, each spectrum of output 2516 would still be located at a frequency distance of $f_1$ from adjacent spectra, and, as shown in FIG. 38, each spectrum of output 2522 would still be located at a frequency distance of $f_2$ from adjacent spectra.

7.2 Method of Operation

Figure 35:
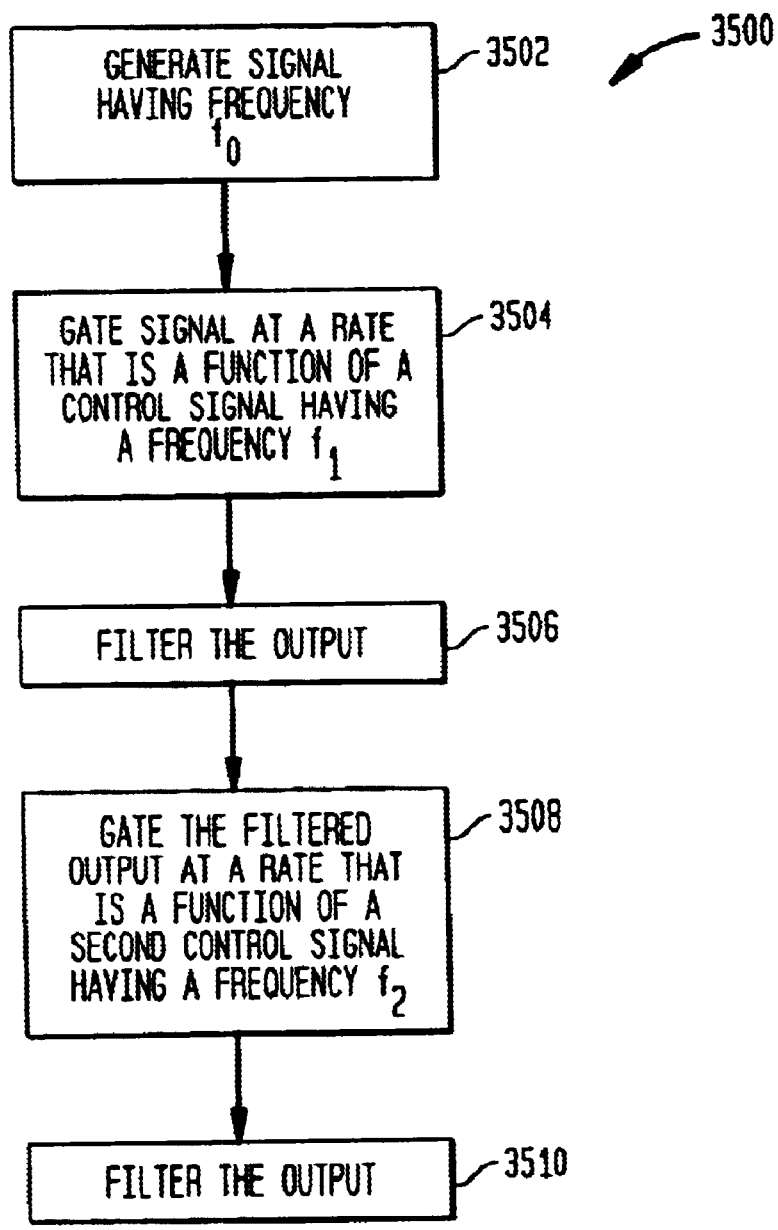
FIG. 35 illustrates an exemplary flowchart of a first embodiment of the invention.

A flowchart 3500 of FIG. 35 illustrates the steps of a first embodiment of the present invention, and is described below with reference to the elements of FIG. 25. In step 3502, signal 2512 having a frequency $f_0$ is generated. In step 3504, signal 2512 is gated at a rate that is a function of the frequency of control signal 2514 having a frequency $f_1$. This results in signal 2516 that is filtered in step 3506. In step 3508, filtered signal 2518 is then gated at a rate that is a function of the frequency of second control signal 2520 having a frequency $f_2$. The output 2522 is then filtered in step 3510, thereby creating a desired output signal 2524.

Figure 36:
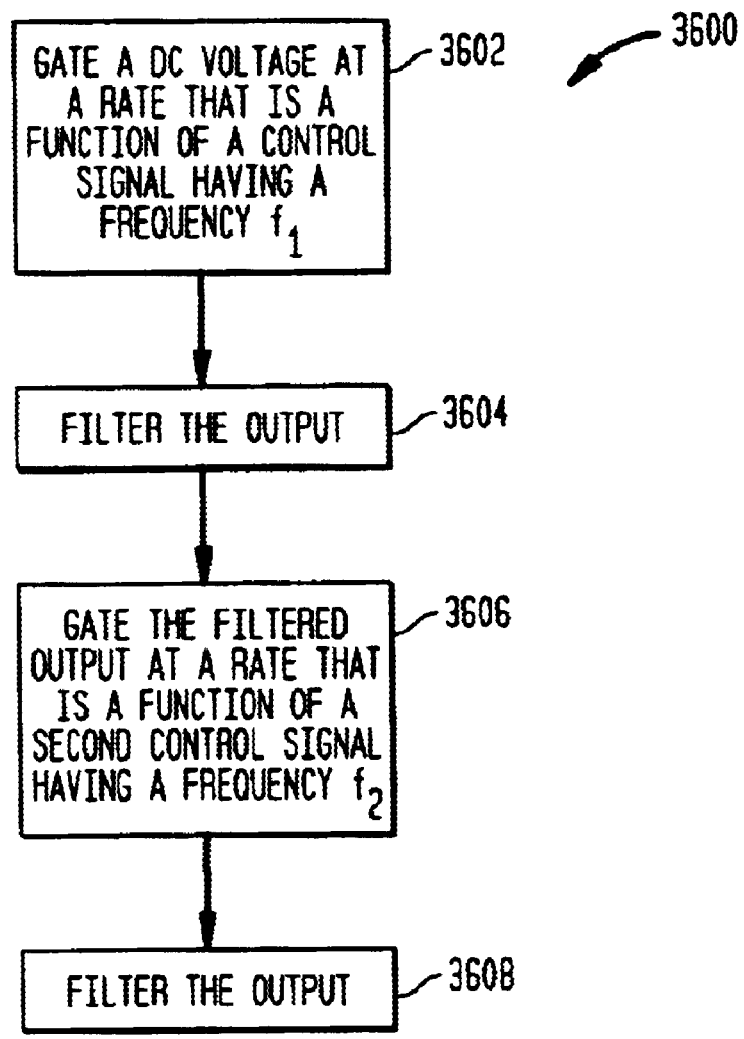
FIG. 36 illustrates an exemplary flowchart of an alternate embodiment of the present invention.

A flowchart 3600 of FIG. 36 illustrates the steps of an alternate embodiment of the present invention, and is described below with reference to the elements of FIG. 25. In step 3602, direct current signal 2512 is gated at a rate that is a function of the frequency of control signal 2514 having a frequency $f_1$. This results in signal 2516 that is filtered in step 3604. In step 3606, filtered signal 2518 is then gated at a rate that is a function of the frequency of second control signal 2520 having a frequency $f_2$. The output 2522 is then filtered in step 3608, thereby creating a desired output signal 2524.

The above methods are provided for illustrative purposes only, and one skilled in the relevant arts would appreciate, based on the teachings contained herein that other methods could be employed and still be within the spirit and scope of the invention.

8. Other Exemplary Applications

The application embodiments described above are provided for purposes of illustration. These applications and embodiments are not intended to limit the invention. Alternate and additional applications and embodiments, differing slightly or substantially from those described herein, will be apparent to persons skilled in the relevant art(s) based on the teachings contained herein. For example, such alternate and additional applications and embodiments include combinations of those described above. Such combinations will be apparent to persons skilled in the relevant art(s) based on the herein teachings.

9. Conclusions

Exemplary implementations of the systems and components of the invention have been described herein. As noted elsewhere, these exemplary implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for frequency synthesizing, comprising the steps of:

gating a first signal at a rate that is a function of the frequency of a second signal, thereby creating a first output signal;

filtering said first output signal, thereby isolating a first filtered output signal;

gating said first filtered output signal at a rate that is a function of a third signal, thereby creating a second output signal; and filtering said second output signal, thereby isolating a desired output signal.

2. The method of claim 1, wherein said first signal has a constant frequency that is greater than zero.

3. The method of claim 1, wherein said first signal is a direct current signal.

4. The method of claim 1, wherein each of said first output signal and said second output signal is a plurality of spectra.

5. The method of claim 4, wherein each spectrum of said first output signal is separated from adjacent spectra by an amount substantially equal to the first frequency of the second signal.

6. The method of claim 4, wherein each spectrum of the second output signal is separate from adjacent spectra by an amount substantially equal to the frequency of the third signal.

7. The method of claim 1, wherein said desired output signal is a single fixed frequency.

8. the method of claim 1, wherein said desired output signal is a single unfixed frequency.

9. The method of claim 1, wherein said desired output signal is a set of simultaneous frequencies.

10. The method of claim 1, wherein at least one of said gating a first signal step and said gating said first filtered output signal step is performed using a generalized frequency translation device having:

a switch; and a capacitor, wherein said switch is controlled by a control signal, wherein an output of said switch is electrically coupled to said capacitor.

11. The method of claim 1, wherein at least one of said gating a first signal step and said gating said first filtered output signal step is performed using a generalized frequency translation device having:

a switch; and a capacitor, wherein said switch is controlled by a control signal, wherein an output of said capacitor is electrically coupled to said switch.

12. The method of claim 1, wherein said step of filtering said second output signal is performed using a selectable filter.

13. The method of claim 1, wherein said gating said first filtered output signal step comprises:

sub-harmonically gating said first filtered output signal.

14. The method of claim 1, wherein said gating said first filtered output signal step comprises:

gating said first filtered output signal according to a control signal formed to enhance energy transfer from said first filtered output signal.

15. The method of claim 1, wherein said gating said first filtered output signal step comprises:

sub-harmonically gating said first filtered output signal according to a control signal formed to enhance energy transfer from said first filtered output signal.

16. A system for frequency synthesizing, comprising:

a first generalized frequency translation device accepting a first control signal, said first generalized frequency translation device gating an input signal at a rate that is a function of said first control signal, thereby creating a first output signal;

a first filter accepting said first output signal and outputting a first filtered output signal;

a second generalized frequency translation device accepting a second control signal, said second generalized frequency translation device gating said first filtered output signal at a rate that is a function of said second control signal, thereby creating a second output signal; and a second filter accepting said second output signal and outputting a desired output signal.

17. The system of claim 16, wherein said input signal is a direct current signal.

18. The system of claim 16, wherein said input signal is a constant frequency signal having a frequency greater than zero.

19. The system of claim 16, wherein at least one of said first generalized frequency translation device and said second generalized frequency translation device comprises:

a switch; and a capacitor, wherein said switch is controlled by a control signal, wherein an output of said switch is electrically coupled to said capacitor.

20. The system of claim 19, wherein said switch is a semiconductor device.

21. The system of claim 19, further comprising a control signal shaping module that processes the control signal prior to being received by the switch.

22. The system of claim 21, wherein said control signal shaping module comprises means for defining the width of pulses of the control signal before the control signal reaches the switch.

23. The system of claim 16, wherein at least one of said first generalized frequency translation device and said second generalized frequency translation device comprises:

a switch; and a capacitor, wherein said switch is controlled by a control signal, wherein an output of said capacitor is electrically coupled to said switch.

24. The system of claim 16, wherein said second filter comprises a selectable filter.

25. The system of claim 16, wherein said second generalized frequency translation device comprises:

means for sub-harmonically gating said first filtered output signal.

26. The system of claim 16, wherein said second generalized frequency translation device comprises:

means for gating said first filtered output signal according to a control signal formed to enhance energy transfer from said first filtered output signal.

27. The system of claim 16, wherein said second generalized frequency translation device comprises:

means for sub-harmonically gating said first filtered output signal according to a control signal formed to enhance energy transfer from said first filtered output signal.

28. A method for frequency synthesizing, comprising:

gating a first signal at a rate that is a function of the frequency of a second signal, thereby creating a first output signal;

filtering said first output signal, thereby isolating a first filtered output signal;

gating said first filtered output signal at a rate that is a function of a third signal, thereby creating a second output signal; and filtering said second output signal, thereby isolating a desired output signal, wherein at least one of said gating a first signal step and said gating said first filtered output signal step is performed using a generalized frequency translation device having:

an impedance module; and a switch, wherein an output of said impedance module is gated by said switch at a rate that is a function of a control signal, to thereby generate an output.

29. A system for frequency synthesizing, comprising:

a first generalized frequency translation device accepting a first control signal, said first generalized frequency translation device gating an input signal at a rate that is a function of said first control signal, thereby creating a first output signal;

a first filter accepting said first filtered output signal and outputting a first filtered output signal;

a second generalized frequency translation device accepting a second control signal, said second generalized frequency translation device gating said first filtered output signal at a rate that is a function of said second control signal, thereby creating a second output signal; and a second filter accepting said second output signal and outputting a desired output signal, wherein at least one of said first generalized frequency translation device and said second generalized frequency translation device comprises:
an impedance module; and
a switch,
wherein an output of said impedance module is gated by said switch at a rate that is a function of a control signal, to thereby generate an output.

30. The system of claim 29, wherein said impedance module comprises at least one of a resistor, an inductor, and a capacitor.

31. The system of claim 29, further comprising a control signal shaping module that processes the control signal prior to being received by the switch.

32. The system of claim 31, wherein said control signal shaping module comprises means for defining the width of pulses of the control signal before the control signal reaches the switch.

* * * * *

UNITED STATES PATENT AND TRADEMARK OFFICE
CERTIFICATE OF CORRECTION

PATENT NO. : 6,694,128 B1 Page 1 of 1
DATED : February 17, 2004
INVENTOR(S) : Sorrells et al.

It is certified that error appears in the above-identified patent and that said Letters Patent is hereby corrected as shown below:

Title page,
Item [56], References Cited, U.S. PATENT DOCUMENTS, please inesrt
-- 6,421,534 B1 7/2002 Cook et al. --.
FOREIGN PATENT DOCUMENTS,
"EP 0 035 166 A1", please replace the publication date of "9/1984" with -- 9/1981 --.
"EP 0 087 336 B1", please replace the publication date of "7/1996" with -- 7/1986 --.
Please replace "WO 96/37950" with -- WO 96/39750 --; please insert -- JP 61-30821 2/1986 --.

Column 1,
Line 10, please replace "6,061,551" with -- 6,091,940 --.

Column 36,
Line 56, please replace "the first frequency" with -- the frequency --.
Line 64, please replace "the method" with -- The method --.

Signed and Sealed this

Twenty-second Day of March, 2005

JON W. DUDAS
*Director of the United States Patent and Trademark Office*